United States Patent
Eilers et al.

(10) Patent No.: US 11,269,456 B1
(45) Date of Patent: *Mar. 8, 2022

(54) ENHANCED MUTUAL CAPACITANCE TOUCH SCREEN DISPLAY WITH WATER COMPENSATION AND METHODS FOR USE THEREWITH

(71) Applicant: SigmaSense, LLC., Wilmington, DE (US)

(72) Inventors: Hans Howard Eilers, Leander, TX (US); Kevin Joseph Derichs, Buda, TX (US); Daniel Keith Van Ostrand, Leander, TX (US); Sarah Marie Derichs, Buda, TX (US); Richard Stuart Seger, Jr., Belten, TX (US); Michael Shawn Gray, Dripping Springs, TX (US)

(73) Assignee: SigmaSense, LLC., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/201,360

(22) Filed: Mar. 15, 2021

Related U.S. Application Data

(63) Continuation of application No. 17/161,109, filed on Jan. 28, 2021.

(Continued)

(51) Int. Cl.
*G06F 3/041* (2006.01)
*G06F 3/044* (2006.01)

(52) U.S. Cl.
CPC ........ *G06F 3/04182* (2019.05); *G06F 3/0412* (2013.01); *G06F 3/0446* (2019.05)

(58) Field of Classification Search
CPC . G06F 3/041–0412; G06F 3/044–0448; G06F 3/04842; G06F 3/0488; G06F 3/0416; G06F 2203/04106
See application file for complete search history.

(56) References Cited

U.S. PATENT DOCUMENTS

| 6,218,972 | B1 | 4/2001 | Groshong |
| 6,665,013 | B1 | 12/2003 | Fossum et al. |

(Continued)

FOREIGN PATENT DOCUMENTS

| CN | 103995626 A | 8/2014 |
| CN | 104182105 A | 12/2014 |
| WO | 2013022459 A1 | 2/2013 |

OTHER PUBLICATIONS

Baker; How delta-sigma ADCs work, Part 1; Analog Applications Journal; Oct. 1, 2011; 6 pgs.

(Continued)

*Primary Examiner* — Sanjiv D. Patel
(74) *Attorney, Agent, or Firm* — Garlick & Markison; Bruce E. Stuckman

(57) ABSTRACT

A capacitive touch screen display operates by: receiving a plurality of sensed signals indicating variations in mutual capacitance associated with a plurality of cross points formed by a plurality of electrodes; generating capacitance image data associated with the plurality of cross points that includes positive capacitance variation data corresponding to positive variations of the capacitance image data from a nominal value and negative capacitance variation data corresponding to negative variations of the capacitance image data from the nominal value; identifying a presence of water on the touch screen display based on the positive capacitance variation data, and the negative capacitance variation data; generating compensated capacitance image data to compensate for effects of the water on the touch screen (Continued)

display in the capacitance image data; and processing the compensated capacitance image data to determine a proximal condition of the touch screen display.

20 Claims, 94 Drawing Sheets
(20 of 94 Drawing Sheet(s) Filed in Color)

Related U.S. Application Data

(60) Provisional application No. 63/104,973, filed on Oct. 23, 2020.

(56) References Cited

U.S. PATENT DOCUMENTS

| | | | |
|---|---|---|---|
| 7,528,755 B2 | 5/2009 | Hammerschmidt | |
| 8,031,094 B2 | 10/2011 | Hotelling et al. | |
| 8,089,289 B1 | 1/2012 | Kremin et al. | |
| 8,279,180 B2 | 10/2012 | Hotelling et al. | |
| 8,547,114 B2 | 10/2013 | Kremin | |
| 8,587,535 B2 | 11/2013 | Oda et al. | |
| 8,625,726 B2 | 1/2014 | Kuan | |
| 8,982,097 B1 | 3/2015 | Kuzo et al. | |
| 9,201,547 B2 | 12/2015 | Elias | |
| 2011/0063154 A1 | 3/2011 | Hotelling et al. | |
| 2011/0298745 A1 | 12/2011 | Souchkov | |
| 2012/0278031 A1 | 11/2012 | Oda | |
| 2013/0063388 A1 | 3/2013 | Ningrat | |
| 2013/0278447 A1 | 10/2013 | Kremin | |
| 2014/0327644 A1 | 11/2014 | Mohindra | |
| 2015/0091847 A1 | 4/2015 | Chang | |
| 2015/0153870 A1 | 6/2015 | Lee et al. | |
| 2015/0242054 A1* | 8/2015 | Gao | G06F 3/04166 345/174 |
| 2015/0346889 A1 | 12/2015 | Chen | |
| 2015/0346903 A1* | 12/2015 | O'Connor | G09G 5/18 345/173 |
| 2016/0188049 A1 | 6/2016 | Yang et al. | |
| 2017/0242540 A1* | 8/2017 | Lee | G06F 3/0418 |
| 2017/0262128 A1 | 9/2017 | Hua et al. | |
| 2020/0089354 A1* | 3/2020 | Gray | G06F 3/0412 |

OTHER PUBLICATIONS

Brian Pisani, "Digital Filter Types in Delta-Sigma ADCs", Application Report SBAA230, May 2017, pp. 1-8, Texas Instruments Incorporated, Dallas, Texas.

International Searching Authority; International Search Report; International Application No. PCT/US2021/050648; dated Dec. 29, 2021; 9 pgs.

* cited by examiner computing device 18

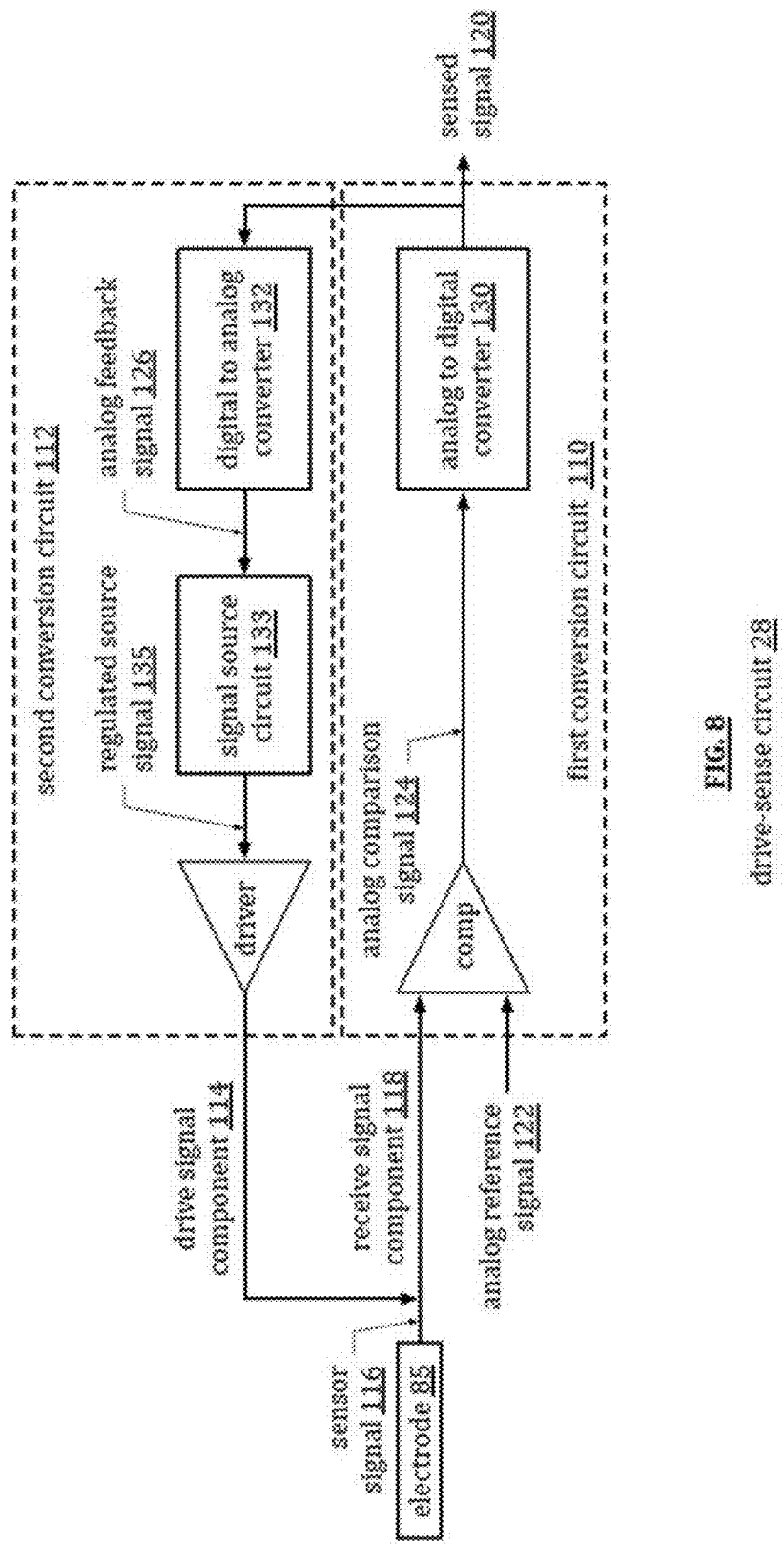

display 83 with in-cell touch sensors

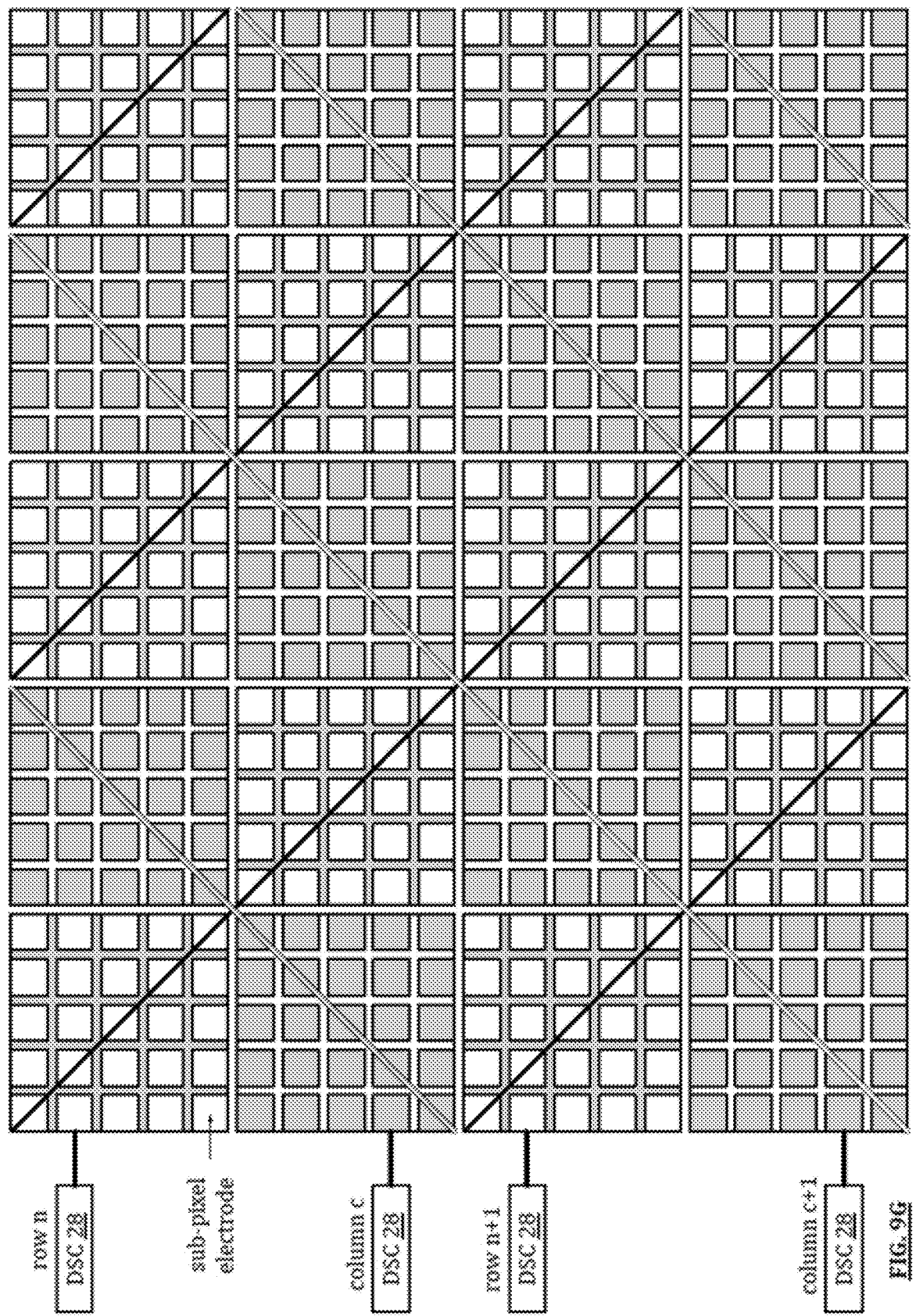

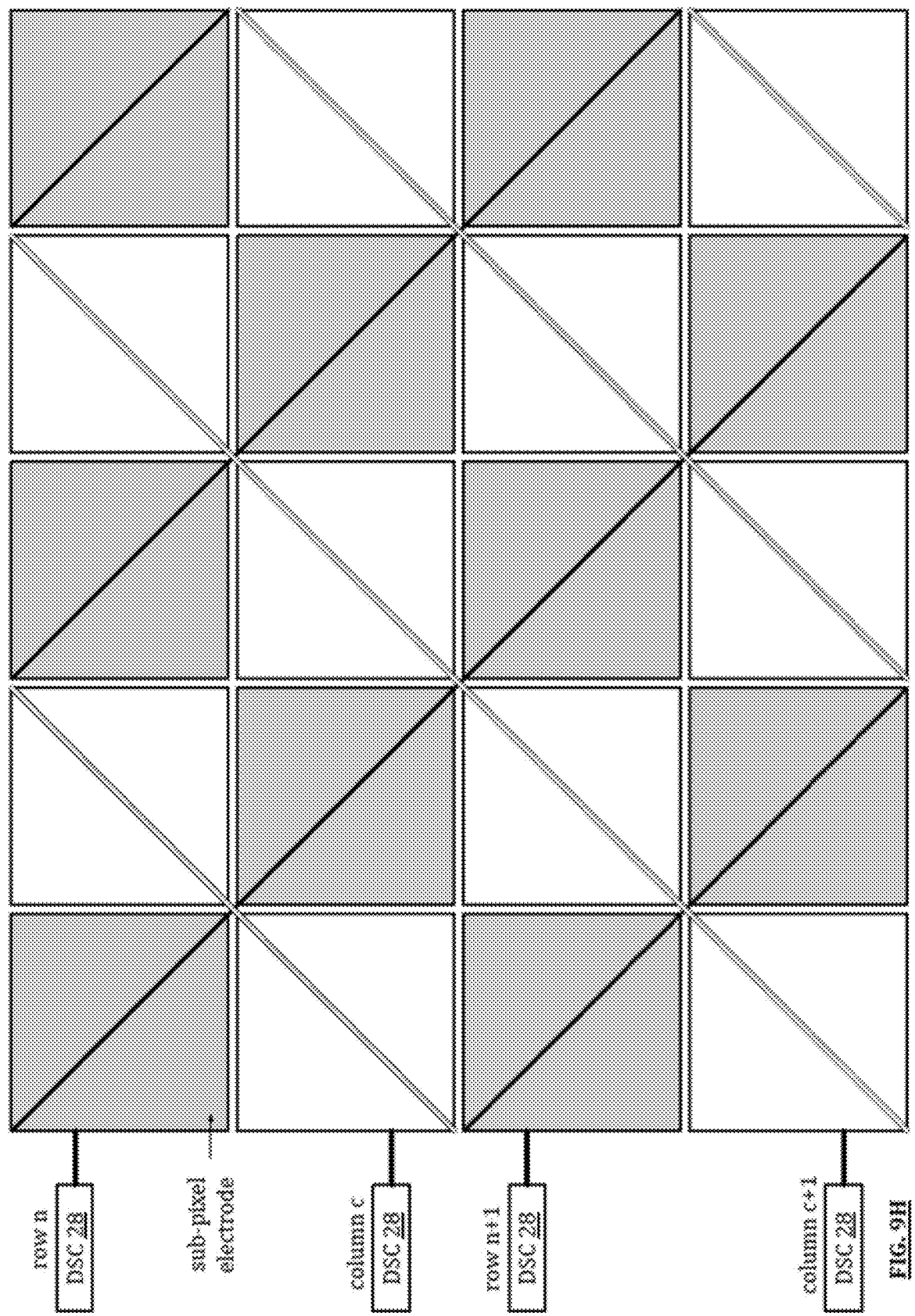

display 83-1 with on-cell touch sensors

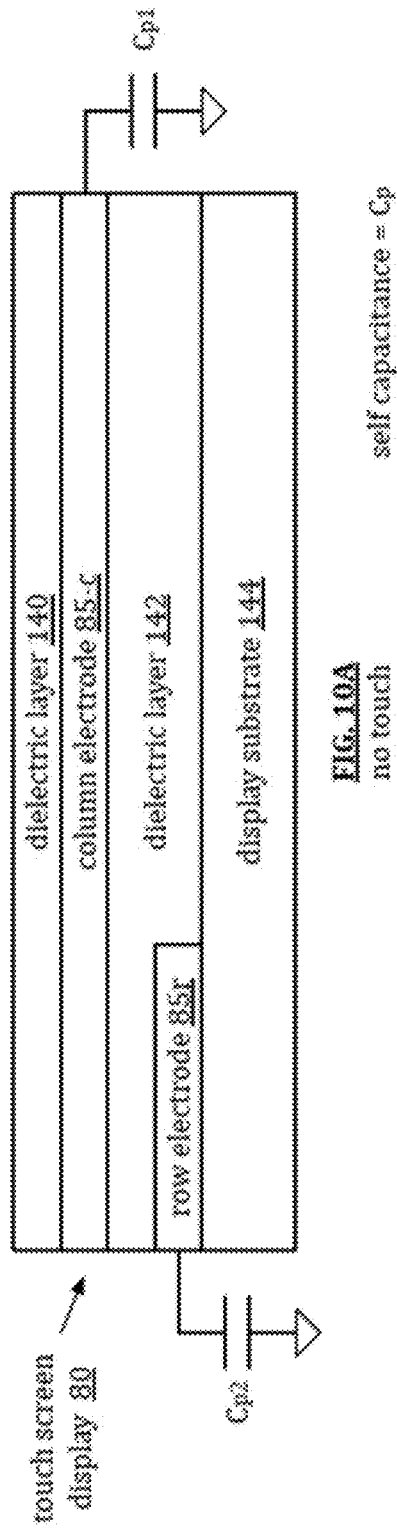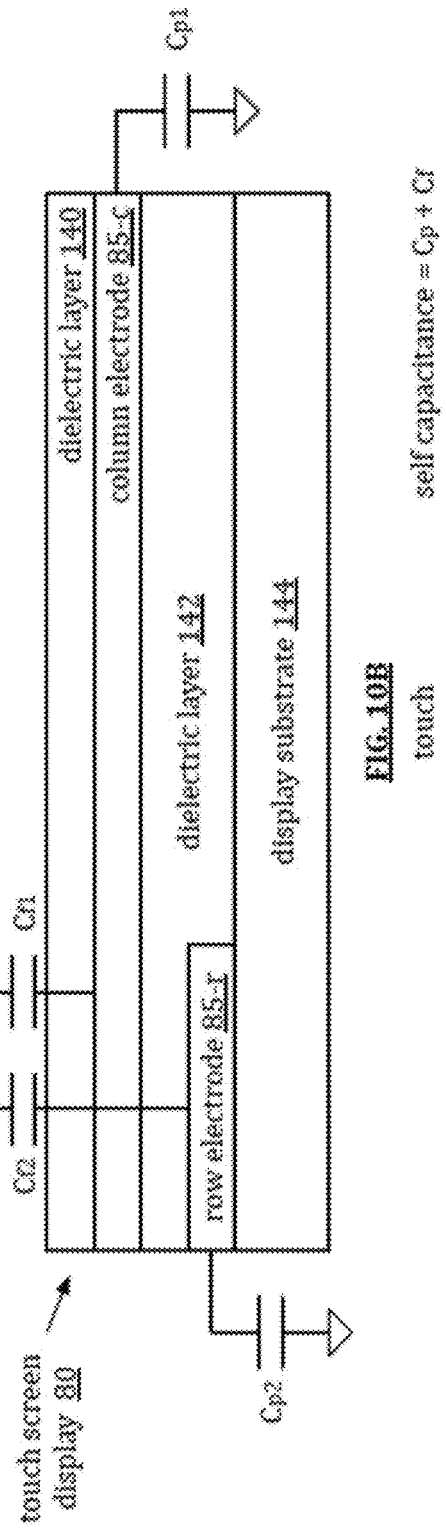

no touch touch

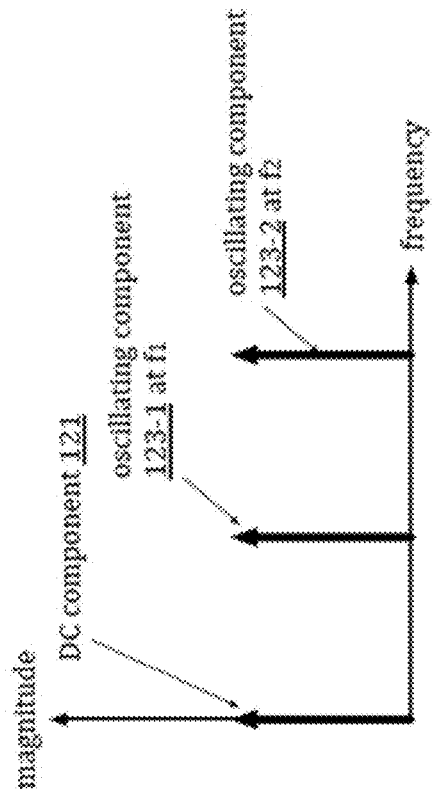
FIG. 14
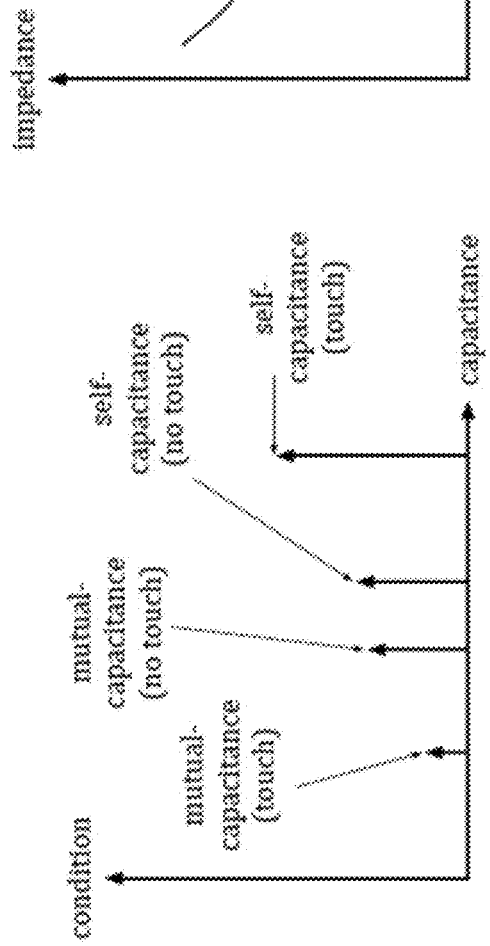
FIG. 13
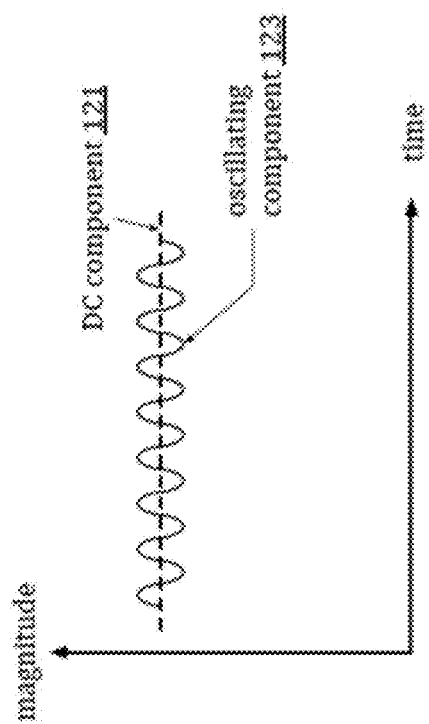
FIG. 16
FIG. 15 no touch with touch

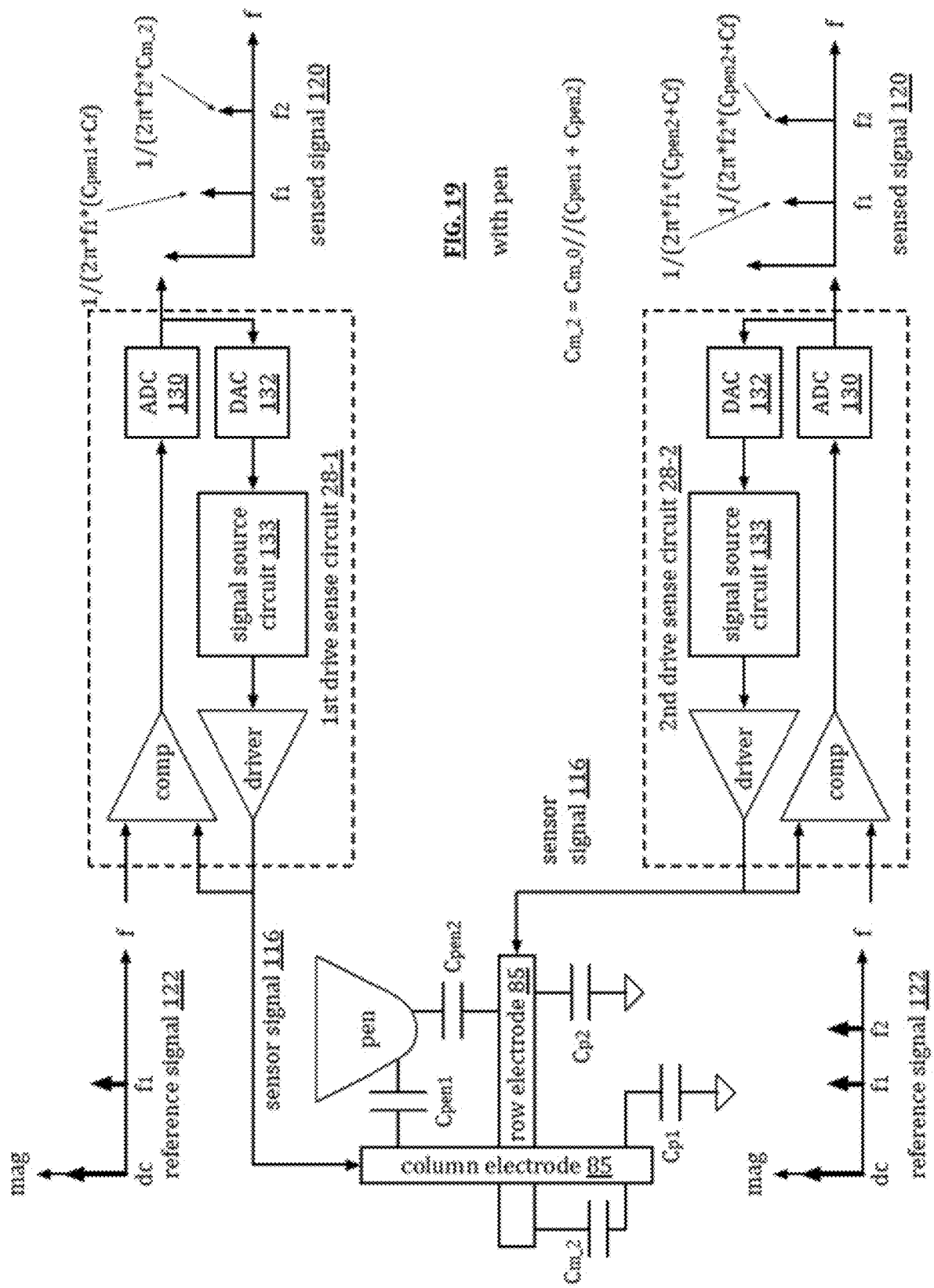

with pen

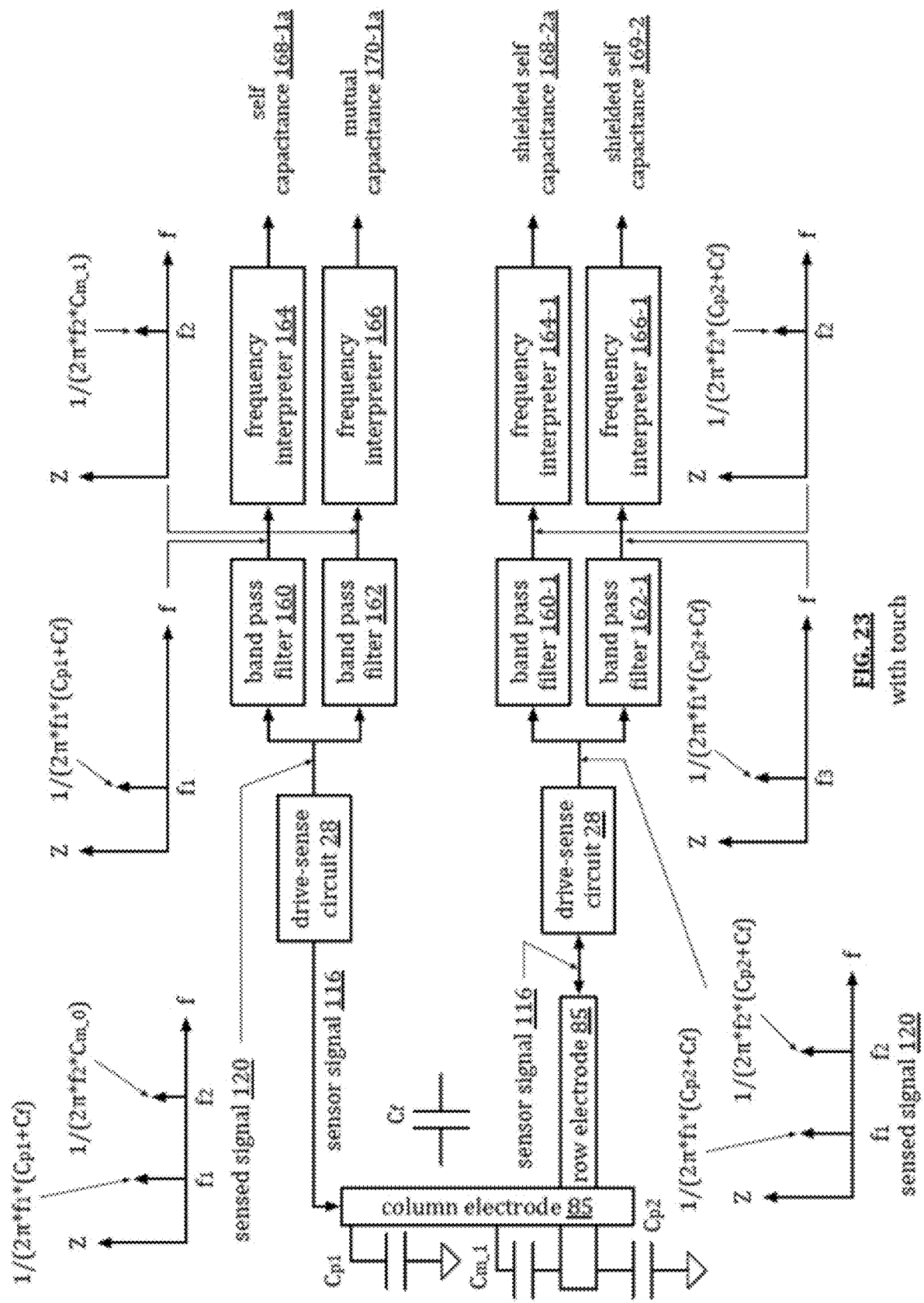
FIG. 23 with touch

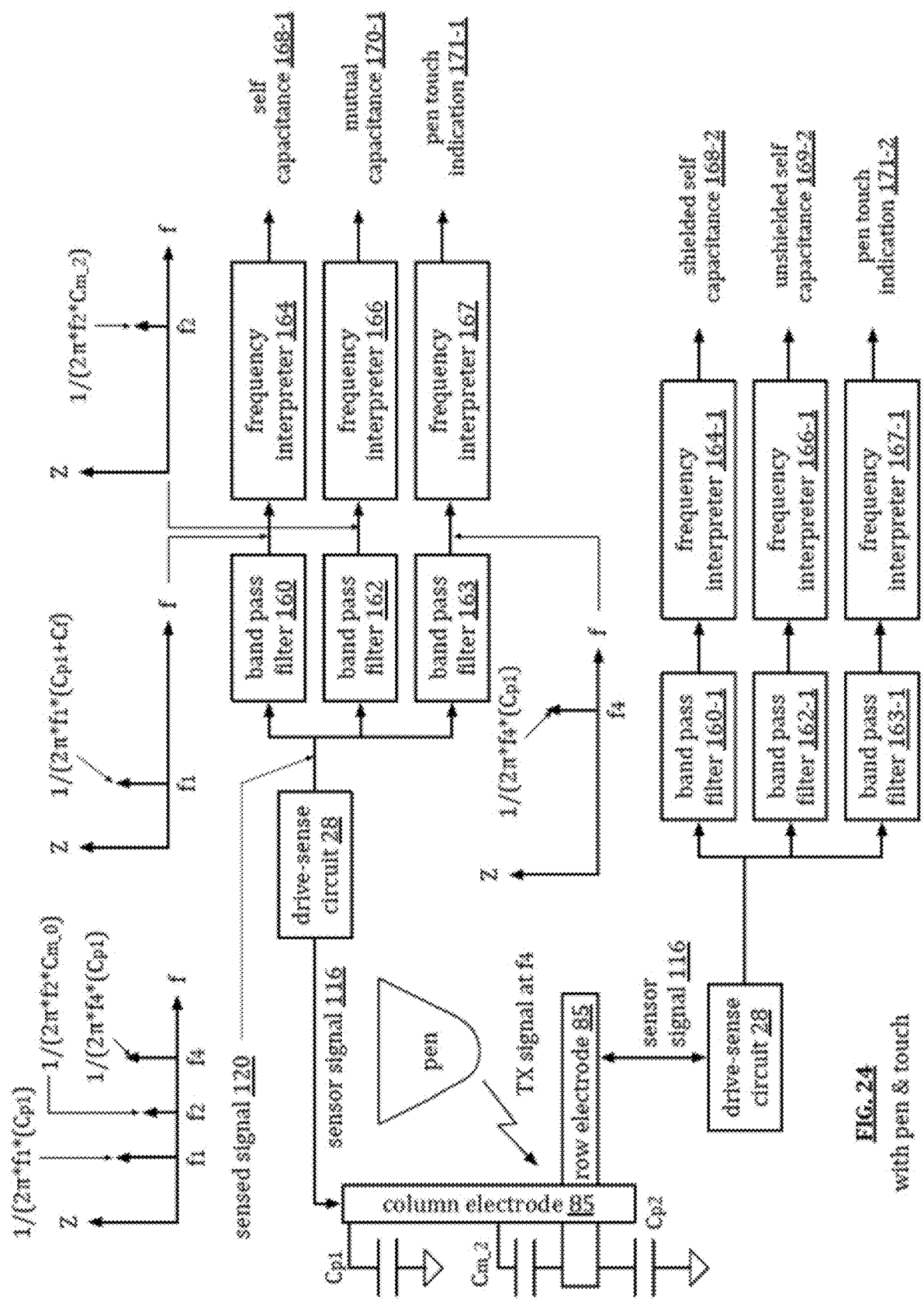
FIG. 24 with pen & touch computing device 14-b computing device 14-a

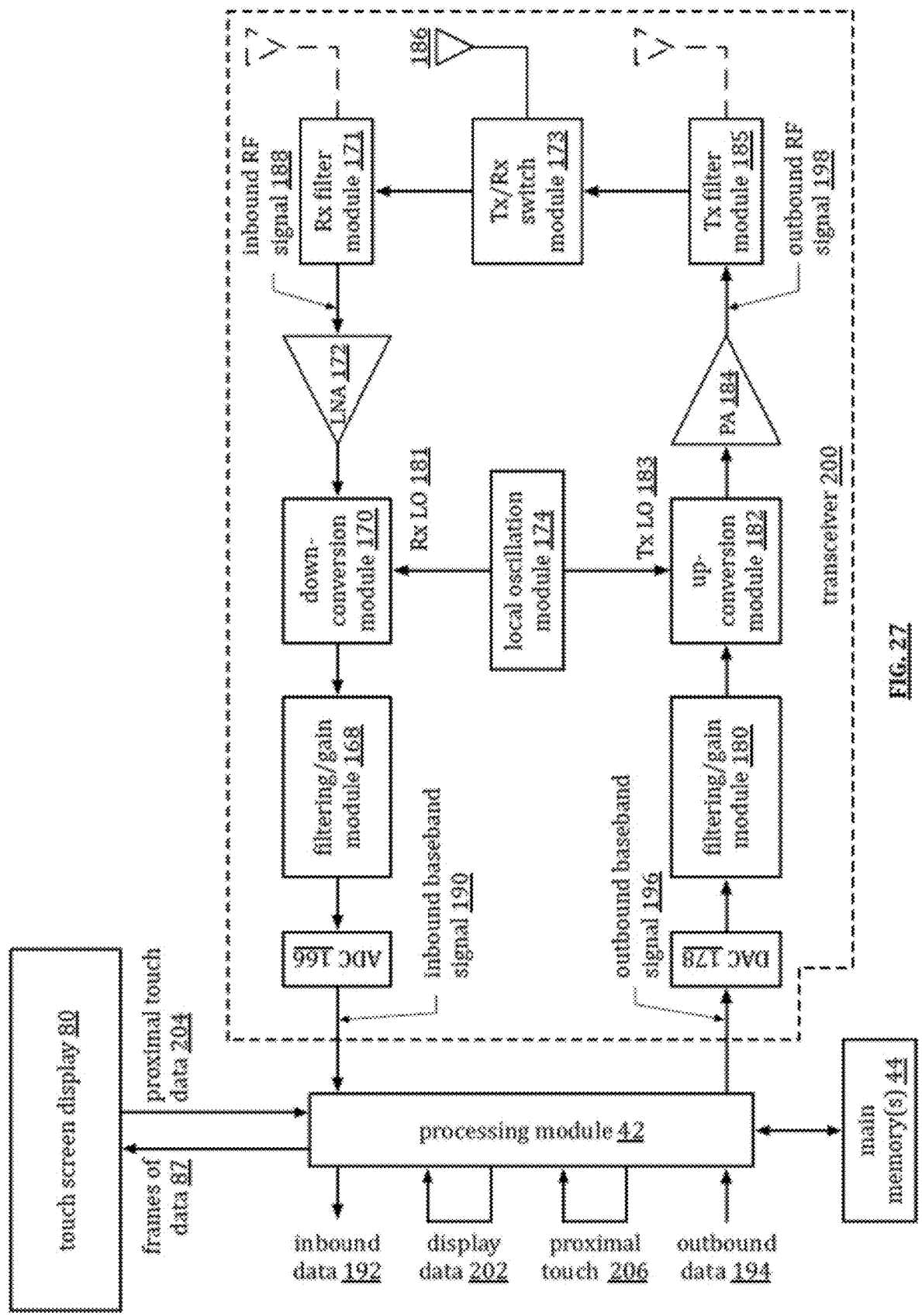

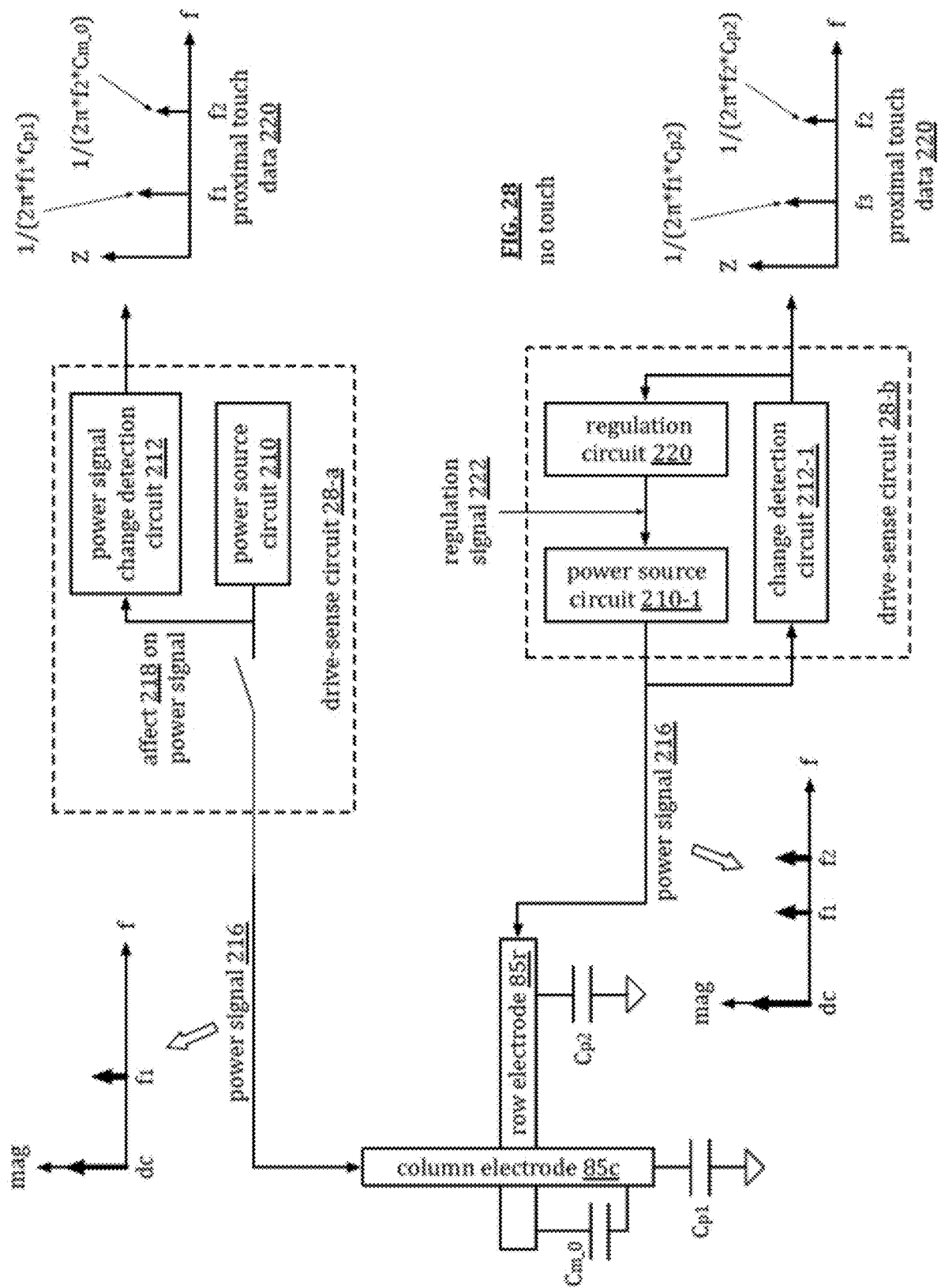

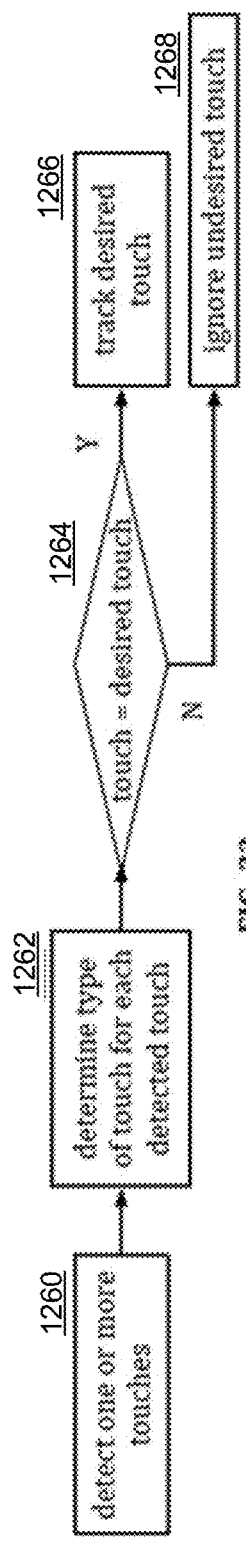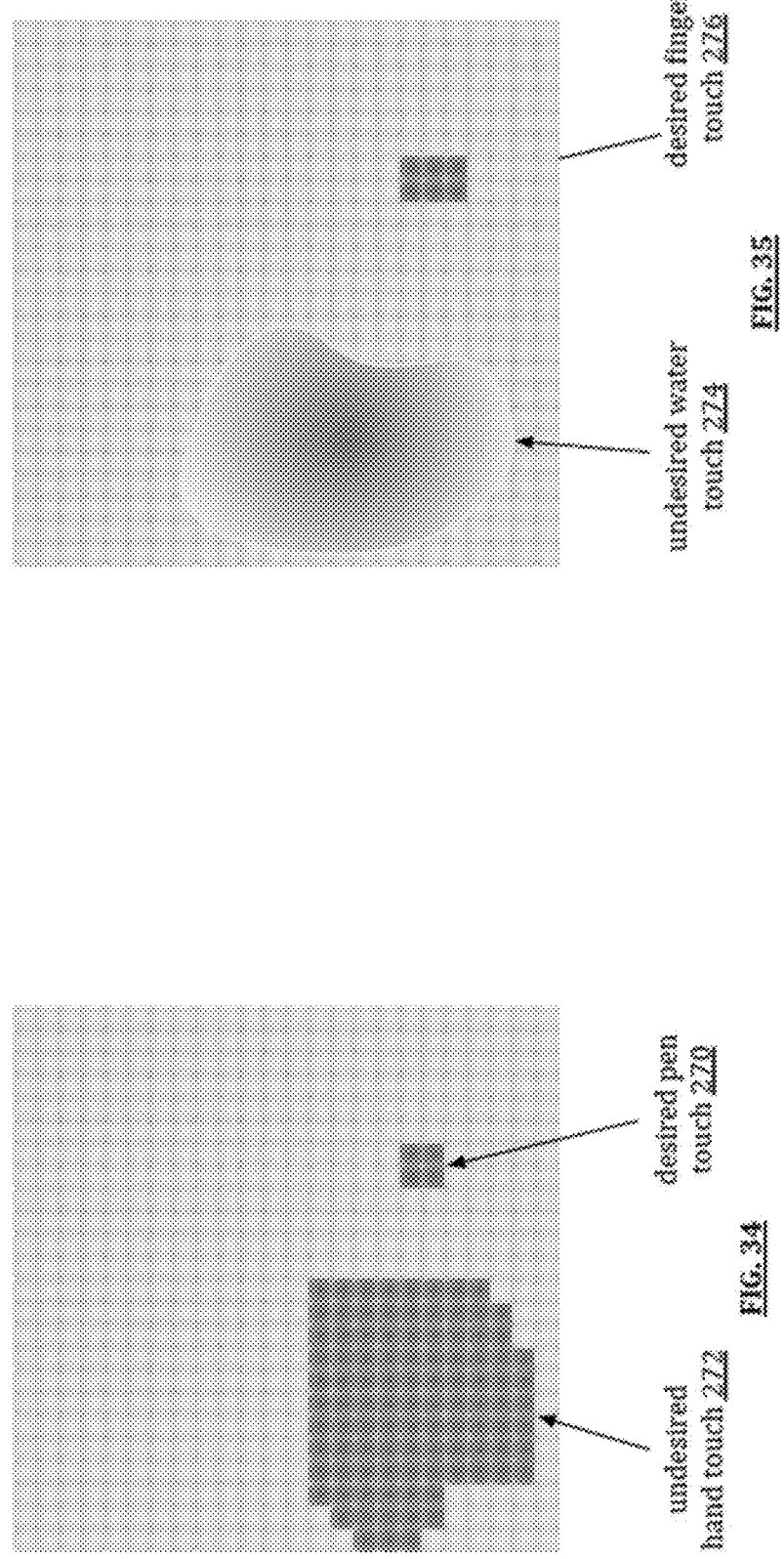
FIG. 33
FIG. 34
FIG. 35 touch screen circuitry 246
DSC = drive-sense circuit

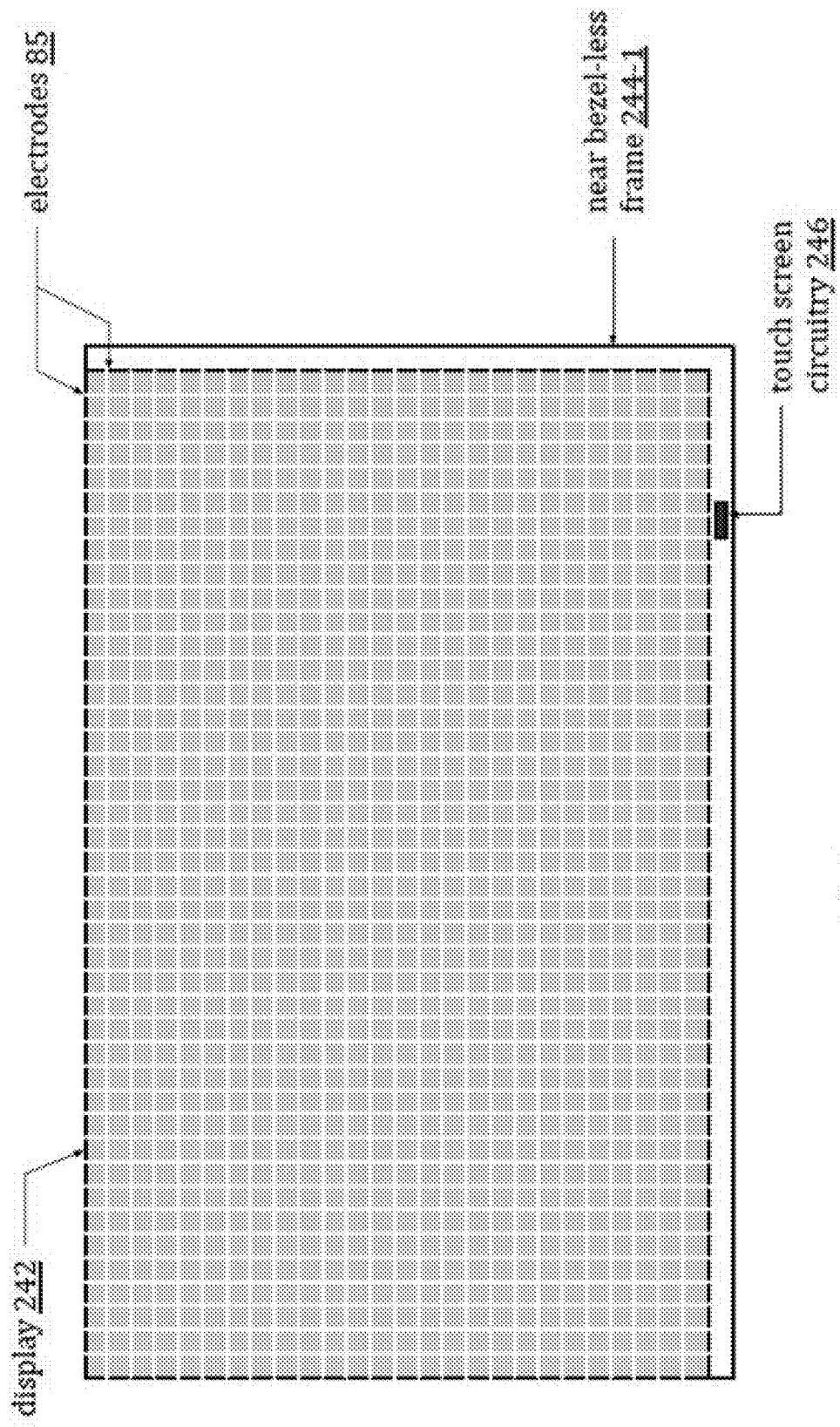

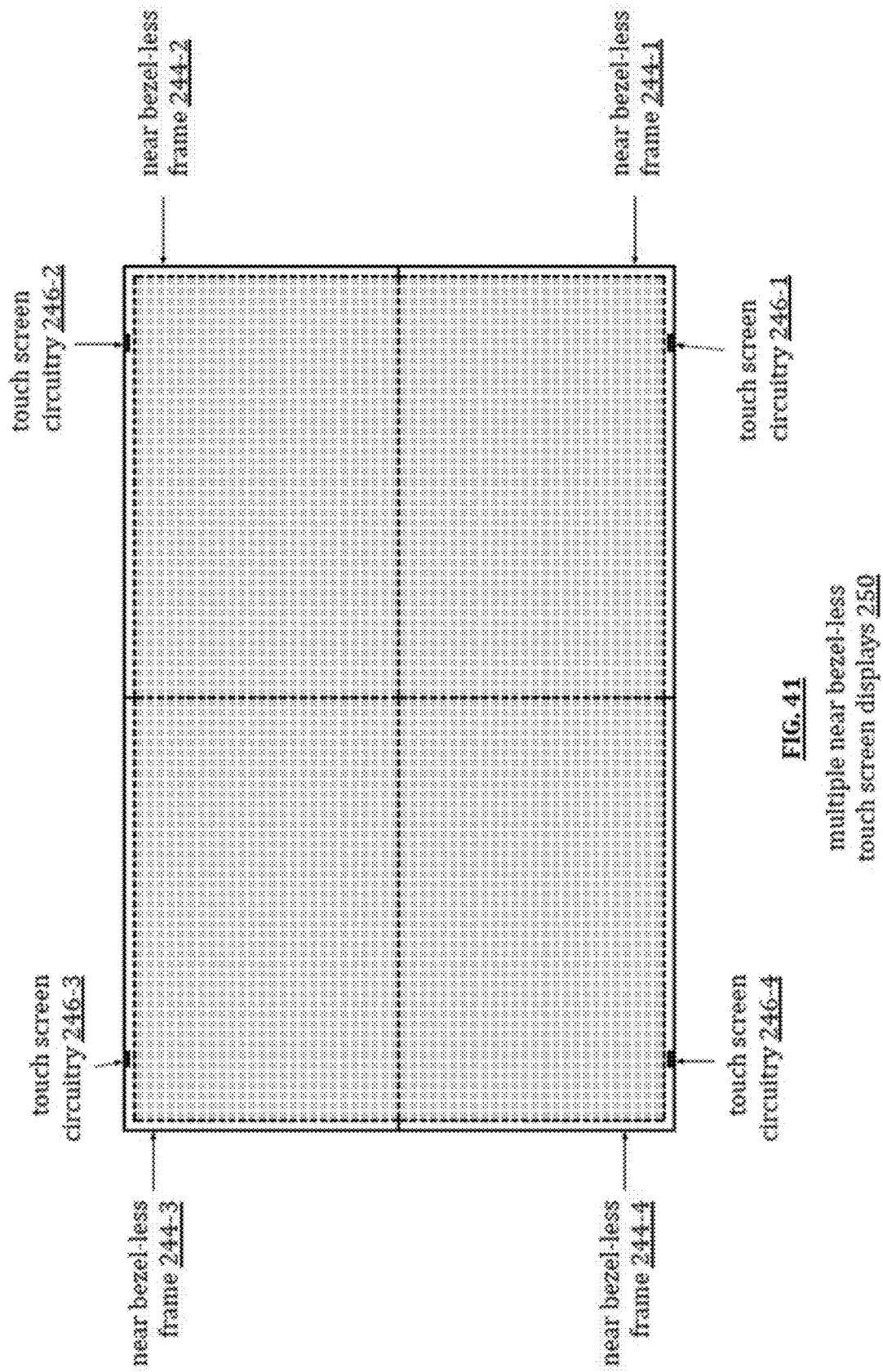

no touch touch

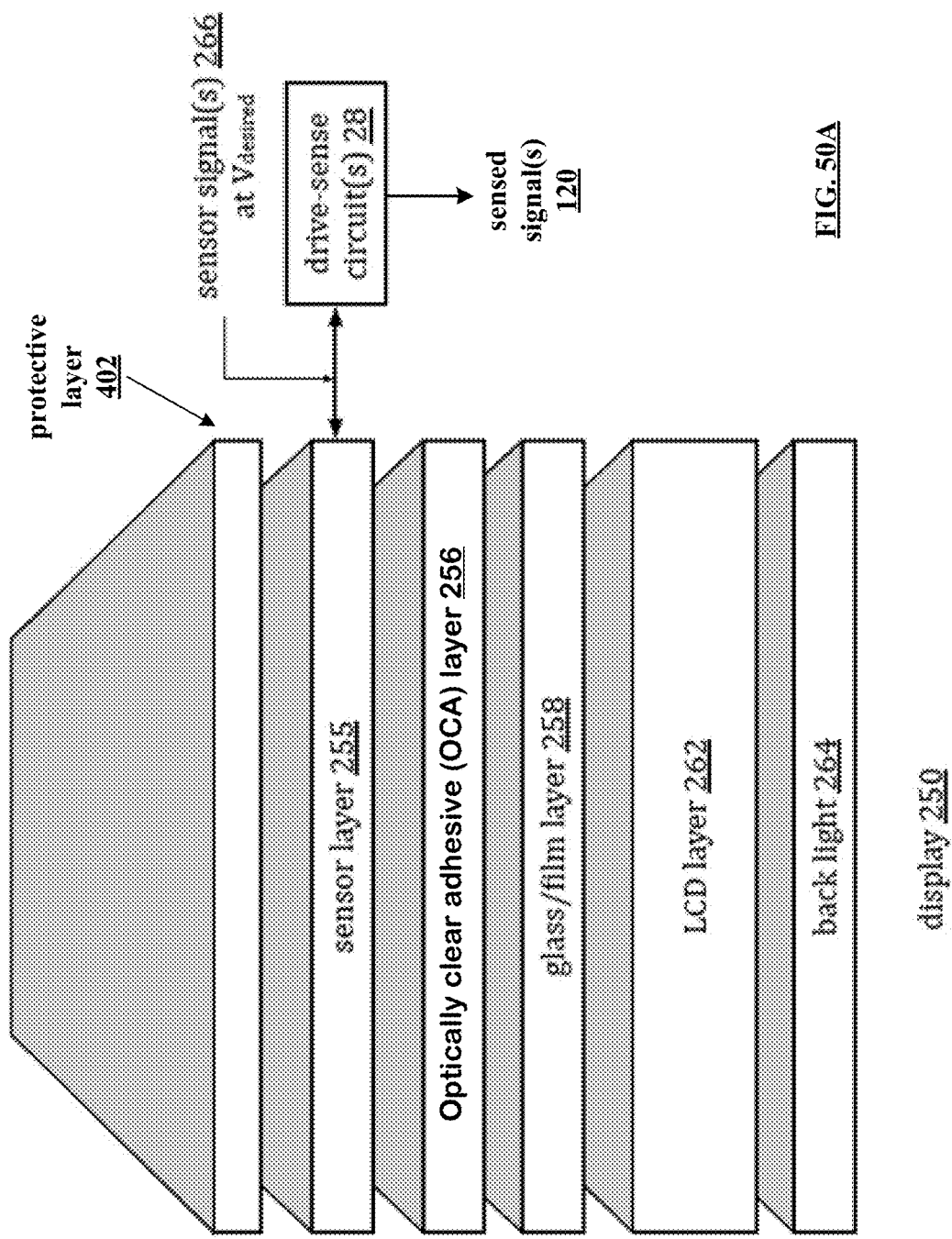

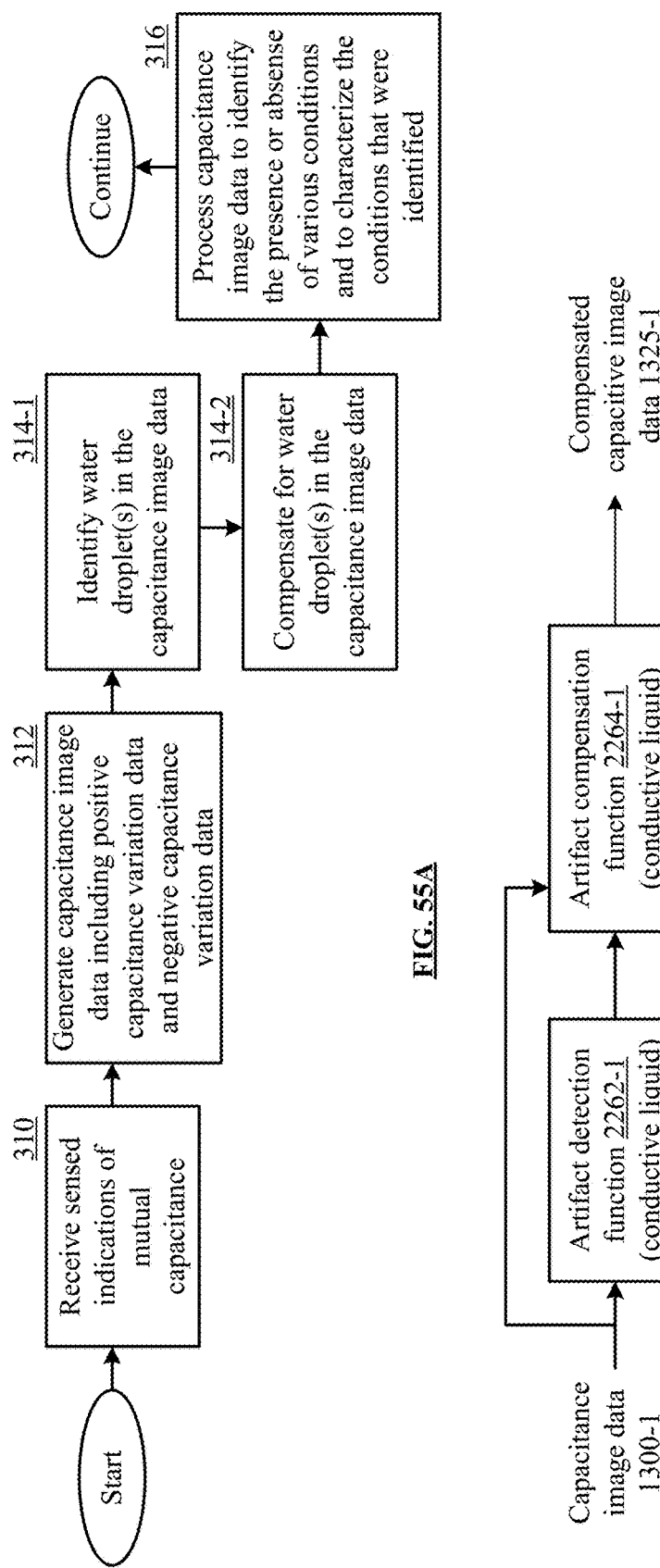
FIG. 55A
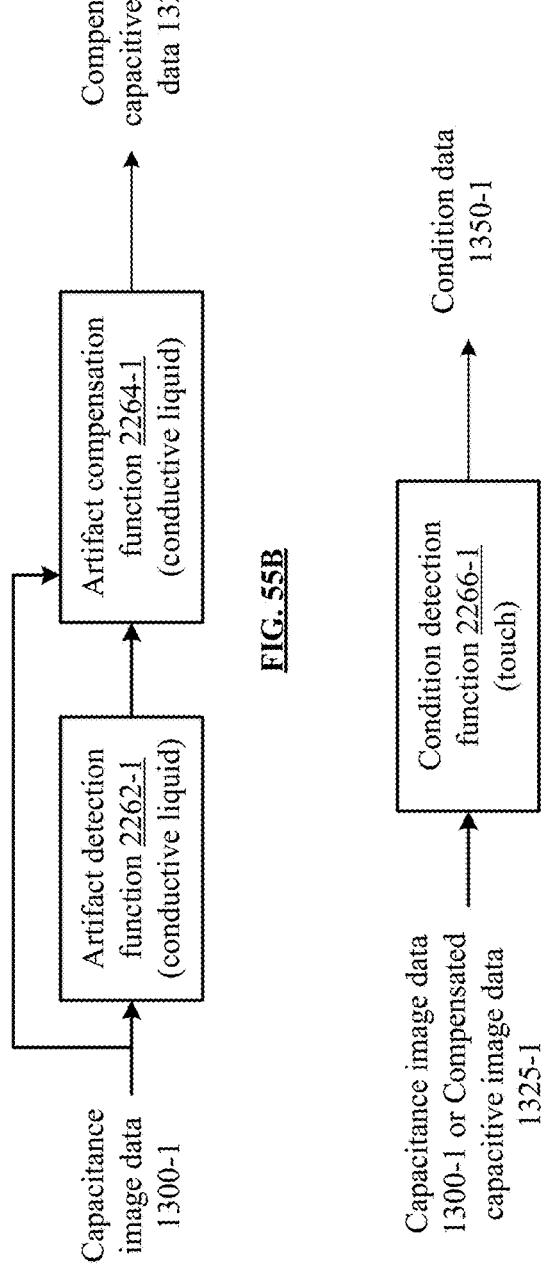
FIG. 55B
FIG. 55C

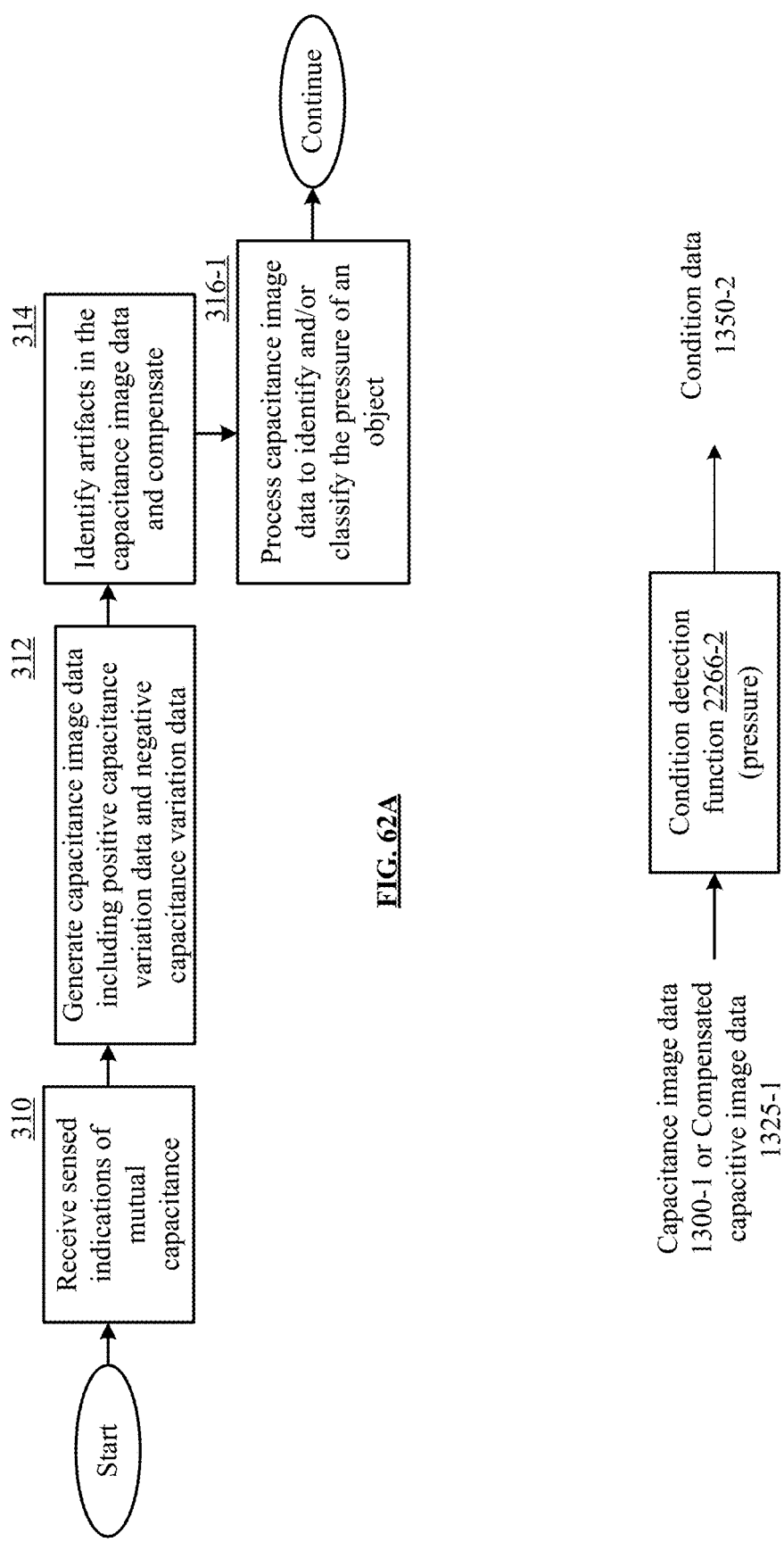

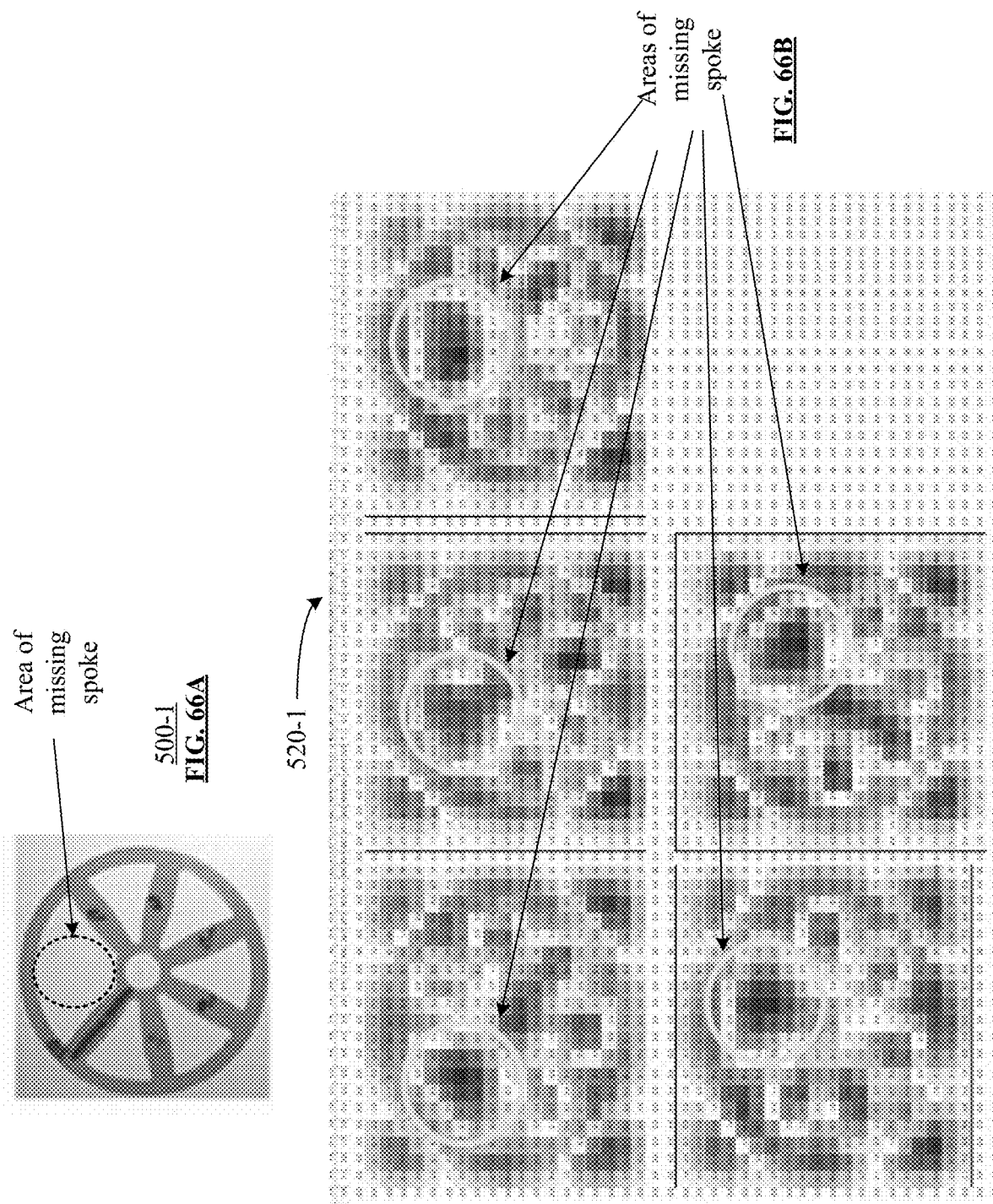

500-2

520-2

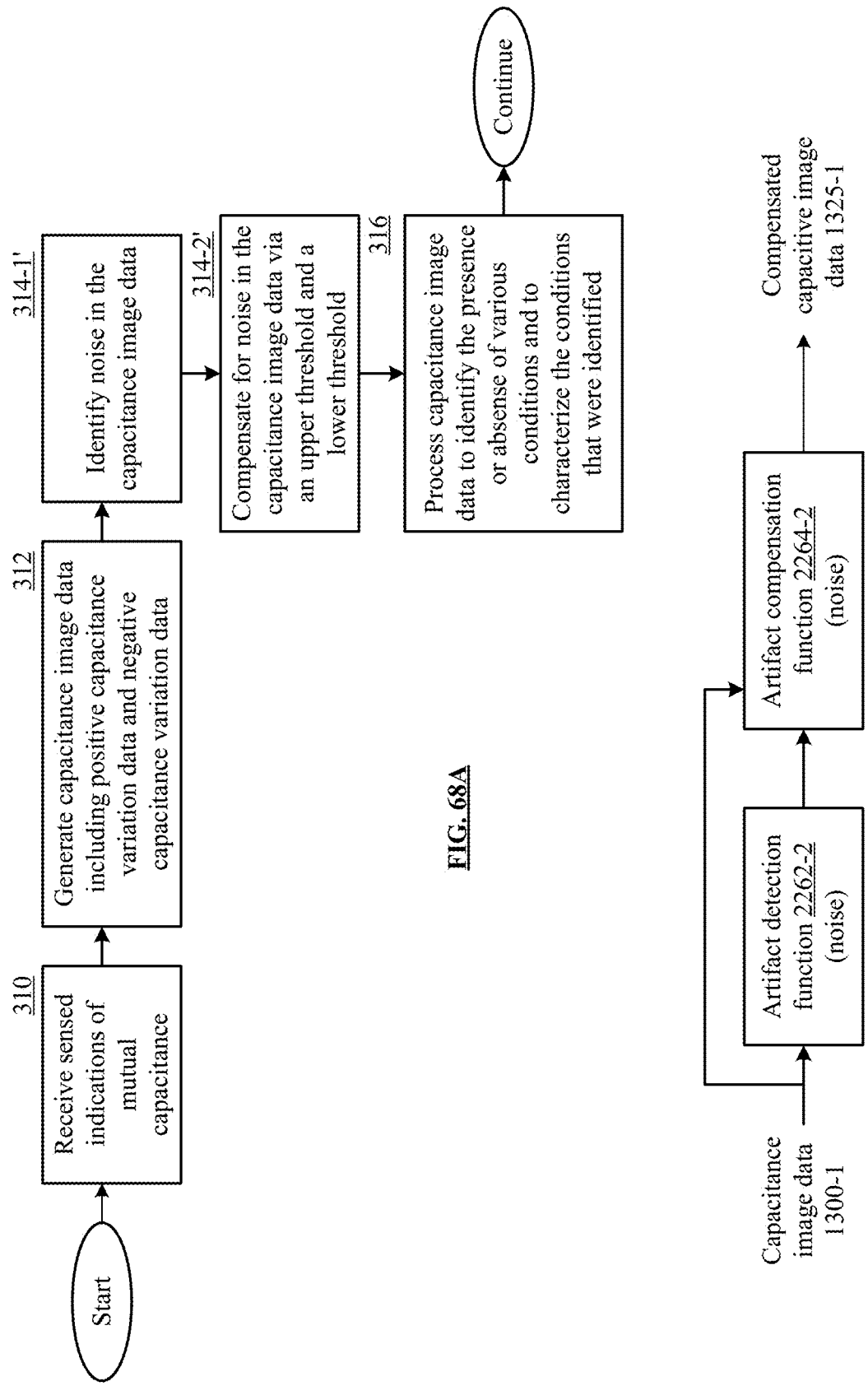

2300

2401

2402

2500

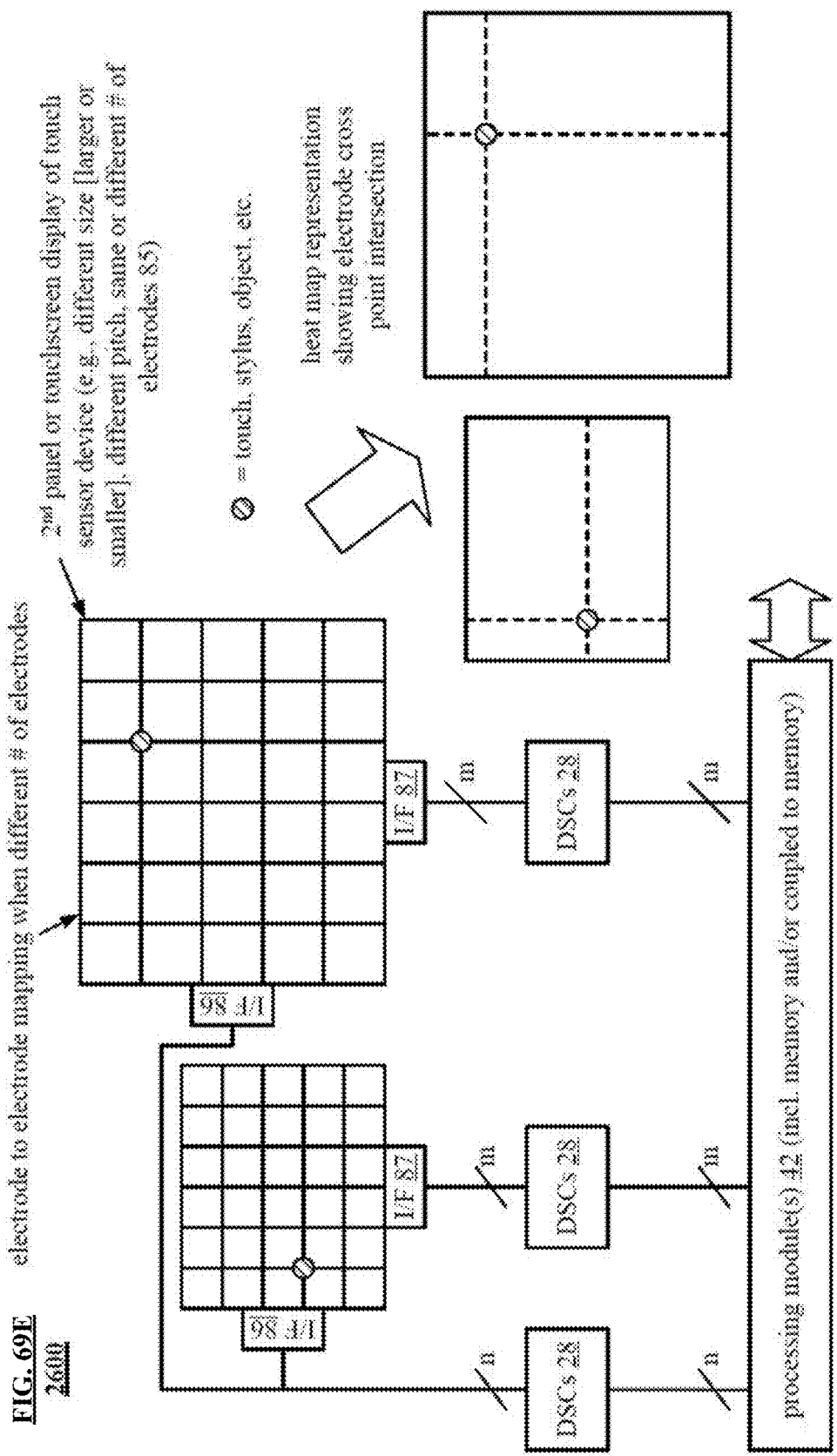

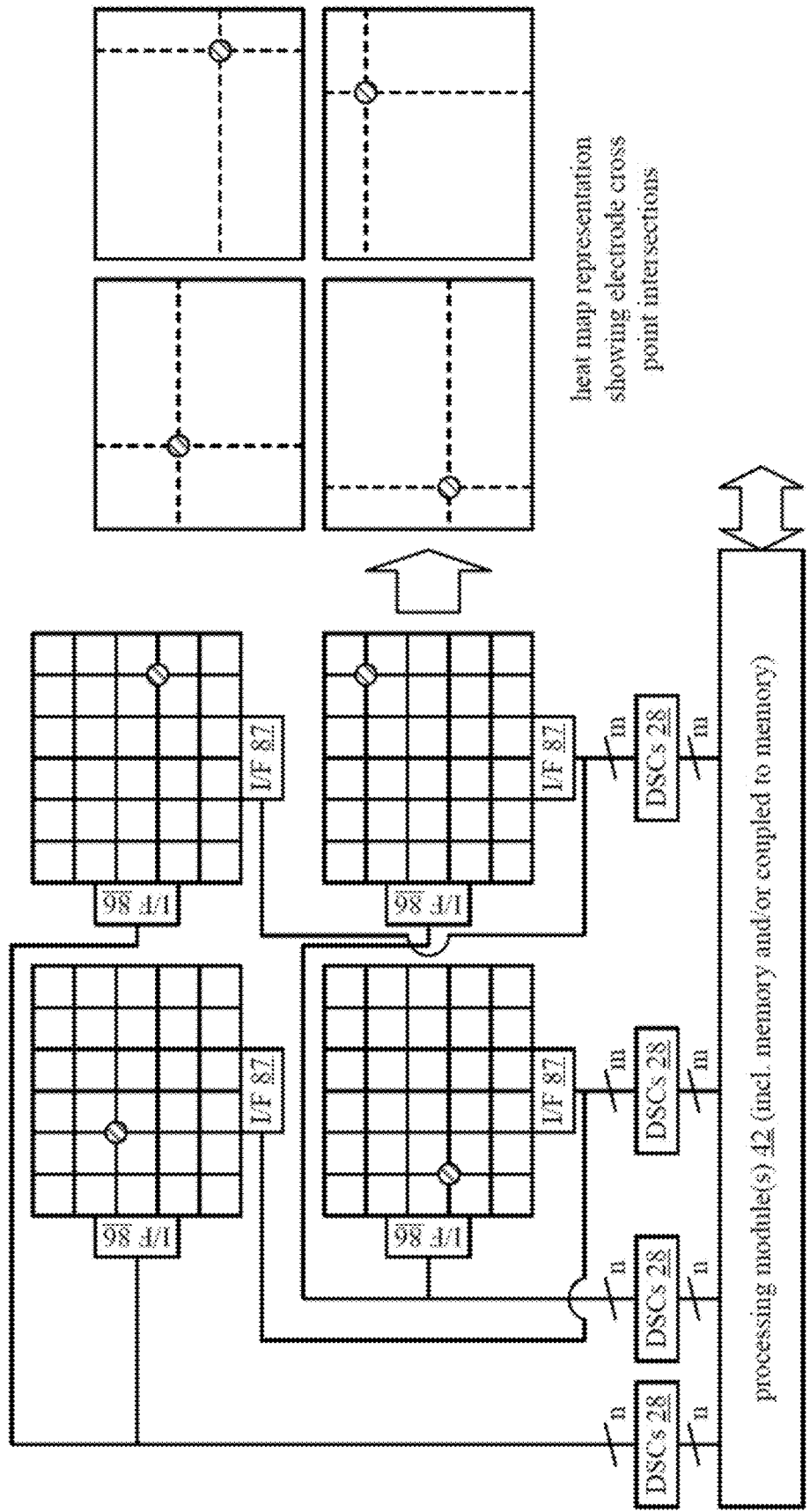

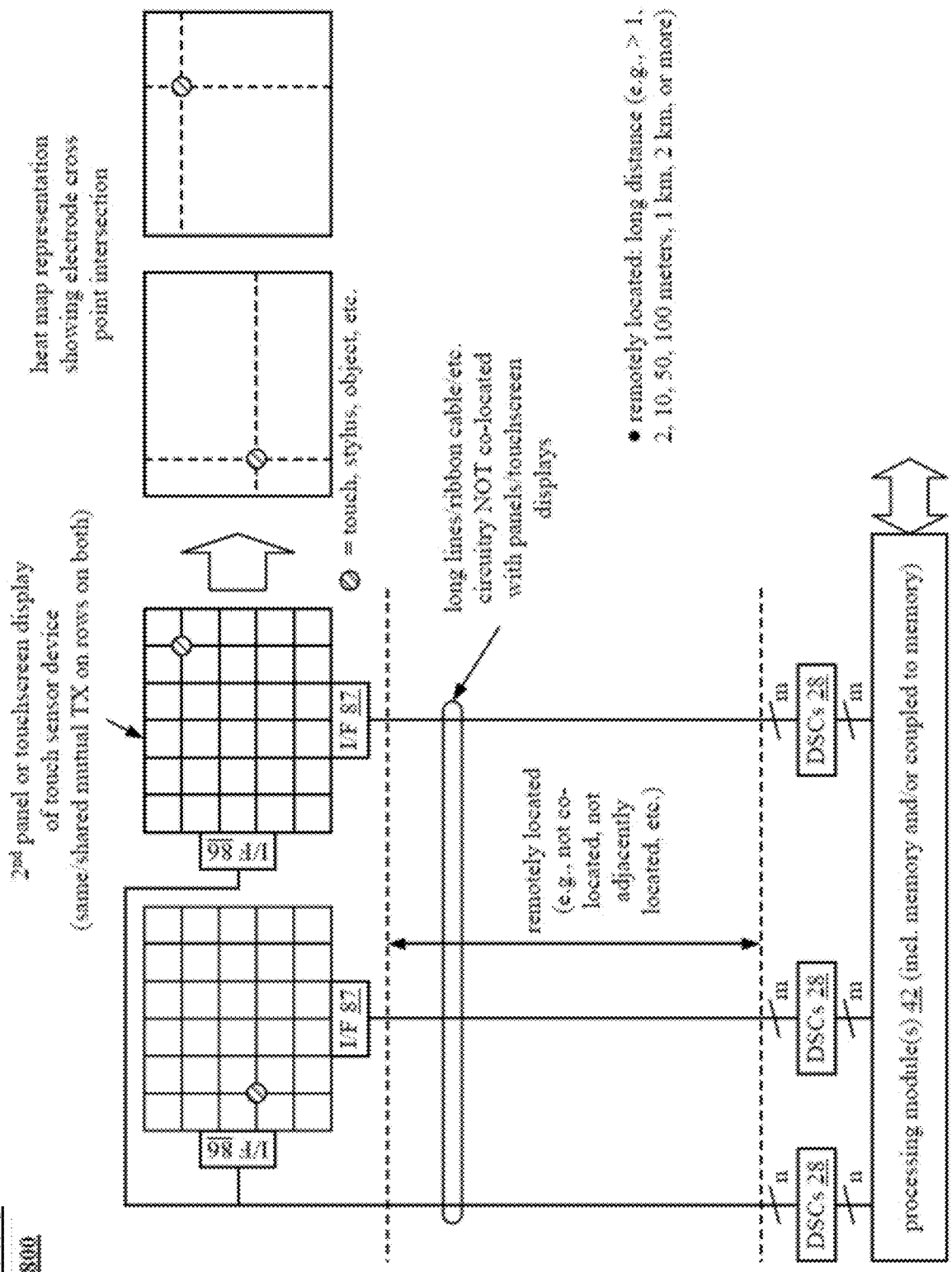

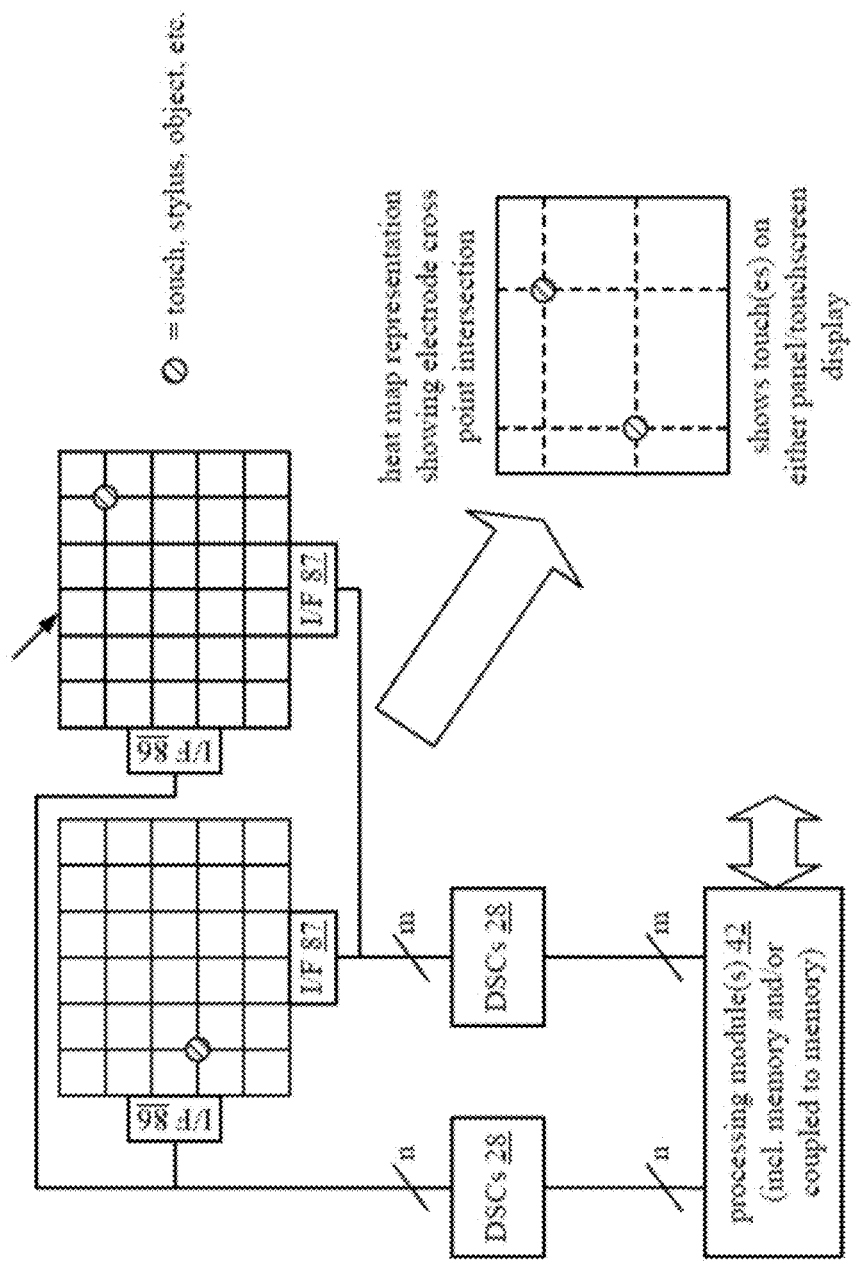

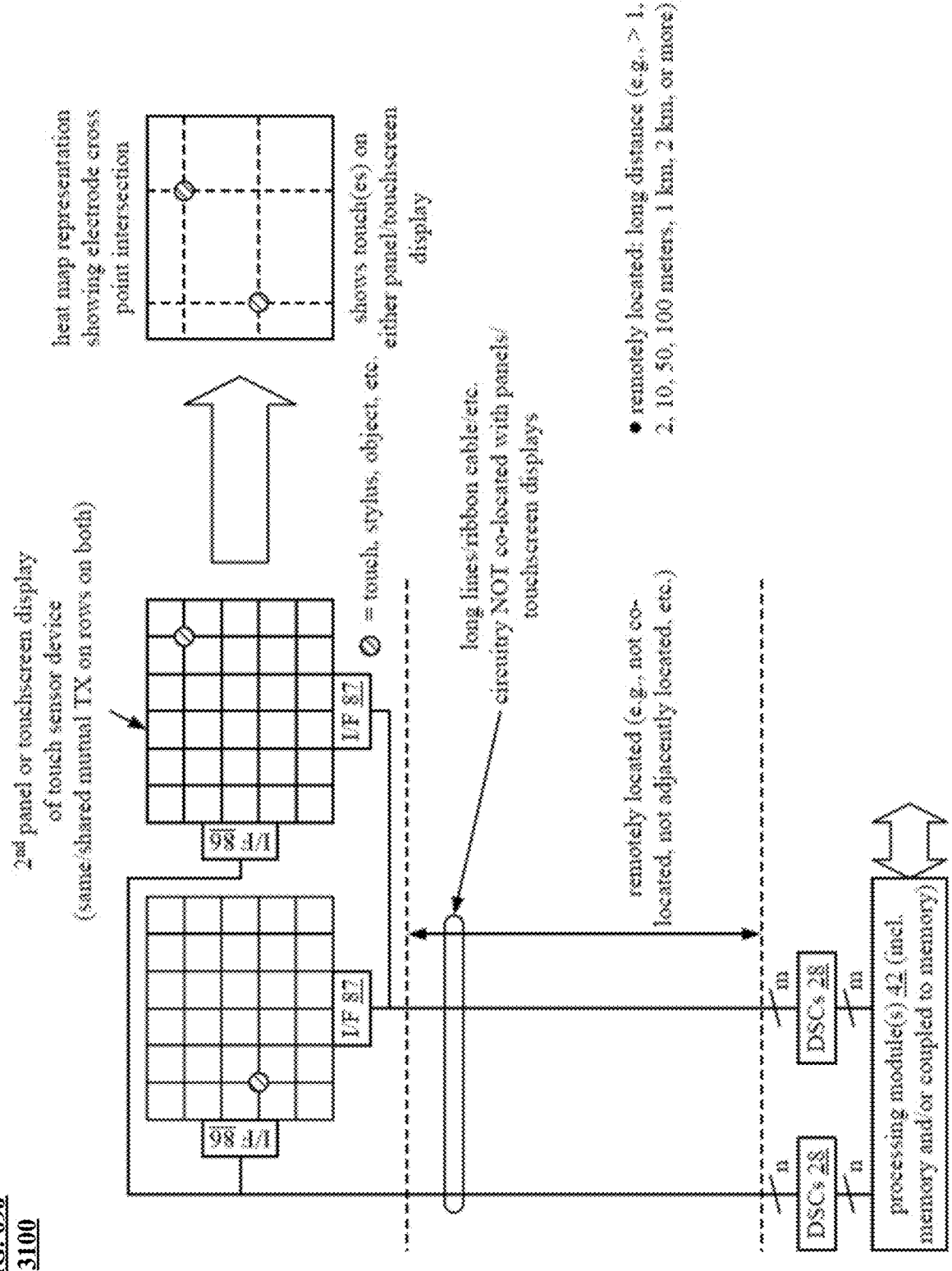

3400

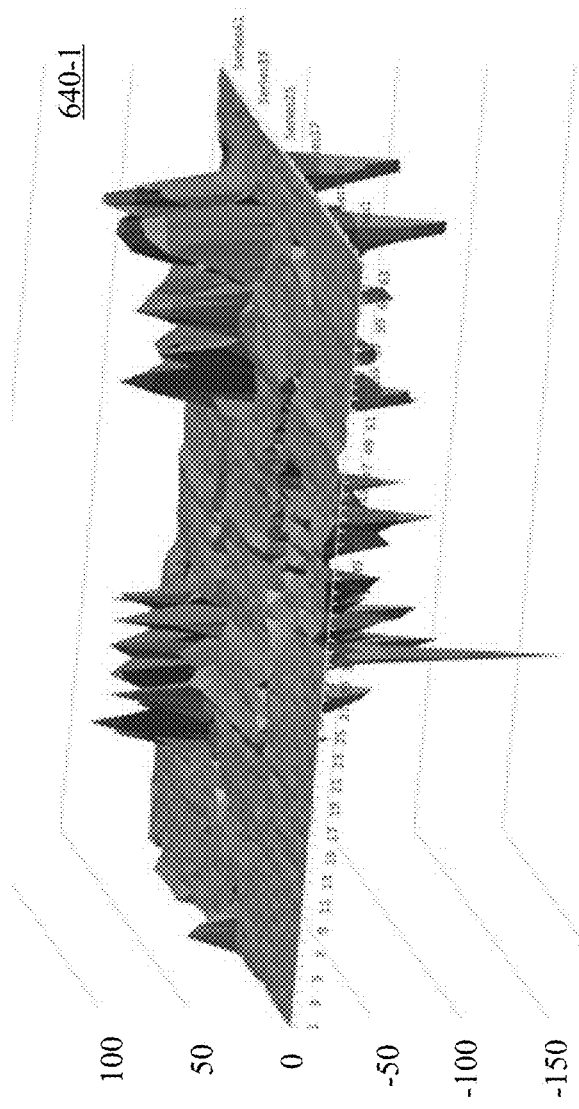

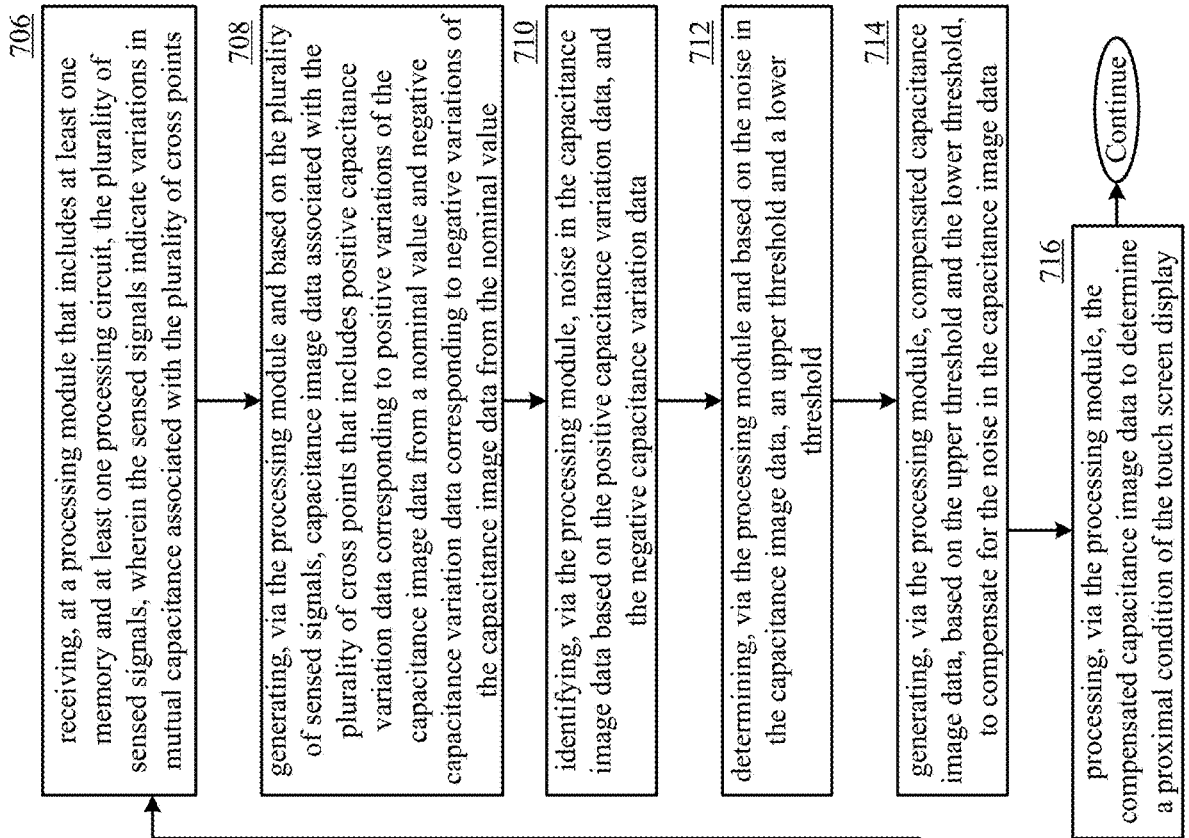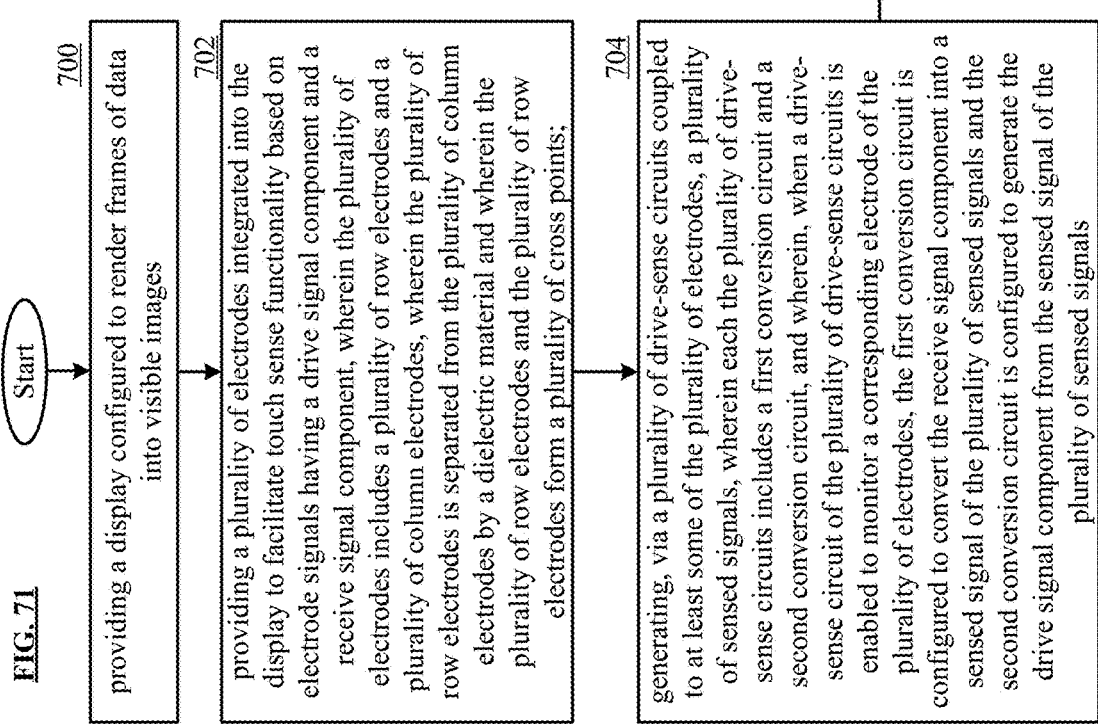
FIG. 71

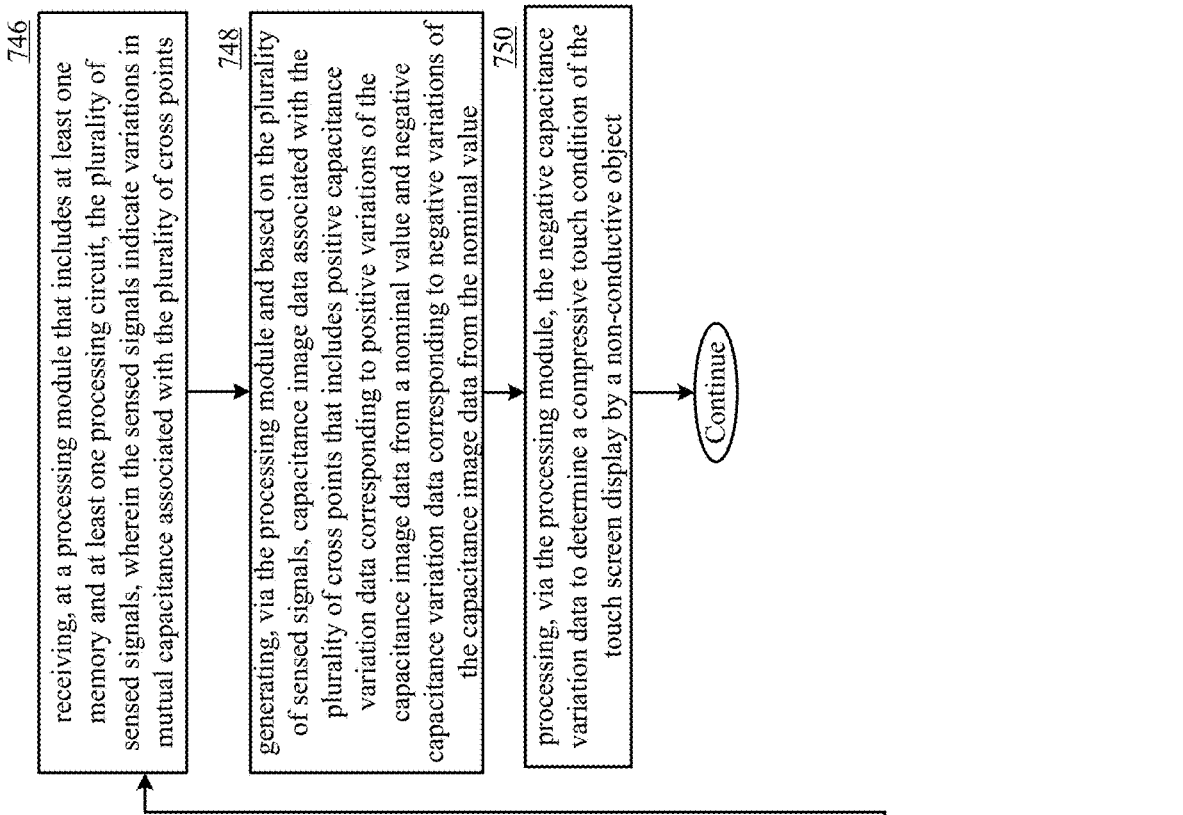
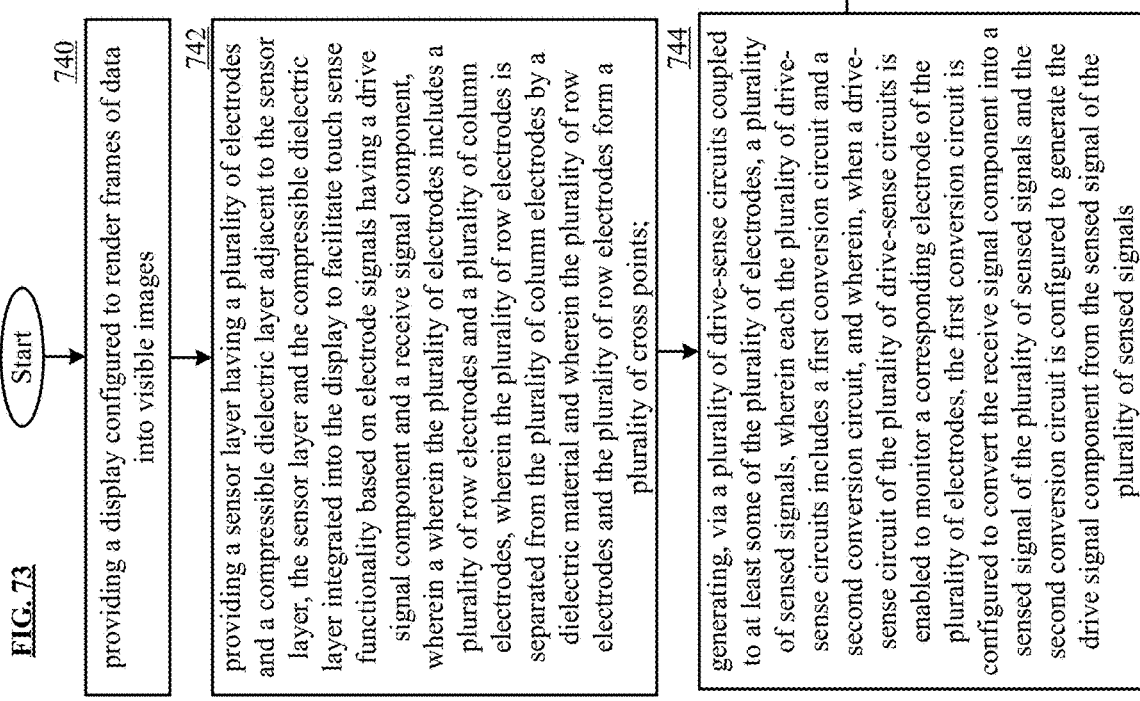
FIG. 73

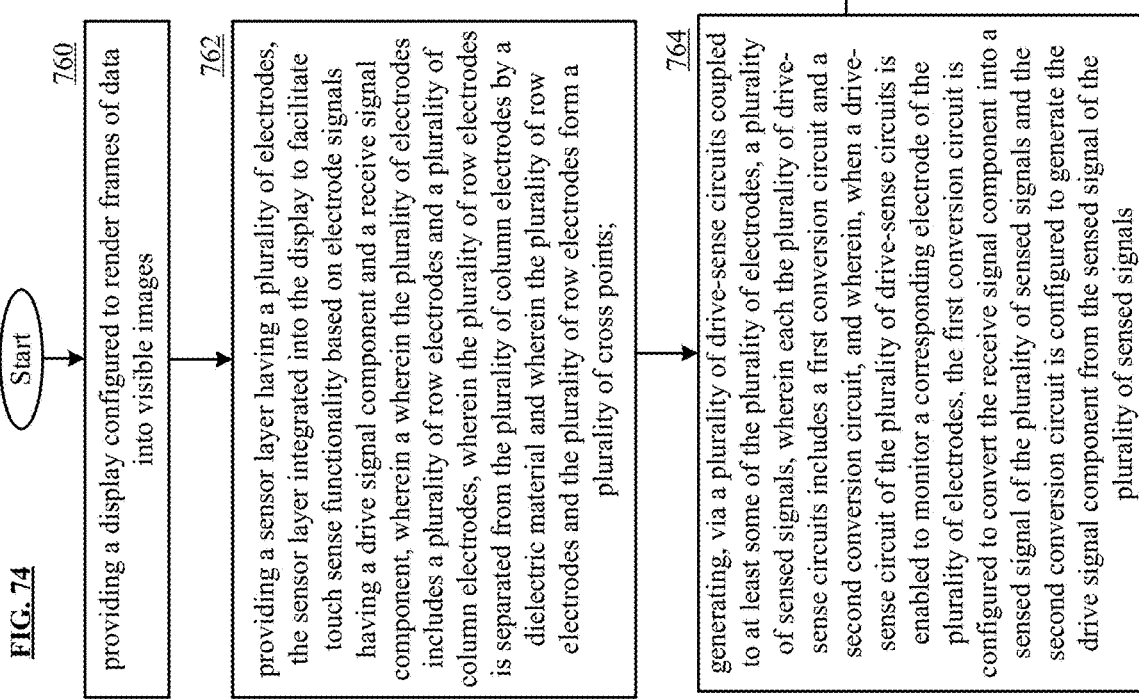

ENHANCED MUTUAL CAPACITANCE TOUCH SCREEN DISPLAY WITH WATER COMPENSATION AND METHODS FOR USE THEREWITH

CROSS-REFERENCE TO RELATED APPLICATIONS

The present U.S. Utility Patent application claims priority pursuant to 35 U.S.C. § 120 as a continuation of U.S. Utility application Ser. No. 17/161,109, entitled "ENHANCED MUTUAL CAPACITANCE TOUCH SCREEN DISPLAY WITH NOISE COMPENSATION AND METHODS FOR USE THEREWITH", filed Jan. 28, 2021, which claims priority pursuant to 35 U.S.C. § 119(e) to U.S. Provisional Application No. 63/104,973, entitled "ENHANCED MUTUAL CAPACITANCE TOUCH SCREEN DISPLAY WITH NOISE COMPENSATION AND METHODS FOR USE THEREWITH", filed Oct. 23, 2020, both of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to data communication systems and more particularly to sensed data collection and/or communication.

Description of Related Art

Sensors are used in a wide variety of applications ranging from in-home automation, to industrial systems, to health care, to transportation, and so on. For example, sensors are placed in bodies, automobiles, airplanes, boats, ships, trucks, motorcycles, cell phones, televisions, touch-screens, industrial plants, appliances, motors, checkout counters, etc. for the variety of applications.

In general, a sensor converts a physical quantity into an electrical or optical signal. For example, a sensor converts a physical phenomenon, such as a biological condition, a chemical condition, an electric condition, an electromagnetic condition, a temperature, a magnetic condition, mechanical motion (position, velocity, acceleration, force, pressure), an optical condition, and/or a radioactivity condition, into an electrical signal.

A sensor includes a transducer, which functions to convert one form of energy (e.g., force) into another form of energy (e.g., electrical signal). There are a variety of transducers to support the various applications of sensors. For example, a transducer is capacitor, a piezoelectric transducer, a piezoresistive transducer, a thermal transducer, a thermal-couple, a photoconductive transducer such as a photoresistor, a photodiode, and/or phototransistor.

A sensor circuit is coupled to a sensor to provide the sensor with power and to receive the signal representing the physical phenomenon from the sensor. The sensor circuit includes at least three electrical connections to the sensor: one for a power supply; another for a common voltage reference (e.g., ground); and a third for receiving the signal representing the physical phenomenon. The signal representing the physical phenomenon will vary from the power supply voltage to ground as the physical phenomenon changes from one extreme to another (for the range of sensing the physical phenomenon).

The sensor circuits provide the received sensor signals to one or more computing devices for processing. A computing device is known to communicate data, process data, and/or store data. The computing device may be a cellular phone, a laptop, a tablet, a personal computer (PC), a work station, a video game device, a server, and/or a data center that support millions of web searches, stock trades, or on-line purchases every hour.

The computing device processes the sensor signals for a variety of applications. For example, the computing device processes sensor signals to determine temperatures of a variety of items in a refrigerated truck during transit. As another example, the computing device processes the sensor signals to determine a touch on a touch screen. As yet another example, the computing device processes the sensor signals to determine various data points in a production line of a product.

BRIEF DESCRIPTION OF THE SEVERAL VIEWS OF THE DRAWING(S)

The patent or application file contains at least one drawing executed in color. Copies of this patent or patent application publication with color drawing(s) will be provided by the Office upon request and payment of the necessary fee.

FIG. 8 is a schematic block diagram of another embodiment of a drive sense circuit in accordance with the present disclosure;

FIG. 9G is a schematic block diagram of an example of sub-pixel electrodes coupled together to form row electrodes and column electrodes of a touch screen sensor in accordance with the present disclosure;

FIG. 9H is a schematic block diagram of an example of a segmented common ground plane forming row electrodes and column electrodes of a touch screen sensor in accordance with the present disclosure;

FIG. 9J is a cross section schematic block diagram of an example of a touch screen display with on-cell touch sensors in accordance with the present disclosure;

FIG. 10A is a cross section schematic block diagram of an example of self-capacitance with no-touch on a touch screen display in accordance with the present disclosure;

FIG. 10B is a cross section schematic block diagram of an example of self-capacitance with a touch on a touch screen display in accordance with the present disclosure;

FIG. 13 is an example graph that plots condition verses capacitance for an electrode of a touch screen display in accordance with the present disclosure;

FIG. 14 is an example graph that plots impedance verses frequency for an electrode of a touch screen display in accordance with the present disclosure;

FIG. 15 is a time domain example graph that plots magnitude verses time for an analog reference signal in accordance with the present disclosure;

FIG. 16 is a frequency domain example graph that plots magnitude verses frequency for an analog reference signal in accordance with the present disclosure;

FIG. 18 is a schematic block diagram of an example of a first drive sense circuit coupled to a first electrode and a second drive sense circuit coupled to a second electrode with a finger touch proximal to the electrodes in accordance with the present disclosure;

FIG. 23 is a schematic block diagram of a finger touch example of a few drive sense circuits and a portion of the touch screen processing module of a touch screen display in accordance with the present disclosure;

FIG. 24 is a schematic block diagram of a pen touch example of a few drive sense circuits and a portion of the touch screen processing module of a touch screen display in accordance with the present disclosure;

FIG. 27 is a schematic block diagram of another embodiment of a computing device having touch screen display in accordance with the present disclosure;

FIG. 28 is a schematic block diagram of another example of a first drive sense circuit coupled to a first electrode and a second drive sense circuit coupled to a second electrode without a touch proximal to the electrodes in accordance with the present disclosure;

FIG. 33 is a logic diagram of an embodiment of a method for identifying desired and undesired touches using a capacitance image in accordance with the present disclosure;

FIG. 34 is a schematic block diagram of an example of using capacitance images to identify desired and undesired touches in accordance with the present disclosure;

FIG. 35 is a schematic block diagram of another example of using capacitance images to identify desired and undesired touches in accordance with the present disclosure;

FIG. 40 is a schematic block diagram of another embodiment of a near bezel-less touch screen display in accordance with the present disclosure;

FIG. 41 is a schematic block diagram of another embodiment of multiple near bezel-less touch screen displays in accordance with the present disclosure;

FIG. 50A is a cross section schematic block diagram of another example of a touch screen display in accordance with the present disclosure;

FIG. 51D is a schematic block diagram of another embodiment of a touch sensor device in accordance with the present disclosure;

FIG. 51E is a schematic block diagram of an embodiment of mutual signaling within a touch sensor device in accordance with the present disclosure;

FIG. 55A is a flow diagram of an embodiment of a method in accordance with the present disclosure;

FIG. 55B is a schematic block diagram of an embodiment of an artifact detection function and artifact compensation function in accordance with the present disclosure;

FIG. 55C is a schematic block diagram of an embodiment of a condition detection function in accordance with the present disclosure;

FIG. 62A is a flow diagram of an embodiment of a method in accordance with the present disclosure;

FIG. 62B is a schematic block diagram of an embodiment of a condition detection function in accordance with the present disclosure;

FIG. 66A is a pictorial diagram of an embodiment of a object in accordance with the present disclosure;

FIG. 66B is a graphical diagram of an embodiment of capacitance image data in accordance with the present disclosure;

FIG. 68A is a flow diagram of an embodiment of a method in accordance with the present disclosure;

FIG. 68B is a schematic block diagram of an embodiment of an artifact detection function and artifact compensation function in accordance with the present disclosure;

Figure 69A:
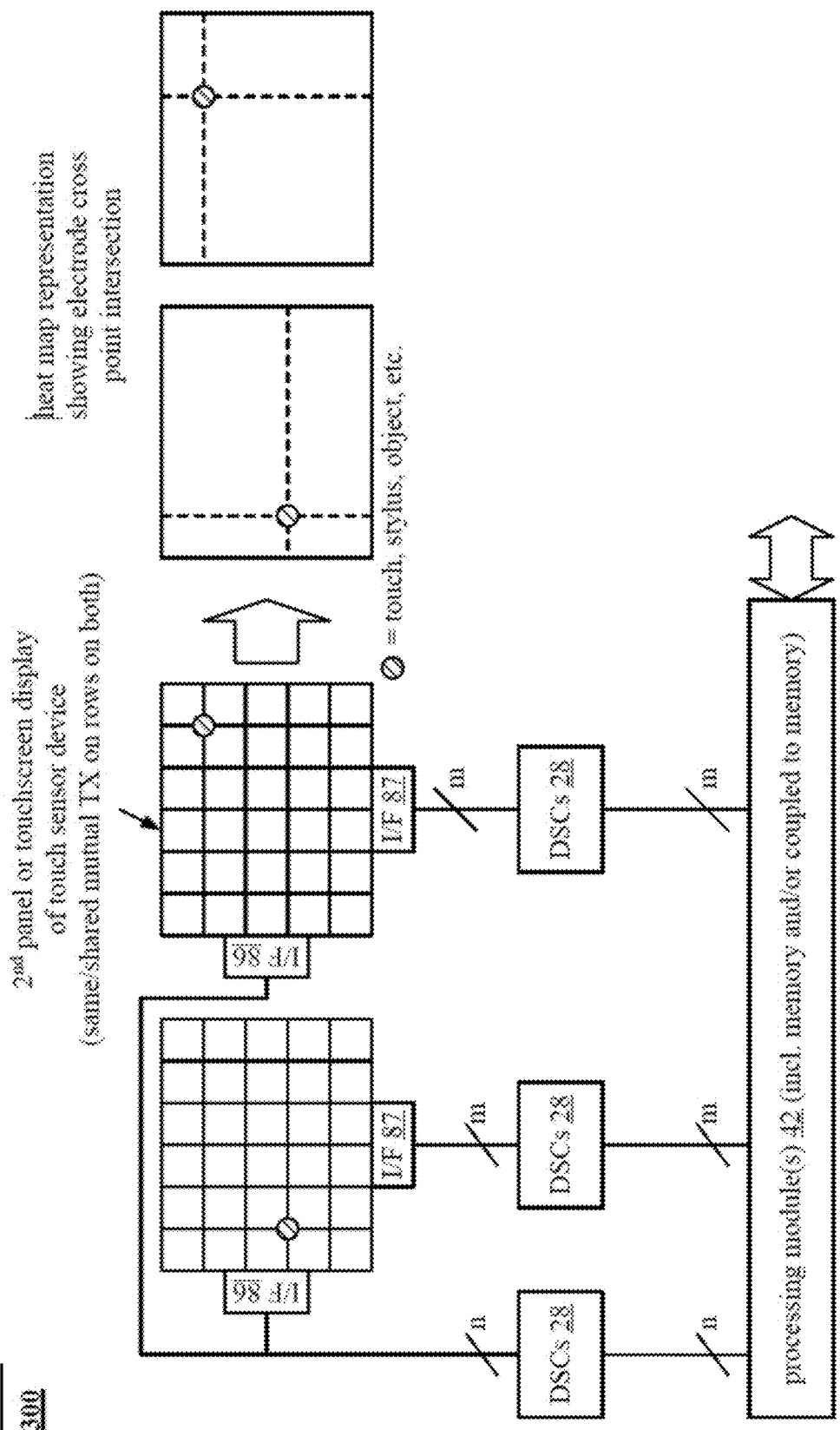
FIG. 69A is a schematic block diagram of an embodiment of an extended touch sensor device in accordance with the present invention.
Figure 69B:
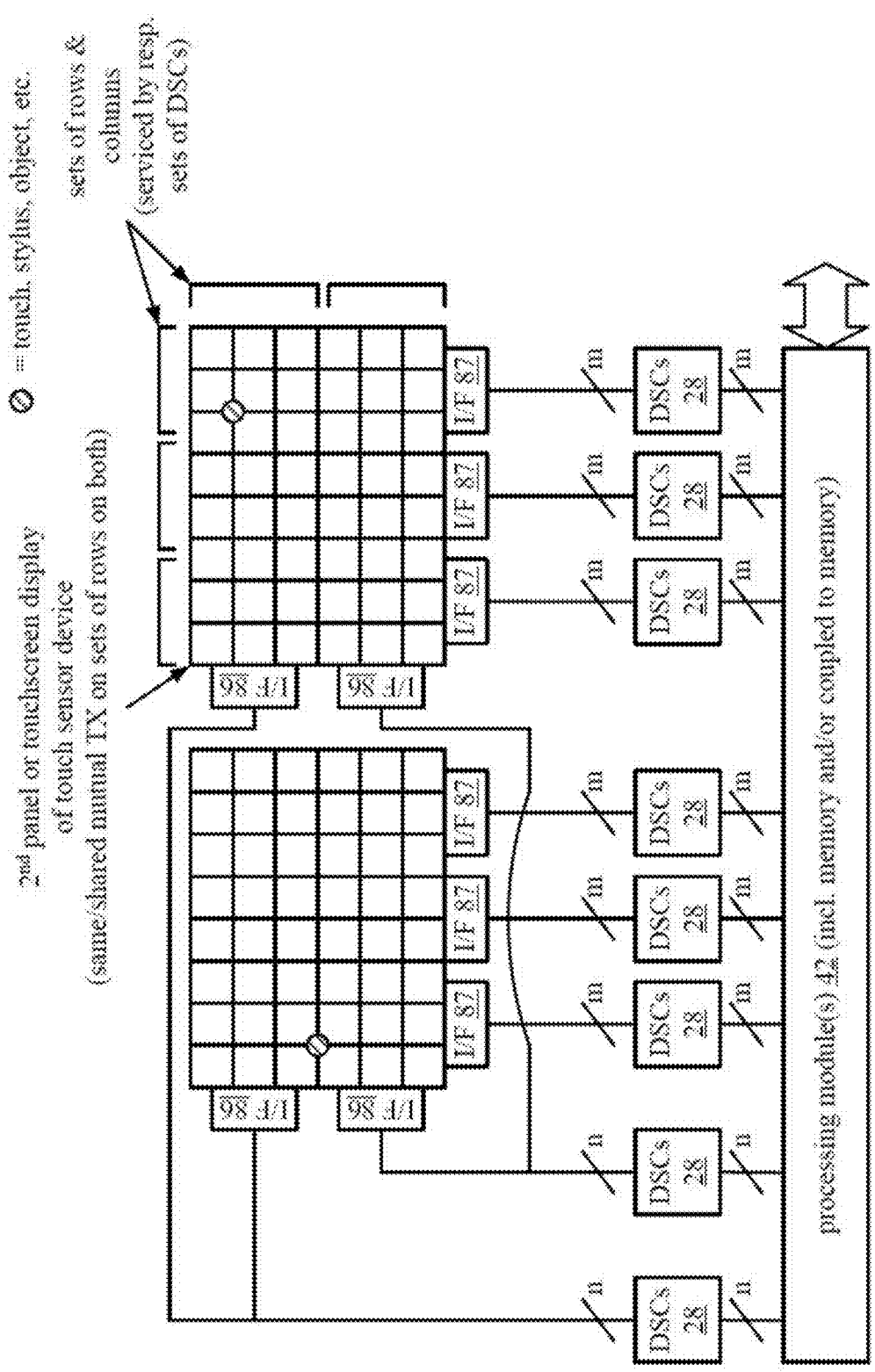
FIG. 69B is a schematic block diagram of an embodiment of an extended touch sensor device including signaling via respective sets of rows and columns in accordance with the present invention.
Figure 69C:
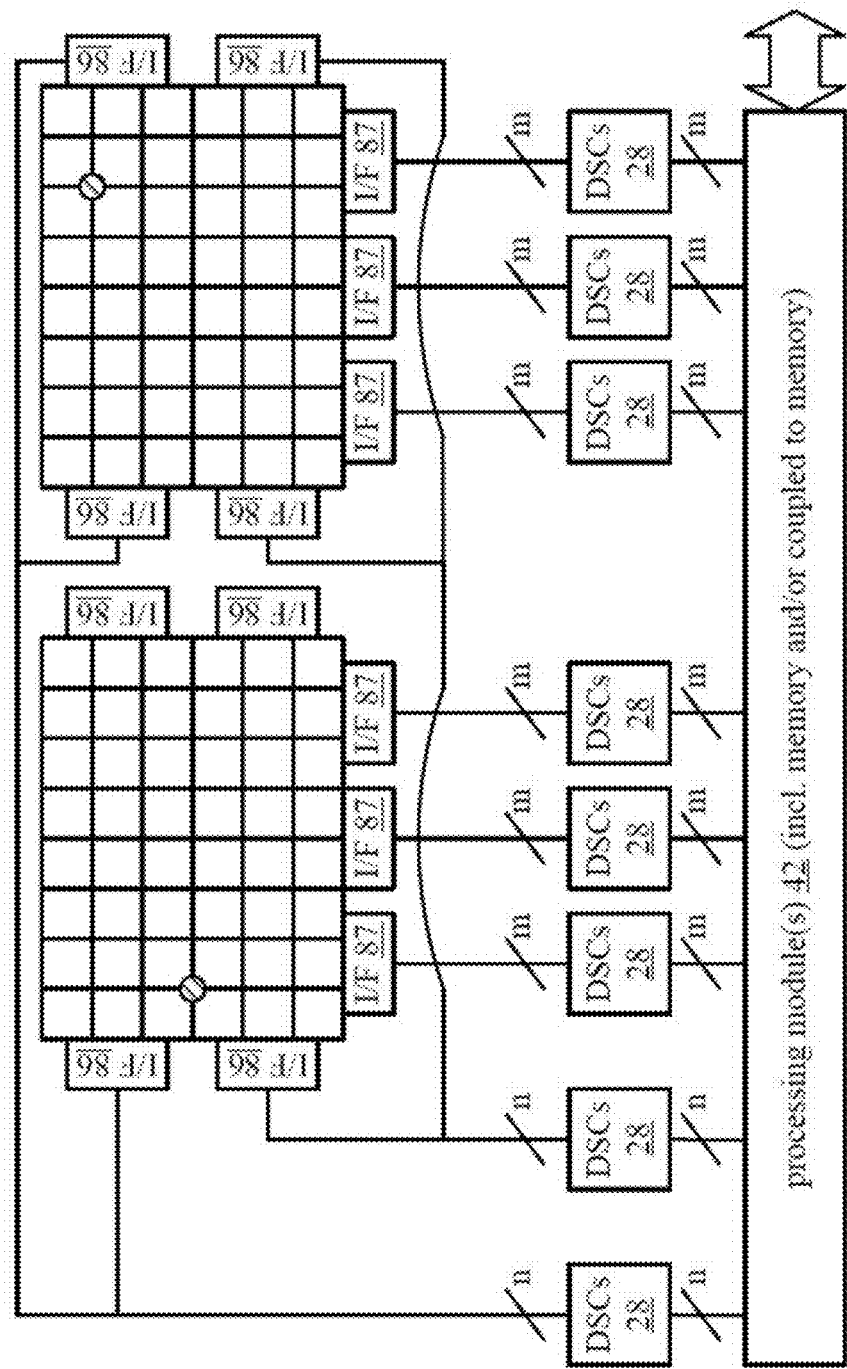
FIG. 69C is a schematic block diagram of another embodiment of an extended touch sensor device including signaling via respective sets of rows and columns in accordance with the present invention.
Figure 69D:
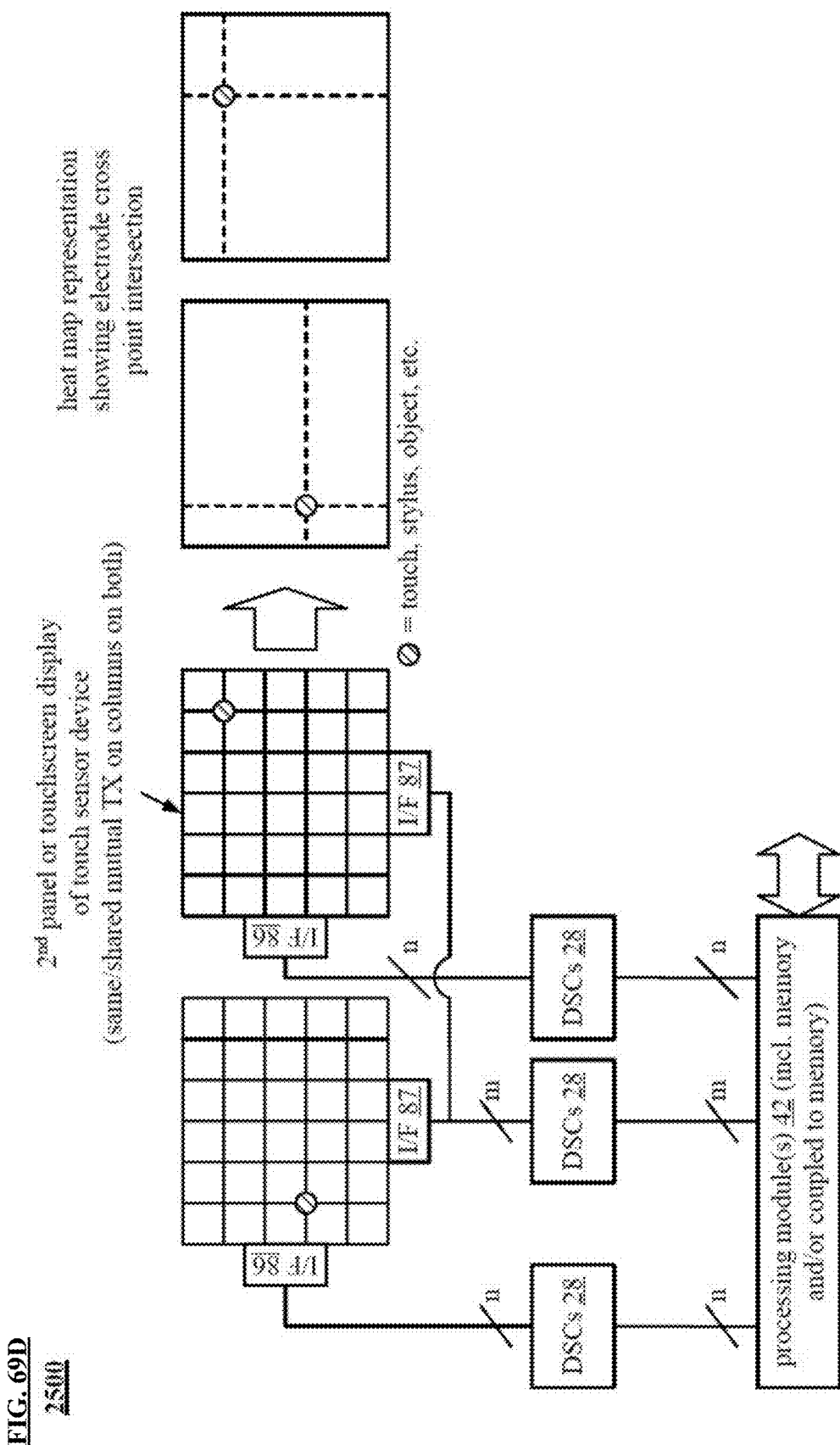
FIG. 69D is a schematic block diagram of another embodiment of an extended touch sensor device in accordance with the present invention.
Figure 69H:
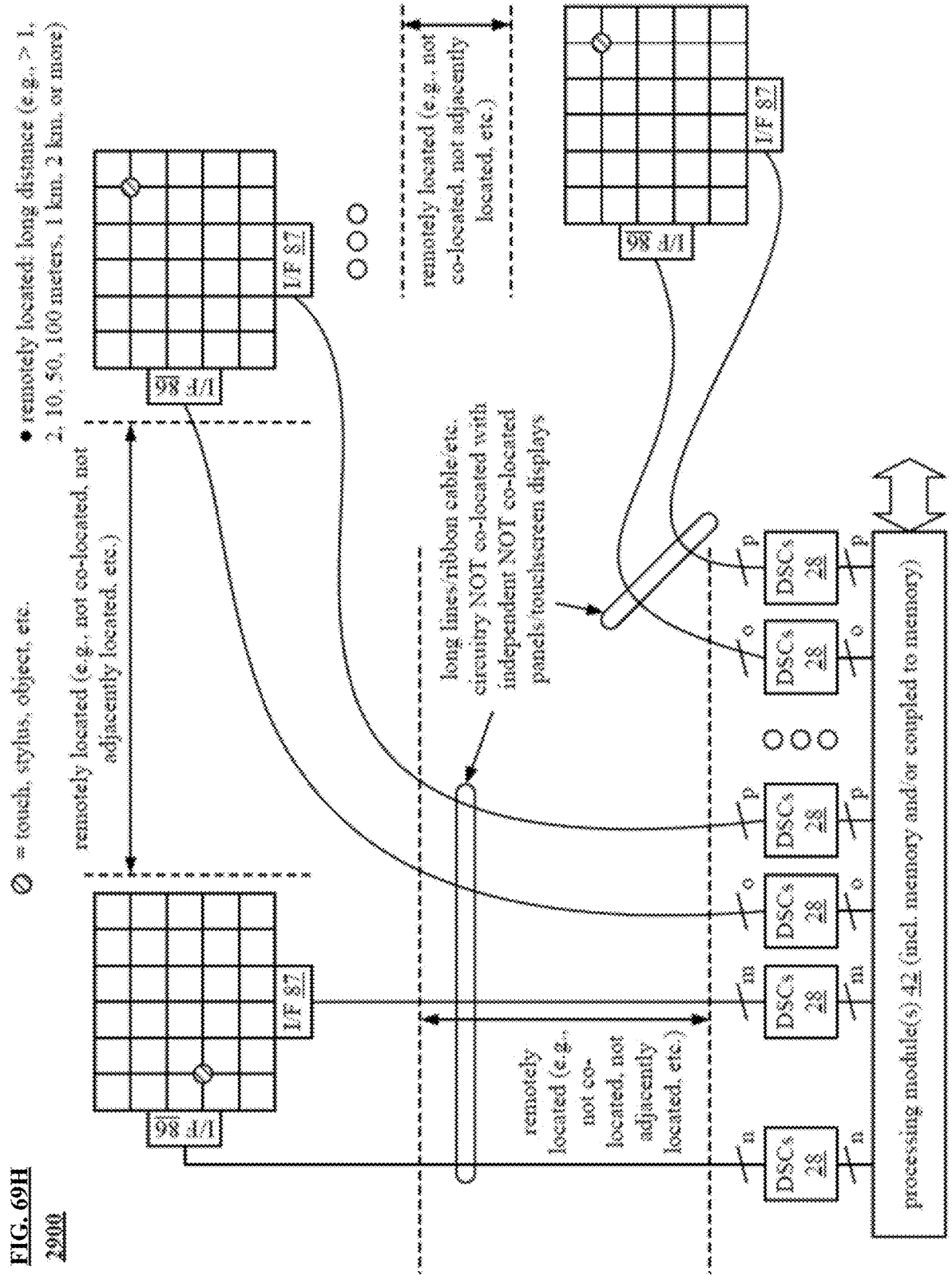
FIG. 69H is a schematic block diagram of another embodiment of a touch sensor device based on a distributed architecture for remotely located and independently operable sensor panels in accordance with the present invention.
Figure 69K:
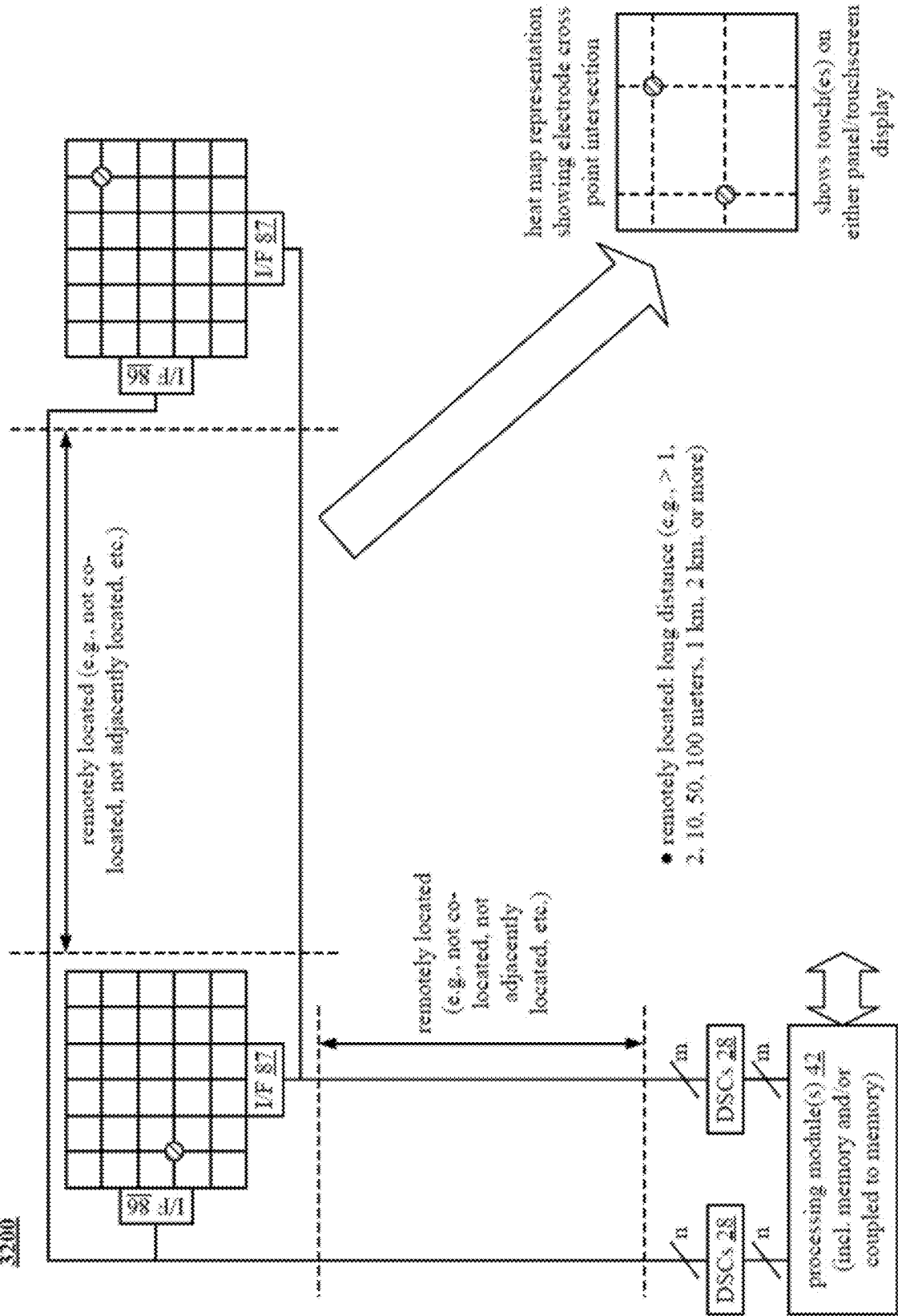
FIG. 69K is a schematic block diagram of another embodiment of a duplicated/mirrored touch sensor device based on a distributed architecture for remotely located sensor panels in accordance with the present invention.
Figure 69L:
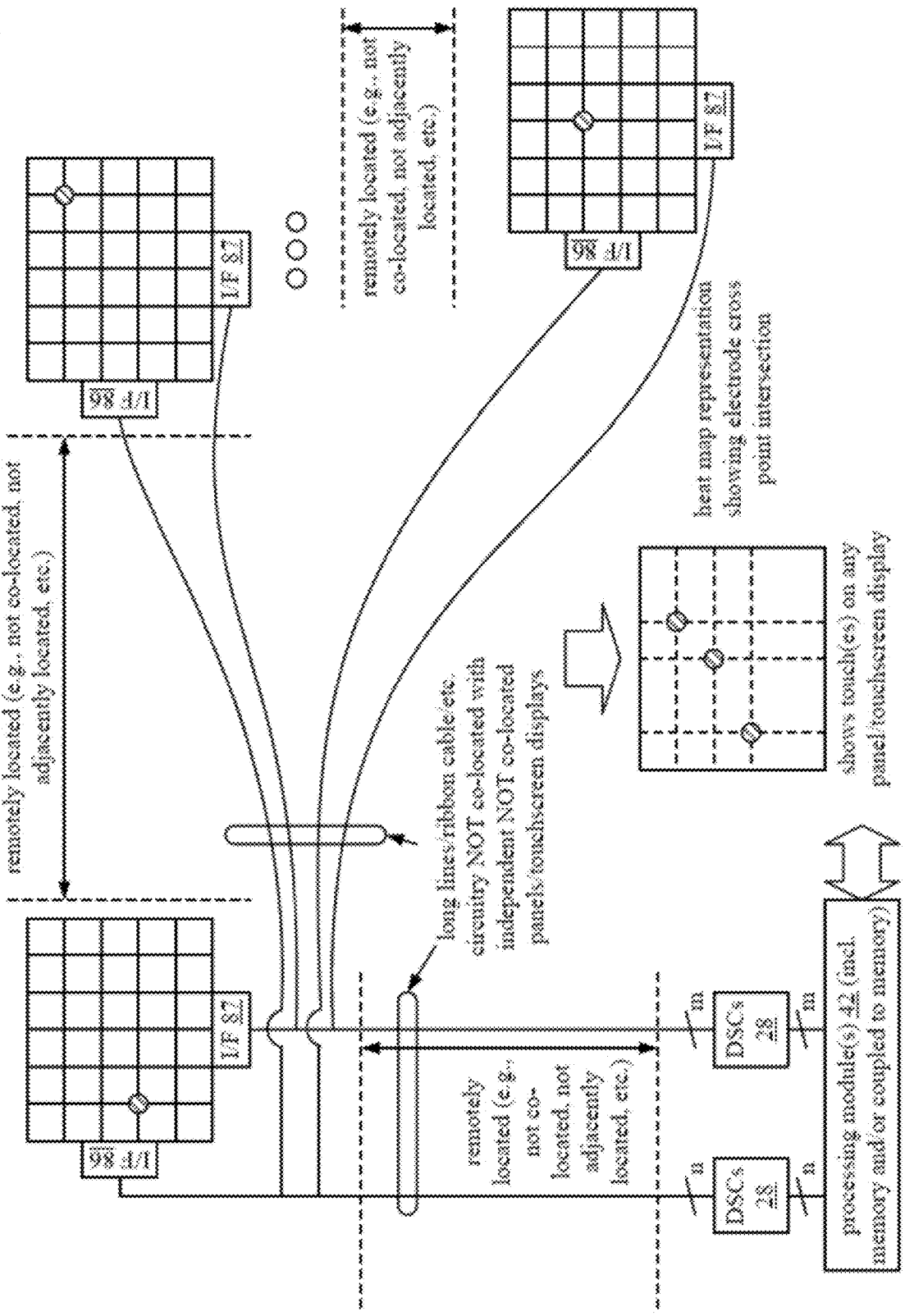
FIG. 69E is a schematic block diagram of an embodiment of an extended touch sensor device including variable resolution and interoperable sensor panels in accordance with the present invention.
FIG. 69F is a schematic block diagram of another embodiment of an extended touch sensor device in accordance with the present invention.
FIG. 69G is a schematic block diagram of another embodiment of an extended touch sensor device based on a distributed architecture for remotely located sensor panels in accordance with the present invention.
FIG. 69I is a schematic block diagram of an embodiment of a duplicated/mirrored touch sensor device in accordance with the present invention.
FIG. 69J is a schematic block diagram of another embodiment of a duplicated/mirrored touch sensor device based on a distributed architecture for remotely located sensor panels in accordance with the present invention.
Figure 69M:
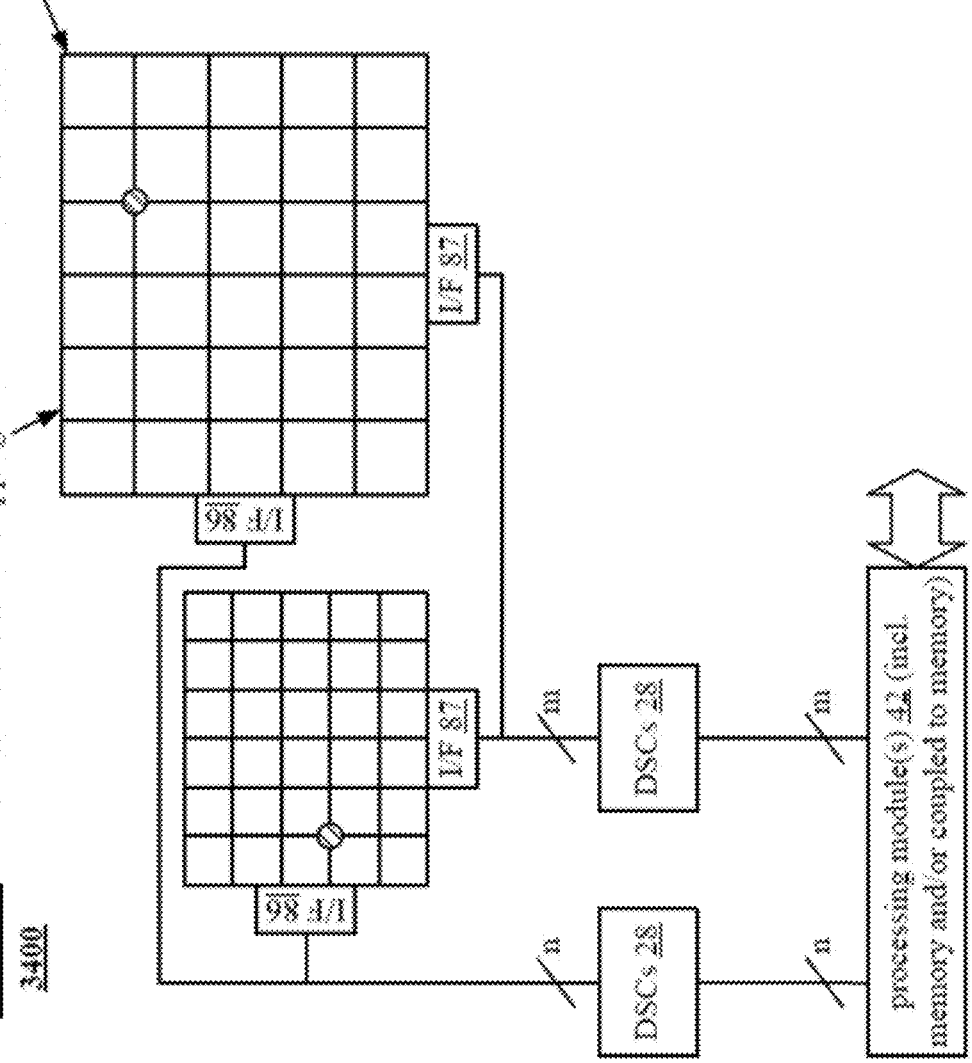

FIG. 69L is a schematic block diagram of another embodiment of a duplicated/mirrored touch sensor device based on a distributed architecture for remotely located sensor panels in accordance with the present invention; and FIG. 69M is a schematic block diagram of an embodiment of a duplicated/mirrored touch sensor device including variable resolution and interoperable sensor panels in accordance with the present invention.

Figure 70A:
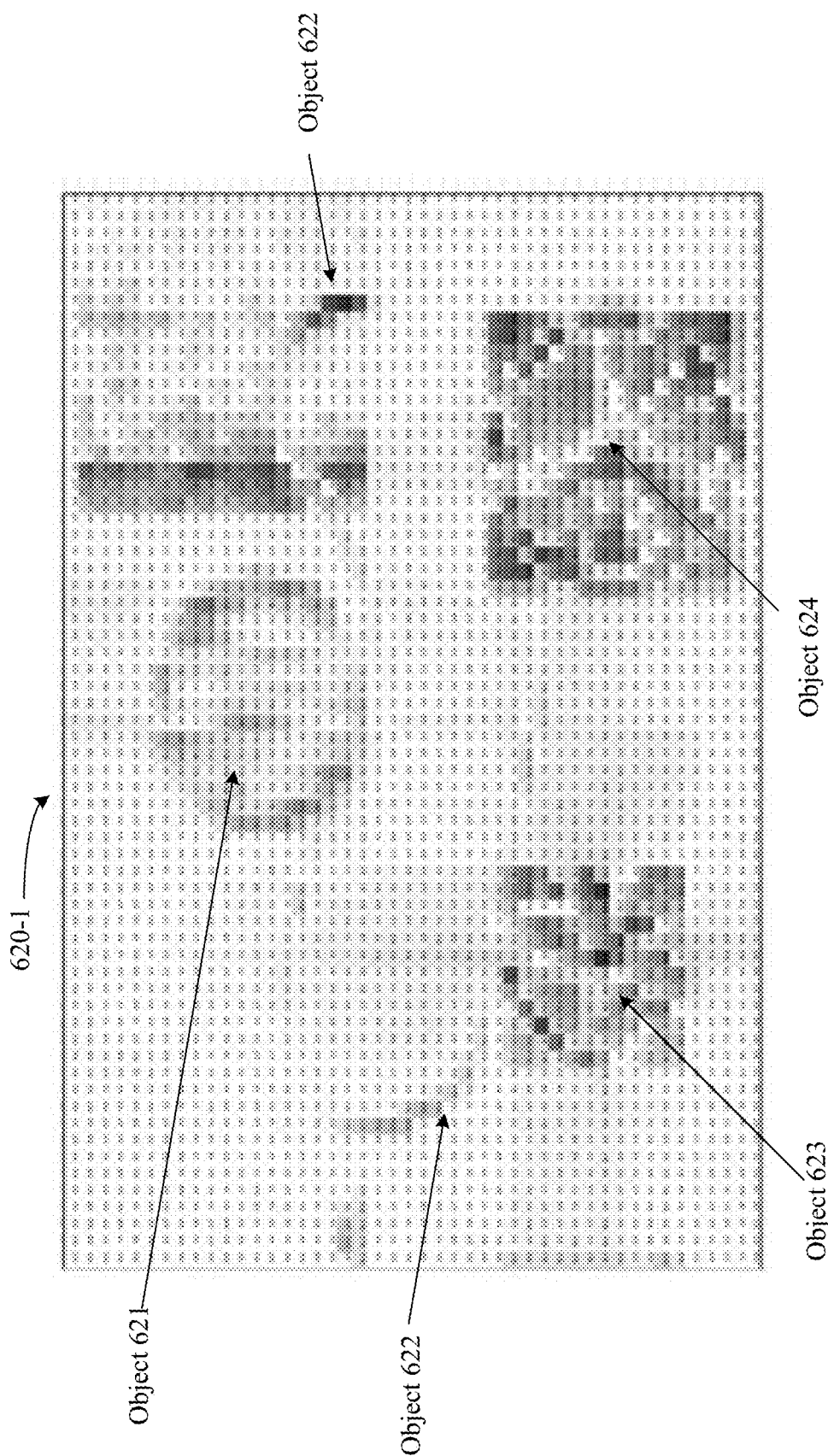
Figure 70C:
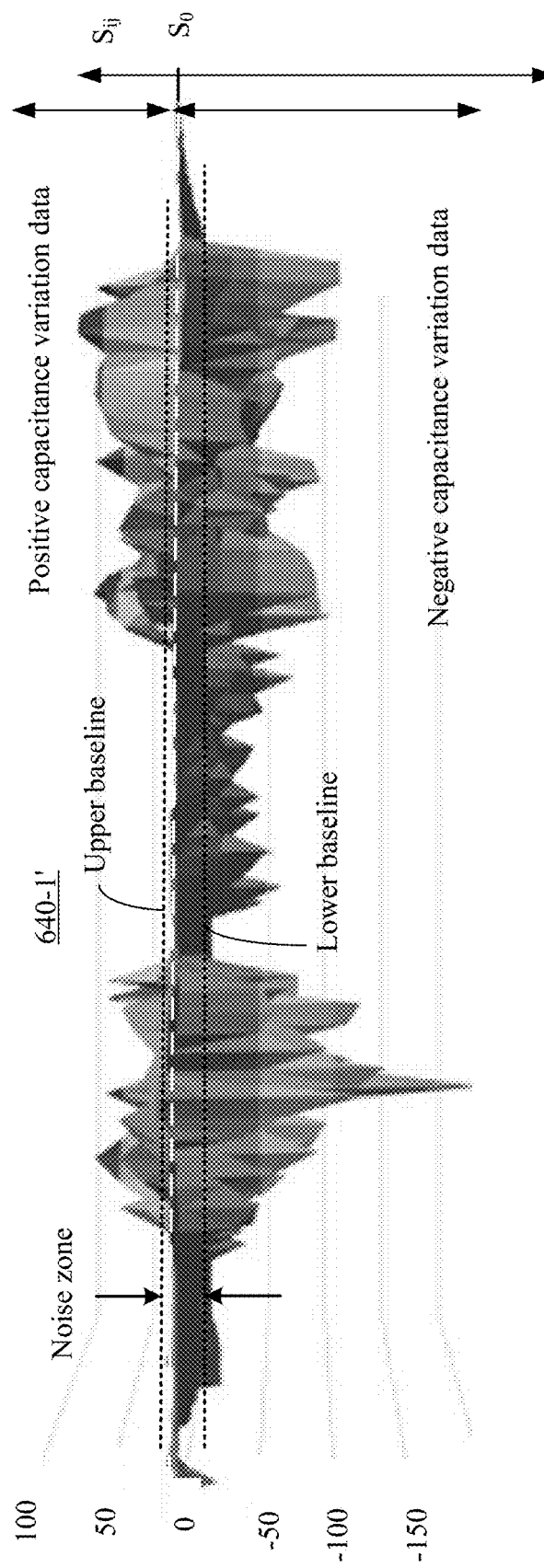
Figure 72:
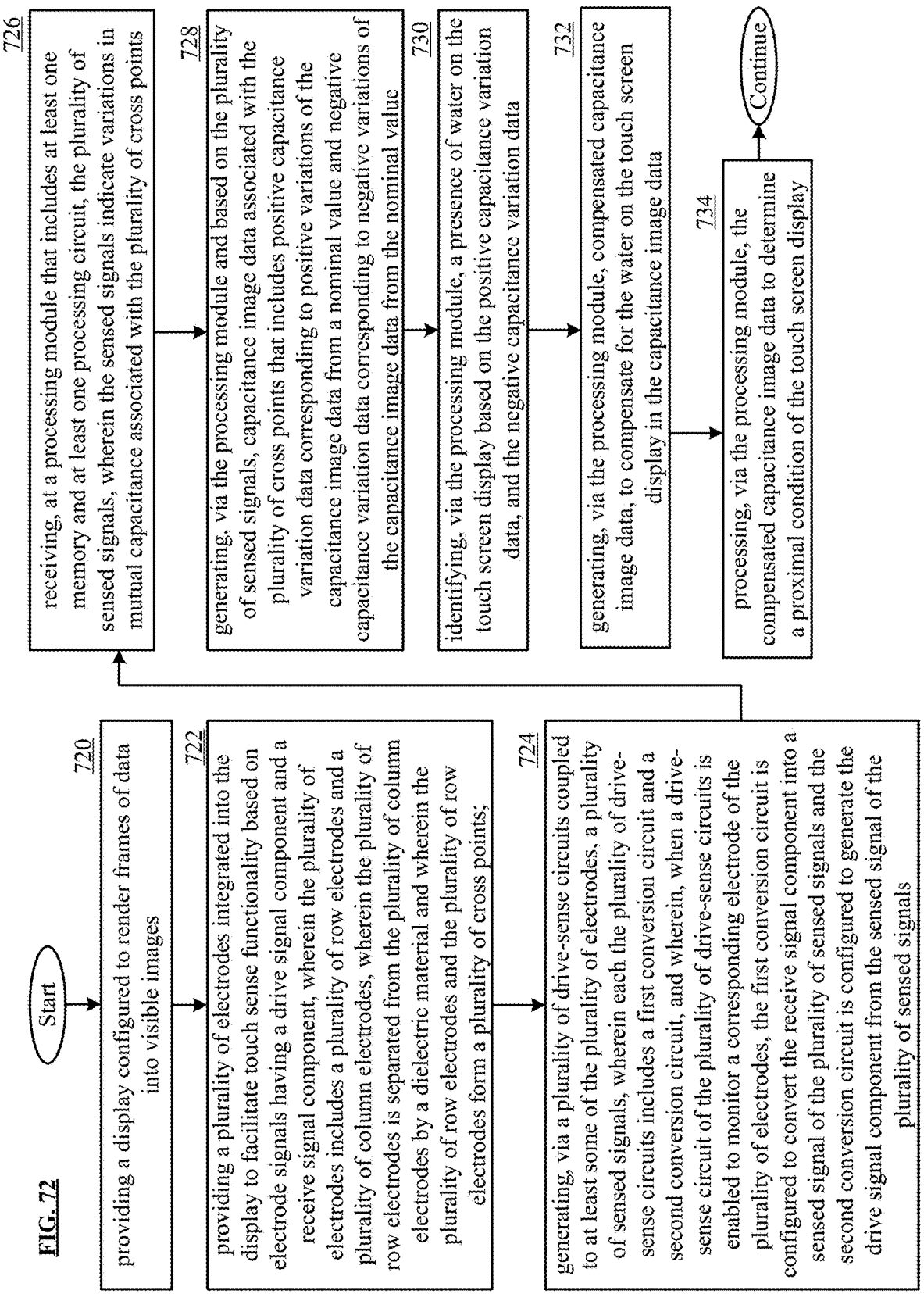

FIGS. 70A, 70B and 70C are graphical diagrams of an embodiment of capacitance image data in accordance with the present disclosure;

FIGS. 70D, 70E, 70F and 70G are graphical diagrams of an embodiment of compensated capacitance image data in accordance with the present disclosure;

FIG. 71 is a flow diagram of an embodiment of a method in accordance with the present disclosure;

FIG. 72 is a flow diagram of an embodiment of a method in accordance with the present disclosure;

FIG. 73 is a flow diagram of an embodiment of a method in accordance with the present disclosure; and FIG. 74 is a flow diagram of an embodiment of a method in accordance with the present disclosure.

DETAILED DESCRIPTION OF THE INVENTION

Figure 1:
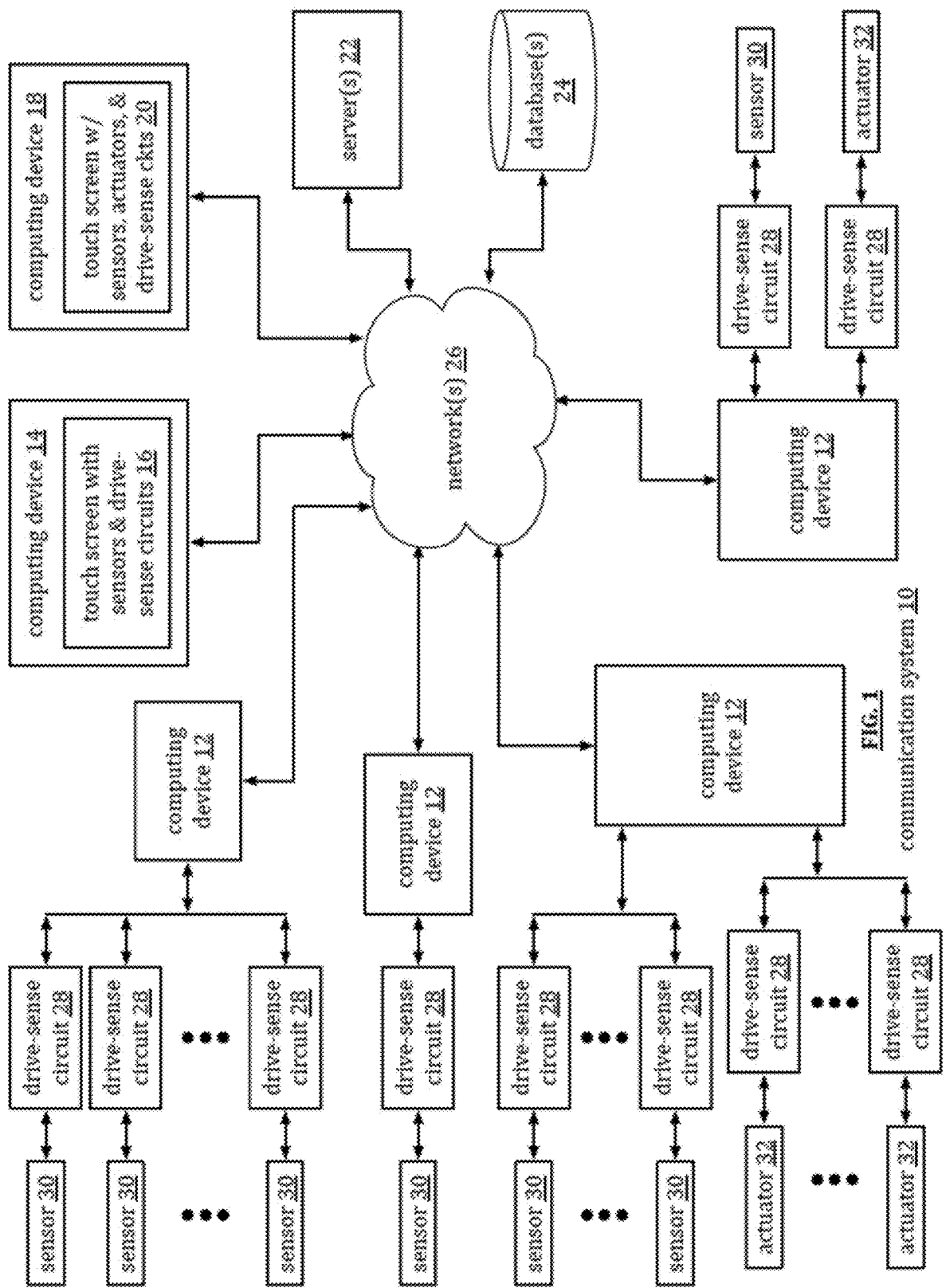
FIG. 1 is a schematic block diagram of an embodiment of a communication system in accordance with the present disclosure.

FIG. 1 is a schematic block diagram of an embodiment of a communication system 10 that includes a plurality of computing, devices 12-10, one or more servers 22, one or more databases 24, one or more networks 26, a plurality of drive-sense circuits 28, a plurality of sensors 30, and a plurality of actuators 32. Computing devices 14 include a touch screen 16 with sensors and drive-sensor circuits and computing devices 18 include a touch & tactic screen 20 that includes sensors, actuators, and drive-sense circuits.

A sensor 30 functions to convert a physical input into an electrical output and/or an optical output. The physical input of a sensor may be one of a variety of physical input conditions. For example, the physical condition includes one or more of, but is not limited to, acoustic waves (e.g., amplitude, phase, polarization, spectrum, and/or wave velocity); a biological and/or chemical condition (e.g., fluid concentration, level, composition, etc.); an electric condition (e.g., charge, voltage, current, conductivity, permittivity, eclectic field, which includes amplitude, phase, and/or polarization); a magnetic condition (e.g., flux, permeability, magnetic field, which amplitude, phase, and/or polarization); an optical condition (e.g., refractive index, reflectivity, absorption, etc.); a thermal condition (e.g., temperature, flux, specific heat, thermal conductivity, etc.); and a mechanical condition (e.g., position, velocity, acceleration, force, strain, stress, pressure, torque, etc.). For example, piezoelectric sensor converts force or pressure into an eclectic signal. As another example, a microphone converts audible acoustic waves into electrical signals.

There are a variety of types of sensors to sense the various types of physical conditions. Sensor types include, but are not limited to, capacitor sensors, inductive sensors, accelerometers, piezoelectric sensors, light sensors, magnetic field sensors, ultrasonic sensors, temperature sensors, infrared (IR) sensors, touch sensors, proximity sensors, pressure sensors, level sensors, smoke sensors, and gas sensors. In many ways, sensors function as the interface between the physical world and the digital world by converting real world conditions into digital signals that are then processed by computing devices for a vast number of applications including, but not limited to, medical applications, production automation applications, home environment control, public safety, and so on.

The various types of sensors have a variety of sensor characteristics that are factors in providing power to the sensors, receiving signals from the sensors, and/or interpreting the signals from the sensors. The sensor characteristics include resistance, reactance, power requirements, sensitivity, range, stability, repeatability, linearity, error, response time, and/or frequency response. For example, the resistance, reactance, and/or power requirements are factors in determining drive circuit requirements. As another example, sensitivity, stability, and/or linear are factors for interpreting the measure of the physical condition based on the received electrical and/or optical signal (e.g., measure of temperature, pressure, etc.).

An actuator 32 converts an electrical input into a physical output. The physical output of an actuator may be one of a variety of physical output conditions. For example, the physical output condition includes one or more of, but is not limited to, acoustic waves (e.g., amplitude, phase, polarization, spectrum, and/or wave velocity); a magnetic condition (e.g., flux, permeability, magnetic field, which amplitude, phase, and/or polarization); a thermal condition (e.g., temperature, flux, specific heat, thermal conductivity, etc.); and a mechanical condition (e.g., position, velocity, acceleration, force, strain, stress, pressure, torque, etc.). As an example, a piezoelectric actuator converts voltage into force or pressure. As another example, a speaker converts electrical signals into audible acoustic waves.

An actuator 32 may be one of a variety of actuators. For example, an actuator 32 is one of a comb drive, a digital micro-mirror device, an electric motor, an electroactive polymer, a hydraulic cylinder, a piezoelectric actuator, a pneumatic actuator, a screw jack, a servomechanism, a solenoid, a stepper motor, a shape-memory allow, a thermal bimorph, and a hydraulic actuator.

The various types of actuators have a variety of actuators characteristics that are factors in providing power to the actuator and sending signals to the actuators for desired performance. The actuator characteristics include resistance, reactance, power requirements, sensitivity, range, stability, repeatability, linearity, error, response time, and/or frequency response. For example, the resistance, reactance, and power requirements are factors in determining drive circuit requirements. As another example, sensitivity, stability, and/or linear are factors for generating the signaling to send to the actuator to obtain the desired physical output condition.

The computing devices 12, 14, and 18 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. The computing devices 12, 14, and 18 will be discussed in greater detail with reference to one or more of FIGS. 2-4.

A server 22 is a special type of computing device that is optimized for processing large amounts of data requests in parallel. A server 22 includes similar components to that of the computing devices 12, 14, and/or 18 with more robust processing modules, more main memory, and/or more hard drive memory (e.g., solid state, hard drives, etc.). Further, a server 22 is typically accessed remotely; as such it does not generally include user input devices and/or user output devices. In addition, a server may be a standalone separate computing device and/or may be a cloud computing device.

A database 24 is a special type of computing device that is optimized for large scale data storage and retrieval. A database 24 includes similar components to that of the computing devices 12, 14, and/or 18 with more hard drive memory (e.g., solid state, hard drives, etc.) and potentially with more processing modules and/or main memory. Further, a database 24 is typically accessed remotely; as such it does not generally include user input devices and/or user output devices. In addition, a database 24 may be a stand-alone separate computing device and/or may be a cloud computing device.

The network 26 includes one more local area networks (LAN) and/or one or more wide area networks WAN), which may be a public network and/or a private network. A LAN may be a wireless-LAN (e.g., Wi-Fi access point, Bluetooth, ZigBee, etc.) and/or a wired network (e.g., Firewire, Ethernet, etc.). A WAN may be a wired and/or wireless WAN. For example, a LAN may be a personal home or business's wireless network and a WAN is the Internet, cellular telephone infrastructure, and/or satellite communication infrastructure.

In an example of operation, computing device 12-1 communicates with a plurality of drive-sense circuits 28, which, in turn, communicate with a plurality of sensors 30. The sensors 30 and/or the drive-sense circuits 28 are within the computing device 12-1 and/or external to it. For example, the sensors 30 may be external to the computing device 12-1 and the drive-sense circuits are within the computing device 12-1. As another example, both the sensors 30 and the drive-sense circuits 28 are external to the computing device 12-1. When the drive-sense circuits 28 are external to the computing device, they are coupled to the computing device 12-1 via wired and/or wireless communication links as will be discussed in greater detail with reference to one or more of FIGS. 5A-5C.

The computing device 12-1 communicates with the drive-sense circuits 28 to; (a) turn them on, (b) obtain data from the sensors (individually and/or collectively), (c) instruct the drive sense circuit on how to communicate the sensed data to the computing device 12-1, (d) provide signaling attributes (e.g., DC level, AC level, frequency, power level, regulated current signal, regulated voltage signal, regulation of an impedance, frequency patterns for various sensors, different frequencies for different sensing applications, etc.) to use with the sensors, and/or (e) provide other commands and/or instructions.

As a specific example, the sensors 30 are distributed along a pipeline to measure flow rate and/or pressure within a section of the pipeline. The drive-sense circuits 28 have their own power source (e.g., battery, power supply, etc.) and are proximally located to their respective sensors 30. At desired time intervals (milliseconds, seconds, minutes, hours, etc.), the drive-sense circuits 28 provide a regulated source signal or a power signal to the sensors 30. An electrical characteristic of the sensor 30 affects the regulated source signal or power signal, which is reflective of the condition (e.g., the flow rate and/or the pressure) that sensor is sensing.

The drive-sense circuits 28 detect the effects on the regulated source signal or power signals as a result of the electrical characteristics of the sensors. The drive-sense circuits 28 then generate signals representative of change to the regulated source signal or power signal based on the detected effects on the power signals. The changes to the regulated source signals or power signals are representative of the conditions being sensed by the sensors 30.

The drive-sense circuits 28 provide the representative signals of the conditions to the computing device 12-1. A representative signal may be an analog signal or a digital signal. In either case, the computing device 12-1 interprets the representative signals to determine the pressure and/or flow rate at each sensor location along the pipeline. The computing device may then provide this information to the server 22, the database 24, and/or to another computing device for storing and/or further processing.

As another example of operation, computing device 12-2 is coupled to a drive-sense circuit 28, which is, in turn, coupled to a sensor 30. The sensor 30 and/or the drive-sense circuit 28 may be internal and/or external to the computing device 12-2. In this example, the sensor 30 is sensing a condition that is particular to the computing device 12-2. For example, the sensor 30 may be a temperature sensor, an ambient light sensor, an ambient noise sensor, etc. As described above, when instructed by the computing device 12-2 (which may be a default setting for continuous sensing or at regular intervals), the drive-sense circuit 28 provides the regulated source signal or power signal to the sensor 30 and detects an effect to the regulated source signal or power signal based on an electrical characteristic of the sensor. The drive-sense circuit generates a representative signal of the affect and sends it to the computing device 12-2.

In another example of operation, computing device 12-3 is coupled to a plurality of drive-sense circuits 28 that are coupled to a plurality of sensors 30 and is coupled to a plurality of drive-sense circuits 28 that are coupled to a plurality of actuators 32. The generally functionality of the drive-sense circuits 28 coupled to the sensors 30 in accordance with the above description.

Since an actuator 32 is essentially an inverse of a sensor in that an actuator converts an electrical signal into a physical condition, while a sensor converts a physical condition into an electrical signal, the drive-sense circuits 28 can be used to power actuators 32. Thus, in this example, the computing device 12-3 provides actuation signals to the drive-sense circuits 28 for the actuators 32. The drive-sense circuits modulate the actuation signals on to power signals or regulated control signals, which are provided to the actuators 32. The actuators 32 are powered from the power signals or regulated control signals and produce the desired physical condition from the modulated actuation signals.

As another example of operation, computing device 12-x is coupled to a drive-sense circuit 28 that is coupled to a sensor 30 and is coupled to a drive-sense circuit 28 that is coupled to an actuator 32. In this example, the sensor 30 and the actuator 32 are for use by the computing device 12-x. For example, the sensor 30 may be a piezoelectric microphone and the actuator 32 may be a piezoelectric speaker.

Figure 2:
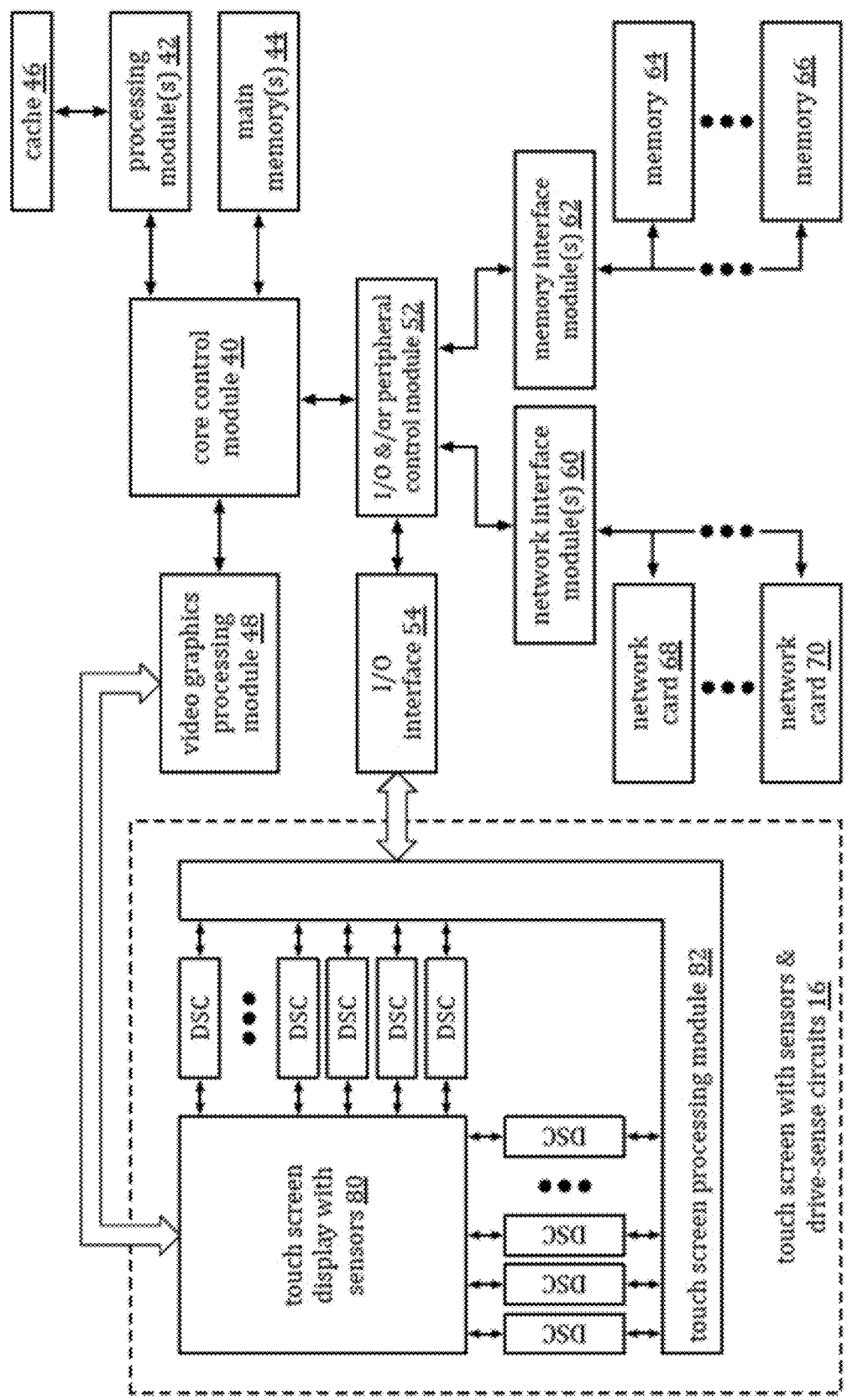
FIG. 2 is a schematic block diagram of an embodiment of a computing device in accordance with the present disclosure.

FIG. 2 is a schematic block diagram of an embodiment of a computing device 12 (e.g., any one of 12-1 through 12-x). The computing device 12 includes a touch screen 16, a core control module 40, one or more processing modules 42, one or more main memories 44, cache memory 46, a video graphics processing module 48, a display 50, an Input-Output (I/O) peripheral control module 52, one or more input interface modules 56, one or more output interface modules 58, one or more network interface modules 60, and one or more memory interface modules 62. A processing module 42 is described in greater detail at the end of the detailed description of the invention section and, in an alternative embodiment, has a direction connection to the main memory 44. In an alternate embodiment, the core control module 40 and the I/O and/or peripheral control module 52 are one module, such as a chipset, a quick path interconnect (QPI), and/or an ultra-path interconnect (UPI).

The touch screen 16 includes a touch screen display 80, a plurality of sensors 30, a plurality of drive-sense circuits (DSC), and a touch screen processing module 82. In general, the sensors (e.g., electrodes, capacitor sensing cells, capacitor sensors, inductive sensor, etc.) detect a proximal touch of the screen. For example, when one or more fingers touches the screen, capacitance of sensors proximal to the touch(es) are affected (e.g., impedance changes). The drive-sense circuits (DSC) coupled to the affected sensors detect the change and provide a representation of the change to the touch screen processing module 82, which may be a separate processing module or integrated into the processing module 42.

The touch screen processing module 82 processes the representative signals from the drive-sense circuits (DSC) to determine the location of the touch(es). This information is inputted to the processing module 42 for processing as an input. For example, a touch represents a selection of a button on screen, a scroll function, a zoom in-out function, etc.

Each of the main memories 44 includes one or more Random Access Memory (RAM) integrated circuits, or chips. For example, a main memory 44 includes four DDR4 (4th generation of double data rate) RAM chips, each running at a rate of 2,400 MHz. In general, the main memory 44 stores data and operational instructions most relevant for the processing module 42. For example, the core control module 40 coordinates the transfer of data and/or operational instructions from the main memory 44 and the memory 64-66. The data and/or operational instructions retrieve from memory 64-66 are the data and/or operational instructions requested by the processing module or will most likely be needed by the processing module. When the processing module is done with the data and/or operational instructions in main memory, the core control module 40 coordinates sending updated data to the memory 64-66 for storage.

The memory 64-66 includes one or more hard drives, one or more solid state memory chips, and/or one or more other large capacity storage devices that, in comparison to cache memory and main memory devices, is/are relatively inexpensive with respect to cost per amount of data stored. The memory 64-66 is coupled to the core control module 40 via the I/O and/or peripheral control module 52 and via one or more memory interface modules 62. In an embodiment, the I/O and/or peripheral control module 52 includes one or more Peripheral Component Interface (PCI) buses to which peripheral components connect to the core control module 40. A memory interface module 62 includes a software driver and a hardware connector for coupling a memory device to the I/O and/or peripheral control module 52. For example, a memory interface 62 is in accordance with a Serial Advanced Technology Attachment (SATA) port.

The core control module 40 coordinates data communications between the processing module(s) 42 and the network(s) 26 via the I/O and/or peripheral control module 52, the network interface module(s) 60, and a network card 68 or 70. A network card 68 or 70 includes a wireless communication unit or a wired communication unit. A wireless communication unit includes a wireless local area network (WLAN) communication device, a cellular communication device, a Bluetooth device, and/or a ZigBee communication device. A wired communication unit includes a Gigabit LAN connection, a Firewire connection, and/or a proprietary computer wired connection. A network interface module 60 includes a software driver and a hardware connector for coupling the network card to the I/O and/or peripheral control module 52. For example, the network interface module 60 is in accordance with one or more versions of IEEE 802.11, cellular telephone protocols, 10/100/1000 Gigabit LAN protocols, etc.

The core control module 40 coordinates data communications between the processing module(s) 42 and input device(s) 72 via the input interface module(s) 56 and the I/O and/or peripheral control module 52. An input device 72 includes a keypad, a keyboard, control switches, a touchpad, a microphone, a camera, etc. An input interface module 56 includes a software driver and a hardware connector for coupling an input device to the I/O and/or peripheral control module 52. In an embodiment, an input interface module 56 is in accordance with one or more Universal Serial Bus (USB) protocols.

The core control module 40 coordinates data communications between the processing module(s) 42 and output device(s) 74 via the output interface module(s) 58 and the I/O and/or peripheral control module 52. An output device 74 includes a speaker, etc. An output interface module 58 includes a software driver and a hardware connector for coupling an output device to the I/O and/or peripheral control module 52. In an embodiment, an output interface module 56 is in accordance with one or more audio codec protocols.

The processing module 42 communicates directly with a video graphics processing module 48 to display data on the display 50. The display 50 includes an LED (light emitting diode) display, an LCD (liquid crystal display), and/or other type of display technology. The display has a resolution, an aspect ratio, and other features that affect the quality of the display. The video graphics processing module 48 receives data from the processing module 42, processes the data to produce rendered data in accordance with the characteristics of the display, and provides the rendered data to the display 50.

Figure 3:
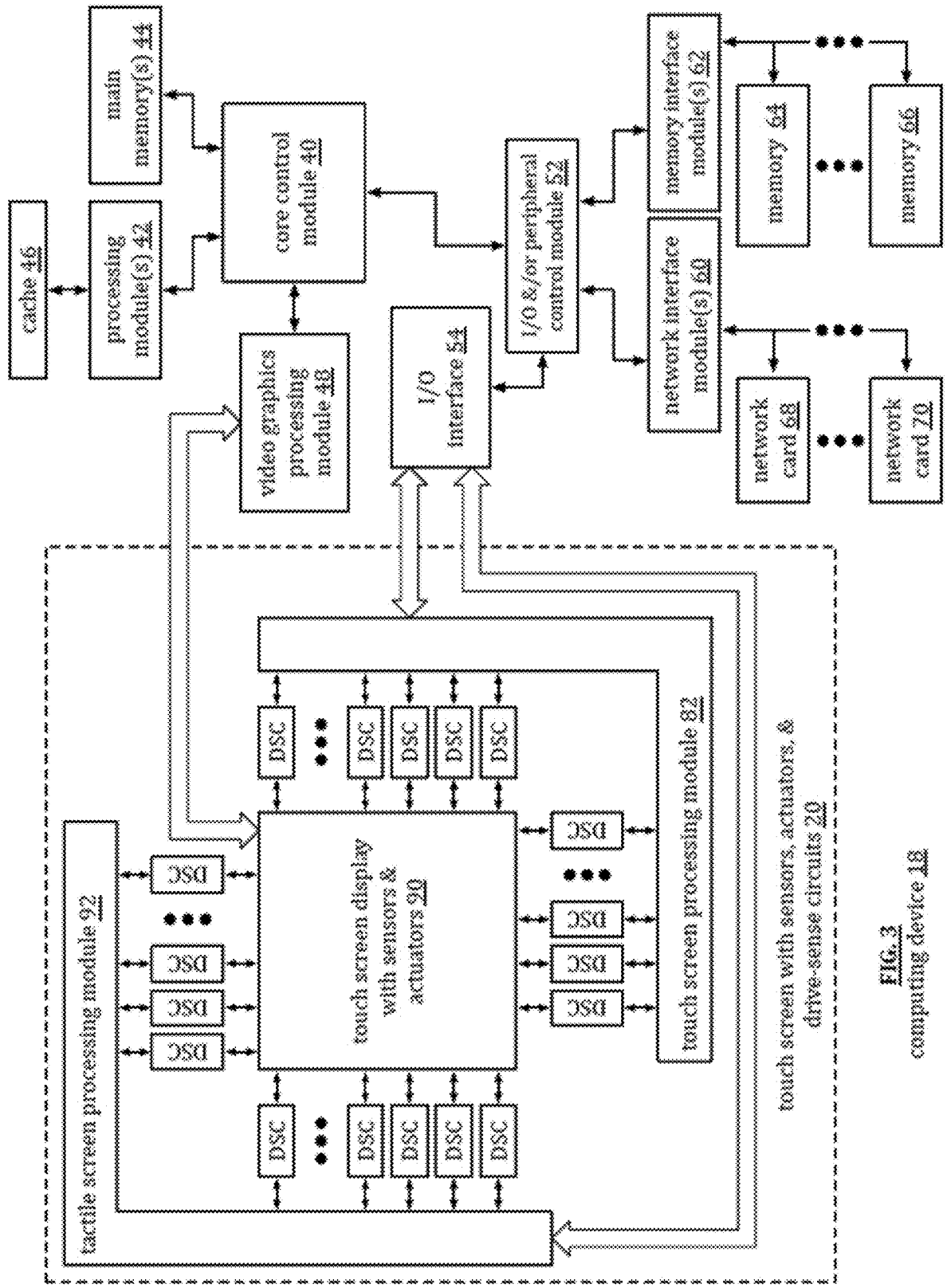
FIG. 3 is a schematic block diagram of another embodiment of a computing device in accordance with the present disclosure.

FIG. 3 is a schematic block diagram of another embodiment of a computing device 18 that includes a core control module 40, one or more processing modules 42, one or more main memories 44, cache memory 46, a video graphics processing module 48, a touch and tactile screen 20, an Input-Output (I/O) peripheral control module 52, one or more input interface modules 56, one or more output interface modules 58, one or more network interface modules 60, and one or more memory interface modules 62. The touch and tactile screen 20 includes a touch and tactile screen display 90, a plurality of sensors 30, a plurality of actuators 32, a plurality of drive-sense circuits (DSC), a touch screen processing module 82, and a tactile screen processing module 92.

Computing device 18 operates similarly to computing device 14 of FIG. 2 with the addition of a tactile aspect to the screen 20 as an output device. The tactile portion of the screen 20 includes the plurality of actuators (e.g., piezoelectric transducers to create vibrations, solenoids to create movement, etc.) to provide a tactile feel to the screen 20. To do so, the processing module creates tactile data, which is provided to the appropriate drive-sense circuits (DSC) via the tactile screen processing module 92, which may be a stand-alone processing module or integrated into processing module 42. The drive-sense circuits (DSC) convert the tactile data into drive-actuate signals and provide them to the appropriate actuators to create the desired tactile feel on the screen 20.

Figure 4:
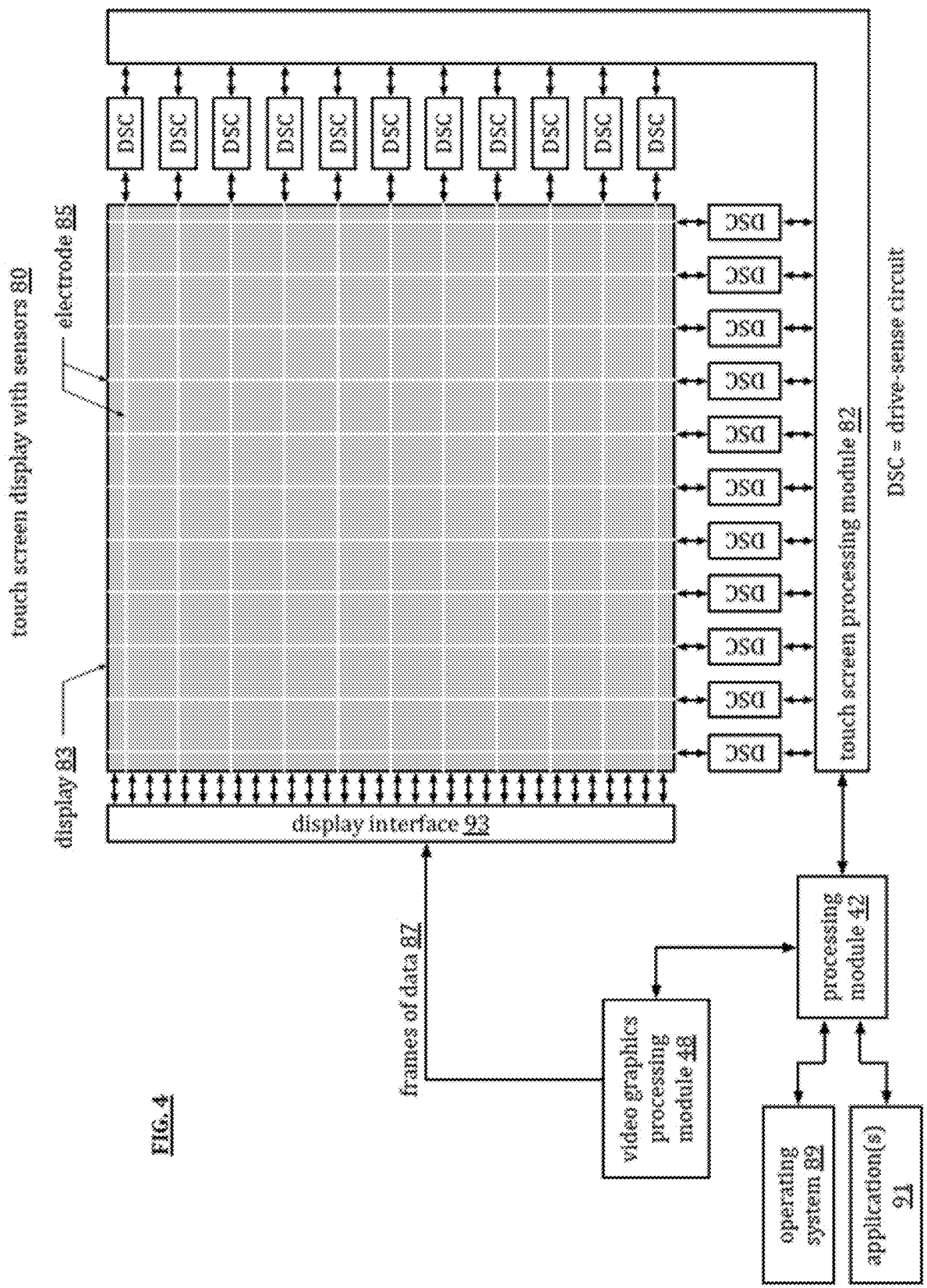
FIG. 4 is a schematic block diagram of an embodiment of a touch screen display in accordance with the present disclosure.

FIG. 4 is a schematic block diagram of an embodiment of a touch screen display 80 that includes a plurality of drive-sense circuits (DSC), a touch screen processing module 82, a display 83, and a plurality of electrodes 85. The touch screen display 80 is coupled to a processing module 42, a video graphics processing module 48, and a display interface 93, which are components of a computing device (e.g., 14-18), an interactive display, or other device that includes a touch screen display. An interactive display functions to provide users with an interactive experience (e.g., touch the screen to obtain information, be entertained, etc.). For example, a store provides interactive displays for customers to find certain products, to obtain coupons, to enter contests, etc.

There are a variety of other devices that include a touch screen display. For example, a vending machine includes a touch screen display to select and/or pay for an item. As another example of a device having a touch screen display is an Automated Teller Machine (ATM). As yet another example, an automobile includes a touch screen display for entertainment media control, navigation, climate control, etc.

The touch screen display 80 includes a large display 83 that has a resolution equal to or greater than full high-definition (HD), an aspect ratio of a set of aspect ratios, and a screen size equal to or greater than thirty-two inches. The following table (Table 1) lists various combinations of resolution, aspect ratio, and screen size for the display 83, but it's not an exhaustive list.

| Resolution | Width (lines) | Height (lines) | pixel aspect ratio | screen aspect ratio | screen size (inches) |
|---|---|---|---|---|---|
| HD (high definition) | 1280 | 720 | 1:1 | 16:9 | 32, 40, 43, 50, 55, 60, 65, 70, 75, &/or >80 |
| Full HD | 1920 | 1080 | 1:1 | 16:9 | 32, 40, 43, 50, 55, 60, 65, 70, 75, &/or >80 |
| HD | 960 | 720 | 4:3 | 16:9 | 32, 40, 43, 50, 55, 60, 65, 70, 75, &/or >80 |
| HD | 1440 | 1080 | 4:3 | 16:9 | 32, 40, 43, 50, 55, 60, 65, 70, 75, &/or >80 |
| HD | 1280 | 1080 | 3:2 | 16:9 | 32, 40, 43, 50, 55, 60, 65, 70, 75, &/or >80 |
| QHD (quad HD) | 2560 | 1440 | 1:1 | 16:9 | 32, 40, 43, 50, 55, 60, 65, 70, 75, &/or >80 |
| UHD (Ultra HD) or 4K | 3840 | 2160 | 1:1 | 16:9 | 32, 40, 43, 50, 55, 60, 65, 70, 75, &/or >80 |
| 8K | 7680 | 4320 | 1:1 | 16:9 | 32, 40, 43, 50, 55, 60, 65, 70, 75, &/or >80 |
| HD and above | 1280->=7680 | 720->=4320 | 1:1, 2:3, etc. | 2:3 | 50, 55, 60, 65, 70, 75, &/or >80 |

The display 83 is one of a variety of types of displays that is operable to render frames of data into visible images. For example, the display is one or more of: a light emitting diode (LED) display, an electroluminescent display (ELD), a plasma display panel (PDP), a liquid crystal display (LCD), an LCD high performance addressing (HPA) display, an LCD thin film transistor (TFT) display, an organic light emitting diode (OLED) display, a digital light processing (DLP) display, a surface conductive electron emitter (SED) display, a field emission display (FED), a laser TV display, a carbon nanotubes display, a quantum dot display, an interferometric modulator display (IMOD), and a digital microshutter display (DMS). The display is active in a full display mode or a multiplexed display mode (i.e., only part of the display is active at a time).

The display 83 further includes integrated electrodes 85 that provide the sensors for the touch sense part of the touch screen display. The electrodes 85 are distributed throughout the display area or where touch screen functionality is desired. For example, a first group of the electrodes are arranged in rows and a second group of electrodes are arranged in columns. As will be discussed in greater detail with reference to one or more of FIGS. 9-12, the row electrodes are separated from the column electrodes by a dielectric material.

The electrodes 85 are comprised of a transparent conductive material and are in-cell or on-cell with respect to layers of the display. For example, a conductive trace is placed in-cell or on-cell of a layer of the touch screen display. The transparent conductive material, which is substantially transparent and has negligible effect on video quality of the display with respect to the human eye. For instance, an electrode is constructed from one or more of: Indium Tin Oxide, Graphene, Carbon Nanotubes, Thin Metal Films, Silver Nanowires Hybrid Materials, Aluminum-doped Zinc Oxide (AZO), Amorphous Indium-Zinc Oxide, Gallium-doped Zinc Oxide (GZO), and poly polystyrene sulfonate (PEDOT).

In an example of operation, the processing module 42 is executing an operating system application 89 and one or more user applications 91. The user applications 91 includes, but is not limited to, a video playback application, a spreadsheet application, a word processing application, a computer aided drawing application, a photo display application, an image processing application, a database application, etc. While executing an application 91, the processing module generates data for display (e.g., video data, image data, text data, etc.). The processing module 42 sends the data to the video graphics processing module 48, which converts the data into frames of video 87.

The video graphics processing module 48 sends the frames of video 87 (e.g., frames of a video file, refresh rate for a word processing document, a series of images, etc.) to the display interface 93. The display interface 93 provides the frames of video to the display 83, which renders the frames of video into visible images.

While the display 83 is rendering the frames of video into visible images, the drive-sense circuits (DSC) provide sensor signals to the electrodes 85. When the screen is touched, capacitance of the electrodes 85 proximal to the touch (i.e., directly or close by) is changed. The DSCs detect the capacitance change for effected electrodes and provide the detected change to the touch screen processing module 82.

The touch screen processing module 82 processes the capacitance change of the effected electrodes to determine one or more specific locations of touch and provides this information to the processing module 42. Processing module 42 processes the one or more specific locations of touch to determine if an operation of the application is to be altered. For example, the touch is indicative of a pause command, a fast forward command, a reverse command, an increase volume command, a decrease volume command, a stop command, a select command, a delete command, etc.

Figure 5:
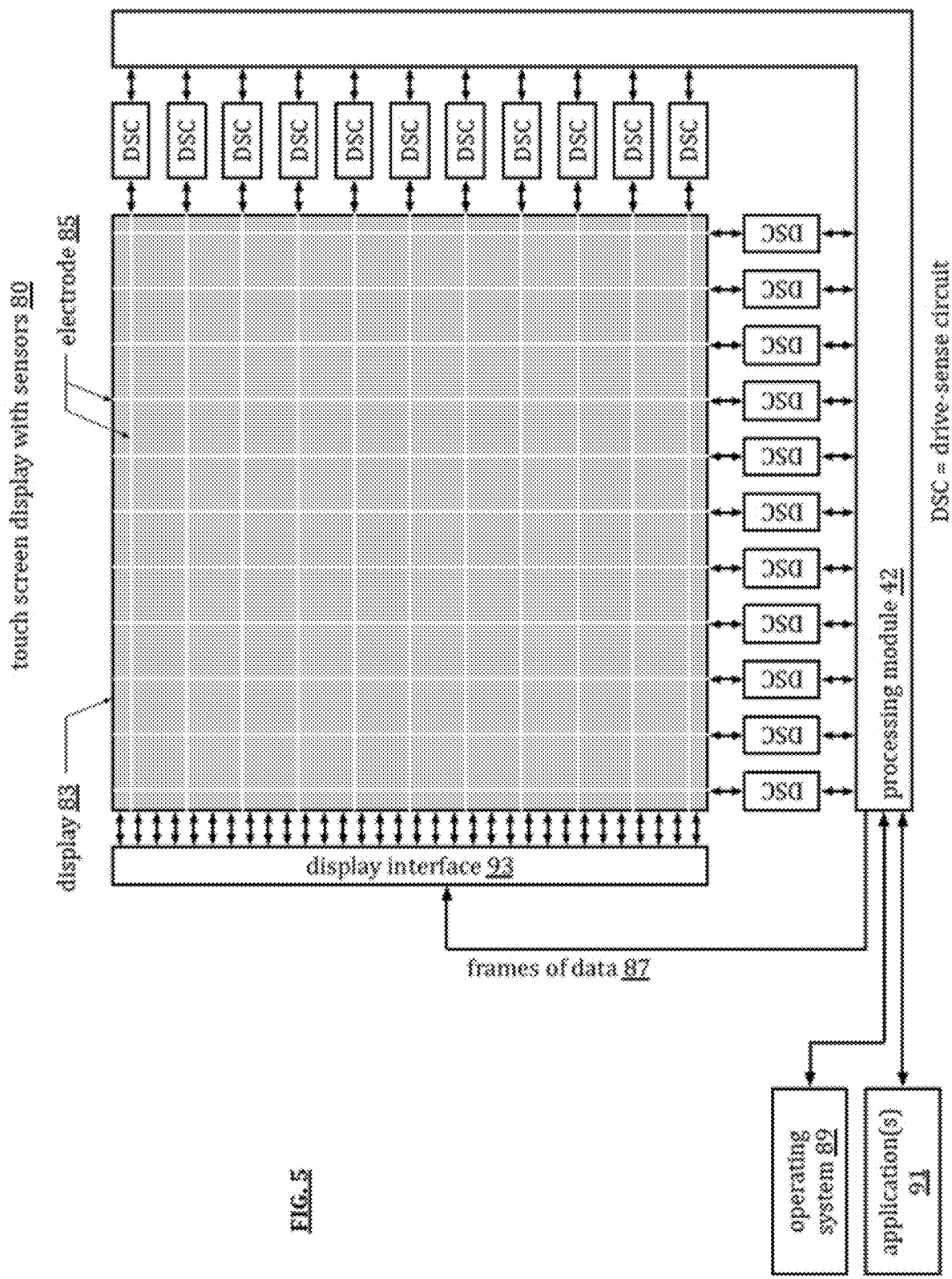
FIG. 5 is a schematic block diagram of another embodiment of a touch screen display in accordance with the present disclosure.

FIG. 5 is a schematic block diagram of another embodiment of a touch screen display 80 that includes a plurality of drive-sense circuits (DSC), the processing module 42, a display 83, and a plurality of electrodes 85. The processing module 42 is executing an operating system 89 and one or more user applications 91 to produce frames of data 87. The processing module 42 provides the frames of data 87 to the display interface 93. The touch screen display 80 operates similarly to the touch screen display 80 of FIG. 4 with the above noted differences.

Figure 6:
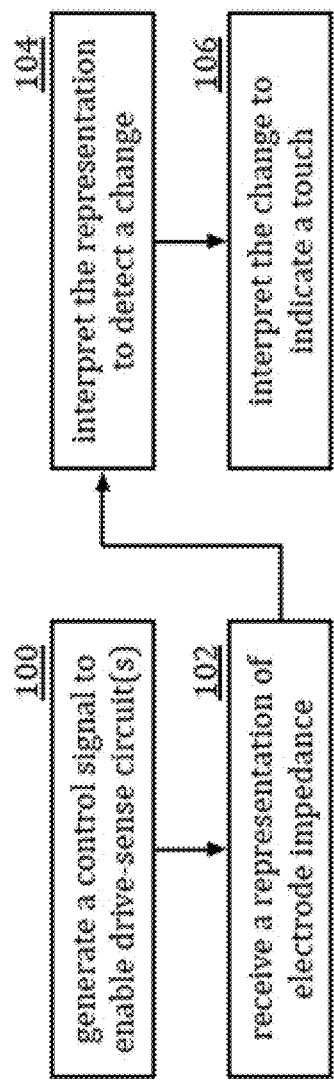
FIG. 6 is a logic diagram of an embodiment of a method for sensing a touch on a touch screen display in accordance with the present disclosure.

FIG. 6 is a logic diagram of an embodiment of a method for sensing a touch on a touch screen display that is executed by one or more processing modules (e.g., 42, 82, and/or 48 of the previous figures). The method begins at step 100 where the processing module generate a control signal (e.g., power enable, operation enable, etc.) to enable a drive-sense circuit to monitor the sensor signal on the electrode. The processing module generates additional control signals to enable other drive-sense circuits to monitor their respective sensor signals. In an example, the processing module enables all of the drive-sense circuits for continuous sensing for touches of the screen. In another example, the processing module enables a first group of drive-sense circuits coupled to a first group of row electrodes and enables a second group of drive-sense circuits coupled to a second group of column electrodes.

The method continues at step 102 where the processing module receives a representation of the impedance on the electrode from a drive-sense circuit. In general, the drive-sense circuit provides a drive signal to the electrode. The impedance of the electrode affects the drive signal. The effect on the drive signal is interpreted by the drive-sense circuit to produce the representation of the impedance of the electrode. The processing module does this with each activated drive-sense circuit in serial, in parallel, or in a serial-parallel manner.

The method continues at step 104 where the processing module interprets the representation of the impedance on the electrode to detect a change in the impedance of the electrode. A change in the impedance is indicative of a touch. For example, an increase in self-capacitance (e.g., the capacitance of the electrode with respect to a reference (e.g., ground, etc.)) is indicative of a touch on the electrode. As another example, a decrease in mutual capacitance (e.g., the capacitance between a row electrode and a column electrode) is also indicative of a touch near the electrodes. The processing module does this for each representation of the impedance of the electrode it receives. Note that the representation of the impedance is a digital value, an analog signal, an impedance value, and/or any other analog or digital way of representing a sensor's impedance.

The method continues at step 106 where the processing module interprets the change in the impedance to indicate a touch of the touch screen display in an area corresponding to the electrode. For each change in impedance detected, the processing module indicates a touch. Further processing may be done to determine if the touch is a desired touch or an undesired touch. Such further processing will be discussed in greater detail with reference to one or more of FIGS. 33-35.

Figure 7:
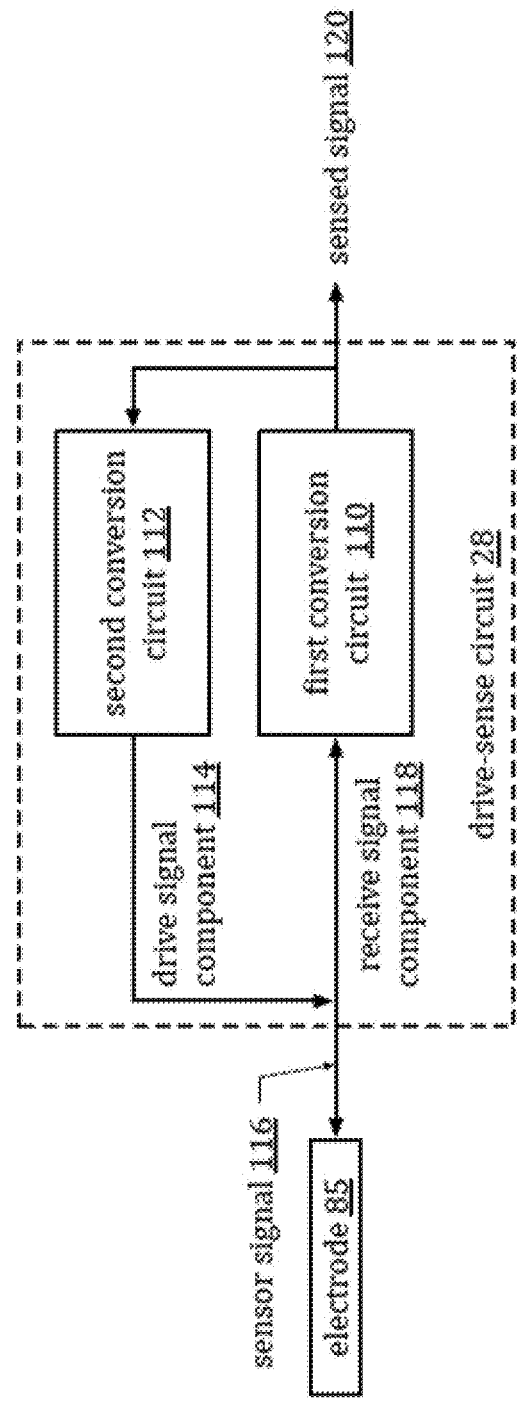
FIG. 7 is a schematic block diagram of an embodiment of a drive sense circuit in accordance with the present disclosure.

FIG. 7 is a schematic block diagram of an embodiment of a drive sense circuit 28 that includes a first conversion circuit 110 and a second conversion circuit 112. The first conversion circuit 110 converts a sensor signal 116 into a sensed signal 120. The second conversion circuit 112 generates the drive signal component 114 from the sensed signal 112. As an example, the first conversion circuit 110 functions to keep the sensor signal 116 substantially constant (e.g., substantially matching a reference signal) by creating the sensed signal 120 to correspond to changes in a receive signal component 118 of the sensor signal. The second conversion circuit 112 functions to generate a drive signal component 114 of the sensor signal based on the sensed signal 120 to substantially compensate for changes in the receive signal component 118 such that the sensor signal 116 remains substantially constant.

In an example, the drive signal 116 is provided to the electrode 85 as a regulated current signal. The regulated current (I) signal in combination with the impedance (Z) of the electrode creates an electrode voltage (V), where V=I*Z. As the impedance (Z) of electrode changes, the regulated current (I) signal is adjusted to keep the electrode voltage (V) substantially unchanged. To regulate the current signal, the first conversion circuit 110 adjusts the sensed signal 120 based on the receive signal component 118, which is indicative of the impedance of the electrode and change thereof. The second conversion circuit 112 adjusts the regulated current based on the changes to the sensed signal 120.

As another example, the drive signal 116 is provided to the electrode 85 as a regulated voltage signal. The regulated voltage (V) signal in combination with the impedance (Z) of the electrode creates an electrode current (I), where I=V/Z. As the impedance (Z) of electrode changes, the regulated voltage (V) signal is adjusted to keep the electrode current (I) substantially unchanged. To regulate the voltage signal, the first conversion circuit 110 adjusts the sensed signal 120 based on the receive signal component 118, which is indicative of the impedance of the electrode and change thereof. The second conversion circuit 112 adjusts the regulated voltage based on the changes to the sensed signal 120.

FIG. 8 is a schematic block diagram of another embodiment of a drive sense circuit 28 that includes a first conversion circuit 110 and a second conversion circuit 112. The first conversion circuit 110 includes a comparator (comp) and an analog to digital converter 130. The second conversion circuit 112 includes a digital to analog converter 132, a signal source circuit 133, and a driver.

In an example of operation, the comparator compares the sensor signal 116 to an analog reference signal 122 to produce an analog comparison signal 124. The analog reference signal 124 includes a DC component and an oscillating component. As such, the sensor signal 116 will have a substantially matching DC component and oscillating component. An example of an analog reference signal 122 will be described in greater detail with reference to FIG. 15.

The analog to digital converter 130 converts the analog comparison signal 124 into the sensed signal 120. The analog to digital converter (ADC) 130 may be implemented in a variety of ways. For example, the (ADC) 130 is one of: a flash ADC, a successive approximation ADC, a ramp-compare ADC, a Wilkinson ADC, an integrating ADC, a delta encoded ADC, and/or a sigma-delta ADC. The digital to analog converter (DAC) 214 may be a sigma-delta DAC, a pulse width modulator DAC, a binary weighted DAC, a successive approximation DAC, and/or a thermometer-coded DAC.

The digital to analog converter (DAC) 132 converts the sensed signal 120 into an analog feedback signal 126. The signal source circuit 133 (e.g., a dependent current source, a linear regulator, a DC-DC power supply, etc.) generates a regulated source signal 135 (e.g., a regulated current signal or a regulated voltage signal) based on the analog feedback signal 126. The driver increases power of the regulated source signal 135 to produce the drive signal component 114.

Figure 9A:
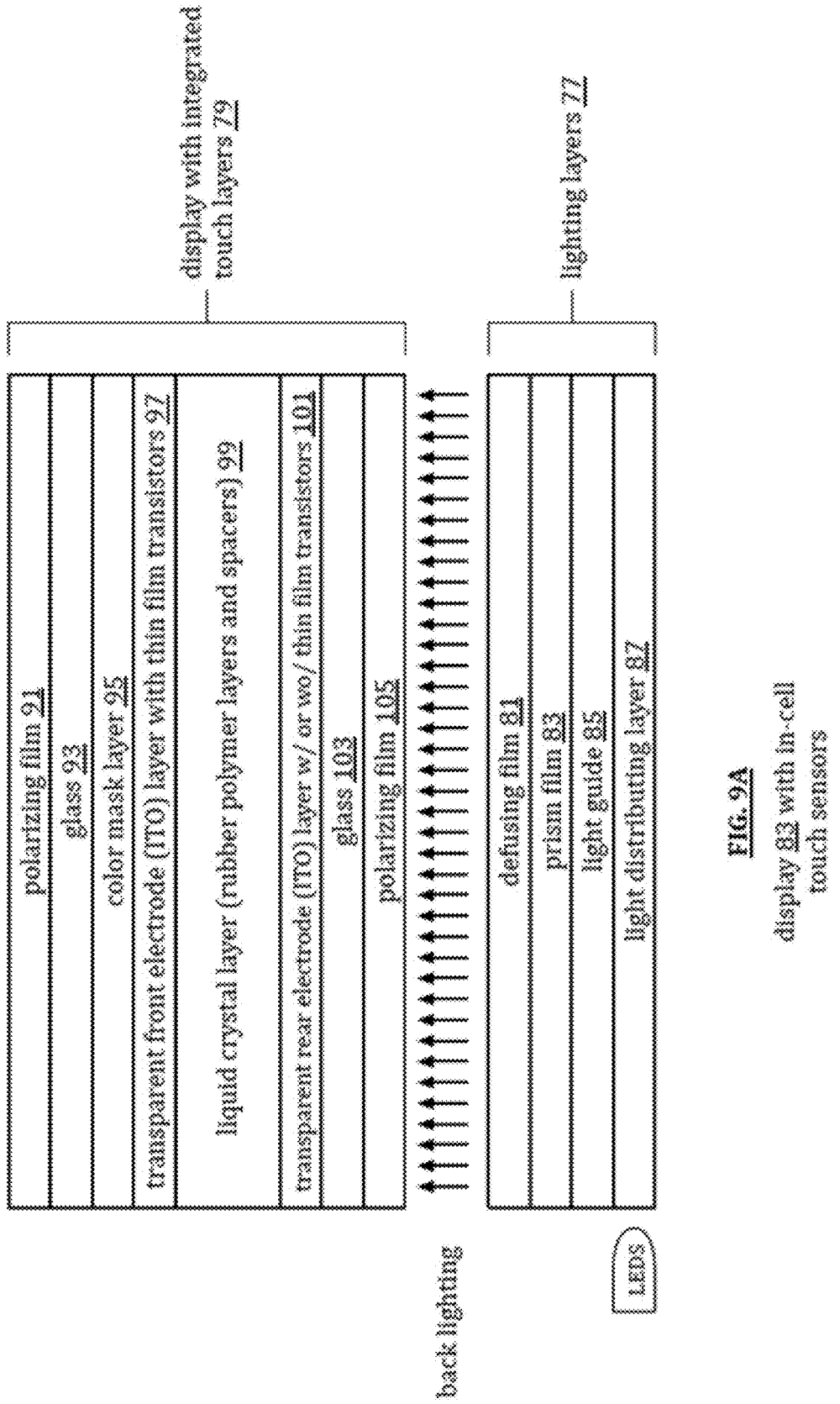
FIG. 9A is a cross section schematic block diagram of an example of a touch screen display with in-cell touch sensors in accordance with the present disclosure.

FIG. 9A is a cross section schematic block diagram of an example of a touch screen display 83 with in-cell touch sensors, which includes lighting layers 77 and display with integrated touch sensing layers 79. The lighting layers 77 include a light distributing layer 87, a light guide layer 85, a prism film layer 83, and a defusing film layer 81. The display with integrated touch sensing layers 79 include a rear polarizing film layer 105, a glass layer 103, a rear transparent electrode layer with thin film transistors 101 (which may be two or more separate layers), a liquid crystal layer (e.g., a rubber polymer layer with spacers) 99, a front electrode layer with thin film transistors 97, a color mask layer 95, a glass layer 93, and a front polarizing film layer 91. Note that one or more protective layers may be applied over the polarizing film layer 91.

In an example of operation, a row of LEDs (light emitted diodes) projects light into the light distributing player 87, which projects the light towards the light guide 85. The light guide includes a plurality of holes that let's some light components pass at differing angles. The prism film layer 83 increases perpendicularity of the light components, which are then defused by the defusing film layer 81 to provide a substantially even back lighting for the display with integrated touch sense layers 79.

The two polarizing film layers 105 and 91 are orientated to block the light (i.e., provide black light). The front and rear electrode layers 97 and 101 provide an electric field at a sub-pixel level to orientate liquid crystals in the liquid crystal layer 99 to twist the light. When the electric field is off, or is very low, the liquid crystals are orientated in a first manner (e.g., end-to-end) that does not twist the light, thus, for the sub-pixel, the two polarizing film layers 105 and 91 are blocking the light. As the electric field is increased, the orientation of the liquid crystals change such that the two polarizing film layers 105 and 91 pass the light (e.g., white light). When the liquid crystals are in a second orientation (e.g., side by side), intensity of the light is at its highest point.

The color mask layer 95 includes three sub-pixel color masks (red, green, and blue) for each pixel of the display, which includes a plurality of pixels (e.g., 1440×1080). As the electric field produced by electrodes change the orientations of the liquid crystals at the sub-pixel level, the light is twisted to produce varying sub-pixel brightness. The sub-pixel light passes through its corresponding sub-pixel color mask to produce a color component for the pixel. The varying brightness of the three sub-pixel colors (red, green, and blue), collectively produce a single color to the human eye. For example, a blue shirt has a 12% red component, a 20% green component, and 55% blue component.

The in-cell touch sense functionality uses the existing layers of the display layers 79 to provide capacitance-based sensors. For instance, one or more of the transparent front and rear electrode layers 97 and 101 are used to provide row electrodes and column electrodes. Various examples of creating row and column electrodes from one or more of the transparent front and rear electrode layers 97 and 101 is discussed in some of the subsequent figures.

Figure 9B:
FIG. 9B is a schematic block diagram of an example of a transparent electrode layer with thin film transistors in accordance with the present disclosure.

FIG. 9B is a schematic block diagram of an example of a transparent electrode layer 97 and/or 101 with thin film transistors (TFT). Sub-pixel electrodes are formed on the transparent electrode layer and each sub-pixel electrode is coupled to a thin film transistor (TFT). Three sub-pixels (R-red, G-green, and B-blue) form a pixel. The gates of the TFTs associated with a row of sub-electrodes are coupled to a common gate line. In this example, each of the four rows has its own gate line. The drains (or sources) of the TFTs associated with a column of sub-electrodes are coupled to a common R, B, or G data line. The sources (or drains) of the TFTs are coupled to its corresponding sub-electrode.

In an example of operation, one gate line is activated at a time and RGB data for each pixel of the corresponding row is placed on the RGB data lines. At the next time interval, another gate line is activated and the RGB data for the pixels of that row is placed on the RGB data lines. For 1080 rows and a refresh rate of 60 Hz, each row is activated for about 15 microseconds each time it is activated, which is 60 times per second. When the sub-pixels of a row are not activated, the liquid crystal layer holds at least some of the charge to keep an orientation of the liquid crystals.

Figure 9C:
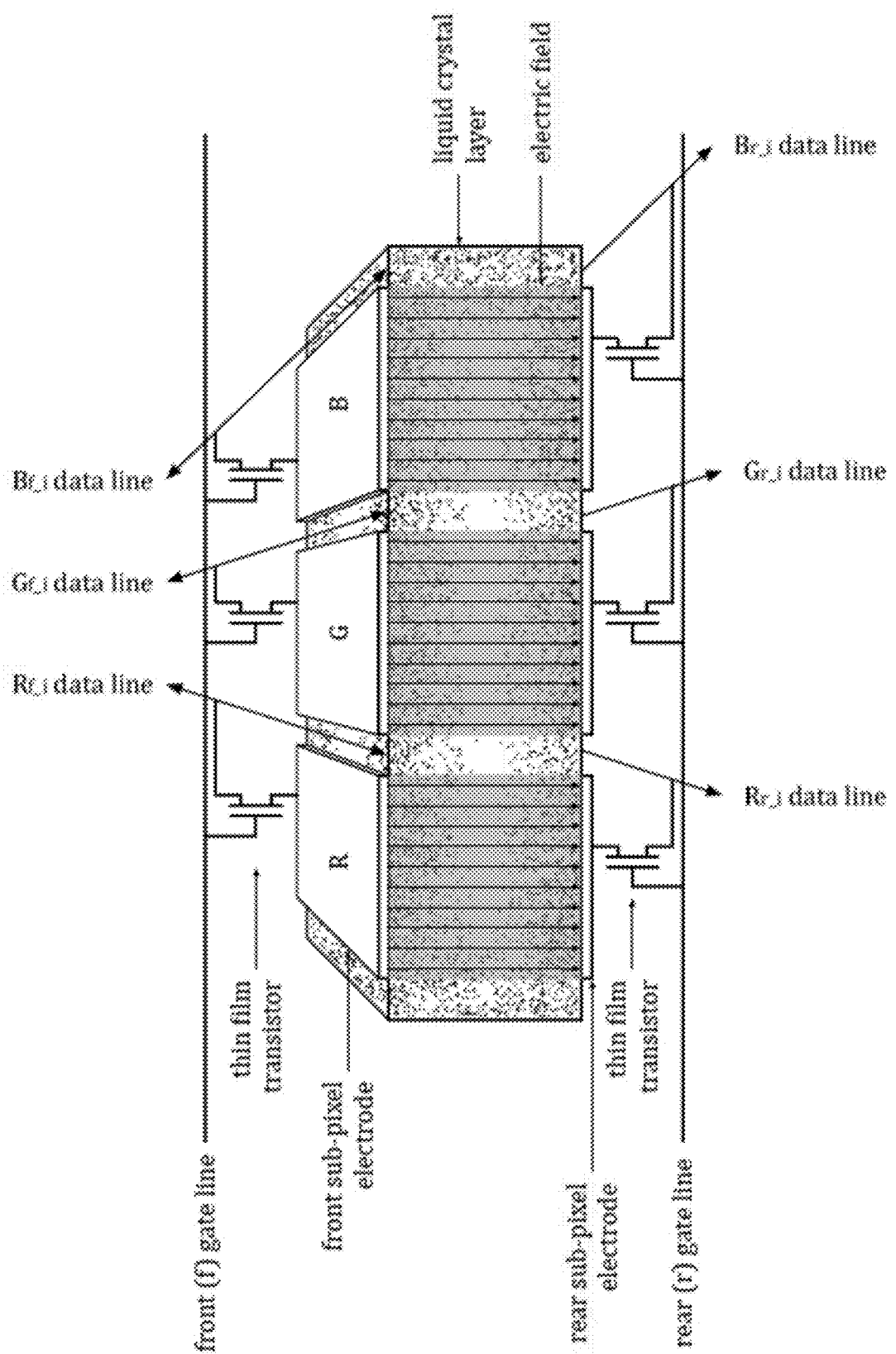
FIG. 9C is a schematic block diagram of an example of a pixel with three sub-pixels in accordance with the present disclosure.

FIG. 9C is a schematic block diagram of an example of a pixel with three sub-pixels (R-red, G-green, and B-blue). In this example, the front sub-pixel electrodes are formed in the front transparent conductor layer 97 and the rear sub-pixel electrodes are formed in the rear transparent conductor layer 101. Each front and rear sub-pixel electrode is coupled to a corresponding thin film transistor. The thin film transistors coupled to the top sub-pixel electrodes are coupled to a front (f) gate line and to front R, G, and B data lines. The thin film transistors coupled to the bottom sub-pixel electrodes are coupled to a rear (f) gate line and to rear R, G, and B data lines.

To create an electric field between related sub-pixel electrodes, a differential gate signal is applied to the front and rear gate lines and differential R, G, and B data signals are applied to the front and rear R, G, and B data lines. For example, for the red (R) sub-pixel, the thin film transistors are activated by the signal on the gate lines. The electric field created by the red sub-pixel electrodes is depending on the front and rear Red data signals. As a specific example, a large differential voltage creates a large electric field, which twists the light towards maximum light passing and increases the red component of the pixel.

The gate lines and data lines are non-transparent wires (e.g., copper) that are positioned between the sub-pixel electrodes such that they are hidden from human sight. The non-transparent wires may be on the same layer as the sub-pixel electrodes or on different layers and coupled using vias.

Figure 9D:
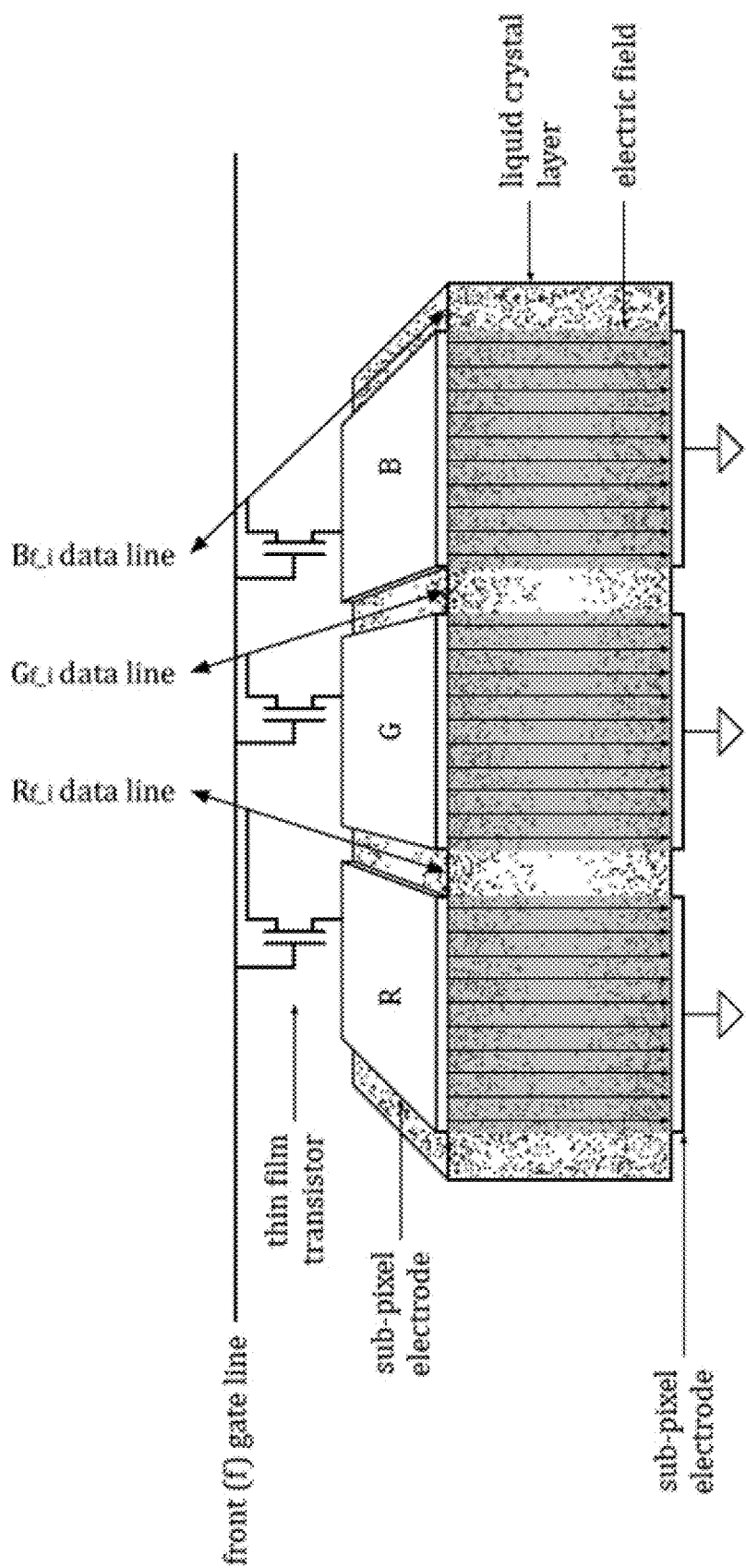
FIG. 9D is a schematic block diagram of another example of a pixel with three sub-pixels in accordance with the present disclosure.

FIG. 9D is a schematic block diagram of another example of a pixel with three sub-pixels (R-red, G-green, and B-blue). In this example, the front sub-pixel electrodes are formed in the front transparent conductor layer 97 and the rear sub-pixel electrodes are formed in the rear transparent conductor layer 101. Each front sub-pixel electrode is coupled to a corresponding thin film transistor. The thin film transistors coupled to the top sub-pixel electrodes are coupled to a front (f) gate line and to front R, G, and B data lines. Each rear sub-pixel electrode is coupled to a common voltage reference (e.g., ground, which may be a common ground plane or a segmented common ground plane (e.g., separate ground planes coupled together to form a common ground plane)).

To create an electric field between related sub-pixel electrodes, a single-ended gate signal is applied to the front gate lines and a single-ended R, G, and B data signals are applied to the front R, G, and B data lines. For example, for the red (R) sub-pixel, the thin film transistors are activated by the signal on the gate lines. The electric field created by the red sub-pixel electrodes is depending on the front Red data signals.

Figure 9E:
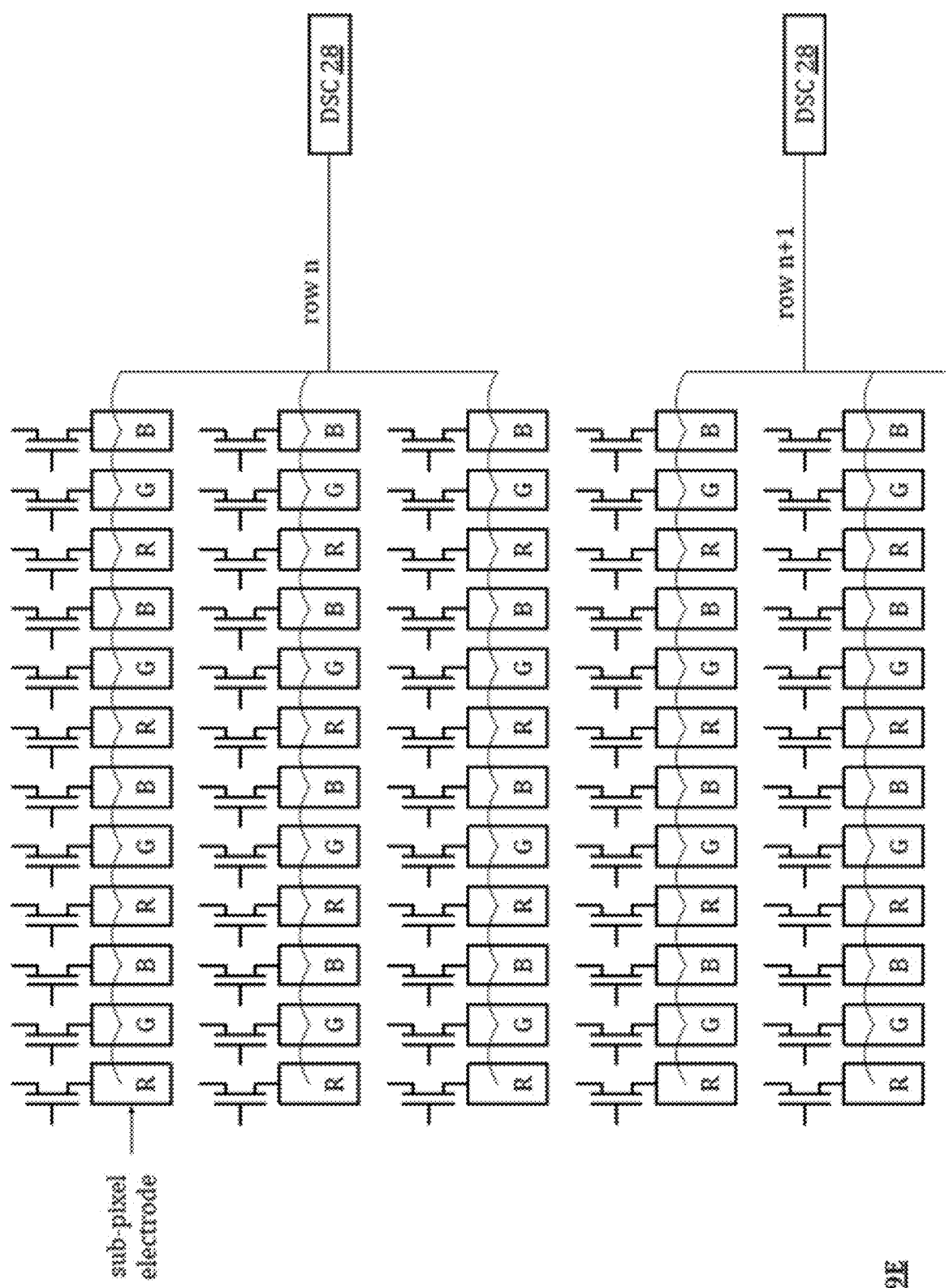
FIG. 9E is a schematic block diagram of an example of sub-pixel electrodes coupled together to form row electrodes of a touch screen sensor in accordance with the present disclosure.

FIG. 9E is a schematic block diagram of an example of sub-pixel electrodes of the front or back electrode layer 97 or 101 coupled together to form row electrodes of a touch screen sensor. In this example, 3 rows of sub-pixel electrodes are coupled together by conductors (e.g., wires, metal traces, vias, etc.) to form one row electrode, which is coupled to a drive sense circuit (DSC) 28. More or less rows of sub-pixel electrodes may be coupled together to form a row electrode.

Figure 9F:
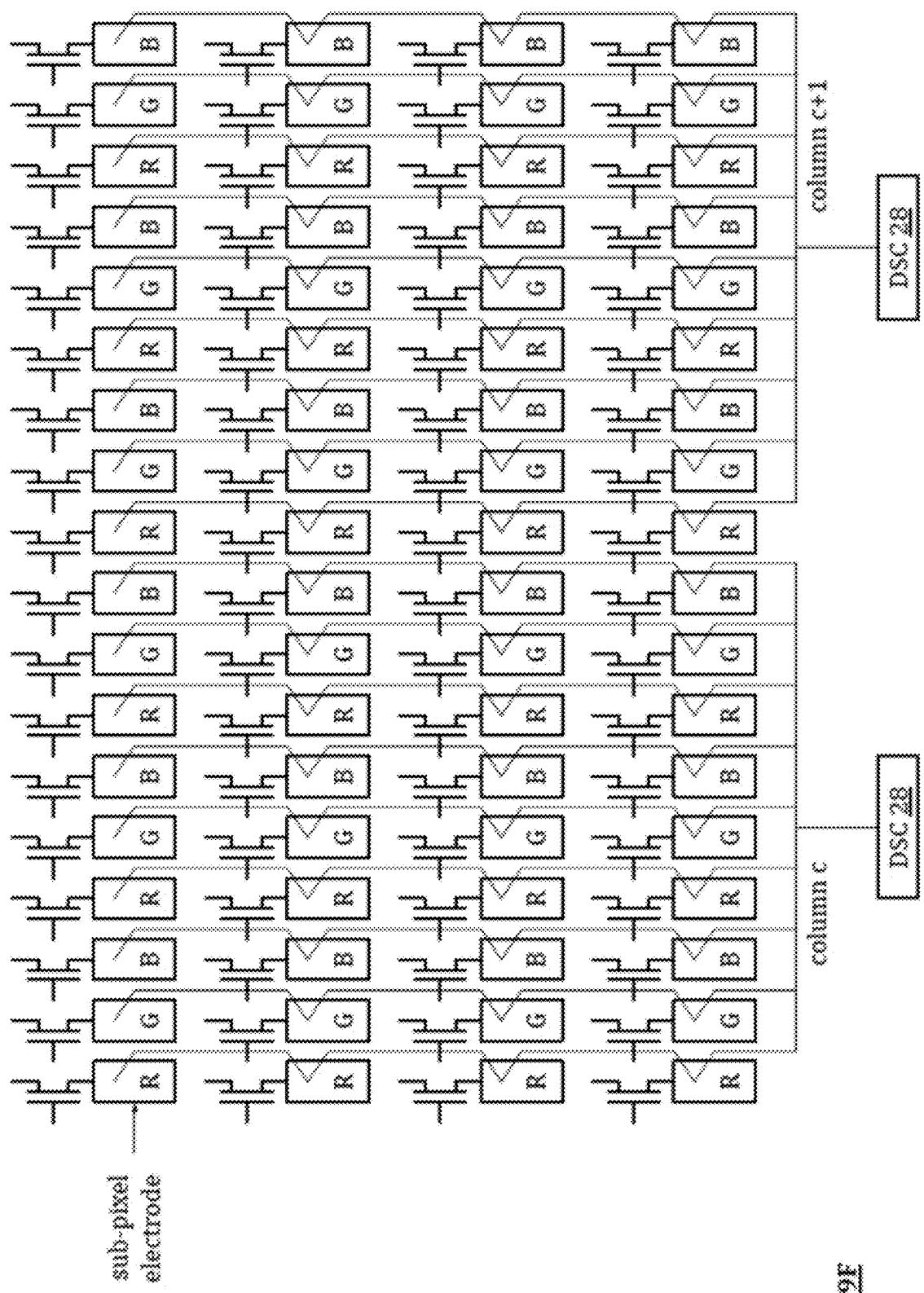
FIG. 9F is a schematic block diagram of an example of sub-pixel electrodes coupled together to form column electrodes of a touch screen sensor in accordance with the present disclosure.

FIG. 9F is a schematic block diagram of an example of sub-pixel electrodes front or back electrode layer 97 or 101 coupled together to form column electrodes of a touch screen sensor. In this example, 9 columns of sub-pixel electrodes are coupled together by conductors (e.g., wires, metal traces, vias, etc.) to form one column electrode, which is coupled to a drive sense circuit (DSC) 28. More or less columns of sub-pixel electrodes may be coupled together to form a column electrode.

With respect to FIGS. 9E and 9F, the row electrodes may be formed on one of the transparent conductor layers 97 or 101 and the column electrodes are formed on the other. In this instance, differential signaling is used for display functionality of sub-pixel electrodes and a common mode voltage is used for touch sensing on the row and column electrodes. This allows for concurrent display and touch sensing operations with negligible adverse effect on display operation.

FIG. 9G is a schematic block diagram of an example of sub-pixel electrodes coupled together to form row electrodes and column electrodes of a touch screen sensor on one of the transparent conductive layers 97 or 101. In this example, 5×5 sub-pixel electrodes are coupled together to form a square (or diamond, depending on orientation), or other geometric shape. The 5 by 5 squares are then cross coupled together to form a row electrode or a column electrode.

In this example, white sub-pixel sub-electrodes with a grey background are grouped to form a row electrode for touch sensing and the grey sub-pixels with the white background are grouped to form a column electrode. Each row electrode and column electrode is coupled to a drive sense circuit (DSC) 28. As shown, the row and column electrodes for touch sensing are diagonal. Note that the geometric shape of the row and column electrodes may be of a different configuration (e.g., zig-zag pattern, lines, etc.) and that the number of sub-pixel electrodes per square (or other shape) may include more or less than 25.

FIG. 9H is a schematic block diagram of an example of a segmented common ground plane forming row electrodes and column electrodes of a touch screen sensor on the rear transparent conductive layer 101. In this instance, each square (or other shape) corresponds to a segment of a common ground plane that services a group of sub-pixel electrodes on the front transparent layer 97. The squares (or other shape) are coupled together to form row electrodes and column electrodes. The white segmented common ground planes are coupled together to form column electrodes and the grey segmented common ground planes are coupled together to form row electrodes. By implementing the on-cell touch screen row and column electrodes in the common ground plane, display and touch sense functionalities may be concurrently executed with negligible adverse effects on the display functionality.

Figure 9I:
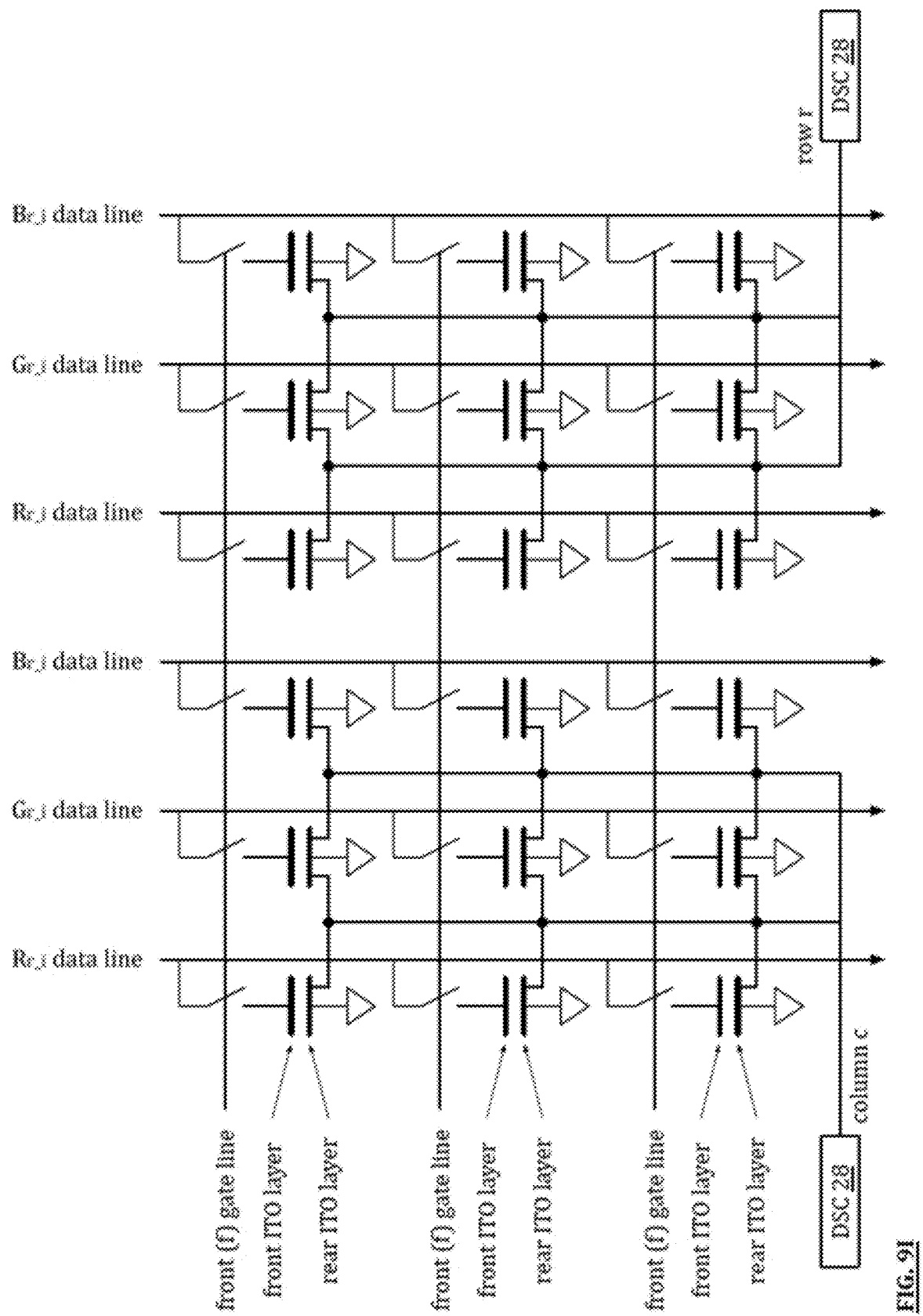
FIG. 9I is a schematic block diagram of another example of sub-pixel electrodes coupled together to form row and column electrodes of a touch screen sensor in accordance with the present disclosure.
Figure 9I:
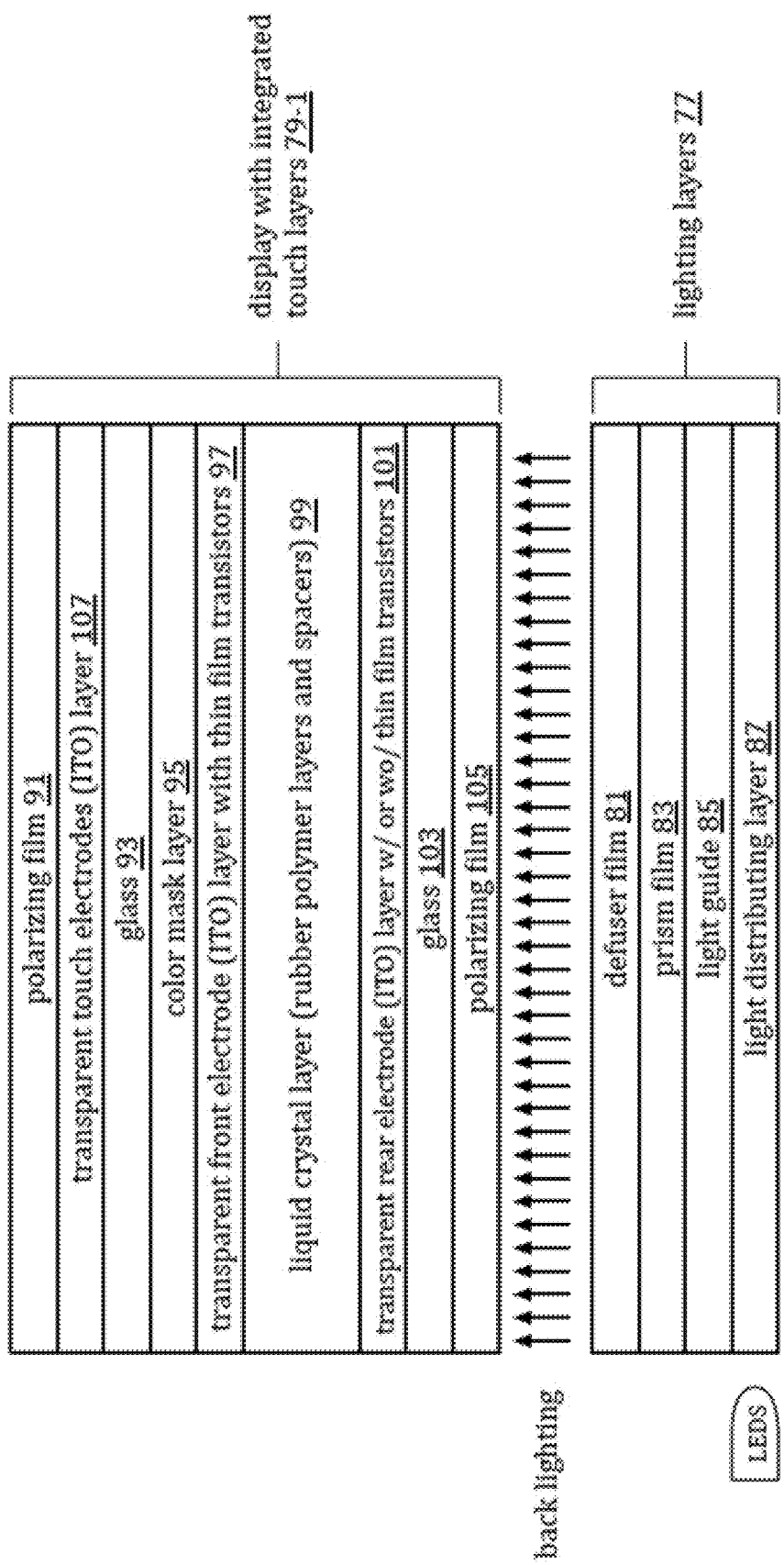

FIG. 9I is a schematic block diagram of another example of sub-pixel electrodes coupled together to form row and column electrodes of a touch screen sensor. In this example, a sub-pixel is represented as a capacitor, with the top plate being implemented in the front ITO layer 97 and the bottom plate being implemented in the back ITO layer 101, which is implemented as a common ground plan. The thin film transistors are represented as switches. In this example, 3×3 sub-pixel electrodes on the rear ITO layer are coupled together to form a portion of a row electrode for touch sensing or a column electrode for touch sensing. With each of the drive sense circuits 28 injecting a common signal for self-capacitance sensing, the common signal has negligible adverse effects on the display operation of the sub-pixels.

FIG. 9J is a cross section schematic block diagram of an example of a touch screen display 83-1 with on-cell touch sensors, which includes lighting layers 77 and display with integrated touch sensing layers 79. The lighting layers 77 include a light distributing layer 87, a light guide layer 85, a prism film layer 83, and a defusing film layer 81. The display with integrated touch sensing layers 79 include a rear polarizing film layer 105, a glass layer 103, a rear transparent electrode layer with thin film transistors 101 (which may be two or more separate layers), a liquid crystal layer (e.g., a rubber polymer layer with spacers) 99, a front electrode layer with thin film transistors 97, a color mask layer 95, a glass layer 93, a transparent touch layer 107, and a front polarizing film layer 91. Note that one or more protective layers may be applied over the polarizing film layer 91.

The lighting layer 77 and the display with integrated touch sensing layer 79-1 function as described with reference to FIG. 9A for generating a display. A difference lies in how on-cell touch sensing of this embodiment in comparison to the in-cell touch sensing of FIG. 9A. In particular, this embodiment includes an extra transparent conductive layer 107 to provide, or assist, with capacitive-based touch sensing. For example, the extra transparent conductive layer 107 includes row and column electrodes as shown in FIG. 9H. As another example, the extra transparent conductive layer 107 includes row electrodes or column electrodes and another one of the conductive layers 97 or 101 includes the other electrodes (e.g., column electrodes if the extra transparent layer includes row electrodes).

FIG. 10A is a cross section schematic block diagram of a touch screen display 80 without a touch of a finger or a pen. The cross section is taken parallel to a column electrode 85-$c$ and a perpendicular to a row electrode 85-$r$. The column electrode 85-$c$ is positioned between two dielectric layers 140 and 142. Alternatively, the column electrode 85-$c$ is in the second dielectric layer 142. The row electrode 85-$r$ is positioned in the second dielectric layer 142. Alternatively, the row electrode 85-$r$ is positioned between the dielectric layer 142 and the display substrate 144. As another alternative, the row and column electrodes are in the same layer. In one or more embodiments, the row and column electrodes are formed as discussed in one or more of FIGS. 9A-9J.

Each electrode 85 has a self-capacitance, which corresponds to a parasitic capacitance created by the electrode with respect to other conductors in the display (e.g., ground, conductive layer(s), and/or one or more other electrodes). For example, row electrode 85-$r$ has a parasitic capacitance $C_{p2}$ and column electrode 85-$c$ has a parasitic capacitance $C_{p1}$. Note that each electrode includes a resistance component and, as such, produces a distributed R-C circuit. The longer the electrode, the greater the impedance of the distributed R-C circuit. For simplicity of illustration the distributed R-C circuit of an electrode will be represented as a single parasitic capacitance.

As shown, the touch screen display 80 includes a plurality of layers 140-144. Each illustrated layer may itself include one or more layers. For example, dielectric layer 140 includes a surface protective film, a glass protective film, and/or one or more pressure sensitive adhesive (PSA) layers. As another example, the second dielectric layer 142 includes a glass cover, a polyester (PET) film, a support plate (glass or plastic) to support, or embed, one or more of the electrodes 85-$c$ and 85-$r$, a base plate (glass, plastic, or PET), and one or more PSA layers. As yet another example, the display substrate 144 includes one or more LCD layers, a back-light layer, one or more reflector layers, one or more polarizing layers, and/or one or more PSA layers.

FIG. 10B is a cross section schematic block diagram of a touch screen display 80, which is the same as in FIG. 9. This figure further includes a finger touch, which changes the self-capacitance of the electrodes. In essence, a finger touch creates a parallel capacitance with the parasitic self-capacitances. For example, the self-capacitance of the column electrode 85-$c$ is $C_{p1}$ (parasitic capacitance)+$C_{f1}$ (finger capacitance) and the self-capacitance of the row electrode 85-$r$ is $C_{p2}$+$C_{f2}$. As such, the finger capacitance increases the self-capacitance of the electrodes, which decreases the impedance for a given frequency. The change in impedance of the self-capacitance is detectable by a corresponding drive sense circuit and is subsequently processed to indicate a screen touch.

Figure 11:
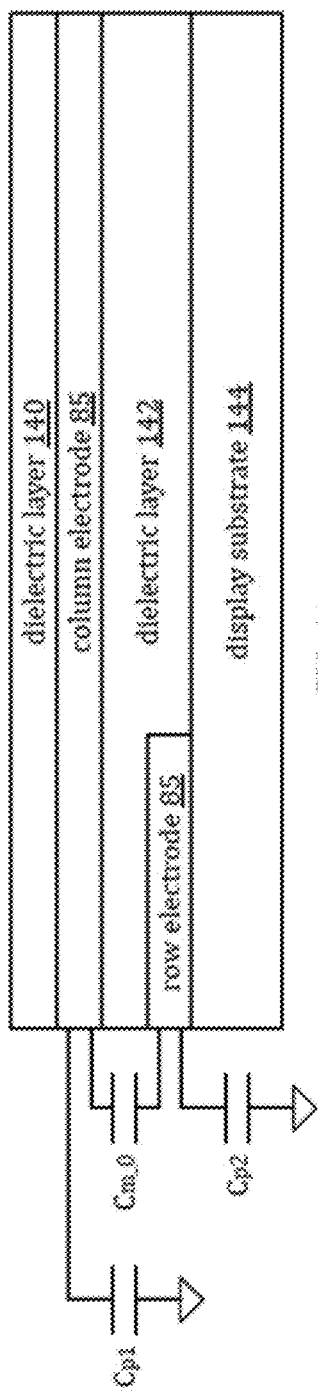
FIG. 11 is a cross section schematic block diagram of an example of self-capacitance and mutual capacitance with no-touch on a touch screen display in accordance with the present disclosure.

FIG. 11 is a cross section schematic block diagram of a touch screen display 80, which is the same as in FIG. 9. This figure further includes a mutual capacitance ($C_{m\_0}$) between the electrodes when a touch is not present.

Figure 12:
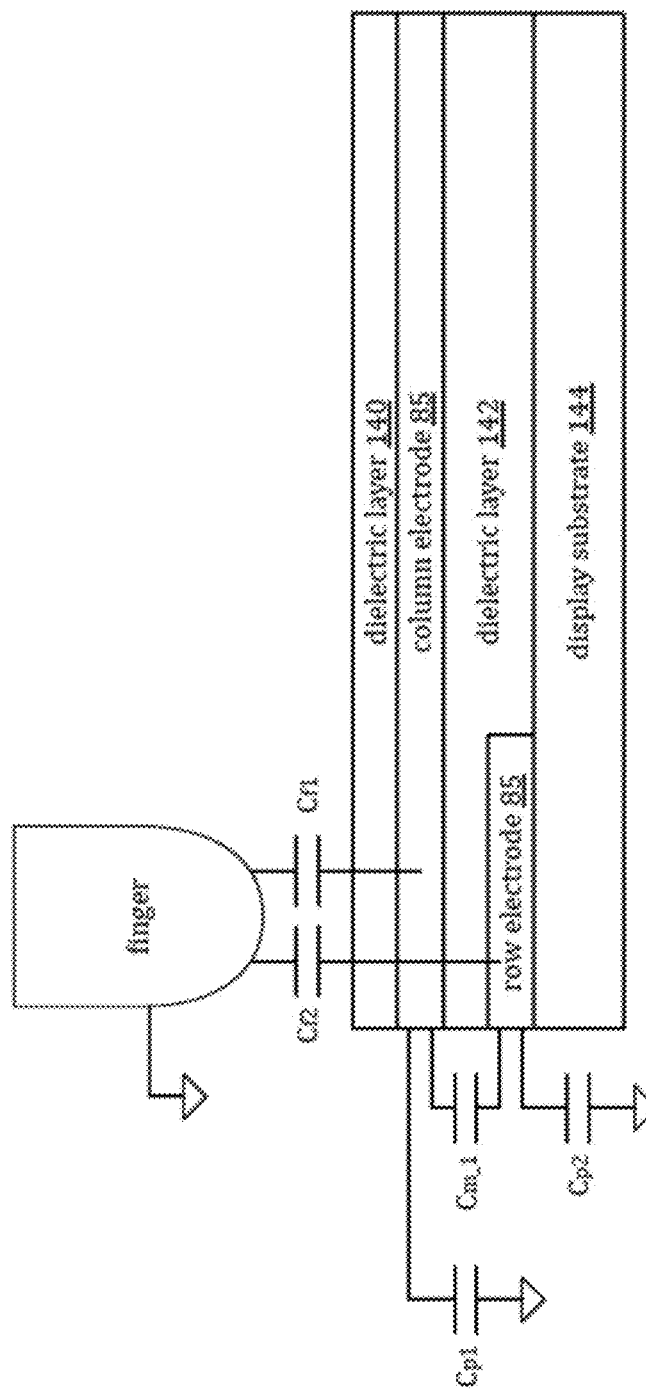
FIG. 12 is a cross section schematic block diagram of an example of self-capacitance and mutual capacitance with a touch on a touch screen display in accordance with the present disclosure.

FIG. 12 is a cross section schematic block diagram of a touch screen display 80, which is the same as in FIG. 9. This figure further includes a mutual capacitance ($C_{m\_1}$) between the electrodes when a touch is present. In this example, the finger capacitance is effectively in series with the mutual capacitance, which decreasing capacitance of the mutual capacitance. As the capacitance decreases for a given frequency, the impedance increases. The change in impedance of the mutual-capacitance is detectable by a corresponding drive sense circuit and is subsequently processed to indicate a screen touch. Note that, depending on the various properties (e.g., thicknesses, dielectric constants, electrode sizes, electrode spacing, etc.) of the touch screen display, the parasitic capacitances, the mutual capacitances, and/or the finger capacitance are in the range of a few pico-Farads to tens of nano-Farads. In equation form, the capacitance (C) equals:

$$C = \epsilon \frac{A}{d}$$

where A is plate area, $\epsilon$ is the dielectric constant(s), and d is the distance between the plates.

FIG. 13 is an example graph that plots condition verses capacitance for an electrode of a touch screen display. As shown, the mutual capacitance decreases with a touch and the self-capacitance increases with a touch. Note that the mutual capacitance and self-capacitance for a no-touch condition are shown to be about the same. This is done merely for ease of illustration. In practice, the mutual capacitance and self-capacitance may or may not be about the same capacitance based on the various properties of the touch screen display discussed above.

FIG. 14 is an example graph that plots impedance verses frequency for an electrode of a touch screen display. Since the impedance of an electrode is primarily based on its capacitance (self and/or mutual), as the frequency increases for a fixed capacitance, the impedance decreases based on $\frac{1}{2\pi f C}$, where f is the frequency and C is the capacitance.

FIG. 15 is a time domain example graph that plots magnitude verses time for an analog reference signal 122. As discussed with reference to FIG. 8, the analog reference signal 122 (e.g., a current signal or a voltage signal) is inputted to a comparator and is compared to the sensor signal 116. The feedback loop of the drive sense circuit 28 functions to keep the senor signal 116 substantially matching the analog reference signal 122. As such, the sensor signal 116 will have a similar waveform to that of the analog reference signal 122.

In an example, the analog reference signal 122 includes a DC component 121 and/or one or more oscillating components 123. The DC component 121 is a DC voltage in the range of a few hundred milli-volts to tens of volts or more. The oscillating component 123 includes a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component).

In another example, the frequency of the oscillating component 123 may vary so that it can be tuned to the impedance of the sensor and/or to be off-set in frequency from other sensor signals in a system. For example, a capacitance sensor's impedance decreases with frequency. As such, if the frequency of the oscillating component is too high with respect to the capacitance, the capacitor looks like a short and variances in capacitances will be missed. Similarly, if the frequency of the oscillating component is too low with respect to the capacitance, the capacitor looks like an open and variances in capacitances will be missed.

FIG. 16 is a frequency domain example graph that plots magnitude verses frequency for an analog reference signal 122. As shown, the analog reference signal 122 includes the DC component 121 at DC (e.g., 0 Hz or near 0 Hz), a first oscillating component 123-1 at a first frequency ($f_1$), and a second oscillating component 123-2 at a second frequency ($f_2$). In an example, the DC component is used to measure resistance of an electrode (if desired), the first oscillating component 123-1 is used to measure the impedance of self-capacitance, and the second oscillating component 123-2 is used to measure the impedance of mutual-capacitance. Note that the second frequency may be greater than the first frequency.

Figure 17:
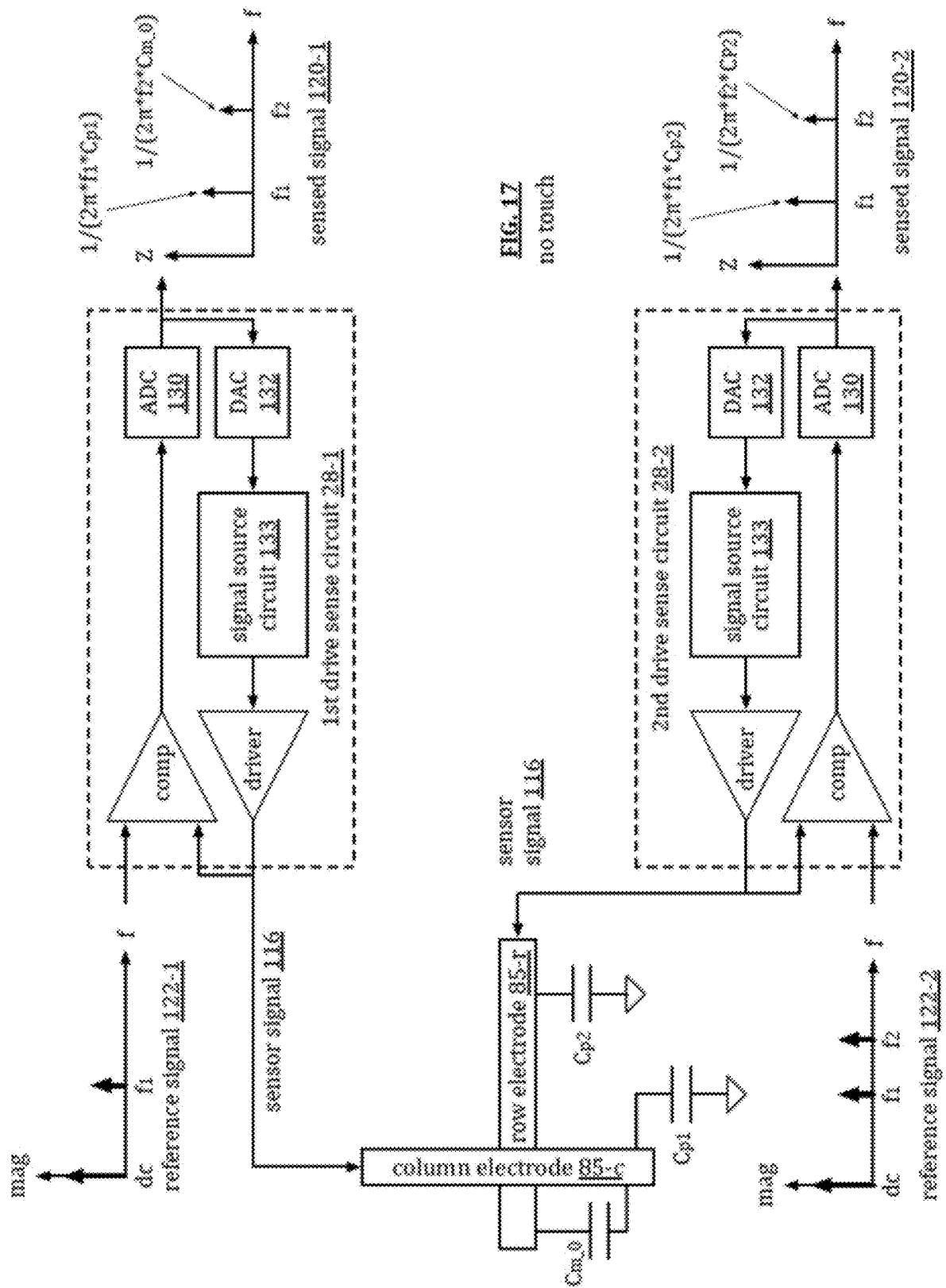
FIG. 17 is a schematic block diagram of an example of a first drive sense circuit coupled to a first electrode and a second drive sense circuit coupled to a second electrode without a touch proximal to the electrodes in accordance with the present disclosure.

FIG. 17 is a schematic block diagram of an example of a first drive sense circuit 28-1 coupled to a first electrode 85-$c$ and a second drive sense circuit 28-2 coupled to a second electrode 85-$r$ without a touch proximal to the electrodes. Each of the drive sense circuits include a comparator, an analog to digital converter (ADC) 130, a digital to analog converter (DAC) 132, a signal source circuit 133, and a driver. The functionality of this embodiment of a drive sense circuit was described with reference to FIG. 8. For additional embodiments of a drive sense circuit see pending patent application entitled, "Drive Sense Circuit with Drive-Sense Line" having a filing date of Aug. 27, 2018, and an application number of Ser. No. 16/113,379.

As an example, a first reference signal 122-1 (e.g., analog or digital) is provided to the first drive sense circuit 28-1 and a second reference signal 122-2 (e.g., analog or digital) is provided to the second drive sense circuit 28-2. The first reference signal includes a DC component and/or an oscillating at frequency $f_1$. The second reference signal includes a DC component and/or two oscillating components: the first at frequency $f_1$ and the second at frequency $f_2$.

The first drive sense circuit 28-1 generates a sensor signal 116 based on the reference signal 122-1 and provides the sensor signal to the column electrode 85-$c$. The second drive sense circuit generates another sensor signal 116 based on the reference signal 122-2 and provides the sensor signal to the column electrode.

In response to the sensor signals being applied to the electrodes, the first drive sense circuit 28-1 generates a first sensed signal 120-1, which includes a component at frequency $f_1$ and a component a frequency $f_2$. The component at frequency $f_1$ corresponds to the self-capacitance of the column electrode 85-$c$ and the component a frequency $f_2$ corresponds to the mutual capacitance between the row and column electrodes 85-$c$ and 85-$r$. The self-capacitance is expressed as $1/(2\pi f_1 C_{p1})$ and the mutual capacitance is expressed as $1/(2\pi f_2 C_{m\_0})$.

Also, in response to the sensor signals being applied to the electrodes, the second drive sense circuit 28-1 generates a second sensed signal 120-2, which includes a component at frequency $f_1$ and a component a frequency $f_2$. The component at frequency $f_1$ corresponds to a shielded self-capacitance of the row electrode 85-$r$ and the component a frequency $f_2$ corresponds to an unshielded self-capacitance of the row electrode 85-$r$. The shielded self-capacitance of the row electrode is expressed as $1/(2\pi f_1 C_{p2})$ and the unshielded self-capacitance of the row electrode is expressed as $1/(2\pi f_2 C_{p2})$.

With each active drive sense circuit using the same frequency for self-capacitance (e.g., $f_1$), the row and column electrodes are at the same potential, which substantially eliminates cross-coupling between the electrodes. This provides a shielded (i.e., low noise) self-capacitance measurement for the active drive sense circuits. In this example, with the second drive sense circuit transmitting the second frequency component, it has a second frequency component in its sensed signal, but is primarily based on the row electrode's self-capacitance with some cross coupling from other electrodes carrying signals at different frequencies. The cross coupling of signals at other frequencies injects unwanted noise into this self-capacitance measurement and hence it is referred to as unshielded.

FIG. 18 is a schematic block diagram of an example of a first drive sense circuit 28-1 coupled to a first electrode 85-$c$ and a second drive sense circuit 28-2 coupled to a second electrode 85-$r$ with a finger touch proximal to the electrodes. This example is similar to the one of FIG. 17 with the difference being a finger touch proximal to the electrodes (e.g., a touch that shadows the intersection of the electrodes or is physically close to the intersection of the electrodes). With the finger touch, the self-capacitance and the mutual capacitance of the electrodes are changed.

In this example, the impedance of the self-capacitance at $f_1$ of the column electrode 85-$c$ now includes the effect of the finger capacitance. As such, the impedance of the self-capacitance of the column electrode equals $1/(2\pi f_1 *(C_{p1}+C_{f1}))$, which is included the sensed signal 120-1. The second frequency component at $f_2$ corresponds to the impedance of the mutual-capacitance at $f_2$, which includes the effect of the finger capacitance. As such, the impedance of the mutual capacitance equals $1/(2\pi f_2 C_{m\_1})$, where $C_{m\_1}=(C_{m\_0}*C_{f1})/(C_{m\_0}+C_{f1})$.

Continuing with this example, the first frequency component at $f_1$ of the second sensed signal 120-2 corresponds to the impedance of the shielded self-capacitance of the row electrode 85-$r$ at $f_1$, which is effected by the finger capacitance. As such, the impedance of the capacitance of the row electrode 85-$r$ equals $1/(2\pi f_1 *(C_{p2}+C_{f2}))$. The second frequency component at $f_2$ of the second sensed signal 120-2 corresponds to the impedance of the unshielded self-capacitance at $f_2$, which includes the effect of the finger capacitance and is equal to $1/(2\pi f_2 *(C_{p2}+C_{f2}))$.

Figure 19:
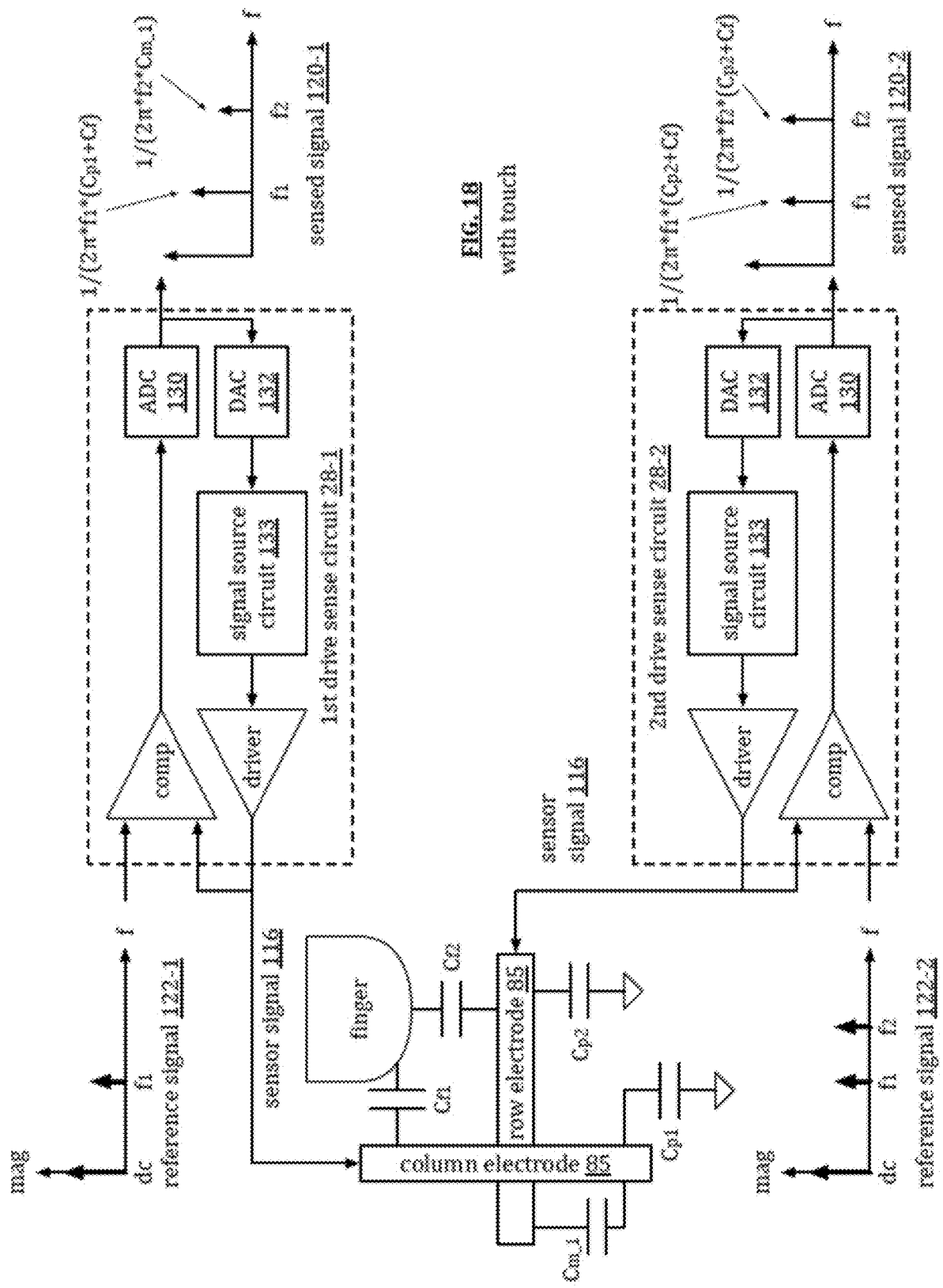
FIG. 19 is a schematic block diagram of an example of a first drive sense circuit coupled to a first electrode and a second drive sense circuit coupled to a second electrode with a pen touch proximal to the electrodes in accordance with the present disclosure.

FIG. 19 is a schematic block diagram of an example of a first drive sense circuit 28-1 coupled to a first electrode 85-$c$ and a second drive sense circuit 28-2 coupled to a second electrode 85-$r$ with a pen touch proximal to the electrodes. This example is similar to the one of FIG. 17 with the difference being a pen touch proximal to the electrodes (e.g., a touch that shadows the intersection of the electrodes or is physically close to the intersection of the electrodes). With the pen touch, the self-capacitance and the mutual capacitance of the electrodes are changed based on the capacitance of the pen $C_{pen1}$ and $C_{pen2}$.

In this example, the impedance of the self-capacitance at $f_1$ of the column electrode 85-c now includes the effect of the pen's capacitance. As such, the impedance of the self-capacitance of the column electrode equals $1/(2\pi f_1*(C_{p1}+C_{pen1}))$, which is included the sensed signal 120-1. The second frequency component at $f_2$ corresponds to the impedance of the mutual-capacitance at $f_2$, which includes the effect of the pen capacitance. As such, the impedance of the mutual capacitance equals $1/(2\pi f_2 C_{m\_2})$, where $C_{m\_2} = (C_{m\_0}*C_{pen2})/(C_{m\_0}+C_{pen1})$.

Continuing with this example, the first frequency component at $f_1$ of the second sensed signal 120-2 corresponds to the impedance of the shielded self-capacitance of the row electrode 85-r at $f_3$, which is effected by the pen capacitance. As such, the impedance of the shielded self-capacitance of the row electrode 85-r equals $1/(2\pi f_1*(C_{p2}+C_{pen2}))$. The second frequency component at $f_2$ of the second sensed signal 120-2 corresponds to the impedance of the unshielded self-capacitance at $f_2$, which includes the effect of the pen capacitance and is equal to $1/(2\pi f_2*(C_{p2}+C_{pen1}))$. Note that the pen capacitance is represented as two capacitances, but may be one capacitance value or a plurality of distributed capacitance values.

Figure 20:
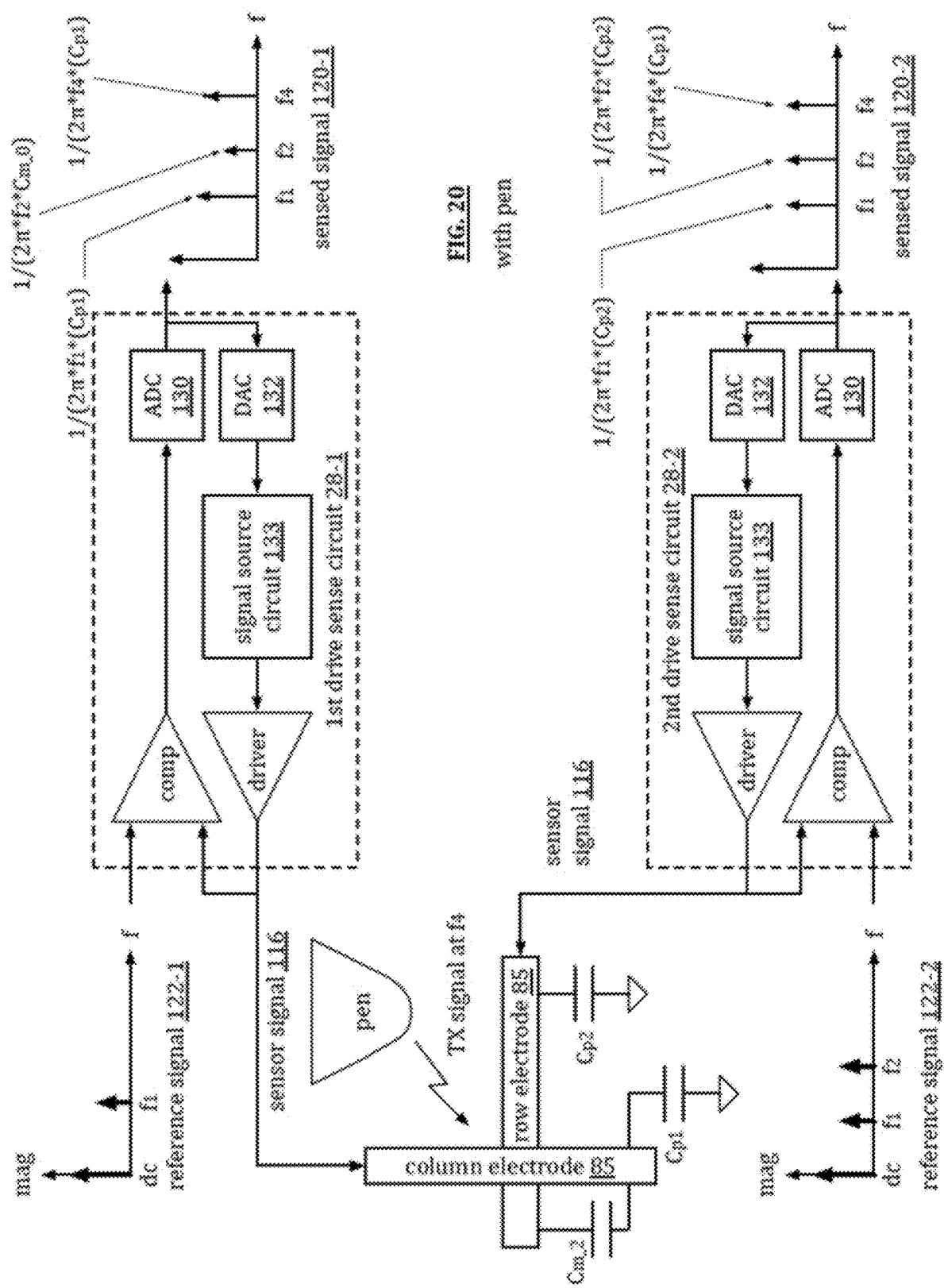
FIG. 20 is a schematic block diagram of another example of a first drive sense circuit coupled to a first electrode and a second drive sense circuit coupled to a second electrode with a pen touch proximal to the electrodes in accordance with the present disclosure.

FIG. 20 is a schematic block diagram of an example of a first drive sense circuit 28-1 coupled to a first electrode 85-c and a second drive sense circuit 28-2 coupled to a second electrode 85-r with a pen proximal to the electrodes. Each of the drive sense circuits include a comparator, an analog to digital converter (ADC) 130, a digital to analog converter (DAC) 132, a signal source circuit 133, and a driver. The functionality of this embodiment of a drive sense circuit was described with reference to FIG. 8. The pen is operable to transmit a signal at a frequency of $f_4$, which affects the self and mutual capacitances of the electrodes 85.

In this example, a first reference signal 122-1 is provided to the first drive sense circuit 28-1. The first reference signal includes a DC component and/or an oscillating component at frequency $f_1$. The first oscillating component at $f_1$ is use to sense impedance of the self-capacitance of the column electrode 85-c. The first drive sense circuit 28-1 generates a first sensed signal 120-1 that includes three frequency dependent components. The first frequency component at $f_1$ corresponds to the impedance of the self-capacitance at $f_1$, which equals $1/(2\pi f_1 C_{p1})$. The second frequency component at $f_2$ corresponds to the impedance of the mutual-capacitance at $f_2$, which equals $1/(2\pi f_2 C_{m\_0})$. The third frequency component at $f_4$ corresponds to the signal transmitted by the pen.

Continuing with this example, a second reference signal 122-2 is provided to the second drive sense circuit 28-2. The second analog reference signal includes a DC component and/or two oscillating components: the first at frequency $f_1$ and the second at frequency $f_2$. The first oscillating component at $f_1$ is use to sense impedance of the shielded self-capacitance of the row electrode 85-r and the second oscillating component at $f_2$ is used to sense the unshielded self-capacitance of the row electrode 85-r. The second drive sense circuit 28-2 generates a second sensed signal 120-2 that includes three frequency dependent components. The first frequency component at $f_1$ corresponds to the impedance of the shielded self-capacitance at $f_3$, which equals $1/(2\pi f_1 C_{p2})$. The second frequency component at $f_2$ corresponds to the impedance of the unshielded self-capacitance at $f_2$, which equals $1/(2\pi f_2 C_{p2})$. The third frequency component at $f_4$ corresponds to signal transmitted by the pen.

As a further example, the pen transmits a sinusoidal signal having a frequency of $f_4$. When the pen is near the surface of the touch screen, electromagnetic properties of the signal increase the voltage on (or current in) the electrodes proximal to the touch of the pen. Since impedance is equal to voltage/current and as a specific example, when the voltage increases for a constant current, the impedance increases. As another specific example, when the current increases for a constant voltage, the impedance increases. The increase in impedance is detectable and is used as an indication of a touch.

Figure 21:
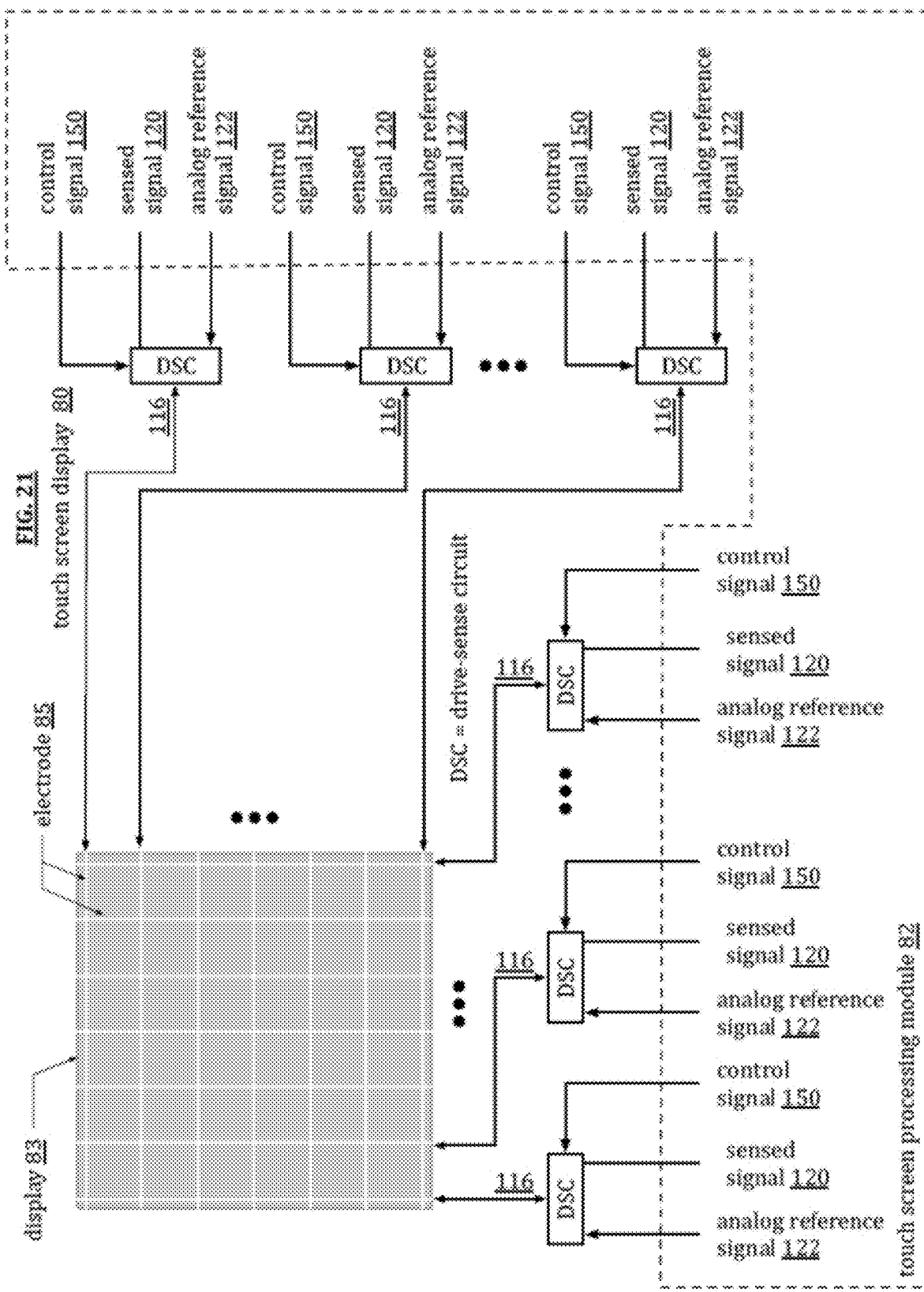
FIG. 21 is a schematic block diagram of another embodiment of a touch screen display in accordance with the present disclosure.

FIG. 21 is a schematic block diagram of another embodiment of a touch screen display 80 that includes the display 83, the electrodes 85, a plurality of drive sense circuits (DSC), and the touch screen processing module 82, which function as previously discussed. In addition, the touch screen processing module 82 generates a plurality of control signals 150 to enable the drive-sense circuits (DSC) to monitor the sensor signals 120 on the electrodes 85. For example, the processing module 82 provides an individual control signal 150 to each of the drive sense circuits to individually enable or disable the drive sense circuits. In an embodiment, the control signal 150 closes a switch to provide power to the drive sense circuit. In another embodiment, the control signal 150 enables one or more components of the drive sense circuit.

The processing module 82 further provides analog reference signals 122 to the drive sense circuits. In an embodiment, each drive sense circuit receives a unique analog reference signal. In another embodiment, a first group of drive sense circuits receive a first analog reference signal and a second group of drive sense circuits receive a second analog reference signal. In yet another embodiment, the drive sense circuits receive the same analog reference signal. Note that the processing module 82 uses a combination of analog reference signals with control signals to ensure that different frequencies are used for oscillating components of the analog reference signal.

The drive sense circuits provide sensed signals 116 to the electrodes. The impedances of the electrodes affect the sensed signal, which the drive sense circuits sense via the received signal component and generate the sensed signal 120 therefrom. The sensed signals 120 are essentially representations of the impedances of the electrodes, which are provided to the touch screen processing module 82.

The processing module 82 interprets the sensed signals 122 (e.g., the representations of impedances of the electrodes) to detect a change in the impedance of one or more electrodes. For example, a finger touch increases the self-capacitance of an electrode, thereby decreasing its impedance at a given frequency. As another example, a finger touch decreases the mutual capacitance of an electrode, thereby increasing its impedance at a given frequency. The processing module 82 then interprets the change in the impedance of one or more electrodes to indicate one or more touches of the touch screen display 80.

Figure 22:
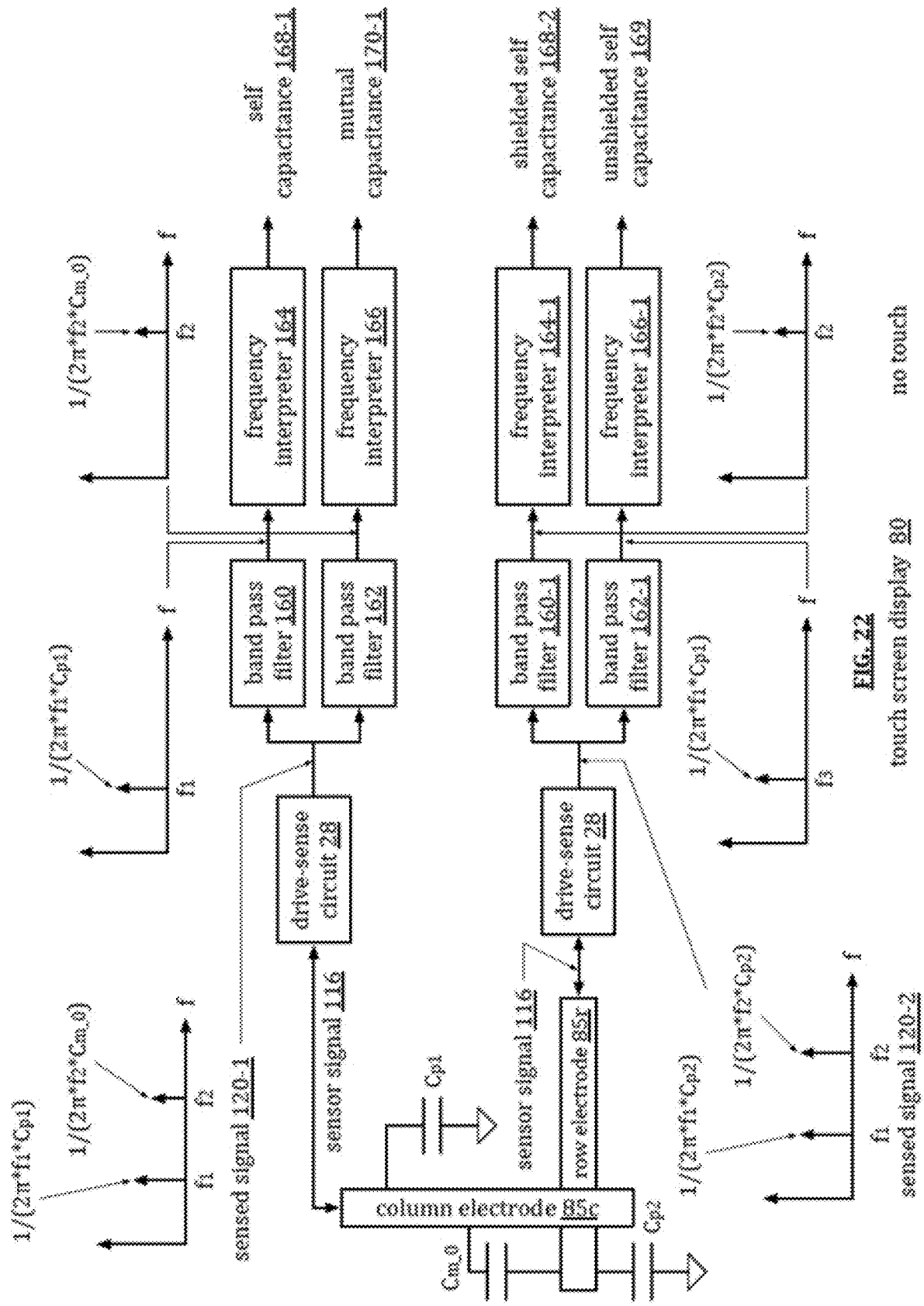
FIG. 22 is a schematic block diagram of a touchless example of a few drive sense circuits and a portion of the touch screen processing module of a touch screen display in accordance with the present disclosure.

FIG. 22 is a schematic block diagram of a touchless example of a few drive sense circuits 28 and a portion of the touch screen processing module 82 of a touch screen display 80. The portion of the processing module 82 includes band pass filters 160, 162, 160-1, & 160-2, self-frequency interpreters 164 & 164-1, and 166 & 166-1. As previously discussed, a first drive sense circuit is coupled to column electrode 85c and a second drive sense circuit is coupled to a row electrode 85r.

The drive sense circuits provide sensor signals 116 to their respective electrodes 85 and produce therefrom respective sensed signals 120. The first sensed signal 120-1 includes a first frequency component at $f_1$ that corresponds to the self-capacitance of the column electrode 85c and a second frequency component at $f_2$ that corresponds to the mutual capacitance of the column electrode 85c. The second sensed signal 120-2 includes a first frequency component at $f_1$ that corresponds to the shielded self-capacitance of the row electrode 85r and/or a second frequency component at $f_2$ that corresponds to the unshielded self-capacitance of the row electrode 85r. In an embodiment, the sensed signals 120 are frequency domain digital signals.

The first bandpass filter 160 passes (i.e., substantially unattenuated) signals in a bandpass region (e.g., tens of Hertz to hundreds of thousands of Hertz, or more) centered about frequency $f_1$ and attenuates signals outside of the bandpass region. As such, the first bandpass filter 160 passes the portion of the sensed signal 120-1 that corresponds to the self-capacitance of the column electrode 85c. In an embodiment, the sensed signal 116 is a digital signal, thus, the first bandpass filter 160 is a digital filter such as a cascaded integrated comb (CIC) filter, a finite impulse response (FIR) filter, an infinite impulse response (IIR) filter, a Butterworth filter, a Chebyshev filter, an elliptic filter, etc.

The frequency interpreter 164 receives the first bandpass filter sensed signal and interprets it to render a self-capacitance value 168-1 for the column electrode. As an example, the frequency interpreter 164 is a processing module, or portion thereof, that executes a function to convert the first bandpass filter sensed signal into the self-capacitance value 168-1, which is an actual capacitance value, a relative capacitance value (e.g., in a range of 0-100), or a difference capacitance value (e.g., is the difference between a default capacitance value and a sensed capacitance value). As another example, the frequency interpreter 164 is a look up table where the first bandpass filter sensed signal is an index for the table.

The second bandpass filter 162 passes, substantially unattenuated, signals in a second bandpass region (e.g., tens of Hertz to hundreds of thousands of Hertz, or more) centered about frequency $f_2$ and attenuates signals outside of the bandpass region. As such, the second bandpass filter 160 passes the portion of the sensed signal 120-1 that corresponds to the mutual-capacitance of the column electrode 85c and the row electrode 85r. In an embodiment, the sensed signal 116 is a digital signal, thus, the second bandpass filter 162 is a digital filter such as a cascaded integrated comb (CIC) filter, a finite impulse response (FIR) filter, an infinite impulse response (IIR) filter, a Butterworth filter, a Chebyshev filter, an elliptic filter, etc.

The frequency interpreter 166 receives the second bandpass filter sensed signal and interprets it to render a mutual-capacitance value 170-1. As an example, the frequency interpreter 166 is a processing module, or portion thereof, that executes a function to convert the second bandpass filter sensed signal into the mutual-capacitance value 170-1, which is an actual capacitance value, a relative capacitance value (e.g., in a range of 0-100), and/or a difference capacitance value (e.g., is the difference between a default capacitance value and a sensed capacitance value). As another example, the frequency interpreter 166 is a look up table where the first bandpass filter sensed signal is an index for the table.

For the row electrode 85r, the drive-sense circuit 28 produces a second sensed signal 120-2, which includes a shielded self-capacitance component and/or an unshielded self-capacitance component. The third bandpass filter 160-1 is similar to the first bandpass filter 160 and, as such passes signals in a bandpass region centered about frequency $f_1$ and attenuates signals outside of the bandpass region. In this example, the third bandpass filter 160-1 passes the portion of the second sensed signal 120-2 that corresponds to the shielded self-capacitance of the row electrode 85r.

The frequency interpreter 164-1 receives the second bandpass filter sensed signal and interprets it to render a second and shielded self-capacitance value 168-2 for the row electrode. The frequency interpreter 164-1 may be implemented similarly to the first frequency interpreter 164 or an integrated portion thereof. In an embodiment, the second self-capacitance value 168-2 is an actual capacitance value, a relative capacitance value (e.g., in a range of 0-100), or a difference capacitance value (e.g., is the difference between a default capacitance value and a sensed capacitance value).

The fourth bandpass filter 162-2, if included, is similar to the second bandpass filter 162. As such, it passes, substantially unattenuated, signals in a bandpass region centered about frequency $f_2$ and attenuates signals outside of the bandpass region. In this example, the fourth bandpass filter 162-2 passes the portion of the second sensed signal 120-2 that corresponds to the unshielded self-capacitance of the row electrode 85r.

The frequency interpreter 166-1, if included, receives the fourth bandpass filter sensed signal and interprets it to render an unshielded self-capacitance value 168-2. The frequency interpreter 166-1 may be implemented similarly to the first frequency interpreter 166 or an integrated portion thereof. In an embodiment, the unshielded self-capacitance value 170-2 is an actual capacitance value, a relative capacitance value (e.g., in a range of 0-100), or a difference capacitance value (e.g., is the difference between a default capacitance value and a sensed capacitance value). Note that the unshielded self-capacitance may be ignored, thus band pass filter 162-1 and frequency interpreter 166-1 may be omitted.

FIG. 23 is a schematic block diagram of a finger touch example of a few drive sense circuits and a portion of the touch screen processing module of a touch screen display that is similar to FIG. 22, with the difference being a finger touch as represented by the finger capacitance Cf. In this example, the self-capacitance and mutual capacitance of each electrode is effected by the finger capacitance.

The effected self-capacitance of the column electrode 85c is processed by the first bandpass filter 160 and the frequency interpreter 164 to produce a self-capacitance value 168-1a. The mutual capacitance of the column electrode 85c and row electrode is processed by the second bandpass filter 162 and the frequency interpreter 166 to produce a mutual-capacitance value 170-1a.

The effected shielded self-capacitance of the row electrode 85r is processed by the third bandpass filter 160-1 and the frequency interpreter 164-1 to produce a self-capacitance value 168-2a. The effected unshielded self-capacitance of the row electrode 85r is processed by the fourth bandpass filter 162-1 and the frequency interpreter 166-1 to produce an unshielded self-capacitance value 170-2a.

FIG. 24 is a schematic block diagram of a pen touch example of a few drive sense circuits and a portion of the touch screen processing module of a touch screen display that is similar to FIG. 22, with the difference being a pen touch as represented by the pen capacitance $C_{pen}$. In this example, the self-capacitance and mutual capacitance of each electrode is effected by the pen capacitance.

The effected self-capacitance of the column electrode 85c is processed by the first bandpass filter 160 and the frequency interpreter 164 to produce a self-capacitance value 168-1a. The effected mutual capacitance of the column electrode 85*c* and row electrode 85*r* is processed by the second bandpass filter 162 and the frequency interpreter 166 to produce a mutual-capacitance value 170-1*a*.

The effected shielded self-capacitance of the row electrode 85*r* is processed by the third bandpass filter 160-1 and the frequency interpreter 164-1 to produce a shielded self-capacitance value 168-2*a*. The effected unshielded self-capacitance of the row electrode 85*r* is processed by the fourth bandpass filter 162-1 and the frequency interpreter 166-1 to produce an unshielded self-capacitance value 170-2*a*.

Figure 25:
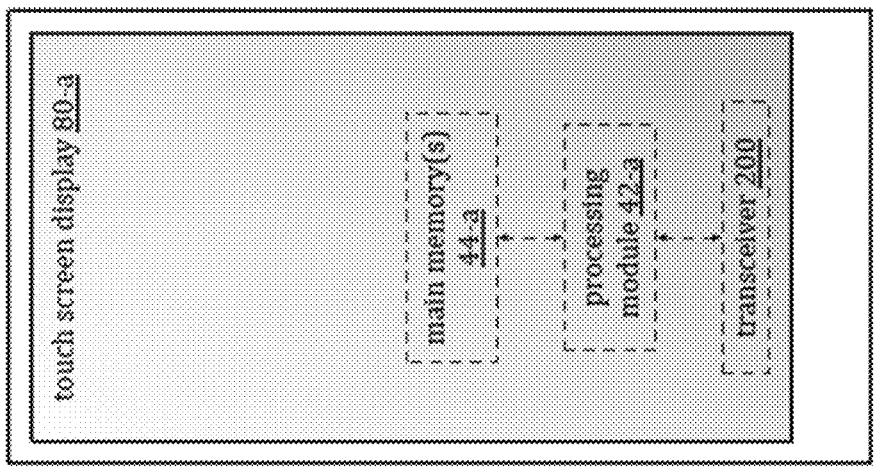
FIG. 25 is a schematic block diagram of an embodiment of a computing device having touch screen display in accordance with the present disclosure.

FIG. 25 is a schematic block diagram of an embodiment of a computing device 14-*a* having touch screen display 80-*a*. The computing device 14-*a* is a cell phone, a personal video device, a tablet, or the like and the touch screen display has a screen size that is equal to or less than 15 inches. The computing device 14-*a* includes a processing module 42-*a*, main memory 44-*a*, and a transceiver 200. An embodiment of the transceiver 200 will be discussed with reference to FIG. 27. The processing module 42-*a* and the main memory 44-*a* are similar to the processing module 42 and the main memory 44 of the computing device 14 of FIG. 2.

Figure 26:
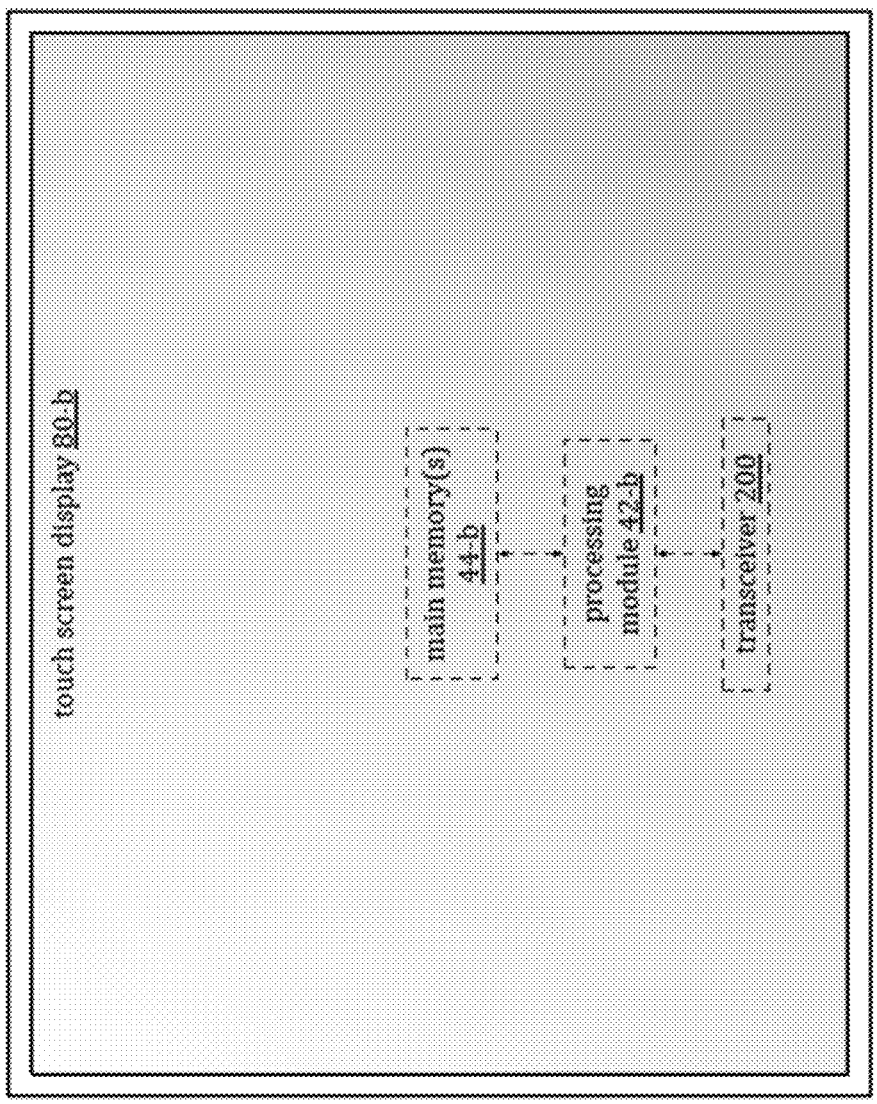
FIG. 26 is a schematic block diagram of another embodiment of a computing device having touch screen display in accordance with the present disclosure.

FIG. 26 is a schematic block diagram of another embodiment of a computing device 14-*b* having touch screen display 80-*b*. The computing device 14-*b* is a computer, an interactive display, a large tablet, or the like and the touch screen display 80-*b* has a screen size that is greater than 15 inches. The computing device 14-*b* includes a processing module 42-*b*, main memory 44-*b*, and a transceiver 200. An embodiment of the transceiver 200 will be discussed with reference to FIG. 27. The processing module 42-*b* and the main memory 44-*b* are similar to the processing module 42 and the main memory 44 of the computing device 14 of FIG. 2.

FIG. 27 is a schematic block diagram of another embodiment of a computing device 14-*a* and/or 14-*b* that includes the processing module 42 (e.g., a and/or b), the main memory 44 (e.g., a and/or b), the touch screen display 80 (e.g., a and/or b), and the transceiver 200. The transceiver 200 includes a transmit/receive switch module 173, a receive filter module 171, a low noise amplifier (LNA) 172, a down conversion module 170, a filter/gain module 168, an analog to digital converter (ADC) 166, a digital to analog converter (DAC) 178, a filter/gain module 170, an up-conversion module 182, a power amplifier (PA) 184, a transmit filter module 185, one or more antennas 186, and a local oscillation module 174. In an alternate embodiment, the transceiver 200 includes a transmit antenna and a receiver antenna (as shown using dashed lines) and omit the common antenna 186 and the transmit/receive (Tx/Rx) switch module 173.

In an example of operation using the common antenna 186, the antenna receives an inbound radio frequency (RF) signal, which is routed to the receive filter module 171 via the Tx/Rx switch module 173 (e.g., a balun, a cross-coupling circuit, etc.). The receive filter module 171 is a bandpass or low pass filter that passes the inbound RF signal to the LNA 172, which amplifies it.

The down conversion module 170 converts the amplified inbound RF signal into a first inbound symbol stream corresponding to a first signal component (e.g., RX 1adj) and into a second inbound symbol stream corresponding to the second signal component (e.g., RX 2adj). In an embodiment, the down conversion module 170 mixes in-phase (I) and quadrature (Q) components of the amplified inbound RF signal (e.g., amplified RX 1adj and RX 2adj) with in-phase and quadrature components of receiver local oscillation 181 to produce a mixed I signal and a mixed Q signal for each component of the amplified inbound RF signal. Each pair of the mixed I and Q signals are combined to produce the first and second inbound symbol streams. In this embodiment, each of the first and second inbound symbol streams includes phase information (e.g., +/−Δθ [phase shift] and/or θ(*t*) [phase modulation]) and/or frequency information (e.g., +/−Δf [frequency shift] and/or f(t) [frequency modulation]). In another embodiment and/or in furtherance of the preceding embodiment, the inbound RF signal includes amplitude information (e.g., +/−ΔA [amplitude shift] and/or A(t) [amplitude modulation]).

The filter/gain module 168 filters the down-converted inbound signal, which is then converted into a digital inbound baseband signal 190 by the ADC 166. The processing module 42 converts the inbound symbol stream(s) into inbound data 192 (e.g., voice, text, audio, video, graphics, etc.) in accordance with one or more wireless communication standards (e.g., GSM, CDMA, WCDMA, HSUPA, HSDPA, WiMAX, EDGE, GPRS, IEEE 802.11, Bluetooth, ZigBee, universal mobile telecommunications system (UMTS), long term evolution (LTE), IEEE 802.16, evolution data optimized (EV-DO), etc.). Such a conversion may include one or more of: digital intermediate frequency to baseband conversion, time to frequency domain conversion, space-time-block decoding, space-frequency-block decoding, demodulation, frequency spread decoding, frequency hopping decoding, beamforming decoding, constellation demapping, deinterleaving, decoding, depuncturing, and/or descrambling. Note that the processing module converts a single inbound symbol stream into the inbound data for Single Input Single Output (SISO) communications and/or for Multiple Input Single Output (MISO) communications and converts the multiple inbound symbol streams into the inbound data for Single Input Multiple Output (SIMO) and Multiple Input Multiple Output (MIMO) communications.

In an example, the inbound data 192 includes display data 202. For example, the inbound RF signal 188 includes streaming video over a wireless link. As such, the inbound data 192 includes the frames of data 87 of the video file, which the processing module 42 provides to the touch screen display 80 for display. The processing module 42 further processes proximal touch data 204 (e.g., finger or pen touches) of the touch screen display 80. For example, a touch corresponds to a command that is to be wirelessly sent to the content provider of the streaming wireless video.

In this example, the processing module interprets the proximal touch data 204 to generate a command (e.g., pause, stop, etc.) regarding the streaming video. The processing module processes the command as outbound data 194 e.g., voice, text, audio, video, graphics, etc.) by converting it into one or more outbound symbol streams (e.g., outbound baseband signal 196) in accordance with one or more wireless communication standards (e.g., GSM, CDMA, WCDMA, HSUPA, HSDPA, WiMAX, EDGE, GPRS, IEEE 802.11, Bluetooth, ZigBee, universal mobile telecommunications system (UMTS), long term evolution (LTE), IEEE 802.16, evolution data optimized (EV-DO), etc.). Such a conversion includes one or more of: scrambling, puncturing, encoding, interleaving, constellation mapping, modulation, frequency spreading, frequency hopping, beamforming, space-time-block encoding, space-frequency-block encoding, frequency to time domain conversion, and/or digital baseband to intermediate frequency conversion. Note that the processing module converts the outbound data into a single outbound symbol stream for Single Input Single Output (SISO) communications and/or for Multiple Input Single Output (MISO) communications and converts the outbound data into multiple outbound symbol streams for Single Input Multiple Output (SIMO) and Multiple Input Multiple Output (MIMO) communications.

The DAC 178 converts the outbound baseband signal 196 into an analog signal, which is filtered by the filter/gain module 180. The up-conversion module 182 mixes the filtered analog outbound baseband signal with a transmit local oscillation 183 to produce an up-converted signal. This may be done in a variety of ways. In an embodiment, in-phase and quadrature components of the outbound baseband signal are mixed with in-phase and quadrature components of the transmit local oscillation to produce the up-converted signal. In another embodiment, the outbound baseband signal provides phase information (e.g., +/−Δθ [phase shift] and/or θ(t) [phase modulation]) that adjusts the phase of the transmit local oscillation to produce a phase adjusted up-converted signal. In this embodiment, the phase adjusted up-converted signal provides the up-converted signal. In another embodiment, the outbound baseband signal further includes amplitude information (e.g., A(t) [amplitude modulation]), which is used to adjust the amplitude of the phase adjusted up converted signal to produce the up-converted signal. In yet another embodiment, the outbound baseband signal provides frequency information (e.g., +/−Δf [frequency shift] and/or f(t) [frequency modulation]) that adjusts the frequency of the transmit local oscillation to produce a frequency adjusted up-converted signal. In this embodiment, the frequency adjusted up-converted signal provides the up-converted signal. In another embodiment, the outbound baseband signal further includes amplitude information, which is used to adjust the amplitude of the frequency adjusted up-converted signal to produce the up-converted signal. In a further embodiment, the outbound baseband signal provides amplitude information (e.g., +/−ΔA [amplitude shift] and/or A(t) [amplitude modulation) that adjusts the amplitude of the transmit local oscillation to produce the up-converted signal.

The power amplifier 184 amplifies the up-converted signal to produce an outbound RF signal 198. The transmit filter module 185 filters the outbound RF signal 198 and provides the filtered outbound RF signal to the antenna 186 for transmission, via the transmit/receive switch module 173. Note that processing module may produce the display data from the inbound data, the outbound data, application data, and/or system data.

FIG. 28 is a schematic block diagram of another example of a first drive sense circuit 28-*a* coupled to a column electrode 85*c* and a second drive sense circuit 28-*b* coupled to a row electrode 85*r* without a touch proximal to the electrodes. The first drive sense circuit 28-*a* includes a power source circuit 210 and a power signal change detection circuit 212. The second drive sense circuit 28-*b* includes a power source circuit 210-1, a power signal change detection circuit 212-1, and a regulation circuit 220.

The power source circuit 210 of the first drive sense circuit 28-*a* is operably coupled to the column electrode 85*c* and, when enabled (e.g., from a control signal from the processing module 42, power is applied, a switch is closed, a reference signal is received, etc.) provides a power signal 216 to the column electrode 85*c*. The power source circuit 210 may be a voltage supply circuit (e.g., a battery, a linear regulator, an unregulated DC-to-DC converter, etc.) to produce a voltage-based power signal, a current supply circuit (e.g., a current source circuit, a current mirror circuit, etc.) to produce a current-based power signal, or a circuit that provides a desired power level to the sensor and substantially matches impedance of the sensor. The power source circuit 110 generates the power signal 116 to include a DC (direct current) component and/or an oscillating component.

When receiving the power signal 216, the impedance of the electrode affects 218 the power signal. When the power signal change detection circuit 212 is enabled, it detects the affect 218 on the power signal as a result of the impedance of the electrode. For example, the power signal is a 1.5 voltage signal and, under a first condition, the sensor draws 1 milliamp of current, which corresponds to an impedance of 1.5 K Ohms. Under a second conditions, the power signal remains at 1.5 volts and the current increases to 1.5 milliamps. As such, from condition 1 to condition 2, the impedance of the electrode changed from 1.5 K Ohms to 1 K Ohms. The power signal change detection circuit 212 determines the change and generates a sensed signal, or proximal touch data 220 therefrom.

The power source circuit 210-1 of the second drive sense circuit 28-*b* is operably coupled to the row electrode 85*r* and, when enabled (e.g., from a control signal from the processing module 42, power is applied, a switch is closed, a reference signal is received, etc.) provides a power signal 216 to the electrode 85*r*. The power source circuit 210-1 may be implemented similarly to power source circuit 210 and generates the power signal 216 to include a DC (direct current) component and/or an oscillating component.

When receiving the power signal 216, the impedance of the row electrode 85*r* affects the power signal. When the change detection circuit 212-1 is enabled, it detects the affect on the power signal as a result of the impedance of the electrode 85*r*. The change detection circuit 210-1 is further operable to generate a sensed signal 120, or proximal touch data 220, that is representative of change to the power signal based on the detected effect on the power signal.

The regulation circuit 152, when its enabled, generates regulation signal 22 to regulate the DC component to a desired DC level and/or regulate the oscillating component to a desired oscillating level (e.g., magnitude, phase, and/or frequency) based on the sensed signal 120. The power source circuit 210-1 utilizes the regulation signal 222 to keep the power signal 216 at a desired setting regardless of the impedance changes of the electrode 85*r*. In this manner, the amount of regulation is indicative of the affect the impedance of the electrode has on the power signal.

In an example, the power source circuit 210-1 is a DC-DC converter operable to provide a regulated power signal 216 having DC and AC components. The change detection circuit 212-1 is a comparator and the regulation circuit 220 is a pulse width modulator to produce the regulation signal 222. The comparator compares the power signal 216, which is affected by the electrode, with a reference signal that includes DC and AC components. When the impedance is at a first level, the power signal is regulated to provide a voltage and current such that the power signal substantially resembles the reference signal.

When the impedance changes to a second level, the change detection circuit 212-1 detects a change in the DC and/or AC component of the power signal 216 and generates the sensed signal 120, which indicates the changes. The regulation circuit 220 detects the change in the sensed signal 120 and creates the regulation signal 222 to substantially remove the impedance change effect on the power signal 216. The regulation of the power signal 216 may be done by regulating the magnitude of the DC and/or AC components, by adjusting the frequency of AC component, and/or by adjusting the phase of the AC component.

Figure 29:
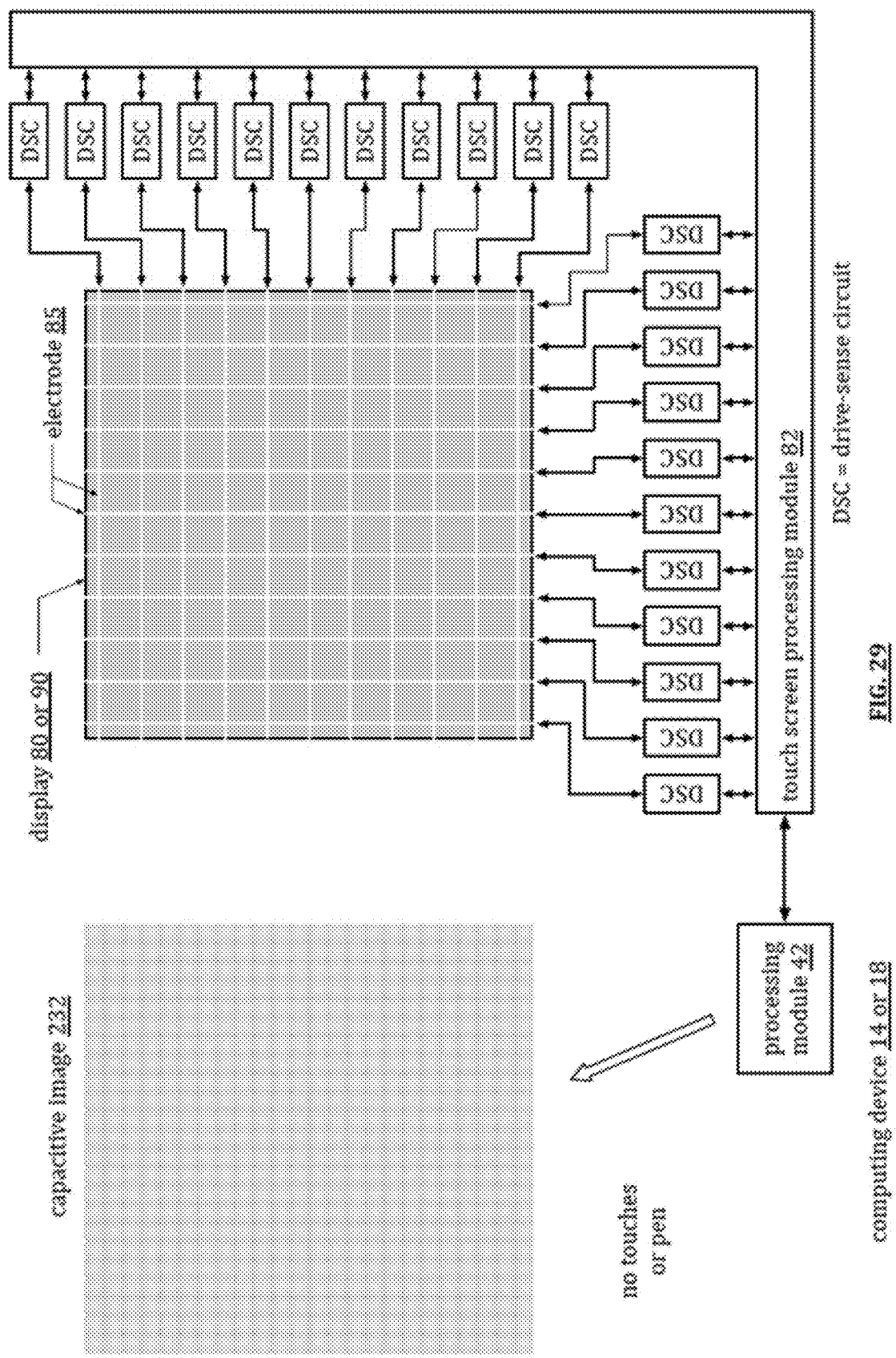
FIG. 29 is a schematic block diagram of an example of a computing device generating a capacitance image of a touch screen display in accordance with the present disclosure.

FIG. 29 is a schematic block diagram of an example of a computing device 14 or 18 that includes the components of FIG. 2 and/or FIG. 3. Only the processing module 42, the touch screen processing module 82, the display 80 or 90, the electrodes 85, and the drive sense circuits (DSC) are shown.

In an example of operation, the touch screen processing module 82 receives sensed signals from the drive sense circuits and interprets them to identify a finger or pen touch. In this example, there are no touches. The touch screen processing module 82 provides touch data (which includes location of touches, if any, based on the row and column electrodes having an impedance change due to the touch(es)) to the processing module 42.

The processing module 42 processes the touch data to produce a capacitance image 232 of the display 80 or 90. In this example, there are no touches, so the capacitance image 232 is substantially uniform across the display. The refresh rate of the capacitance image ranges from a few frames of capacitance images per second to a hundred or more frames of capacitance images per second. Note that the capacitance image may be generated in a variety of ways. For example, the self-capacitance and/or mutual capacitance of each touch cell (e.g., intersection of a row electrode with a column electrode) is represented by a color. When the touch cells have substantially the same capacitance, their representative color will be substantially the same. As another example, the capacitance image is topological mapping of differences between the capacitances of the touch cells.

Figure 30:
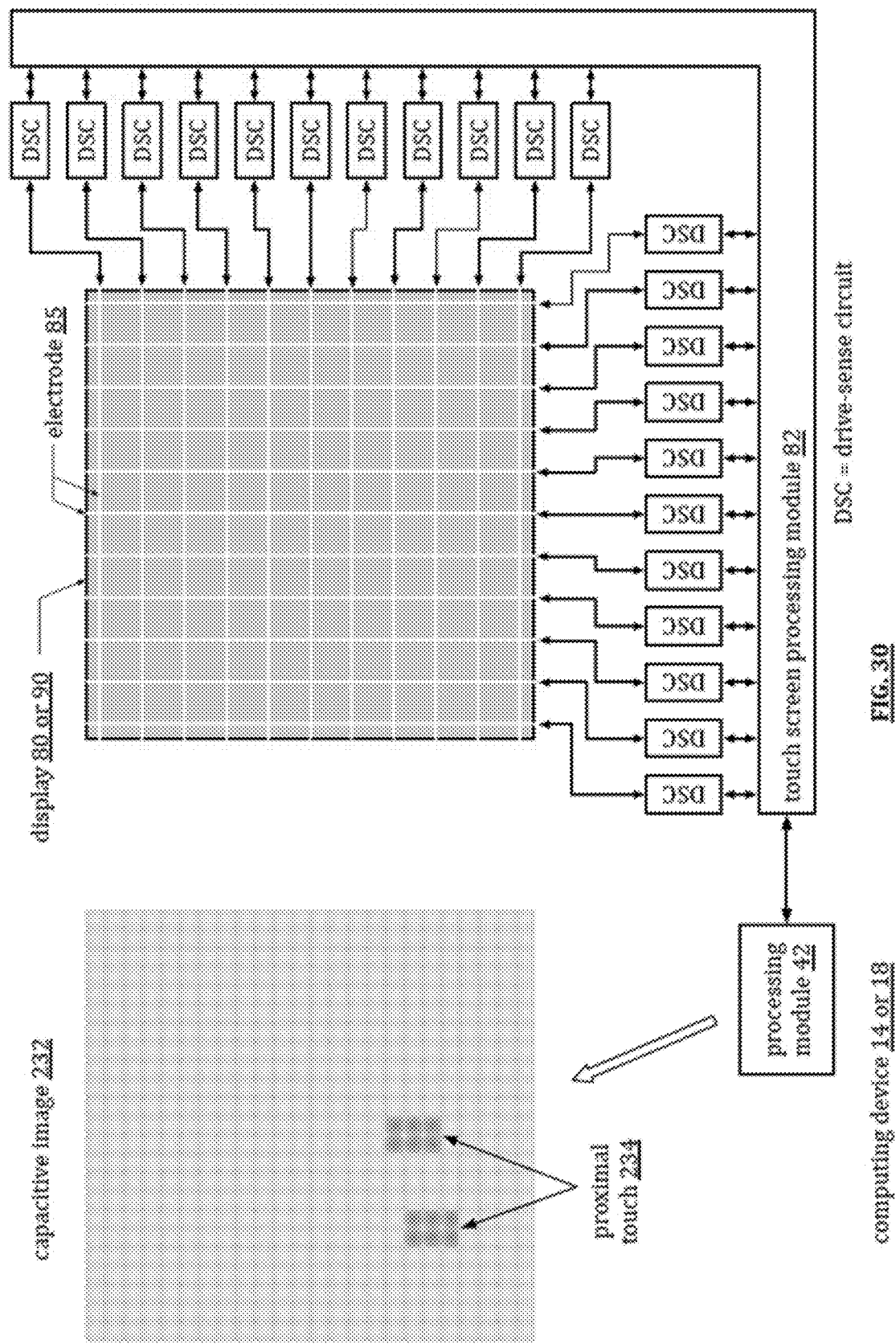
FIG. 30 is a schematic block diagram of another example of a computing device generating a capacitance image of a touch screen display in accordance with the present disclosure.

FIG. 30 is a schematic block diagram of another example of a computing device that is substantially similar to the example of FIG. 29 with the exception that the touch data includes two touches. As such, the touch data generated by the touch screen processing module 82 includes the location of two touches based on effected rows and columns. The processing module 42 processes the touch data to determine the x-y coordinates of the touches on the display 80 or 90 and generates the capacitance image, which includes the touches.

Figure 31:
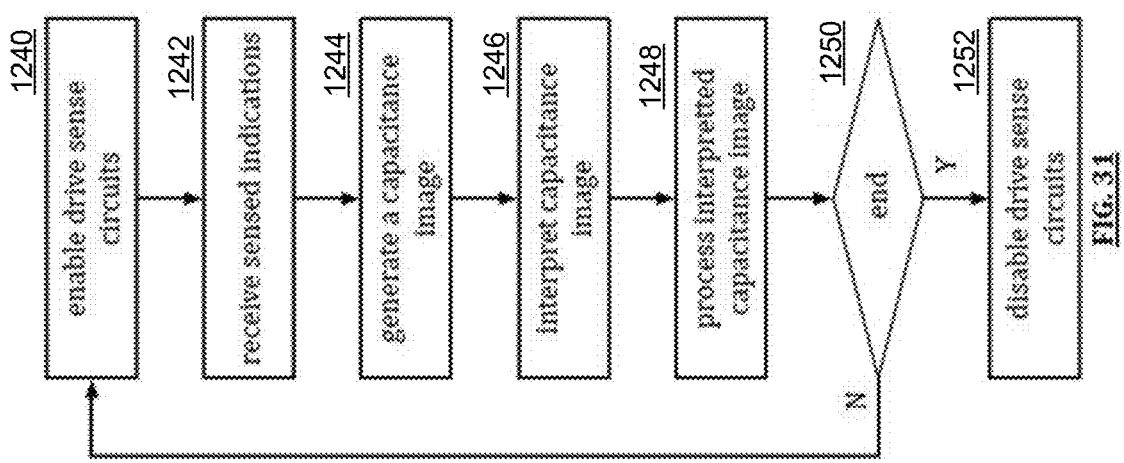
FIG. 31 is a logic diagram of an embodiment of a method for generating a capacitance image of a touch screen display in accordance with the present disclosure.

FIG. 31 is a logic diagram of an embodiment of a method for generating a capacitance image of a touch screen display that is executed by the processing module 42 and/or 82. The method begins at step 1240 where the processing module enables (for continuous or periodic operation) the drive-sense circuits to provide a sensor signals to the electrodes. For example, the processing module 42 and/or 82 provides a control signal to the drive sense circuits to enable them. The control signal allows power to be supplied to the drive sense circuits, to turn-on one or more of the components of the drive sense circuits, and/or close a switch coupling the drive sense circuits to their respective electrodes.

The method continues at step 1242 where the processing module receives, from the drive-sense circuits, sensed indications regarding (self and/or mutual) capacitance of the electrodes. The method continues at step 1244 where the processing module generates a capacitance image of the display based on the sensed indications. As part of step 1244, the processing module stores the capacitance image in memory. The method continues at step 1246 where the processing module interprets the capacitance image to identify one or more proximal touches (e.g., actual physical contact or near physical contact) of the touch screen display.

The method continues at step 1248 where the processing module processes the interpreted capacitance image to determine an appropriate action. For example, if the touch(es) corresponds to a particular part of the screen, the appropriate action is a select operation. As another example, of the touches are in a sequence, then the appropriate action is to interpret the gesture and then determine the particular action.

The method continues at step 1250 where the processing module determines whether to end the capacitance image generation and interpretation. If so, the method continues to step 1252 where the processing module disables the drive sense circuits. If the capacitance image generation and interpretation is to continue, the method reverts to step 1240.

Figure 32:
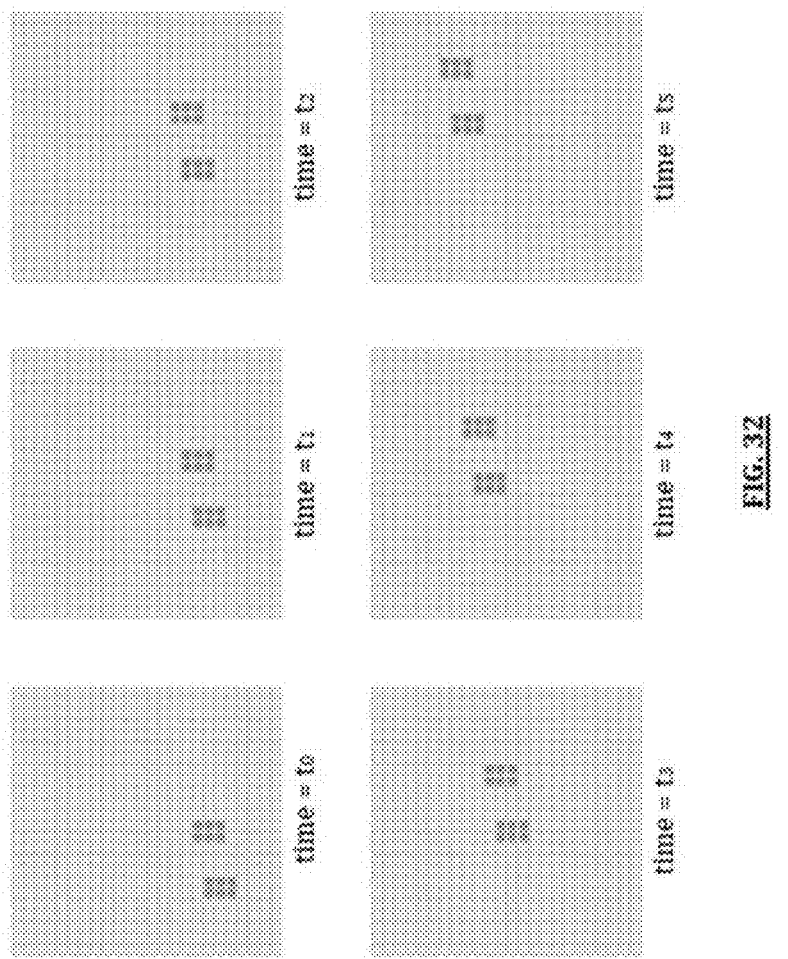
FIG. 32 is a schematic block diagram of an example of generating capacitance images over a time period in accordance with the present disclosure.

FIG. 32 is a schematic block diagram of an example of generating capacitance images over a time period. In this example, two touches are detected at time t0 and move across and upwards through the display over times t1 through t5. The movement corresponds to a gesture or action. For instance, the action is dragging a window across and upwards through the display.

FIG. 33 is a logic diagram of an embodiment of a method for identifying desired and undesired touches using a capacitance image that is executed by processing module 42 and/or 82. The method starts are step 1260 where the processing module detects one or more touches. The method continues at step 1262 where the processing module determines the type of touch for each detected touch. For example, a desired touch is a finger touch or a pen touch. As a further example, an undesired touch is a water droplet, a side of a hand, and/or an object.

The method continues at step 1264 where the processing module determines, for each touch, whether it is a desired or undesired touch. For example, a desired touch of a pen and/or a finger will have a known effect on the self-capacitance and mutual-capacitance of the effected electrodes. As another example, an undesired touch will have an effect on the self-capacitance and/or mutual-capacitance outside of the know effect of a finger and/or a pen. As another example, a finger touch will have a known and predictable shape, as will a pen touch. An undesired touch will have a shape that is different from the known and desired touches.

If the touch is desired, the method continues at step 1266 where the processing module continues to monitor the desired touch. If the touch is undesired, the method continues at step 1268 where the processing module ignores the undesired touch.

FIG. 34 is a schematic block diagram of an example of using capacitance images to identify desired and undesired touches. In this example, the desired pen touch 270 will be processed and the undesired hand touch 272 will be ignored.

FIG. 35 is a schematic block diagram of another example of using capacitance images to identify desired and undesired touches. In this example, the desired finger touch 276 will be processed and the undesired water touch 274 will be ignored. The undesired water touch 274 would not produce a change to the self-capacitance of the effected electrodes since the water does not have a path to ground and the same frequency component is used for self-capacitance for activated electrodes.

Figure 36:
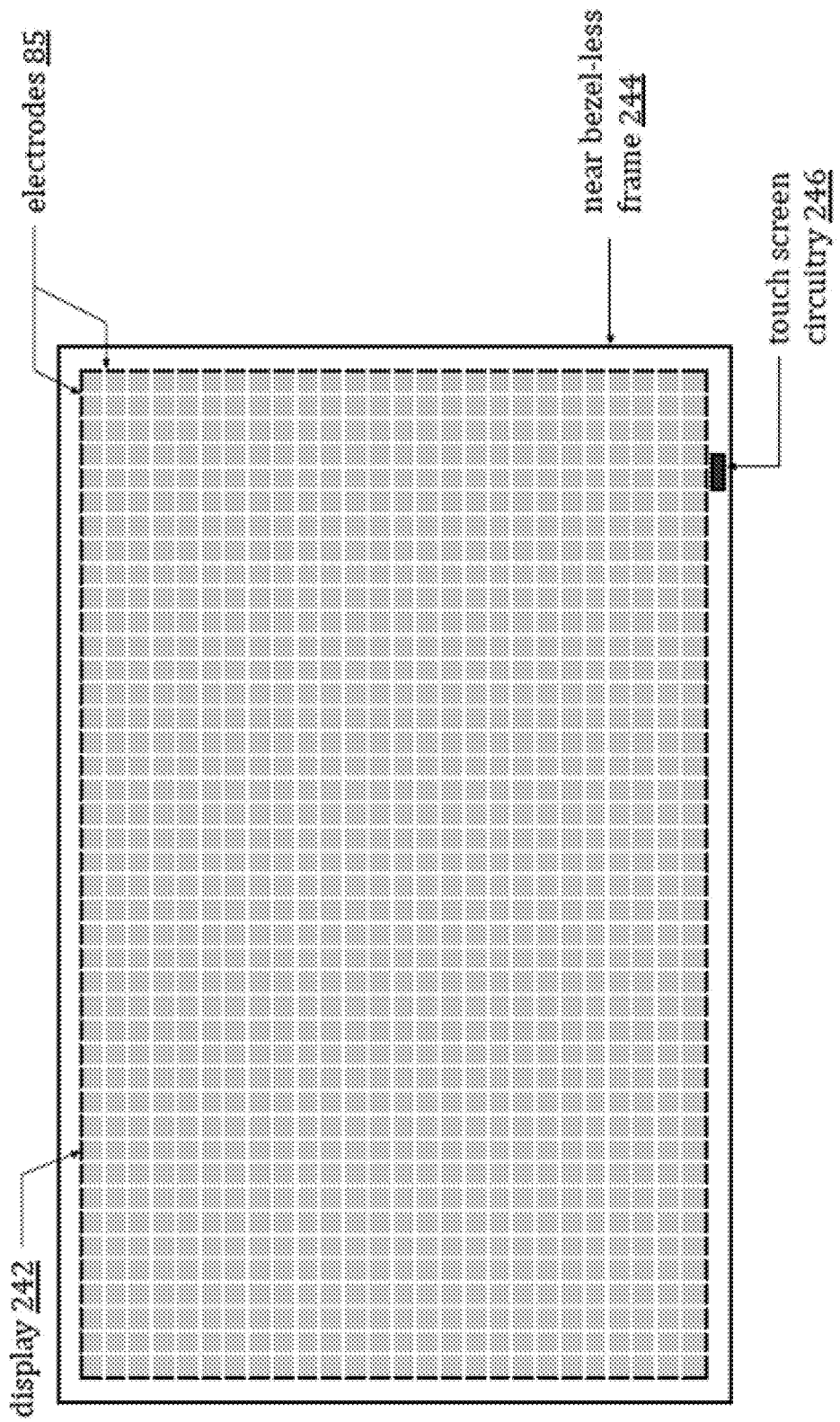
FIG. 36 is a schematic block diagram of an embodiment of a near bezel-less touch screen display in accordance with the present disclosure.

FIG. 36 is a schematic block diagram of an embodiment of a near bezel-less touch screen display 240 that includes a display 242, a near bezel-less frame 244, touch screen circuit 246, and a plurality of electrodes 85. The touch screen display 240 is a large screen, generally considered to have a diagonal dimension of 32 inches or more. The near bezel-less frame 244 has a visible width with respect to the display of one inch or less. In an embodiment, the width of the near bezel-less frame 244 is ½ inch or less on two or more sides. The display 242 has properties in accordance with the Table 1.

An issue with a large display and very small bezel of the frame 244 is running leads to the electrodes 85 from the touch screen circuitry 246. The connecting leads, which are typically conventional wires, need to be located with the frame 244 or they will adversely effect the display. The larger the display, the more electrodes and the more leads that connect to them. To get the connecting leads to fit within the frame, they need to be tightly packed together (i.e., very little space between them). This creates three problems for conventional touch screen circuitry: (1) with conventional low voltage signaling to the electrodes (e.g., signals swinging from rail to rail of the power supply voltage, which is at least 1 volt and typically greater than 1.5), electromagnetic cross-coupling between the leads causes interference between the signals; (2) smaller leads and longer electrodes create higher total resistance, which requires higher voltage signals; and (3) the tight coupling of the leads increases the parasitic capacitance of each lead, which increases the current required to drive the signals. With conventional touch screen circuitry, as the screen becomes larger, the impedance of each electrode (including lead) increases, resulting in more power required to drive touch signals to the touch screen. Because of these issues, display sizes for touch screen displays have been effectively limited to smaller display sizes or touch sensors have to have very low resistance and capacitance.

With the touch screen circuitry 246 disclosed herein, effective and efficient large touch screen displays can be practically realized. For instance, the touch screen circuitry 246 uses very low voltage signaling (e.g., 25-1,250 milli-volt RMS of the oscillating component of the sensor signal or power signal), which reduces power requirements and substantially reduces adverse effects of cross-coupling between the leads. For example, when the oscillating component is a sinusoidal signal at 25 milli-volt RMS and each electrode (or at least some of them) are driven by oscillating components of different frequencies, the cross-coupling is reduced and, what cross-coupled does exist, is easily filtered out. Continuing with the example, with a 25 milli-voltage signal and increased impedance of longer electrodes and tightly packed leads, the power requirement is dramatically reduced. As a specific example, for conventional touch screen circuitry operating with a power supply of 1.5 volts and the touch screen circuitry 246 operating with 25 milli-volt signaling, the power requirements are reduced by as much as 60 times.

In an embodiment, the near bezel-less touch screen display 240 includes the display 242, the near bezel-less frame 244, electrodes 85, and the touch screen circuitry 246, which includes drive sense circuits (DSC) and a processing module. The display 242 is operable to render frames of data into visible images. The near bezel-less frame 244 at least partially encircles the display 242. In this example, the frame 244 fully encircles the frame and the touch screen circuitry 246 is positioned in the bezel area to have about the same number of electrode connections on each side of it. In FIG. 40, as will be subsequently discussed, the frame 244 partially encircles the display 242.

The drive-sense circuits are coupled to the electrodes via connections, which are substantially within the near bezel-less frame. The connections include wires and connectors, which are achieved by welds, crimping, soldering, male-female connectors, etc. The drive-sense circuits are operable to provide and monitor sensor signals of the electrodes 85 to detect impedance and impedance changes of the electrodes. The processing module processes the impedances of the electrodes to determine one or more touches on the touch screen display 240.

In the present FIG. 36, the electrodes 85 are shown in a first arrangement (e.g., as rows) and a second arrangement (e.g., as columns). Other patterns for the electrodes may be used to detect touches to the screen. For example, the electrodes span only part of the way across the display and other electrodes span the remaining part of the display. As another example, the electrodes are patterned at an angle different than 90 degrees with respect to each other.

Figure 37:
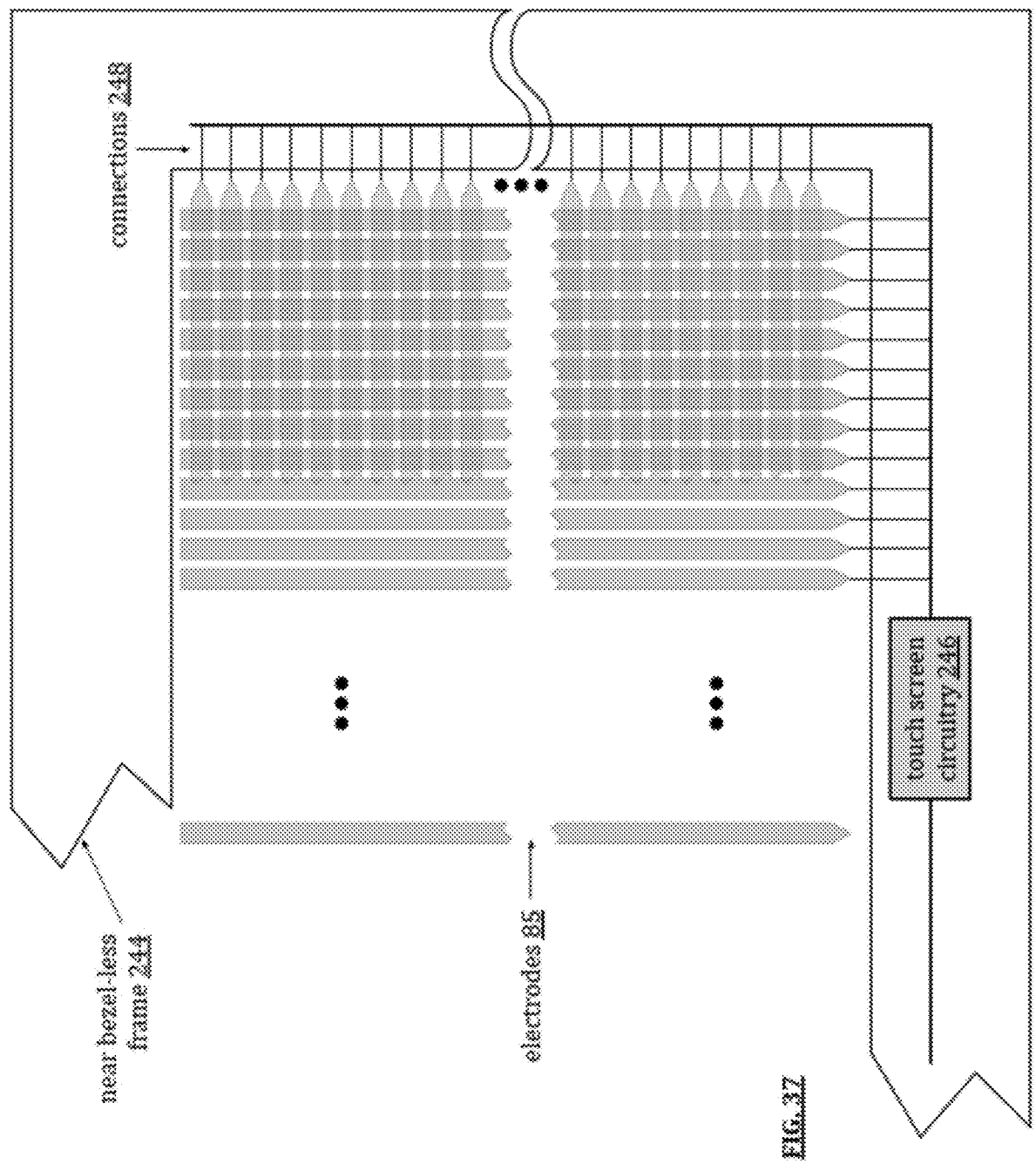
FIG. 37 is a schematic block diagram of another embodiment of a near bezel-less touch screen display in accordance with the present disclosure.

FIG. 37 is a schematic block diagram that further illustrates an embodiment of a near bezel-less touch screen display 242. As shown, the touch screen circuit 246 is coupled to the electrodes 85 via a plurality of connectors 248. The electrodes are arranged in rows and columns, are constructed using a finely patterned or transparent conductive material (e.g., ITO, metal mesh, PEDOT, silver nanowire) and distributed throughout the display 242. The larger the touch screen display, the more electrodes are needed. For example, a touch screen display includes hundreds to thousands, or more, of electrodes.

The connections 248 and the touch screen circuitry 246 are physically located with the near bezel-less frame 244. The more tightly packed the connectors, the thinner the bezel can be. A drive sense circuit of the touch screen circuitry 246 is coupled to an individual electrode 85. Thus, if there are 100 electrodes, there are 100 drive sense circuits and 100 connections. In an embodiment, the connections 248 include traces on a multi-layer printed circuit board, where the traces are spaced at a few microns or less. As another example, the spacing between the connections is a minimum spacing needed to ensure that the insulation between the connections does not break down. Note that the touch screen circuitry 246 may be implemented in multiple integrated circuits that are distributed about the frame 244.

Figure 38:
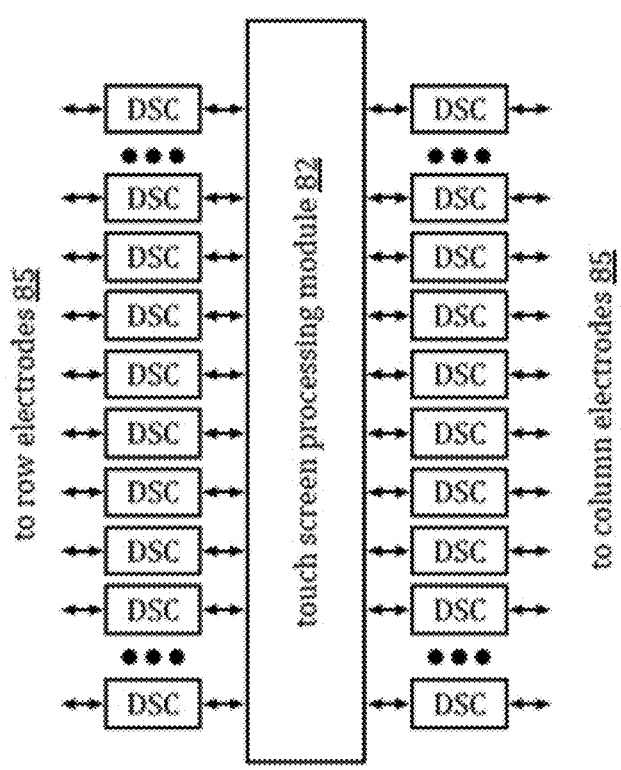
FIG. 38 is a schematic block diagram of an embodiment of touch screen circuitry of a near bezel-less touch screen display in accordance with the present disclosure.

FIG. 38 is a schematic block diagram of an embodiment of touch screen circuitry 246 that includes a touch screen processing module 82 and a plurality of drive sense circuits (DSC). Some of the drive sense circuits are coupled to row electrodes and other drive sense circuits are coupled to column electrodes. The touch screen circuitry 246 may be implemented in one or more integrated circuits. For example, the touch screen processing module 82 and a certain number (e.g., tens to hundreds) of drive sense circuits are implemented one a single die. An integrated circuit may include one or more of the dies. Thus, depending on the number of electrodes in the touch screen display, one or more dies in one or more integrated circuits is needed.

When more than a single die is used, the touch screen circuitry 246 includes more than one processing module 82. In this instance, the processing modules 82 on different dies function as peer processing modules, in that, they communicate with their own drive sense circuits and process the data from the drive sense circuits and then coordinate to provide the process data upstream for further processing (e.g., determining whether touches have occurred, where on the screen, is the touch a desired touch, and what does the touch mean). The upstream processing may be done by another processing module (e.g., processing module 42), as a distributed function among the processing modules 82, and/or by a designed processing module of the processing modules 82.

Figure 39:
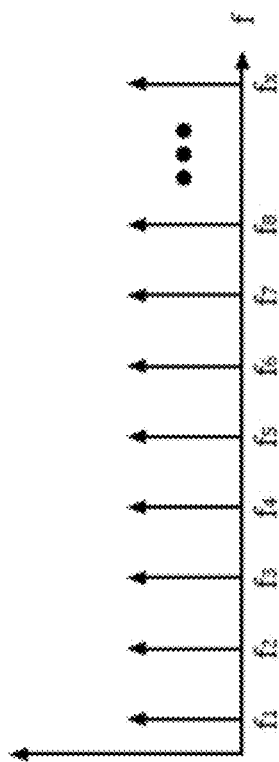
FIG. 39 is a schematic block diagram of an example of frequencies for the various analog reference signals for the drive-sense circuits in accordance with the present disclosure.

FIG. 39 is a schematic block diagram of an example of frequencies for the various analog reference signals for the drive-sense circuits. As mentioned above, to reduce the adverse effects of cross-coupling, the drive sense circuits use a common frequency component for self-capacitance measurements and uses different frequencies components for mutual capacitance measurements. In this example, there are x number of equally-spaced different frequencies. The frequency spacing is dependent on the filtering of the sensed signals. For example, the frequency spacing is in the range of 10 Hz to 10's of thousands of Hz. Note that the spacing between the frequencies does not need to be equal or that every frequency needs to be used. Further note that, for very large touch screen displays having tens to thousands of electrodes, a frequency reuse pattern may be used.

FIG. 40 is a schematic block diagram of another embodiment of a near bezel-less touch screen display 240-1 that includes the display 242, the electrodes 85, the touch screen display circuitry 246, and a near bezel-less frame 244-1. In this embodiment, the frame 244-1 is on two sides of the display 242; the other two sides are bezel-less. The functionality of the display 242, the electrodes 85, the touch screen display circuitry 246 are as previously discussed.

FIG. 41 is a schematic block diagram of another embodiment of multiple near bezel-less touch screen displays 250 that includes a plurality of near bezel-less touch screen displays 240-1. Each of the near bezel-less touch screen displays 240-1 have two sides that are bezel-less and two sides that include a near bezel-less frame. The location of the two bezel-less sides can vary such that the displays 240-1 can be positioned to create one large multiple touch screen display 250.

In an alternate embodiment, a near bezel-less touch screen display includes three sides that are bezel-less and one side that includes a near bezel-less frame. The side having the near bezel-less frame is variable to allow different combinations of the near bezel-less touch screen displays to create a large multiple touch screen display.

Figure 42:
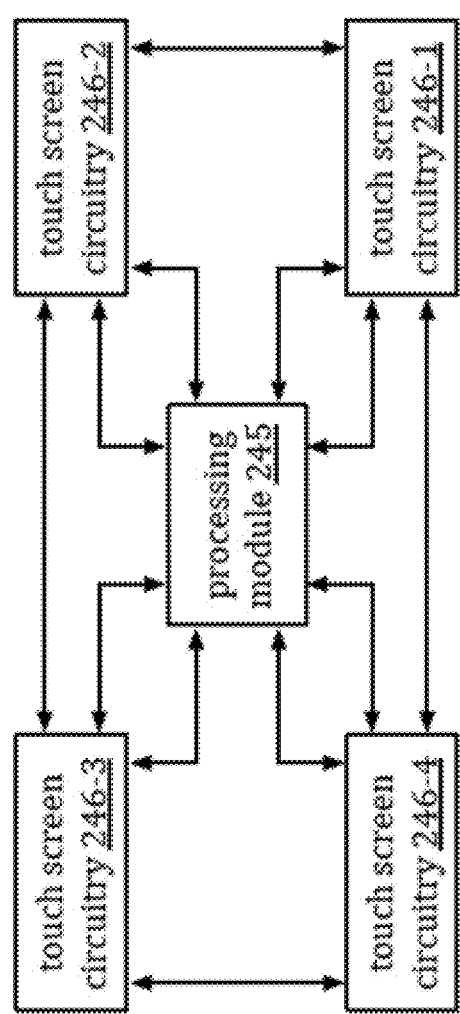
FIG. 42 is a schematic block diagram of an embodiment of processing modules for the multiple near bezel-less touch screen displays of FIG. 41 in accordance with the present disclosure.

FIG. 42 is a schematic block diagram of an embodiment of the touch screen circuitry 246 and one or more processing modules for the multiple near bezel-less touch screen displays of FIG. 41. Each of the displays 240-1 includes touch screen circuitry 246-1 through 246-4, which are coupled together and to a centralized processing module 245. Each of the touch screen circuitry 246-1 through 246-4 interacts with the electrodes of its touch screen display 240-1 to produce capacitance information (e.g., self-capacitance, mutual capacitance, change in capacitance, location of the cells having a capacitance change, etc.).

The centralized processing module 245 processes the capacitance information form the touch screen circuitry 246-1 through 246-4 to determine location of a touch, or touches, meaning of the touch(es), etc. In an embodiment, the centralized processing module 245 is processing module 42. In another embodiment, the centralized processing module 245 is one of the processing modules of the touch screen circuitry 246-1 through 246-4. In yet another embodiment, the centralized processing module 245 includes two or more of the processing modules of the touch screen circuitry 246-1 through 246-4 functioning as a distributed processing module.

Figure 43:
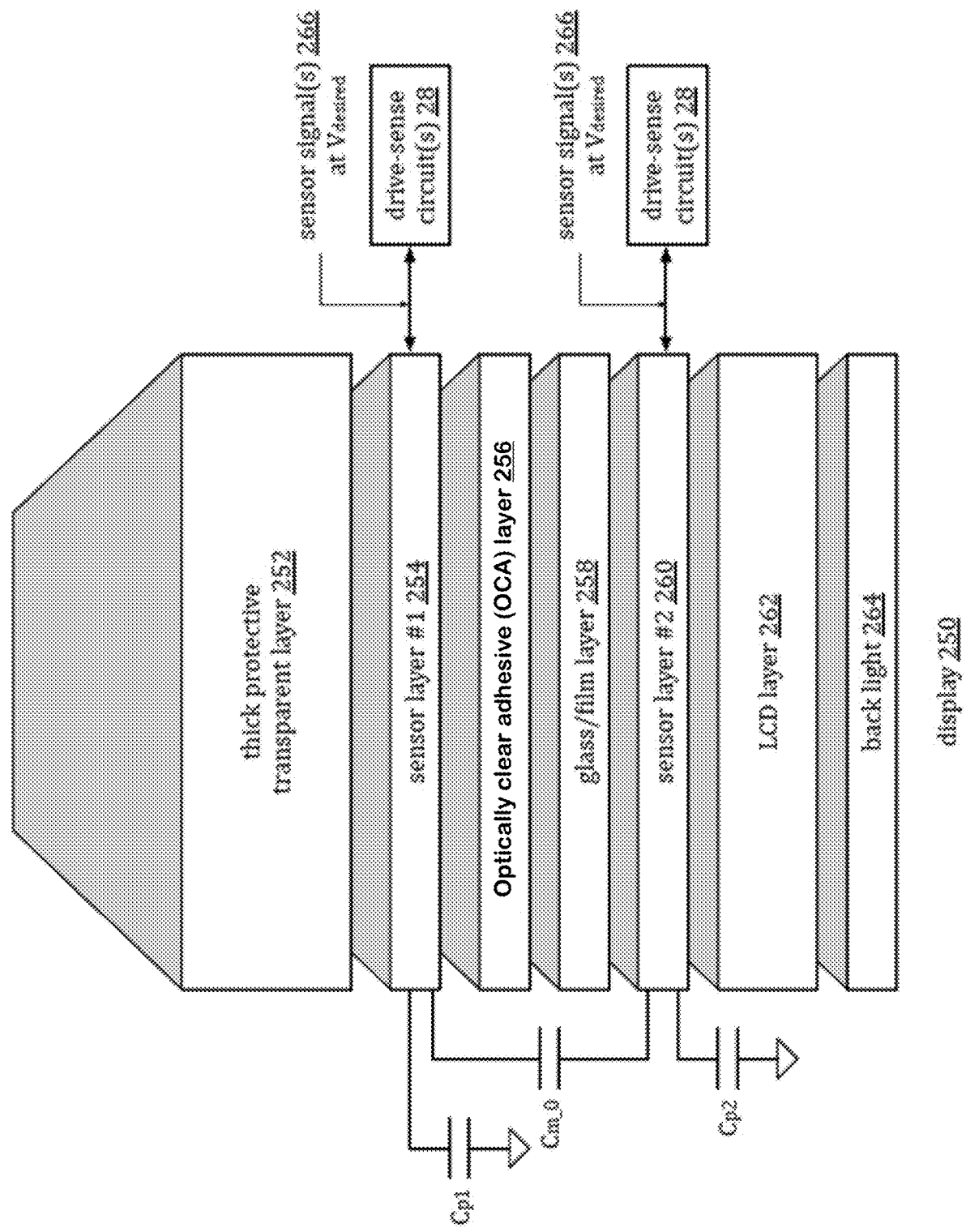
FIG. 43 is a cross section schematic block diagram of an example of a touch screen display having a thick protective transparent layer in accordance with the present disclosure.

FIG. 43 is a cross section schematic block diagram of an example of a touch screen display 80 having a thick protective transparent layer 252. The display 80 further includes a first sensor layer 254, one or more optically clear adhesive (OCA) layers 256, a glass/film layer 258, a second sensor layer 260, an LCD layer 262, and a back-light layer 264. A first group of drive sense circuits 28 is coupled to the first sensor layer 254 and a second group of drive sense circuits 28 is coupled to the second sensor layer 260.

The thick protective transparent layer 252 includes one or more layers of glass, film, etc. to protect the display 250 from damaging impacts (e.g., impact force, impact pressure, etc.). In many instances, the thicker the protective transparent layer 252 is, the more protection it provides. For example, the protective transparent layer 252 is at least a ¼ inch thick and, in some applications, is thicker than 1 inch or more.

The protective transparent layer 252 acts as a dielectric for finger capacitance and/or for pen capacitance. The material, or materials, comprising the protective transparent layer 252 will have a dielectric constant (e.g., 5-10 for glass). The capacitance (finger or pen) is then at least partially based on the dielectric constant and thickness of the protective transparent layer 252. In particular, the capacitance (C) equals:

$$C = \epsilon \frac{A}{d}$$

where A is plate area, E is the dielectric constant(s), and d is the distance between the plates, which includes the thickness of the protective layer 252.

As such, the thicker the protective transparent layer, the smaller the capacitance (finger and/or pen). As the capacitance decreases, its effect on the self-capacitance of the sensor layers and the effect on the mutual capacitance between the sensor layer is reduced. Accordingly, the drive sense circuits 28 provide the sensor signals 266 at a desired voltage level, which increases as the finger and/or pen capacitance decreases due to the thickness of the protective transparent layer 252. In an embodiment, the first sensor layer includes a plurality of column electrodes and the second sensor layer includes a plurality of row electrodes.

There are a variety of ways to implement a touch sensor electrode. For example, the sensor electrode is implemented using a glass-glass configuration. As another example, the sensor electrode is implemented using a glass-film configuration. Other examples include a film-film configuration, a 2-sided film configuration, a glass and 2-sided film configuration, or a 2-sided glass configuration. Furthermore, it should be noted that layers 256 & 258 can be removed and/or there may be other layers between the protective layer 252, one or both of the sensor layers 254 and 360 and the LCD layer 262. In addition, the LCD layer 262 could be replaced by other layer technologies such as OLED, EL, Plasma, EPD, microLED, etc. Other configurations are possible as well.

Figure 44:
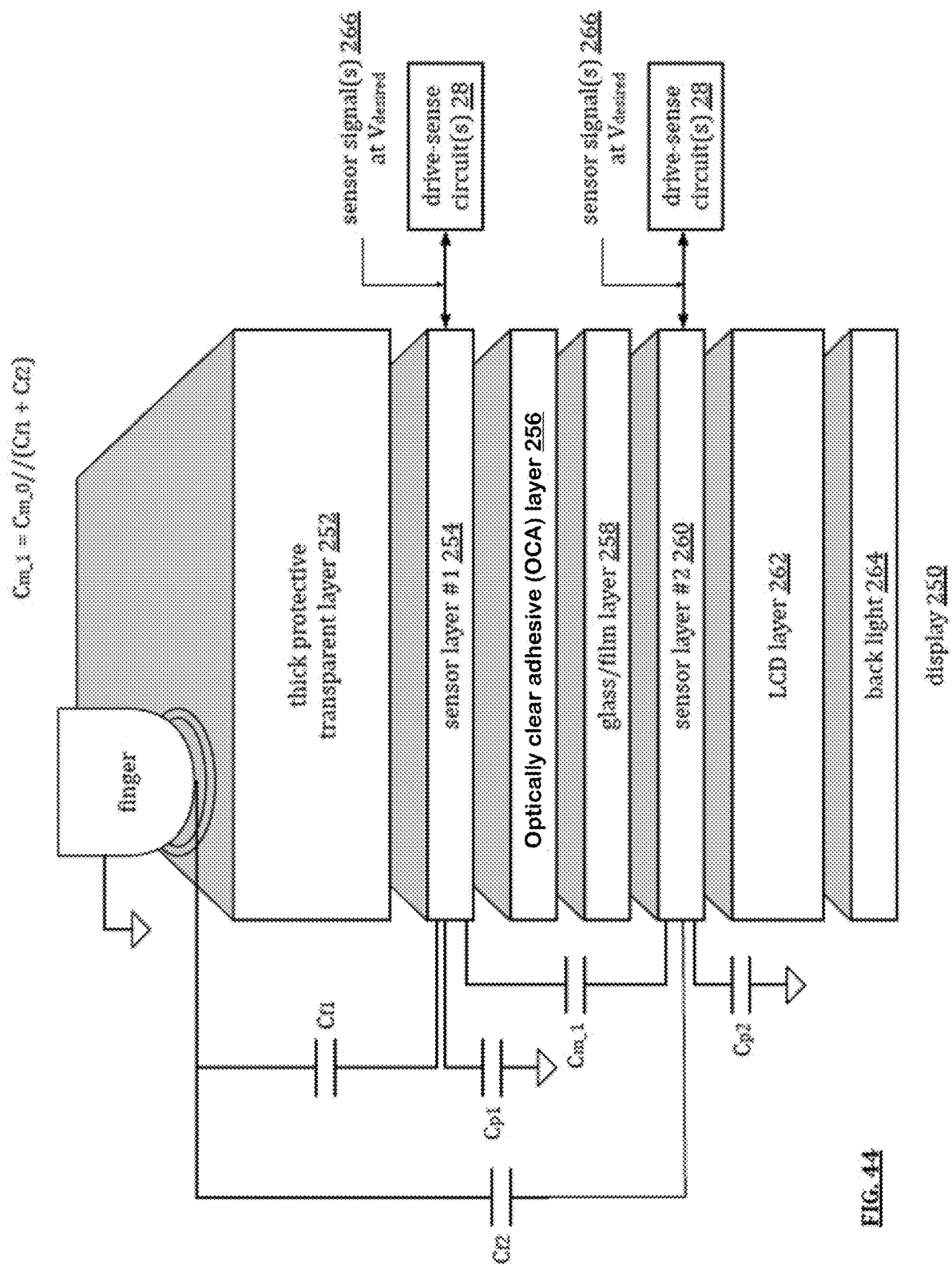
FIG. 44 is a cross section schematic block diagram of another example of a touch screen display having a thick protective transparent layer in accordance with the present disclosure.

FIG. 44 is a cross section schematic block diagram that is similar to FIG. 43, with the exception that this figure includes a finger touch. The finger touch provides a finger capacitance with respect the sensor layers 254 and 260. As is shown, the finger capacitance includes a first capacitance component from the finger to the first sensor layer ($C_{f1}$) and a second capacitance component from the finger to the second sensor layer ($C_{f2}$). As previously discussed, the finger capacitance is effectively in parallel with the self-capacitances ($C_{p0}$ and $C_{p1}$) of the sensor layers, which increases the effective self-capacitance and decreases impedance at a given frequency. As also previously discussed, the finger capacitance is effectively in series with the mutual-capacitance ($C_{m\_0}$) of the sensor layers, which decreases the effective mutual-capacitance ($C_{m\_1}$) and increases impedance at a given frequency.

Thus, the smaller the finger capacitance due to a thicker protective layer 252, the less effect it has on the self-capacitance and mutual-capacitance. This can be better illustrated with reference to FIGS. 45-50. As previously noted, layers 256 & 258 can be removed and/or there may be other layers between the protective layer 252, one or both of the sensor layers 254 and 360 and the LCD layer 262. In addition, the LCD layer 262 could be replaced by other layer technologies such as OLED, EL, Plasma, EPD, microLED, etc. Other configurations are possible as well.

Figure 45:
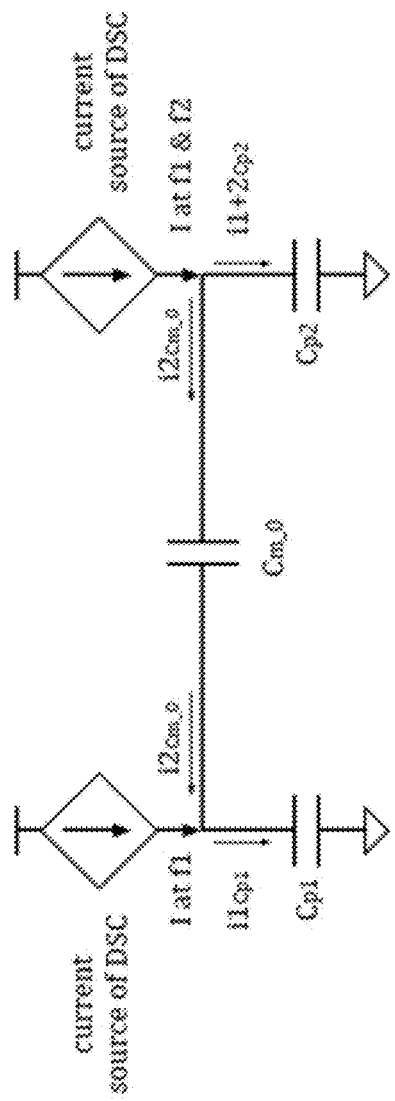
FIG. 45 is a schematic block diagram of an electrical equivalent circuit of two drive sense circuits coupled to two electrodes without a finger touch in accordance with the present disclosure.

FIG. 45 is a schematic block diagram of an electrical equivalent circuit of two drive sense circuits coupled to two electrodes without a finger touch. The drive sense circuits are represented as dependent current sources, the self-capacitance of a first electrode is referenced as $C_{p1}$, the self-capacitance of the second electrode is referenced as $C_{p2}$, and the mutual capacitance between the electrodes is referenced as $C_{m\_0}$. In this example, the current source of the first drive sense circuit is providing a controlled current (I at f1) that includes a DC component and an oscillating component, which oscillates at frequency f1. The current source of the second drive sense circuit is providing a controlled current (I at f1 and at f2) that includes a DC component and two oscillating components at frequency f1 and frequency f2.

The first controlled current (I at f1) has one components: $i1_{Cp1}$ and the second controlled current (I at f1 and f2) has two components: $i1+2_{Cp2}$ and $i2_{Cm\_0}$. The current ratio between the two components for a controlled current is based on the respective impedances of the two paths.

Figure 46:
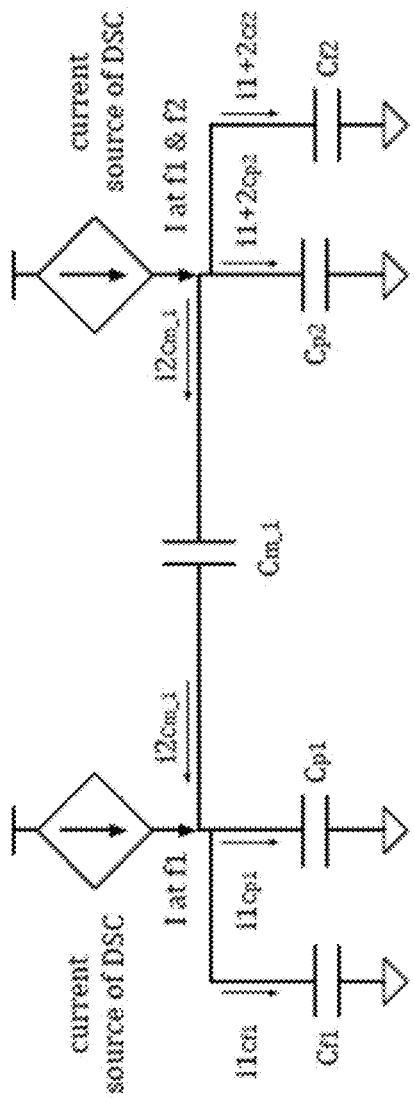
FIG. 46 is a schematic block diagram of an electrical equivalent circuit of two drive sense circuits coupled to two electrodes with a finger touch in accordance with the present disclosure.

FIG. 46 is a schematic block diagram of an electrical equivalent circuit of two drive sense circuits coupled to two electrodes as shown in FIG. 45, but this figure includes a finger touch. The finger touch is represented by the finger capacitances ($C_{f1}$ and $C_{f2}$), which are in parallel with the self-capacitance ($C_{p1}$ and $C_{p2}$). The dependent current sources are providing the same levels of current as in FIG. 45 (I at f1 and I at f1 and f2).

In this example, however, more current is being directed towards the self-capacitance in parallel with the finger capacitance than in FIG. 45. Further, less current is being directed towards the mutual capacitance ($C_{m\_1}$) (i.e., taking charge away from the mutual capacitance, where C=Q/V). With the self-capacitance effectively having an increase in capacitance due to the finger capacitance, its impedance decreases and, with the mutual-capacitance effectively having a decrease in capacitance, its impedance increases.

The drive sense circuits can detect the change in the impedance of the self-capacitance and of the mutual capacitance when the change is within the sensitivity of the drive sense circuits. For example, V=I*Z, I*t=C*V, and Z=½πfC (where V is voltage, I is current, Z is impedance, t is time, C is capacitance, and f is the frequency), thus V=I*½πfC. If the change between C is small, then the change in V will be small. If the change in V is too small to be detected by the drive sense circuit, then a finger touch will go undetected. To reduce the chance of missing a touch due to a thick protective layer, the voltage (V) and/or the current (I) can be increased. As such, for small capacitance changes, the increased voltage and/or current allows the drive sense circuit to detect a change in impedance. As an example, as the thickness of the protective layer increases, the voltage and/or current is increased by 2 to more than 100 times.

Figure 47:
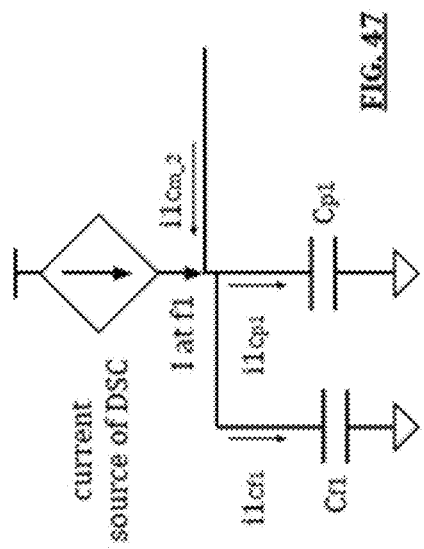
FIG. 47 is a schematic block diagram of an electrical equivalent circuit of a drive sense circuit coupled to an electrode without a finger touch in accordance with the present disclosure.

FIG. 47 is a schematic block diagram of an electrical equivalent circuit of a drive sense circuit coupled to an electrode without a finger touch. This similar to FIG. 45, but for just one drive sense circuit and one electrode. Thus, the current source of the first drive sense circuit is providing a controlled current (I at f1) that includes a DC component and an oscillating component, which oscillates at frequency f1 and the first controlled current (I at f1) has two components: $i1_{Cp1}$ and $i1_{Cf1}$.

Figure 48:
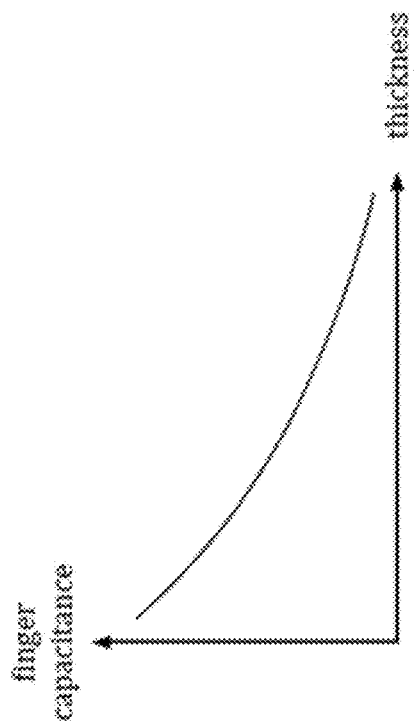
FIG. 48 is an example graph that plots finger capacitance verses protective layer thickness of a touch screen display in accordance with the present disclosure.

FIG. 48 is an example graph that plots finger capacitance verses protective layer thickness of a touch screen display 250. As shown, as the thickness increases, the finger capacitance decreases. This effects changes in the mutual-capacitance as shown in FIG. 49 and in self-capacitance as shown in FIG. 50.

Figure 49:
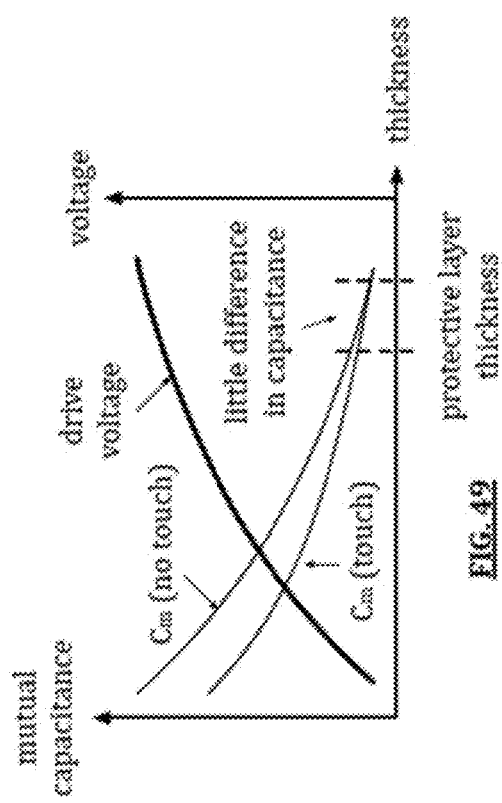
FIG. 49 is an example graph that plots mutual capacitance verses protective layer thickness and drive voltage verses protective layer thickness of a touch screen display in accordance with the present disclosure.

FIG. 49 is an example graph that plots mutual capacitance verses protective layer thickness and drive voltage verses protective layer thickness of a touch screen display 150. As shown, as the thickness increases, the difference between the mutual capacitance without a touch and mutual capacitance with a touch decreases. In order for the decreasing difference to be detected, the voltage (or current) sourced to the electrode increases substantially inversely proportion to the decrease in finger capacitance.

FIG. 50A is a cross section schematic block diagram of another example of a touch screen display 250 having a protective transparent layer 402. This embodiment is similar to the embodiment of FIG. 43 with the exception that this embodiment includes a single sensor layer 255. Similar elements are referred to by common reference numerals. The sensor layer 255 may be implemented in a variety of ways. In various embodiments, the sensor layer 255 includes a plurality of capacitive sensors that operate via mutual capacitance.

Consider the following example. The sensor layer 255 includes a plurality of electrodes integrated into the display to facilitate touch sense functionality based on electrode signals, such as sensor signals 266, having a drive signal component and a receive signal component. The plurality of electrodes includes a plurality of row electrodes and a plurality of column electrodes. The plurality of row electrodes is separated from the plurality of column electrodes by a dielectric material. The plurality of row electrodes and the plurality of column electrodes form a plurality of cross points. A plurality of drive-sense circuit(s) 28 is coupled to at least some of the plurality of electrodes (e.g. the rows or the columns) to generate a plurality of sensed signal(s) 120. Each the plurality of drive-sense circuits 28 includes a first conversion circuit and a second conversion circuit. When a drive-sense circuit 28 is enabled to monitor a corresponding electrode of the plurality of electrodes, the first conversion circuit is configured to convert the receive signal component into a sensed signal 120 and the second conversion circuit is configured to generate the drive signal component from the sensed signal 120. The sensed signals 120 indicate variations in mutual capacitance associated the plurality of cross points. In particular, components of sensed signals 120 that correspond to the capacitive coupling of each cross-point vary from the nominal mutual capacitance value for each cross-point in response to variations in mutual capacitance associated with that cross point. Conditions at cross-point, such as proximal touch conditions by a finger for example, can decrease the mutual capacitance at that cross point, causing an increase in impedance indicated in a corresponding component of sensed signals 120. As previously noted, layers 256 & 258 can be removed and/or there may be other layers between the protective layer 402 and the LCD layer 262. In addition, the LCD layer 262 could be replaced by other layer technologies such as OLED, EL, Plasma, EPD, microLED, etc. Other configurations are possible as well.

Figure 50B:
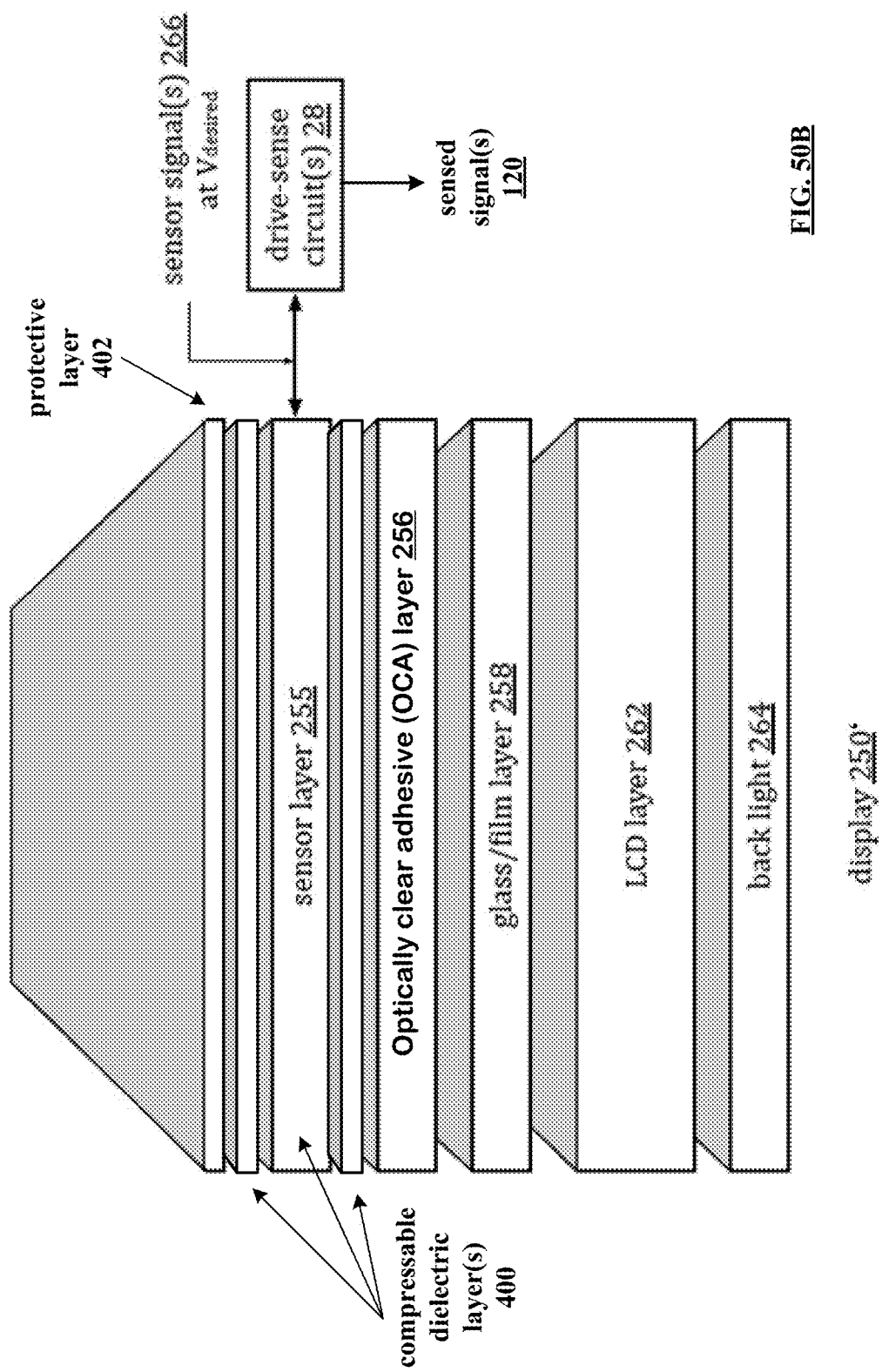
FIG. 50B is a cross section schematic block diagram of another example of a touch screen display in accordance with the present disclosure.

FIG. 50B is a cross section schematic block diagram 250' of another example of a touch screen display in accordance with the present disclosure. This embodiment is similar to the embodiment of FIG. 50A with the exception that this embodiment includes one or more compressible dielectric layers 400 that are each adjacent to (above or below) the sensor layer 255. In addition or in the alternative, a compressible dielectric layer 400 may be implemented adjacent to the sensor layer 255 as all or part of the dielectric layer that is between the column and row electrodes—within the sensor layer 255 itself. As previously noted, layers 256 & 258 can be removed and/or there may be additional layers between the protective layer 402 and the LCD layer 262. In addition, the LCD layer 262 could be replaced by other layer technologies such as OLED, EL, Plasma, EPD, microLED, etc. Other configurations are possible as well.

It can be difficult to detect pressure of objects in a traditional PCAP touch systems. Typically, non-conductive or dielectric objects cannot be detected using a traditional PCAP touch controller. Furthermore traditional PCAP touch controllers and touch sensors cannot detect pressure of an object. Pressure conditions in proximity to a cross-point, by a passive stylus for example, cause compression in the dielectric layer that increases the mutual capacitance at that cross-point, causing an decrease in impedance indicated in a corresponding component of sensed signals 120. This provides a mechanism whereby a passive stylus can be tracked and/or levels of pressure can be measured.

Figure 51A:
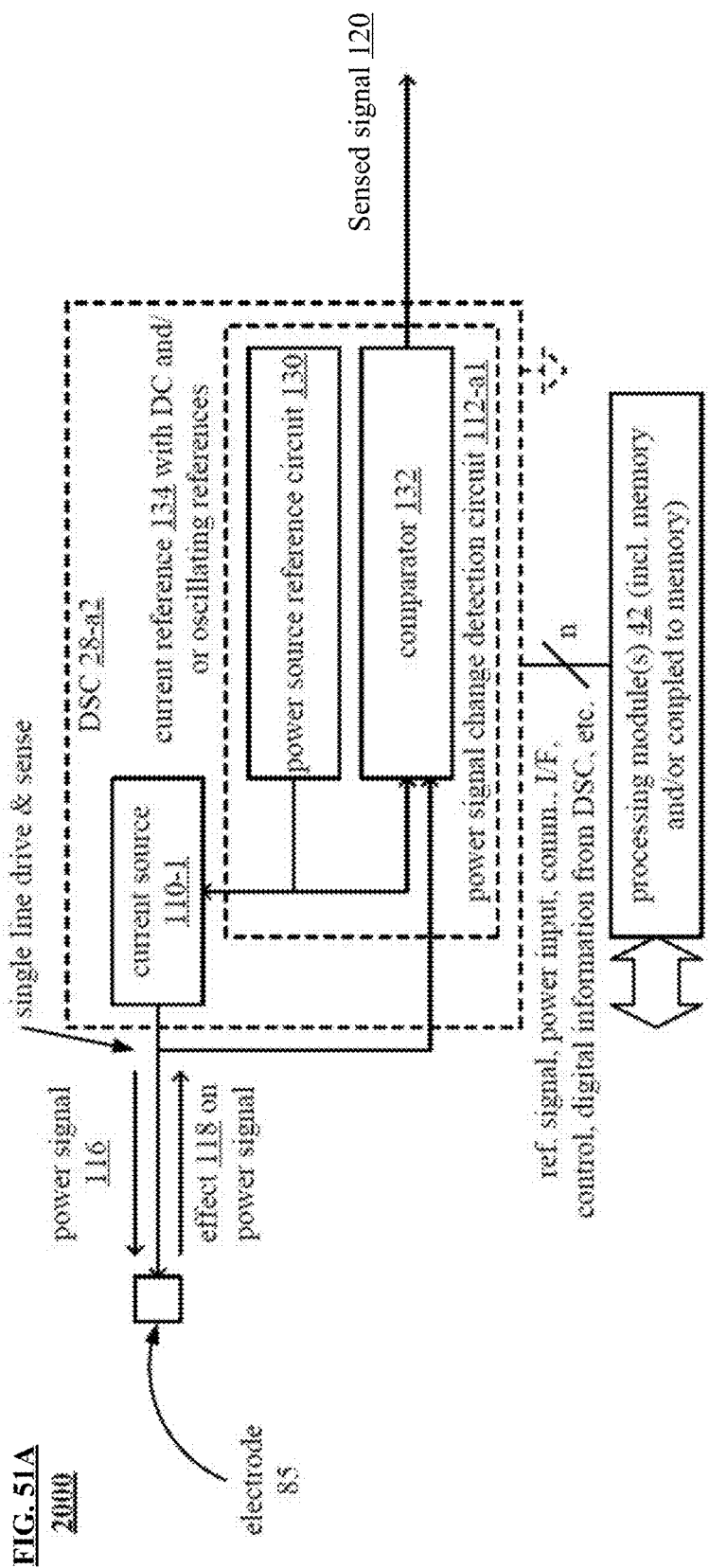
FIG. 51A is a schematic block diagram of an embodiment of a DSC that is interactive with an electrode in accordance with the present disclosure.

FIG. 51A is a schematic block diagram of an embodiment 2000 of a DSC that is interactive with an electrode in accordance with the present disclosure. Similar to other diagrams, examples, embodiments, etc. herein, the DSC 28-$a2$ of this diagram is in communication with one or more processing modules 42. The DSC 28-$a2$ is configured to provide a signal (e.g., a power signal, an electrode signal, transmit signal, a monitoring signal, etc.) to the electrode 85 via a single line and simultaneously to sense that signal via the single line. In some examples, sensing the signal includes detection of an electrical characteristic of the electrode that is based on a response of the electrode 85 to that signal. Examples of such an electrical characteristic may include detection of an impedance (such as the magnitude of the impedance) of the electrode 85 that is dependent on the mutual capacitance of the various cross-points of the electrode 85, detection of one or more signals coupled into the electrode 85 such as from one or more other electrodes, and/or other electrical characteristics.

In some examples, the DSC 28-$a2$ is configured to provide the signal to the electrode to perform any one or more of capacitive imaging of an element (e.g., a touch screen display) that includes the electrode. This embodiment of a DSC 28-$a2$ includes a current source 110-1 and a power signal change detection circuit 112-$a1$. The power signal change detection circuit 112-$a1$ includes a power source reference circuit 130 and a comparator 132. The current source 110-1 may be an independent current source, a dependent current source, a current mirror circuit, etc.

In an example of operation, the power source reference circuit 130 provides a current reference 134 with DC and oscillating components to the current source 110-1. The current source generates a current as the power signal 116 based on the current reference 134. An electrical characteristic of the electrode 85 has an effect on the current power signal 116. For example, if the magnitude of the impedance of the electrode 85 decreases, the current power signal 116 remains substantially unchanged, and the voltage across the electrode 85 is decreased.

The comparator 132 compares the current reference 134 with the affected power signal 118 to produce the sensed signal 120 that is representative of the change to the power signal. For example, the current reference signal 134 corresponds to a given current (I) times a given impedance (Z). The current reference generates the power signal to produce the given current (I). If the impedance of the electrode 85 substantially matches the given impedance (Z), then the comparator's output is reflective of the impedances substantially matching. If the impedance of the electrode 85 is greater than the given impedance (Z), then the comparator's output is indicative of how much greater the impedance of the electrode 85 is than that of the given impedance (Z). If the impedance of the electrode 85 is less than the given impedance (Z), then the comparator's output is indicative of how much less the impedance of the electrode 85 is than that of the given impedance (Z).

Furthermore, components of the sensed signal 120 having differing frequencies or other distinguishing characteristics can each represent the impedance or other electrical characteristic of the electrode 85 for each of the corresponding cross-points that intersect that electrode 85. When considering all of the row/column electrodes 85 of a touch screen display, this facilitates the creation of capacitance image data associated with the plurality of cross points that indicates the capacitive coupling associated with each individual cross-point and consequently, indicate variations of mutual capacitance at each individual cross-point.

Figure 51B:
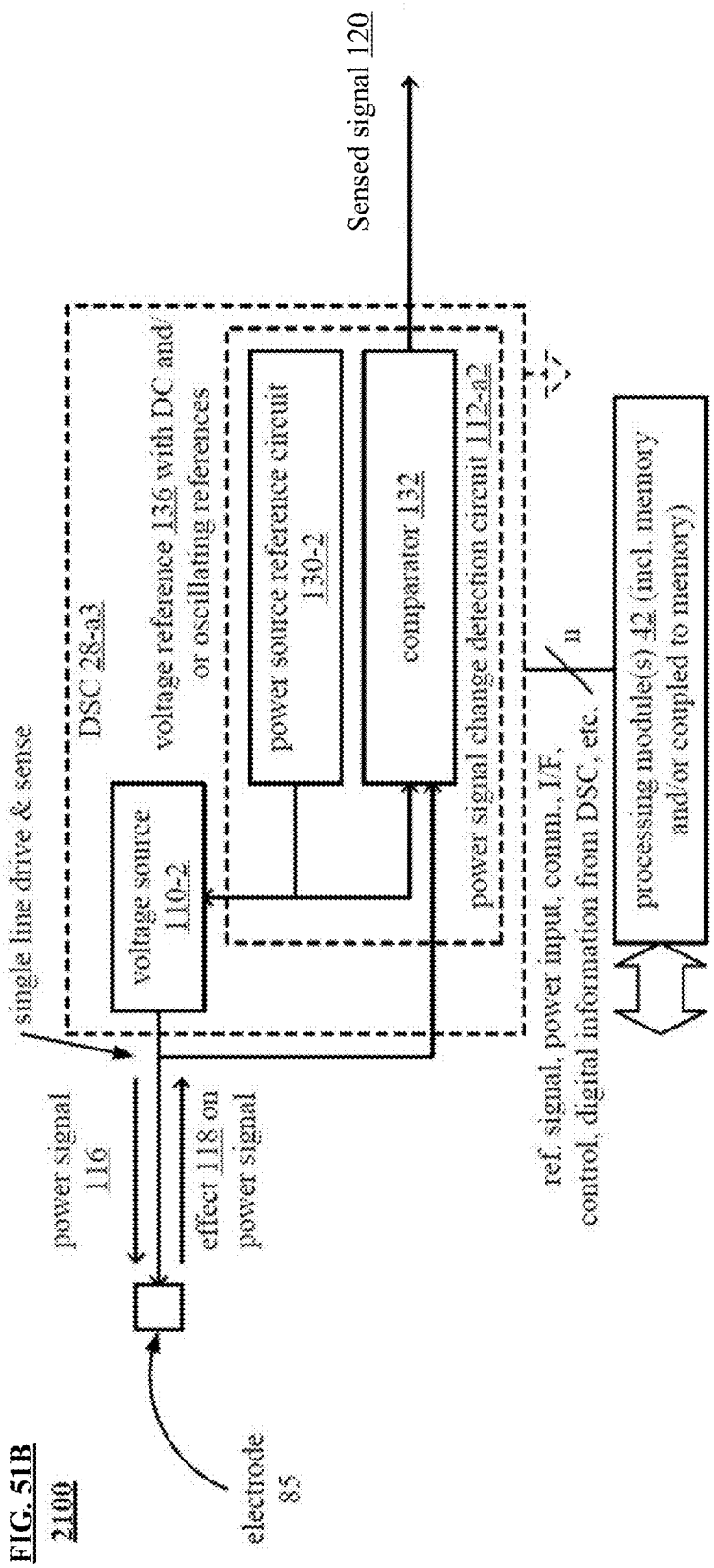
FIG. 51B is a schematic block diagram of another embodiment of a DSC that is interactive with an electrode in accordance with the present disclosure.

FIG. 51B is a schematic block diagram of another embodiment 2100 of a DSC that is interactive with an electrode in accordance with the present disclosure. Similar to other diagrams, examples, embodiments, etc. herein, the DSC 28-$a3$ of this diagram is in communication with one or more processing modules 42. Similar to the previous diagram, although providing a different embodiment of the DSC, the DSC 28-$a3$ is configured to provide a signal to the electrode 85 via a single line and simultaneously to sense that signal via the single line. In some examples, sensing the signal includes detection of an electrical characteristic of the electrode 85 that is based on a response of the electrode 85 to that signal. Examples of such an electrical characteristic may include detection of an impedance of the electrode 85 that depends on a mutual capacitance of the electrode 85, detection of one or more signals coupled into the electrode 85 such as from one or more other electrodes, and/or other electrical characteristics.

This embodiment of a DSC 28-$a3$ includes a voltage source 110-2 and a power signal change detection circuit 112-$a2$. The power signal change detection circuit 112-$a2$ includes a power source reference circuit 130-2 and a comparator 132-2. The voltage source 110-2 may be a battery, a linear regulator, a DC-DC converter, etc.

In an example of operation, the power source reference circuit 130-2 provides a voltage reference 136 with DC and oscillating components to the voltage source 110-2. The voltage source generates a voltage as the power signal 116 based on the voltage reference 136. An electrical characteristic of the electrode 85 has an effect on the voltage power signal 116. For example, if the impedance of the electrode 85 decreases, the voltage power signal 116 remains substantially unchanged and the current through the electrode 85 is increased.

The comparator 132 compares the voltage reference 136 with the affected power signal 118 to produce the signal 120 that is representative of the change to the power signal. For example, the voltage reference signal 134 corresponds to a given voltage (V) divided by a given impedance (Z). The voltage reference generates the power signal to produce the given voltage (V). If the impedance of the electrode 85 substantially matches the given impedance (Z), then the comparator's output is reflective of the impedances substantially matching. If the impedance of the electrode 85 is greater than the given impedance (Z), then the comparator's output is indicative of how much greater the impedance of the electrode 85 is than that of the given impedance (Z). If the impedance of the electrode 85 is less than the given impedance (Z), then the comparator's output is indicative of how much less the impedance of the electrode 85 is than that of the given impedance (Z).

With respect to many of the following diagrams, one or more processing modules 42, which includes and/or is coupled to memory, is configured to communicate and interact with one or more DSCs 28 the coupled to one or more electrodes of the panel or a touchscreen display. In many of the diagrams, the DSCs 28 are shown as interfacing with electrodes of the panel or touchscreen display (e.g., via interface 86 that couples to roll electrodes and interface 87 that couples to column electrodes). Note that the number of lines that coupled the one or more processing modules 42 to the respective one or more DSCs 28, and from the one or more DSCs 28 to the respective interfaces 86 and 87 may be varied, as shown by n and m, which are positive integers greater than or equal to 1. Other diagrams also show different values, such as o, p, etc., which are also positive integers greater than or equal to 1. Note that the respective values may be the same or different within different respective embodiments and/or examples herein.

Note that the same and/or different respective signals may be driven simultaneously sensed by the respective one or more DSCs 28 that couple to electrodes 85 within any of the various embodiments and/or examples herein. In some examples, different respective signals (e.g., different respective signals having one or more different characteristics) are implemented in accordance with mutual signaling as described below.

For example, as previously discussed the different respective signals that are driven and simultaneously sensed via the electrodes 85 may be distinguished/differentiated from one another. For example, appropriate filtering and processing can identify the various signals given their differentiation, orthogonality to one another, difference in frequency, etc. Note that the differentiation among the different respective signals that are driven and simultaneously sensed by the various DSCs 28 may be differentiated based on any one or more characteristics such as frequency, amplitude, modulation, modulation & coding set/rate (MCS), forward error correction (FEC) and/or error checking and correction (ECC), type, etc.

Other examples described herein and their equivalents operate using any of a number of different characteristics other than or in addition to frequency. Differentiation between the signals based on frequency corresponds to a first signal has a first frequency and a second signal has a second frequency different than the first frequency. Differentiation between the signals based on amplitude corresponds to a that if first signal has a first amplitude and a second signal has a second amplitude different than the first amplitude. Note that the amplitude may be a fixed amplitude for a DC signal or the oscillating amplitude component for a signal having both a DC offset and an oscillating component. Differentiation between the signals based on DC offset corresponds to a that if first signal has a first DC offset and a second signal has a second DC offset different than the first DC offset.

Differentiation between the signals based on modulation and/or modulation & coding set/rate (MCS) corresponds to a first signal has a first modulation and/or MCS and a second signal has a second modulation and/or MCS different than the first modulation and/or MCS. Examples of modulation and/or MCS may include binary phase shift keying (BPSK), quadrature phase shift keying (QPSK) or quadrature amplitude modulation (QAM), 8-phase shift keying (PSK), 16 quadrature amplitude modulation (QAM), 32 amplitude and phase shift keying (APSK), 64-QAM, etc., uncoded modulation, and/or any other desired types of modulation including higher ordered modulations that may include even greater number of constellation points (e.g., 1024 QAM, etc.). For example, a first signal may be of a QAM modulation, and the second signal may be of a 32 APSK modulation. In an alternative example, a first signal may be of a first QAM modulation such that the constellation points there and have a first labeling/mapping, and the second signal may be of a second QAM modulation such that the constellation points there and have a second labeling/mapping.

Differentiation between the signals based on FEC/ECC corresponds to a first signal being generated, coded, and/or based on a first FEC/ECC and a second signal being generated, coded, and/or based on a second FEC/ECC that is different than the first modulation and/or first FEC/ECC. Examples of FEC and/or ECC may include turbo code, convolutional code, turbo trellis coded modulation (TTCM), low density parity check (LDPC) code, Reed-Solomon (RS) code, BCH (Bose and Ray-Chaudhuri, and Hocquenghem) code, binary convolutional code (BCC), Cyclic Redundancy Check (CRC), and/or any other type of ECC and/or FEC code and/or combination thereof, etc. Note that more than one type of ECC and/or FEC code may be used in any of various implementations including concatenation (e.g., first ECC and/or FEC code followed by second ECC and/or FEC code, etc. such as based on an inner code/outer code architecture, etc.), parallel architecture (e.g., such that first ECC and/or FEC code operates on first bits while second ECC and/or FEC code operates on second bits, etc.), and/or any combination thereof. For example, a first signal may be generated, coded, and/or based on a first LDPC code, and the second signal may be generated, coded, and/or based on a second LDPC code. In an alternative example, a first signal may be generated, coded, and/or based on a BCH code, and the second signal may be generated, coded, and/or based on a turbo code. Differentiation between the different respective signals may be made based on a similar type of FEC/ECC, using different characteristics of the FEC/ECC (e.g., codeword length, redundancy, matrix size, etc. as may be appropriate with respect to the particular type of FEC/ECC). Alternatively, differentiation between the different respective signals may be made based on using different types of FEC/ECC for the different respective signals.

Differentiation between the signals based on type corresponds to a first signal being or a first type and a second signal being of a second generated, coded, and/or based on a second type that is different than the first type. Examples of different types of signals include a sinusoidal signal, a square wave signal, a triangular wave signal, a multiple level signal, a polygonal signal, a DC signal, etc. For example, a first signal may be of a sinusoidal signal type, and the second signal may be of a DC signal type. In an alternative example, a first signal may be of a first sinusoidal signal type having first sinusoidal characteristics (e.g., first frequency, first amplitude, first DC offset, first phase, etc.), and the second signal may be of second sinusoidal signal type having second sinusoidal characteristics (e.g., second frequency, second amplitude, second DC offset, second phase, etc.) that is different than the first sinusoidal signal type.

Note that any implementation that differentiates the signals based on one or more characteristics may be used in this and other embodiments, examples, and their equivalents to distinguish and identify variations in capacitive coupling/mutual capacitance between each cross point between the row and column electrodes in a sensing layer.

In addition, within this diagram above as well as any other diagram described herein, or their equivalents, the one or electrodes 85 (e.g., touch sensor electrodes such as may be implemented within a device operative to facilitate sensing of touch, proximity, gesture, etc.) may be of any of a variety of one or more types including any one or more of a touch sensor device, a touch sensor element (e.g., including one or more touch sensors with or without display functionality), a touch screen display including both touch sensor and display functionality, a button, an electrode, an external controller, one or more rows of electrodes, one or more columns of electrodes, a matrix of buttons, an array of buttons, a film that includes any desired implementation of components to facilitate touch sensor operation, and/or any other configuration by which interaction with the touch sensor may be performed.

Note that the one or more electrodes 85 may be implemented within any of a variety of devices including any one or more of a touchscreen, a pad device, a laptop, a cell phone, a smartphone, a whiteboard, an interactive display, a navigation system display, an in-vehicle display, etc., and/or any other device in which one or more touch electrodes 85 may be implemented.

Note that such interaction of a user with an electrode 85 may correspond to the user touching the touch sensor, the user being in proximate distance to the touch sensor (e.g., within a sufficient proximity to the touch sensor that coupling from the user to the touch sensor may be performed via capacitively coupling (CC), etc. and/or generally any manner of interacting with the touch sensor that is detectable based on processing of signals transmitted to and/or sensed from the touch sensor including proximity detection, gesture detection, etc.). With respect to the various embodiments, implementations, etc. of various respective electrodes as described herein, note that they may also be of any such variety of one or more types. For example, electrodes may be implemented within any desired shape or style (e.g., lines, buttons, pads, etc.) or include any one or more of touch sensor electrodes, capacitive buttons, capacitive sensors, row and column implementations of touch sensor electrodes such as in a touchscreen, etc.

Figure 51C:
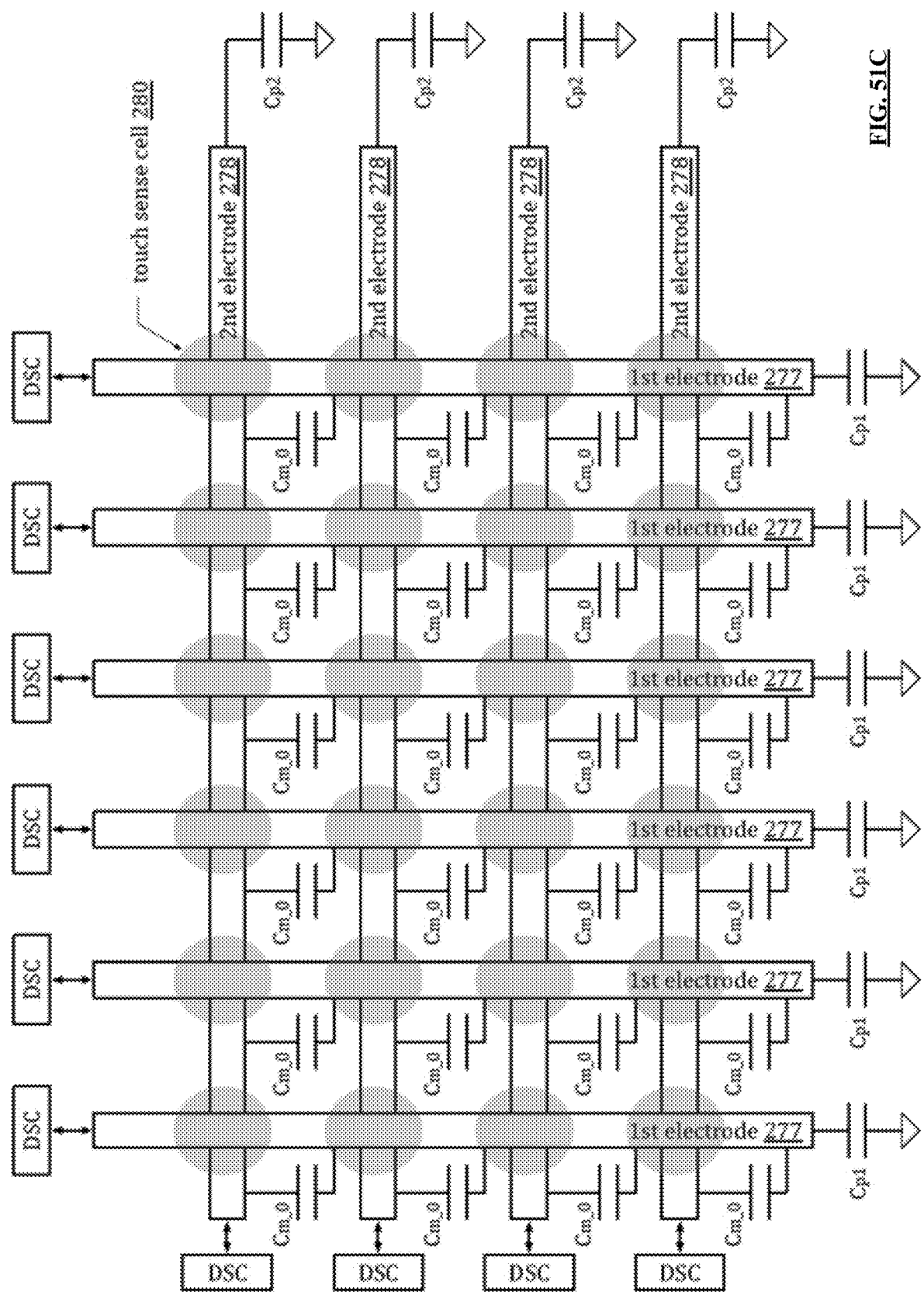
FIG. 51C is a schematic block diagram of an embodiment of a plurality of electrodes creating a plurality of touch sense cells 280 within a display.

FIG. 51C is a schematic block diagram of an embodiment of a plurality of electrodes creating a plurality of touch sense cells 280 within a display. In this embodiment, a few second electrodes 278 are perpendicular and on a different layer of the display than a few of the first electrodes 277. For each cross-point of a first electrode and a second electrode, a touch sense cell 280 is created. At each touch sense cell 280/cross-point, a mutual capacitance ($C_{m\_0}$) is created between the crossing electrodes at each cross-point.

A drive sense circuit (DSC) is coupled to a corresponding one of the electrodes. The drive sense circuits (DSC) provides electrode signals to the electrodes and generates sensed signals 120 that indicates the loading on the electrode signals of the electrodes. When no touch is present, each touch cell 280 will have a similar mutual capacitance, $C_{m\_0}$. When a traditional proximal touch is applied on or near a touch sense cell 280 by a finger, for example, the mutual capacitance of the cross point will decrease (creating an increased impedance). Based on these impedance changes of the various distinguishing components of sensed signals 120, the processing module can generate capacitance image data as, for example, captured frames of data that indicate the magnitude of the capacitive coupling at each of the cross-points indicative of variations in their mutual capacitance and further can be analyzed to determine the location of a touch, or touches and or other conditions of the display.

Figures 51D, 51E:
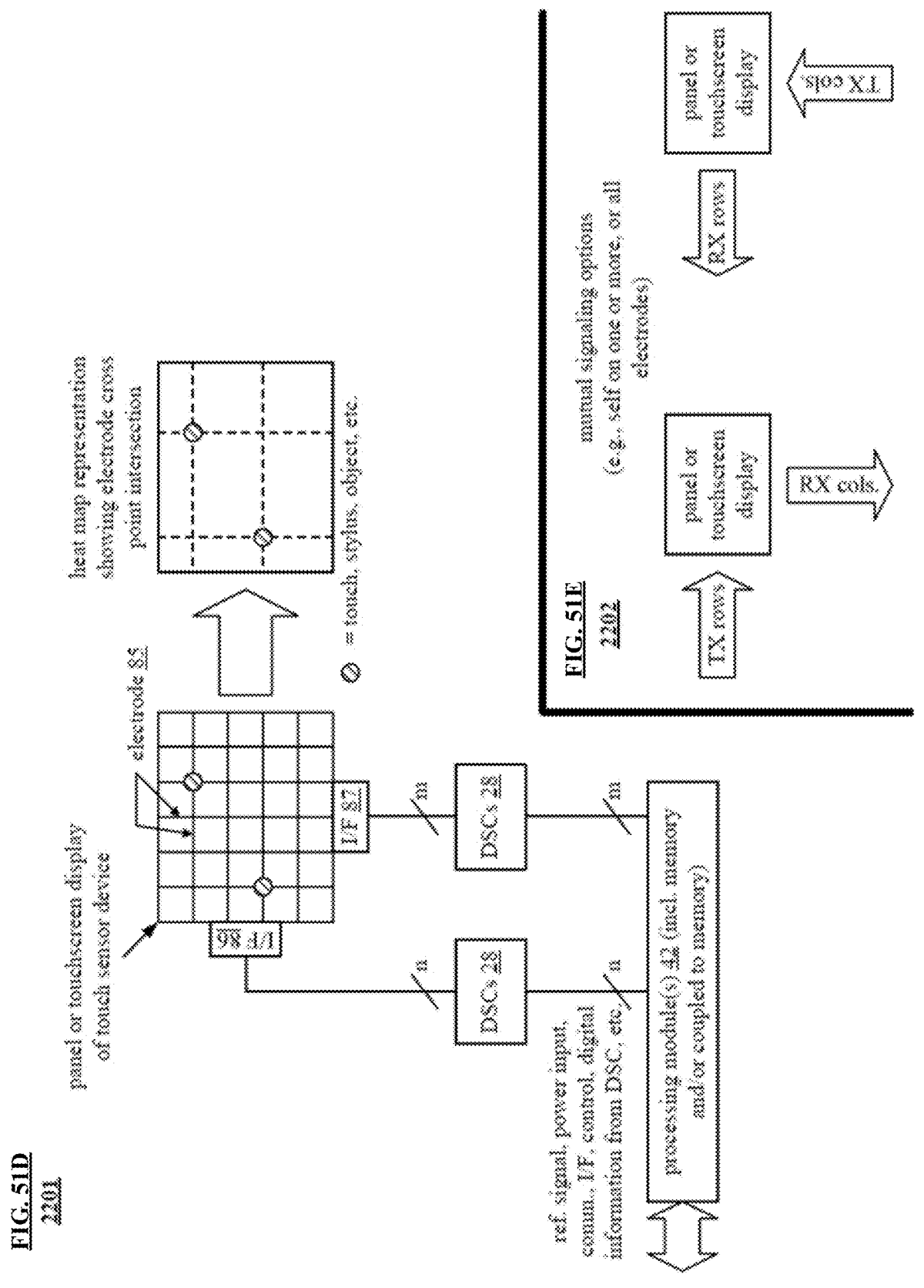

FIG. 51D is a schematic block diagram of another embodiment 2201 of a touch sensor device in accordance with the present disclosure. This diagram shows a panel or touchscreen display with touch sensor device that includes electrodes 85 that are arranged in rows and columns. One or more processing modules 42 is implemented to communicate and interact with the first set of DSCs 28 that couple to the row electrodes via interface 86 and a second set of DSCs 28 that are coupled to the column electrodes the interface 87.

With respect to signaling provided from the DSCs 28 to the respective column and row electrodes, note that mutual signaling is performed in certain examples. With respect to mutual signaling, different signals are provided via the respective DSCs 28 that couple to the row and column electrodes. For example, a first mutual signal is provided via a first DSC 28 to a first row electrode via the interface 86, and a second mutual signals provided via second DSC 28 to a second row electrode via the interface 86, etc. Generally speaking, different respective mutual signals are provided via different respective DSCs 28 to different respective row electrodes via the interface 86 and those different respective mutual signals are then detected via capacitive coupling into one or more of the respective column electrodes via the different respective DSCs 28 that couple to the row electrodes via the interface 87. Then, the respective DSCs 28 that couple to the column electrodes via interface 87 are implemented to detect capacitive coupling of those signals that are provided via the respective row electrodes via the interface 86 to identify the location of any interaction with the panel or touchscreen display.

From certain perspectives and generally speaking, mutual signaling facilitates not only detection of interaction with the panel or touchscreen but can also provide disambiguation of the location of the interaction with the panel or touchscreen. In certain examples, one or more processing modules 42 is configured to process both the signals that are transmitted, received, and simultaneously sensed, etc. in accordance with mutual signaling with respect to a panel or touchscreen display.

For example, as a user interacts with the panel or touchscreen display, such as based on a touch from a finger or portion of the user's body, a stylus, etc., there will be capacitive coupling of the signals that are provided via the row electrodes into the column electrodes proximally close to the cross-points of each of those row and column electrodes. Based on detection of the signal that has been transmitted via the row electrode into the column electrode, has facilitated based on the capacitive coupling that is based on the user interaction with the panel or touchscreen display via, for example, a stylus, pen or finger). The one or more processing modules 42 is configured to identify the location of the user interaction with the panel or touchscreen display based on changes in the sensed signals 120 caused by changes in mutual capacitance at the various cross-points. In addition, note that non-user associated objects may also interact with the panel or touchscreen display, such as based on capacitive coupling between such non-user associated objects with the panel or touchscreen display that also facilitate capacitive coupling between signals transmitted via a row electrode into corresponding column electrodes at a corresponding cross-points in the row, or vice versa.

Consider two respective interactions with the panel touchscreen display as shown by the hashed circles, then a corresponding heat map or other capacitance image data showing the electrode cross-point intersection may be generated by the one or more processing modules 42 interpreting the signals provided to it via the DSCs 28 that couple to the row and column electrodes.

In addition, with respect to this diagram and others herein, the one or more processing modules 42 and DSC 28 may be implemented in a variety of ways. In certain examples, the one or more processing modules 42 includes a first subset of the one or more processing modules 42 that are in communication and operative with a first subset of the one or more DSCs 28 (e.g., those in communication with one or more row electrodes of a panel or touchscreen display a touch sensor device) and a second subset of the one or more processing modules 42 that are in communication and operative with a second subset of the one or more DSCs 28 (e.g., those in communication with column electrodes of a panel or touchscreen display a touch sensor device).

In even other examples, the one or more processing modules 42 includes a first subset of the one or more processing modules 42 that are in communication and operative with a first subset of one or more DSCs 28 (e.g., those in communication with one or more row and/or column electrodes) and a second subset of the one or more processing modules 42 that are in communication and operative with a second subset of one or more DSCs 28 (e.g., those in communication with electrodes of another device entirely, such as another touch sensor device, an e-pen, etc.).

In yet other examples, the first subset of the one or more processing modules 42, a first subset of one or more DSCs 28, and a first subset of one or more electrodes 85 are implemented within or associated with a first device, and the second subset of the one or more processing modules 42, a second subset of one or more DSCs 28, and a second subset of one or more electrodes 85 are implemented within or associated with a second device. The different respective devices (e.g., first and second) may be similar type devices or different devices. For example, they may both be devices that include touch sensors (e.g., without display functionality). For example, they may both be devices that include touchscreens (e.g., with display functionality). For example, the first device may be a device that include touch sensors (e.g., with or without display functionality), and the second device is an e-pen device.

In an example of operation and implementation, with respect to the first subset of the one or more processing modules 42 that are in communication and operative with a first subset of one or more DSCs 28, a signal #1 is coupled from a first electrode 85 that is in communication to a first DSC 28 of the first subset of one or more DSCs 28 that is in communication and operative with the first subset of the one or more processing modules 42 to a second electrode 85 that is in communication to a first DSC 28 of the second subset of one or more DSCs 28 that is in communication and operative with the second subset of the one or more processing modules 42.

When more than one DSC 28 is included within the first subset of one or more DSCs 28, the signal #1 may also be coupled from the first electrode 85 that is in communication to a first DSC 28 of the first subset of one or more DSCs 28 that is in communication and operative with the first subset of the one or more processing modules 42 to a third electrode 85 that is in communication to a second DSC 28 of the second subset of one or more DSCs 28 that is in communication and operative with the second subset of the one or more processing modules 42.

Generally speaking, signals may be coupled between one or more electrodes 85 that are in communication and operative with the first subset of the one or more DSCs 28 associated with the first subset of the one or more processing modules 42 and the one or more electrodes 85 that are in communication and operative with the second subset of the one or more DSCs 28 (e.g., signal #1, signal #2). In certain examples, such signals are coupled from one electrode 85 to another electrode 85.

In some examples, these two different subsets of the one or more processing modules 42 are also in communication with one another (e.g., via communication effectuated via capacitive coupling between a first subset of electrodes 85 serviced by the first subset of the one or more processing modules 42 and a second subset of electrodes 85 serviced by the first subset of the one or more processing modules 42, via one or more alternative communication means such as a backplane, a bus, a wireless communication path, etc., and/or other means). In some particular examples, these two different subsets of the one or more processing modules 42 are not in communication with one another directly other than via the signal coupling between the one or more electrodes 85 themselves.

A first group of one or more DSCs 28 is/are implemented simultaneously to drive and to sense respective one or more signals provided to a first of the one or more electrodes 85. In addition, a second group of one or more DSCs 28 is/are implemented simultaneously to drive and to sense respective one or more other signals provided to a second of the one or more electrodes 85.

For example, a first DSC 28 is implemented simultaneously to drive and to sense a first signal via a first sensor electrode 85. A second DSC 28 is implemented simultaneously to drive and to sense a second signal via a second sensor electrode 85. Note that any number of additional DSCs implemented simultaneously to drive and to sense additional signals to additional electrodes 85 as may be appropriate in certain embodiments. Note also that the respective DSCs 28 may be implemented in a variety of ways. For example, they may be implemented within a device that includes the one or more electrodes 85, they may be implemented within a touchscreen display, they may be distributed among the device that includes the one or more electrodes 85 that does not include display functionality, etc.

FIG. 51E is a schematic block diagram of an embodiment 2202 of mutual signaling within a touch sensor device in accordance with the present disclosure. Note that mutual signaling may be performed in a variety of different ways. For example, mutual signaling may be performed such that signals are transmitted via the row electrodes of the panel or touchscreen display and detection of capacitive coupling of those signals into the column electrodes is detected via the column electrodes as variations in sensed signals 120. Alternatively, mutual signaling may be performed such that signals are transmitted via the column electrodes of the panel or touchscreen display and detection of capacitive coupling of those signals into the row electrodes is detected via the row electrodes as variations in sensed signals 120. Regardless of the particular implementation by which mutual signaling is performed, note that a respective DSC 28 is configured to transmit a signal via the respective electrode to which it coupled and simultaneously to sense that same signal via that respective electrode including to sense any other signal that is coupled into that respective electrode (e.g., such as with respect to capacitive coupling of signals from one or more other electrodes based on user interaction with the panel or touchscreen display).

Note that certain examples of signaling as described herein relate to mutual signaling such that a one or more signals are transmitted via row electrodes of one or more panels or touchscreen displays and, based on capacitive coupling of those one or more signals into column electrodes of the one or more panels are touchscreen displays, disambiguation of the location of any interaction of a user, device, object, etc. may be identified by one or more processing modules 42 that are configured to interpret the signals provided from one or more DSCs 28.

Figure 51F:
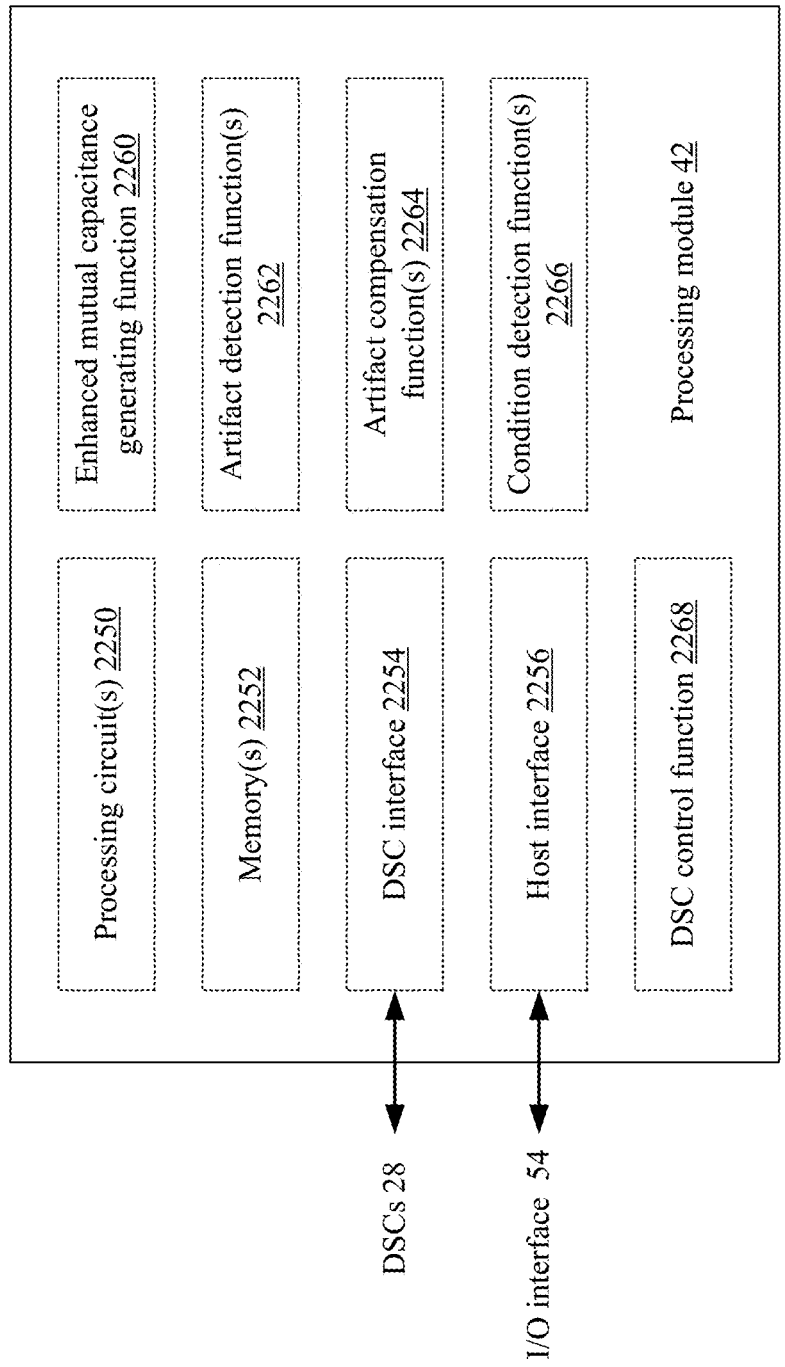
FIG. 51F is a schematic block diagram of an embodiment of a processing module in accordance with the present disclosure.

FIG. 51F is a schematic block diagram of an embodiment of a processing module in accordance with the present disclosure. In particular, a processing module 42 is presented as a further embodiment of processing module 42, and/or other processing modules disclosed herein with display 250, 250' and/or other touch screen displays disclosed herein. The processing module 42 improves the technology of touch screens, such as Projected Capacitive (PCAP) touch screens and associated touch screen controllers by employing enhanced mutual capacitance, namely the ability to detect both increases and decreases in the amplitude of mutual capacitance signals with the processing module 42 or other touch controller. This enhanced mutual capacitance capability allows for improved performance in the presence of noise, interference and/or other artifacts. It further provides an improved ability to detect, identify, characterize and track proximal touch conditions by an object or finger, pressure conditions and other conditions of a touch screen display.

The processing module 42 includes one or more processing circuits 2250 and one or more memories 2252. The processing module 42 also includes a DCS interface 2254, such as a serial or parallel I/O interface or other interface device for receiving sensed signals 120 from the DSC(s) 28 and/or for controlling their operation, e.g. via selectively enabling or disabling groups or individual DSC(s) 28. The processing module 42 also includes a host interface 2254, such as a serial or parallel I/O interface or other interface device for receiving commands from core computer 14 or other host device and for sending condition data and/or other touch screen data to a core computer 14 or other host device indicating, for example, the presence or absence of various touch conditions of the touch screen display, tracking and location data as well as other parameters associated the various touch conditions of the touch screen display that identify and/or characterize various artifacts or conditions.

In operation, the memory(s) 2252 store operational instructions and the processing circuit(s) execute the instructions to perform operations that can include selectively enabling or disabling groups or individual DSC(s) 28 and receiving sensed signals 120 via the DSC interface 2254. In addition, the operations can include other operations such as executing enhanced mutual capacitance generating function 2260, artifact detection function(s) 2262, artifact compensation function(s) 2264, condition detection function(s) 2266 and/or other functions and operations associated with a touch screen display.

In various embodiments, the enhanced mutual capacitance generating function 2260 can include one or more of the following operations:

Analyzing sensed signals 120 to distinguish the separate components, e.g. impedances or other electrical characteristics indicating capacitive coupling/mutual capacitance corresponding to each individual cross-point. This can include differentiation of individual components by frequency, time, modulation, coding and/or other distinguishing characteristic as discussed herein.

Formatting the separate components as capacitance image data. This can include capturing the magnitude of the separate components corresponding to each individual cross-point and a corresponding coordinates indicating the position of the cross-point in the touch screen display, and generating capacitive image data, for example as frames of data formatted to indicate these magnitudes and positions as a two-dimensional image or other array. In particular, the magnitude portion of the capacitance image data includes positive capacitance variation data corresponding to positive variations of the capacitance image data from a nominal value and negative capacitance variation data corresponding to negative variations of the capacitance image data from the nominal value.

Examples of positive capacitance variation data and negative capacitance variation data including several alternatives will be discussed further in conjunction with FIG. 52A that follows.

Figure 52A:
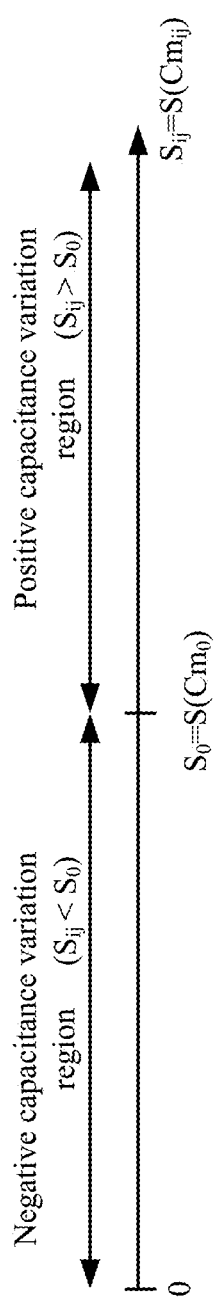
FIG. 52A is a graphical diagram of an embodiment of capacitance image data in accordance with the present disclosure.

FIG. 52A is a graphical diagram 300 of an embodiment of capacitance image data in accordance with the present disclosure. As previously discussed, components of the sensed signal 120 having differing frequencies or other differentiating characteristics can each represent the impedance or other electrical characteristic of an electrode 85 for each of the corresponding cross-points that intersect that electrode 85. When considering all of the row/column electrodes 85 of a touch screen display, this facilitates the creation of capacitance image data associated with the plurality of cross points that indicates the capacitive coupling associated with each individual cross-point and consequently, indicate variations of mutual capacitance at each individual cross-point. In particular, components of sensed signals 120 vary from the nominal mutual capacitance value for each cross-point in response to variations in mutual capacitance associated with that cross point.

Consider a component of sensed signals 120 for a cross-point with coordinate position (i, j) of the touch screen display and in a corresponding coordinate position in the capacitance image data to be represented by $S_{ij}$. This component can be expressed as a function S of the actual mutual capacitance of the cross-point with coordinate position (i, j) or $Cm_{ij}$, $S_{ij} = S(Cm_{ij})$ As previously discussed, the function S can be proportional to the magnitude of the impedance of the cross-point (i, j) at the particular operating frequency, in which case, the value of $S_{ij}$ increases in response to a decrease in the value of the mutual capacitance $Cm_{ij}$. As also noted, in other examples, the function S can be proportional to other electrical characteristic(s) of the mutual capacitance of the cross-point.

Consider further, the nominal value of $S_{ij}$—corresponding to a quiescent state—such as the absence of a proximal touch condition of the touch screen display, noise, pressure or other artifacts, etc. This nominal value can be represented by $S_0$, where, $S_0 = S(Cm_0)$ and $Cm_0$ (or $Cm_{\_0}$) represents a nominal mutual capacitance, such as the mutual capacitance of the particular cross-point (i, j) in the quiescent state. In a further example, the nominal mutual capacitance $Cm_0$ can be predetermined value and assumed to be the same, or substantially the same for all of the cross-points within a predetermined or industry-accepted tolerance such as 1%, 5%, 10% or some other value and the same value of $Cm_0$ is used for all cross-points. In the alternative, $Cm_0$ can be calculated as an average mutual capacitance calculated over all of the cross-points of the touch screen display in the quiescent state or other operating state in the presence of normal operating noise. In a further example, $Cm_0$ can be calculated individually for all of the cross-points of the touch screen display in the quiescent state or other operating state in the presence of normal operating noise, with each individual value being used for its corresponding cross-point. While described above in terms of values of $Cm_0$, predetermined or calculated values of $S_0$ could similarly be used directly.

As used herein, a frame of capacitance image data for an N×M touch screen includes, an N×M array of magnitude data $S_{ij}$, at corresponding cross-point coordinate positions $1 \leq i \leq N$ and $1 \leq j \leq M$. The magnitude portion of the capacitance image data $S_{ij}$ can include positive capacitance variation data corresponding to positive variations of the capacitance image data from the nominal value $S_0$ in the positive capacitance region shown where, $(S_{ij} > S_0)$ The magnitude portion of the capacitance image data $S_{ij}$ can also include negative capacitance variation data corresponding to negative variations of the capacitance image data from the nominal value $S_0$ in the negative capacitance region shown where, $(S_{ij} < S_0)$ It should be noted, when the function S is proportional to the magnitude of the impedance of the cross-point (i, j) at the particular operating frequency, negative variations in mutual capacitance from the nominal mutual capacitance $Cm_0$ result in positive capacitance variation data. Conversely, positive variations in mutual capacitance from the nominal mutual capacitance $Cm_0$ result in negative capacitance variation data.

Figure 52B:
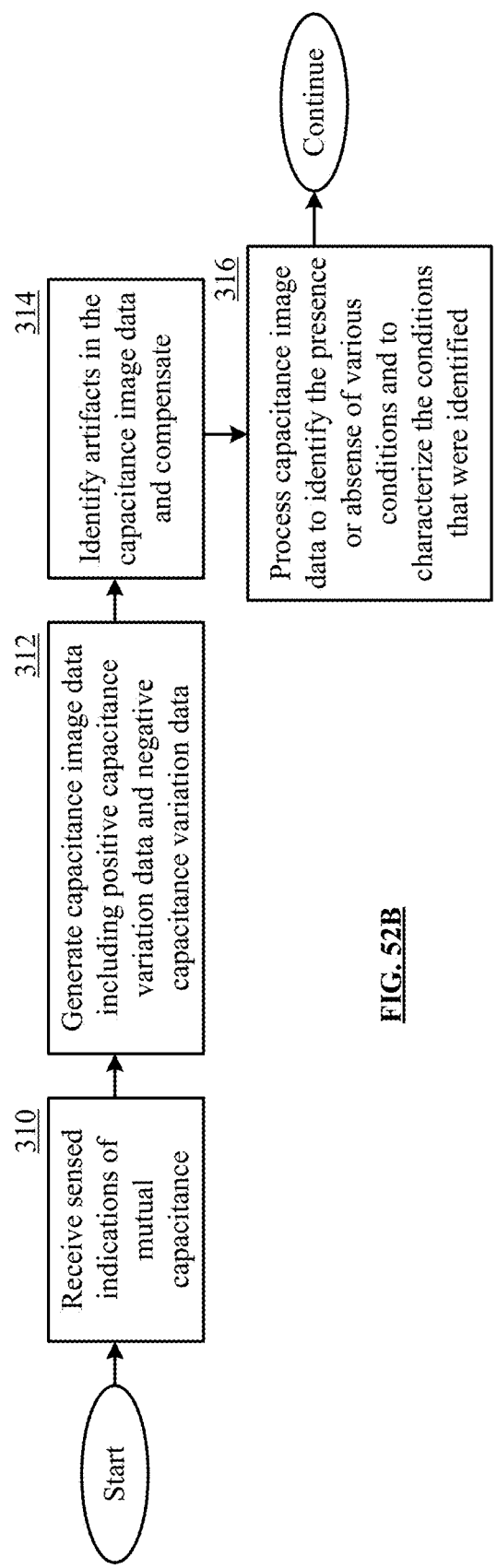
FIG. 52B is a flow diagram of an embodiment of a method in accordance with the present disclosure.

FIG. 52B is a flow diagram of an embodiment of a method in accordance with the present disclosure. In particular a method is presented for use in conjunction with the processing module 42, display 250, 250' and/or other processing modules and touch screen displays disclosed herein. Step 310 includes receiving sensed indications of mutual capacitance. This step can be performed, for example, via DSC interface 2254. Step 312 includes generating capacitance image data including positive capacitance variation data and negative capacitance variation data. This step can be performed, for example, via enhanced mutual capacitance generating function 2260. Step 314 includes identifying artifacts in the capacitance image data and compensating for those artifacts. This step can be performed, for example, via artifact detection function(s) 2262 and/or artifact detection function(s) 2264. In some embodiments, artifact compensation is performed only if one or more artifacts are identified. In other examples, such as noise compensation, artifact compensation can be performed repeatedly, continuously and/or periodically. Step 316 includes processing the capacitance image data to identify the presence and/or absence of various conditions and to characterize the conditions that were identified. This step can be performed, for example, via condition detection function(s) 2266.

Returning back to FIG. 51F, in various embodiments, the artifact detection function(s) 2262 process the capacitance image data to detect, identify and/or characterize one or more conditions of the touch screen display corresponding to artifacts in the capacitance image data—conditions that differ from the ordinary proximal touch conditions, by fingers, a stylus, etc. and/or that differ from other conditions of the touch screen display that occur during the intended operation of the touch screen display. Examples of such artifacts include noise in the capacitance image data, interference caused by the presence of devices in proximity to the display that emit electromagnetic fields having frequencies that overlap with the operating frequency or frequencies of the touch screen display and/or variations in the capacitance image data caused by the presence of water or salt-water on the surface of the touch screen display, the presence of other foreign objects on the surface of the touch screen display or in proximity to the display including conductive objects, dielectric objects and non-conductive objects that are not intended by the user to invoke touch operations and/or other artifacts in the capacitance image data caused by other undesirable conditions.

The operations of the artifact detection function(s) 2262 can include one or more of the following operations:

Processing the positive capacitance variation data and/or the negative capacitance variation data via one or more inference functions corresponding to each possible artifact to be detected. Examples of such inference functions can include signal analysis, statistical noise analysis, statistical pattern recognition functions, other pattern recognition functions, texture recognition functions, artificial intelligence (AI) models such as convolutional neural networks, deep-learning functions, clustering algorithms, machine learning functions trained on sets of training data with capacitance image data corresponding to known conditions of various kinds, and/or other image processing techniques. In various embodiments, the capacitance image data is processed via each of the inference functions to determine if an artifact corresponding to each particular inference function is present or absent.

If the presence of a particular artifact is detected, the particular artifact can be identified and/or characterized based on one or more parameters of the artifact. In this fashion, for example, noise or interference can be identified and characterized based on noise or interference levels, signal to noise ratio, signal to noise and interference ratio, interference frequencies, etc. In a further example, the presence of water droplets on the display can be identified and or characterized by amount or level.

When one or more artifacts are detected via the artifact detection function(s) 2262, one or more artifact compensation function(s) 2264 corresponding to the identified artifact or artifacts can be selected and enabled to compensate for these particular artifact(s) in the capacitance image data. In particular the goal of the artifact compensation function(s) 2264 is to generate compensated capacitance image data that permits the continued normal and desired touch operation of the touch screen display. The operations of the artifact detection function(s) 2262 can include one or more of the following operations:

Determining locations and/or other portions of the positive capacitance variation data and/or the negative capacitance variation data corresponding to the artifact(s). For example, the presence of noise can result in high frequency variations in both the positive capacitance variation data and the negative capacitance variation data within a noise zone about $S_0$. The magnitude of the noise determined statistically or based on peak signal levels by the artifact detection functions(s) 2262 can be used to determine the size of the noise zone. In another example, the presence of water on the display can result in static or slowly varying variations in both the positive capacitance variation data and the negative capacitance variation data about $S_0$. The signal variation artifacts caused by the water in the positive capacitance variation data and the negative capacitance variation data can be identified.

Generating compensated capacitance image data by subtracting, ignoring or removing the portions of the positive capacitance variation data and/or the negative capacitance variation data corresponding to the artifact(s).

The condition detection function(s) 2266 operate to detect and/or identify a desired condition of the touch screen display, i.e. an intended actual proximal touch operation. Examples of such desired conditions a proximal touch by a finger, e-pen or stylus, touch pressure by a conductive, non-conductive or dielectric object, the presence of an object with a particular shape on the surface of the display, and/or other desired conditions. The operation of the condition detection function(s) 2266 can include:

Processing the positive capacitance variation data and/or the negative capacitance variation data from the capacitance image data (in the absence of artifacts) or from the compensated capacitance image data (in the presence of one or more artifacts) to identify one or more touch conditions or other desired condition. For example, the presence of a spike in the positive capacitance variation data above a touch threshold can be used to identify proximal finger touches. In another example, the presence of a spike in the negative capacitance variation data below a pressure threshold can be used to identify a pressure point caused, for example, by weight applied by an object. In a further example, an object of one or more particular shape(s) on or near the surface of the display can be detected based on analysis by one or more inference functions corresponding to these particular shapes. Examples of such inference functions can include statistical pattern recognition functions, other pattern recognition functions, texture recognition functions, artificial intelligence (AI) models such as convolutional neural networks, deep-learning functions, clustering algorithms, machine learning functions trained on sets of training data with capacitance image data corresponding to known conditions of various kinds, and/or other image processing techniques.

If a particular condition is detected, condition data can be generated that indicates the condition, and/or parameters of the condition. Such condition data can be sent via the host interface 2256 for use by a host device, running app, the core computer 14 etc. Examples of such condition data include the identification and location of one or more touches, the identification and location of one or more pressure points, the locations and identification of one or more particular shapes and/or their orientation and/or other characterization parameters.

The further operation of the processing module 42, including several optional functions and features, will be described in conjunction with the figures that follow.

Figure 53:
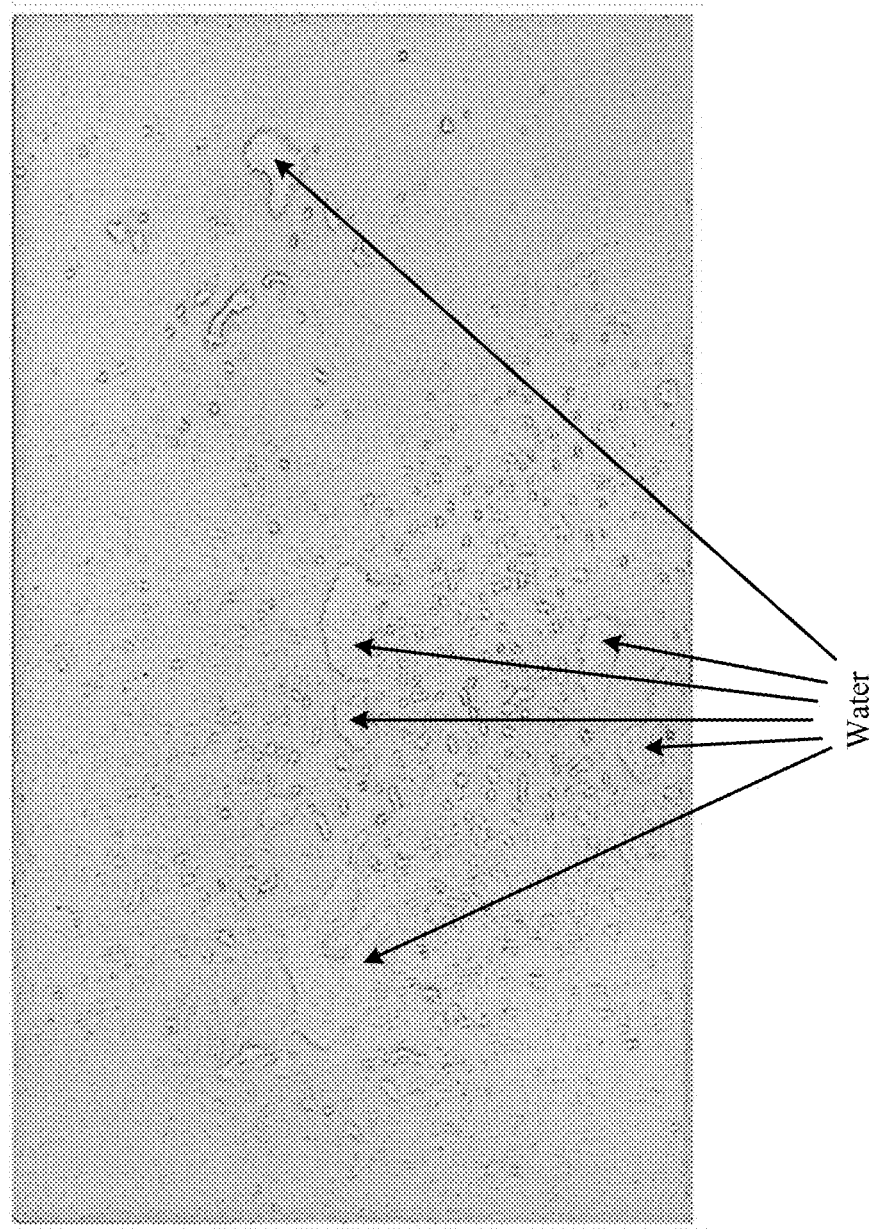
FIG. 53 is a pictorial diagram of an embodiment of a surface of a touch screen display in accordance with the present disclosure.

FIG. 53 is a pictorial diagram of an embodiment of a surface of a touch screen display in accordance with the present disclosure. In particular, the surface 320-1 of a touch screen display, such as display 250, 250' and/or other display of a touch screen system. The surface 320-1 has been splashed with water, causing blobs of water to be present on the surface. This includes several significant blobs of water that are pointed to, as shown.

Water, moisture or any conductive object on a capacitive sensing device can disrupt the ability to sense a desired object such as a finger, stylus or pen. Water, and especially salt water, can be highly conductive. Water (or any other conductive liquid) when placed on a PCAP touch sensor in sufficiently large blobs, can conduct mutual signals from rows to columns (or vice versa) and 'look' like a touch. It can be difficult for traditional PCAP touch controllers to distinguish between the water and regular touches, and therefore traditional systems can report many 'false' touches from the water. Other touch controllers can be overwhelmed by the presence of conductive liquid and stop all touch reporting. A method is needed to distinguish water from on the surface of a display from desired touch conditions so normal object detection and tracking can occur.

Conductive liquid (like water) on the touch sensor will create variations in the capacitance image data. In particular, conductive objects or liquids that cross multiple rows and columns receive the mutual signals from each row they cover and then retransmit those frequencies back into all other columns that they cover. Positive capacitance variation data occurs when the water couples mutual transmitted signals from a row to the column immediately above it, but when the water also transmits those mutual signals to other columns, it can generate negative capacitance variation data at other cross points. Positive and negative capacitance variation data caused by for water droplets appear in the capacitance image data immediately adjacent to each other in the rectangle defined by the combined area of all rows and columns which are even partially covered by the contiguous water droplet. These droplets create patterns containing both positive and negative capacitance variation data which are distinguishable from normal touch conditions caused by a finger, palm or pen.

In various embodiments, the capacitance image data generated by the enhanced mutual capacitance generating function 2260 can be in the form of frames of data in a heatmap format or other image data format. This capacitance image data can be processed by an artifact detection function 2262 that is tuned, trained and/or otherwise designed to detect the presence of water. A corresponding artifact compensation function 2264 can be used to identify the portions of the capacitance image data associated with the water and further to compensate for these artifacts via compensated capacitance image data generated by subtracting, removing or ignoring the portions of the capacitance image data associated with the water. This compensated capacitance image data improves the detection, identification, characterization and/or tracking of pressure conditions, proximal touch conditions or other conditions of a touch screen display by the condition detection functions 2266.

Figure 54A:
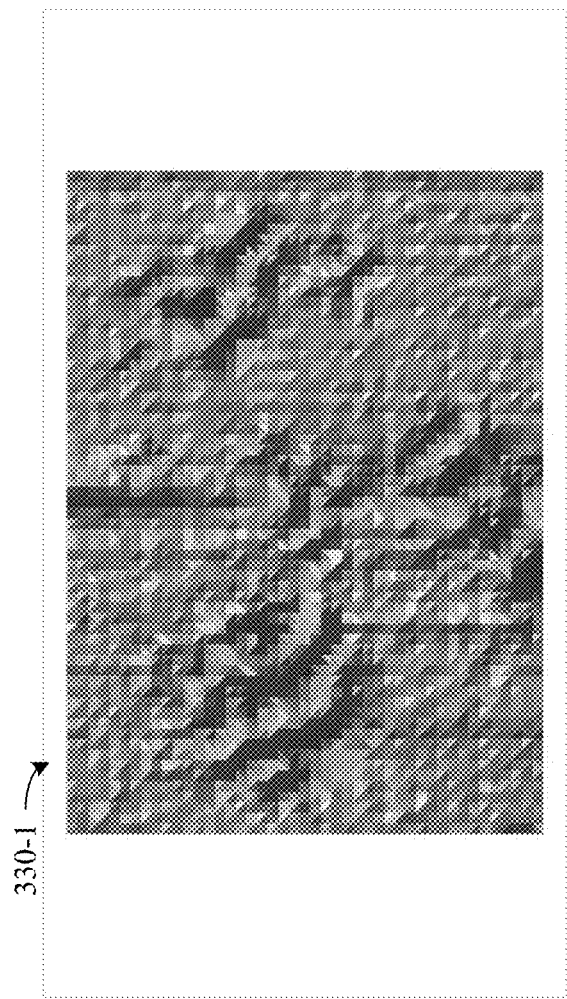
FIGS. 54A and 54B are graphical diagrams of an embodiment of capacitance image data in accordance with the present disclosure.
Figure 54B:
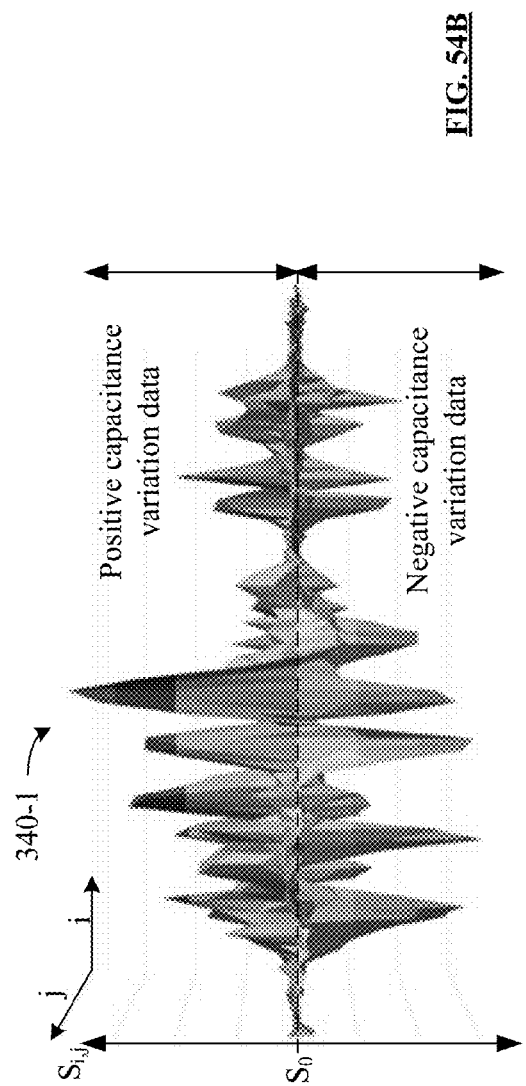

FIGS. 54A and 54B are graphical diagrams 330-1 and 340-1 of an embodiment of capacitance image data in accordance with the present disclosure. In particular, capacitance image data is presented in response to the surface water presented in conjunction with FIG. 53. FIG. 54A presents a 2-D heat map representation where differing colors represent the magnitude of the positive capacitance variation data and the negative capacitance variation data.

FIG. 54B presents a 3-D heat map representation where, again, differing colors represent the magnitude of the positive capacitance variation data and the negative capacitance variation data. As shown, the presence of water on the display causes both positive and negative variations of the sensed signal components $S_{ij}$ from the nominal value $S_0$ for various values of $(i, j)$. Regions of positive capacitance variation data and the negative capacitance variation data are indicated. It is clear to see that various peaks in the positive capacitance variation data could otherwise be mistaken for touch conditions—however, the additional presence of significant negative capacitance variation data in the capacitance image data presents a different pattern from a normal touch conditions that can be used to detect the presence of water.

FIG. 55A is a flow diagram of an embodiment of a method in accordance with the present disclosure. In particular a method is presented for use in conjunction with the processing module 42, display 250, 250' and/or other processing modules and touch screen displays disclosed herein. Common elements of FIG. 52B are referred to by common reference numerals. Step 314-1 includes identifying water droplet(s) and/or droplet(s) of other conductive liquid in the capacitance image data. This step can be performed, for example, via a corresponding artifact detection function 2262 tuned, trained or otherwise designed for this purpose. Step 314-2 includes compensating the identified water droplet(s) and/or droplet(s) of other conductive liquid in the capacitance image data. This step can be performed, for example, via an artifact compensation function 2264.

FIG. 55B is a schematic block diagram of an embodiment of an artifact detection function and artifact compensation function in accordance with the present disclosure. As previously discussed, the artifact detection function(s) 2262 can detect one or more differing artifacts such as the presence of water or salt-water on the surface of the touch screen display, the presence of other foreign objects on the surface of the touch screen display or in proximity to the display including conductive objects, dielectric objects and non-conductive objects, and/or other artifacts in the capacitance image data caused by other undesirable conditions.

In various embodiments, the artifact detection function(s) 2262 can be implemented via differing inference functions or other detection functions for each of the possible artifacts. In the presence of a single artifact, the particular artifact detection function 2262 corresponding to single artifact operates to signal the presence of that artifact—while the other artifact detection functions 2262 corresponding to other artifacts operate to signal the absence of their corresponding artifacts. In the presence of a more than one artifact, the particular artifact detection functions 2262 corresponding to artifact detected each operate to signal the presence of their corresponding artifact while the other artifact detection functions 2262 corresponding to other artifacts operate to signal the absence of their corresponding artifacts.

Furthermore, the artifact compensation function(s) 2264 can be implemented via differing inference functions or other compensation functions for each of the possible artifacts. When a single artifact is identified as being present, the particular artifact compensation function 2262 is enabled to compensate for the presence of artifact data corresponding to the artifact in the capacitance image data. When more than one artifact is identified as being present, the corresponding artifact compensation function(s) 2262 are each enabled to compensate for the presence of the corresponding artifacts in the capacitance image data.

Following through with the example presented in FIGS. 53, 54A and 54B, capacitance image data 1300-1, including the positive capacitance variation data and the negative capacitance variation data is analyzed by an artifact detection function 2262-1 corresponding to conductive liquids. The artifact detection function 2262-1 can operate to detect the presence of the water on the surface of the display via a statistical pattern recognition function, other pattern recognition function, and/or texture recognition functions that recognizes a pattern or texture corresponding to the presence of water on the surface. In a further example, the artifact detection function 2262-1 can operate to detect the presence of the water on the surface of the display via an artificial intelligence (AI) model such as a convolutional neural network, deep-learning function, clustering algorithm, or other machine learning function trained on sets of training data corresponding to capacitance image data with known artifacts of various kinds. In yet another example, the capacitance image data 1300-1 can be transformed into a 2-D frequency domain, via a discrete Fourier transform, and the resulting frequencies are analyzed to identify one or more frequencies or a band of frequencies determined to correspond to water or other conductive liquid.

Once the presence of water or other conductive liquid is detected by the artifact detection function 2262-1, indication of this detection can be sent to the artifact compensation function 2264-1 corresponding to this artifact. In response to this indication, the artifact compensation function 2264-1 can be enabled to generate compensated capacitance image data 1325-1 from the capacitance image data 1300-1. As previously discussed, the presence of conductive liquid on the display can result in static or slowly varying variations in both the positive capacitance variation data and the negative capacitance variation data about $S_0$. This signal variation artifacts caused by the water in the positive capacitance variation data and the negative capacitance variation data can be identified and located, particularly when water is determined to be present on only a portion of the display. The compensated capacitance image data 1325-1 can be generated by subtracting from the capacitance image data 1300-1, the portions of the positive capacitance variation data and the negative capacitance variation data corresponding to this artifact.

In another example, compensated capacitance image data 1325-1 can be generated by:
  determining a zone in the positive capacitance variation data and the negative capacitance variation data corresponding to variations caused by this artifact. For example, the zone can be defined by the region between an upper threshold corresponding to a highest positive peak in the positive capacitance variation data and a lower threshold corresponding to a lowest negative peak in the negative capacitance variation data.
  generating the capacitance image data 1325-1 by removing from the capacitance image data 1300-1, the portions of the positive capacitance variation data and the negative capacitance variation data within this zone or otherwise ignoring the portions of the positive capacitance variation data and the negative capacitance variation data within this zone. This technique can be used, for example when droplets of water are not localized to a small region and instead are scattered over more than a predetermined percentage of the surface of the display.

FIG. 55C is a schematic block diagram of an embodiment of a condition detection function in accordance with the present disclosure. In particular a condition detection function 2266-1 is presented corresponding to a proximal touch condition by a finger. The condition detection function 2266-1 operates based on capacitance image data 1300-1 or compensated capacitance image data 1325-1, in the event that one or more artifacts were detected and compensated.

In various embodiments, the presence of a spike in the positive capacitance variation data above a touch threshold can be used to identify proximal finger touches. The touch threshold can be a predetermined threshold or a dynamic threshold that is adjusted based on the presence of one or more artifacts, such as noise, water, the presence of foreign objects, etc.

If a proximal touch condition is detected, condition data 1350-1 can be generated that indicates the touch, and/or parameters of the touch. Examples of condition data 1350-1 include the identification and location of one or more proximal touches, tracking data, etc. Such condition data 1325-1 can be sent via the host interface 2256 for use by a host device, a running app, the core computer 14, etc.

Figure 56:
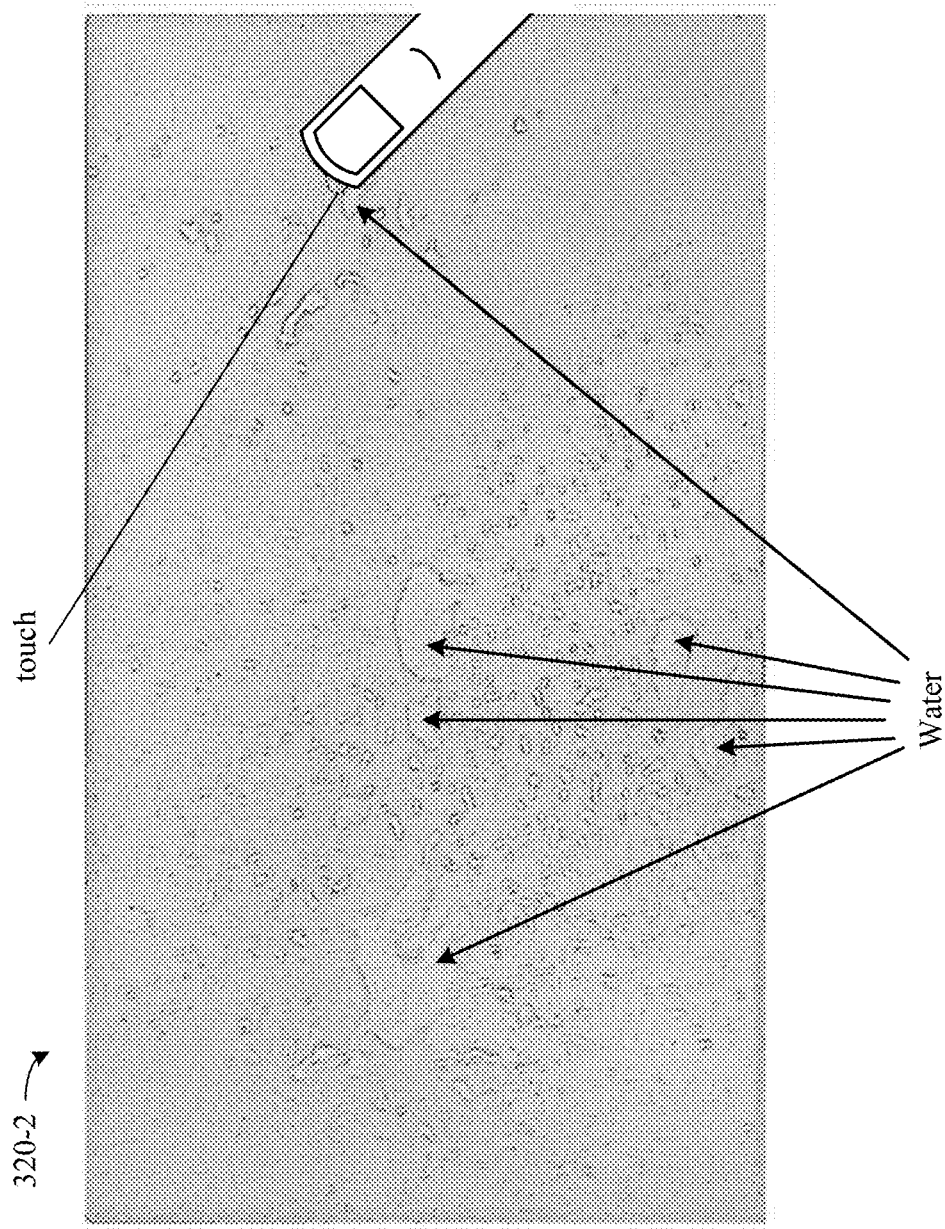
FIG. 56 is a pictorial diagram of an embodiment of a surface of a touch screen display in accordance with the present disclosure.
Figure 57A:
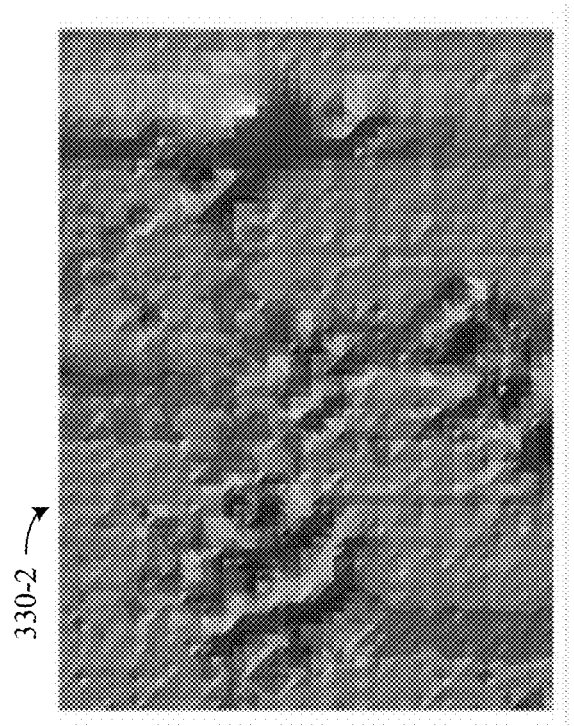
FIGS. 57A and 57B are graphical diagrams of an embodiment of capacitance image data in accordance with the present disclosure.
Figure 57B:
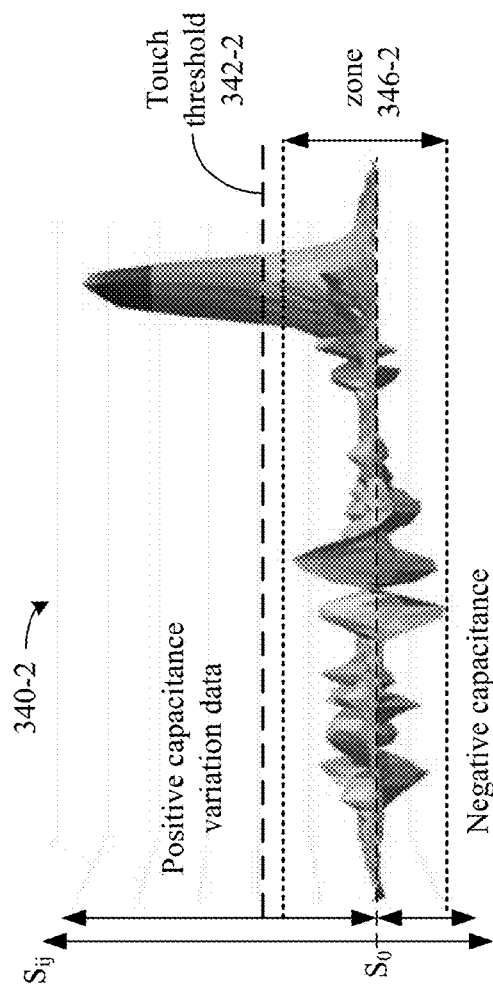

FIG. 56 is a pictorial diagram 320-2 of an embodiment of a surface of a touch screen display in accordance with the present disclosure. In particular, a further example of water on the display surface is presented that includes a touch by a finger. FIGS. 57A and 57B are graphical diagrams 330-2 and 340-2 of an embodiment of capacitance image data in accordance with the present disclosure. In particular, the presence of the finger touch is clearly indicated by the large peak in positive capacitance touch data. Compensated capacitance image data can subtract, remove or ignore portions of the positive capacitance variation data and the negative capacitance variation data within the zone 346-2 and/or by increasing the touch threshold 342-2 to fall above this zone 346-2. A condition detection function 2266 corresponding to a finger touch can detect and identify the finger touch based on the location of the positive peak in the positive capacitance variation data that exceeds the touch threshold 342-2. In the example shown, the touch threshold 342-2 is placed slightly above, such as a predetermined value above, the upper threshold of the zone 346-2. In other examples, the touch threshold 342-2 can be set at the upper threshold of the zone 346-2.

Figure 58:
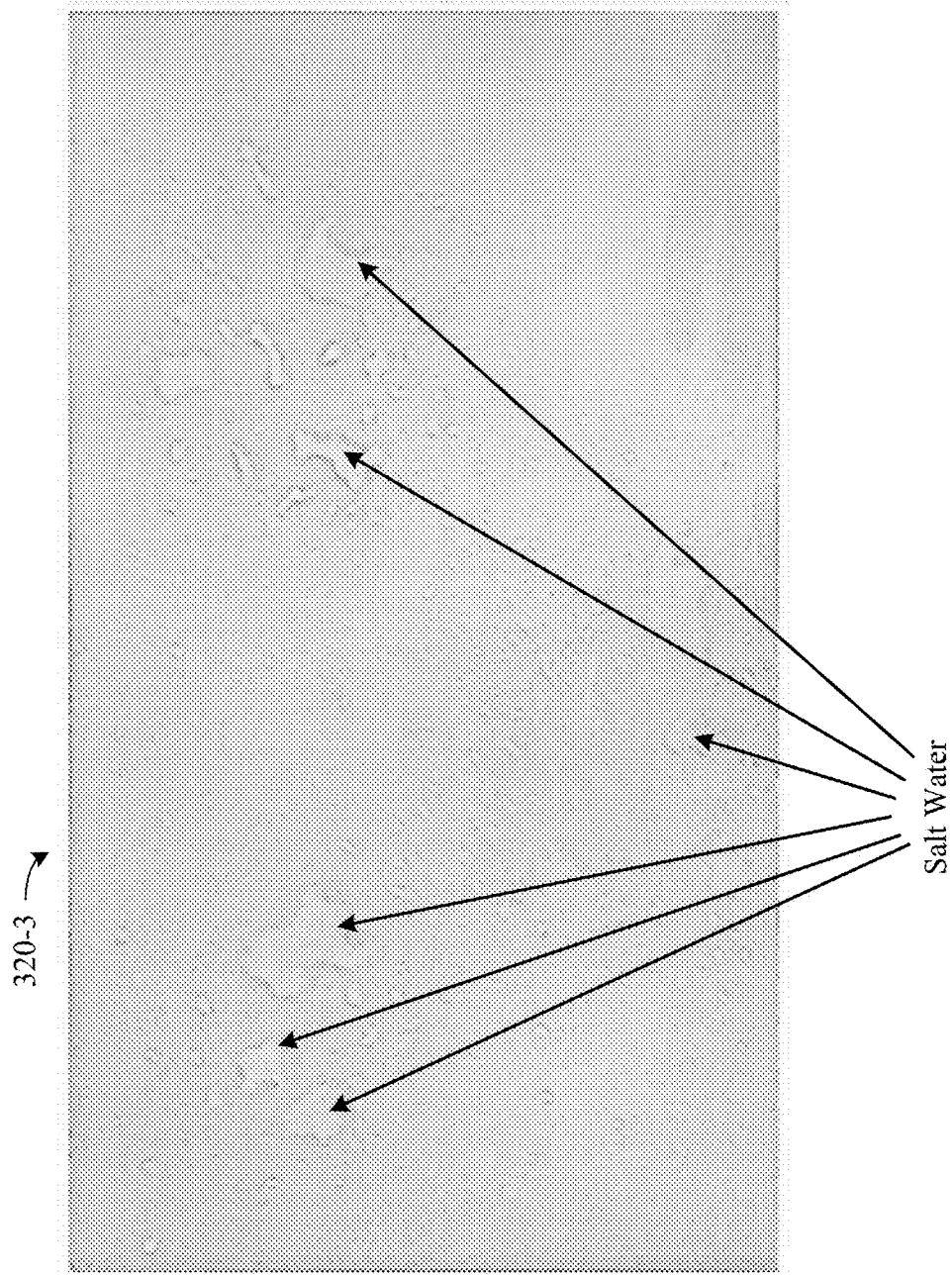
FIG. 58 is a pictorial diagram of an embodiment of a surface of a touch screen display in accordance with the present disclosure.

FIG. 58 is a pictorial diagram 320-3 of an embodiment of a surface of a touch screen display in accordance with the present disclosure. In particular, the surface of a touch screen display, such as display 250, 250' and/or other display of a touch screen system is shown. The surface 320-3 has been splashed with salt water, causing blobs of salt water to be present on the surface. This includes several significant blobs of salt water that are pointed to, as shown.

Figure 59A:
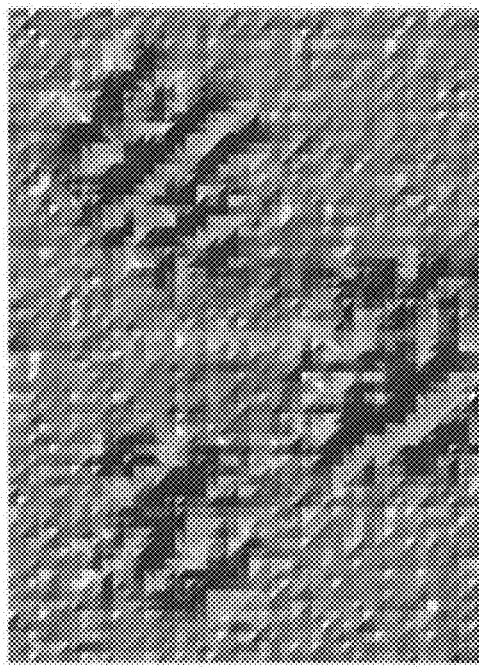
FIGS. 59A and 59B are graphical diagrams of an embodiment of capacitance image data in accordance with the present disclosure.
Figure 59B:
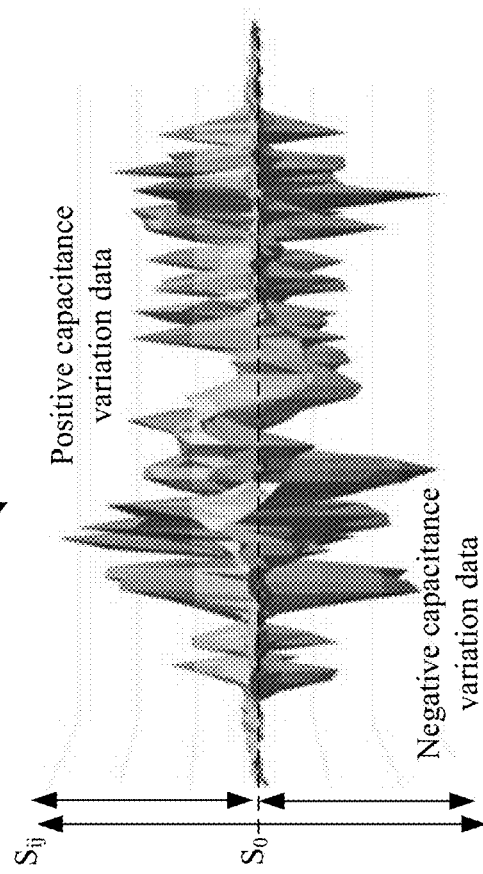

FIGS. 59A and 59B are graphical diagrams 330-3 and 340-3 of an embodiment of capacitance image data in accordance with the present disclosure. In particular, capacitance image data is presented in response to the salt water presented in conjunction with FIG. 58. FIG. 58A presents a 2-D heat map representation where differing colors represent the magnitude of the positive capacitance variation data and the negative capacitance variation data.

FIG. 59B presents a 3-D heat map representation where, again, differing colors represent the magnitude of the positive capacitance variation data and the negative capacitance variation data. As shown, the presence of salt water on the display cause both positive and negative variations of the sensed signal components Si from the nominal value $S_0$ for various values of (i, j). Regions of positive capacitance variation data and the negative capacitance variation data are indicated. It is clear to see that various peaks in the positive capacitance variation data could otherwise be mistaken for touch conditions—however, the additional presence of significant negative capacitance variation data present a different pattern from normal touch conditions that can be used to detect the presence of salt water.

Figure 60:
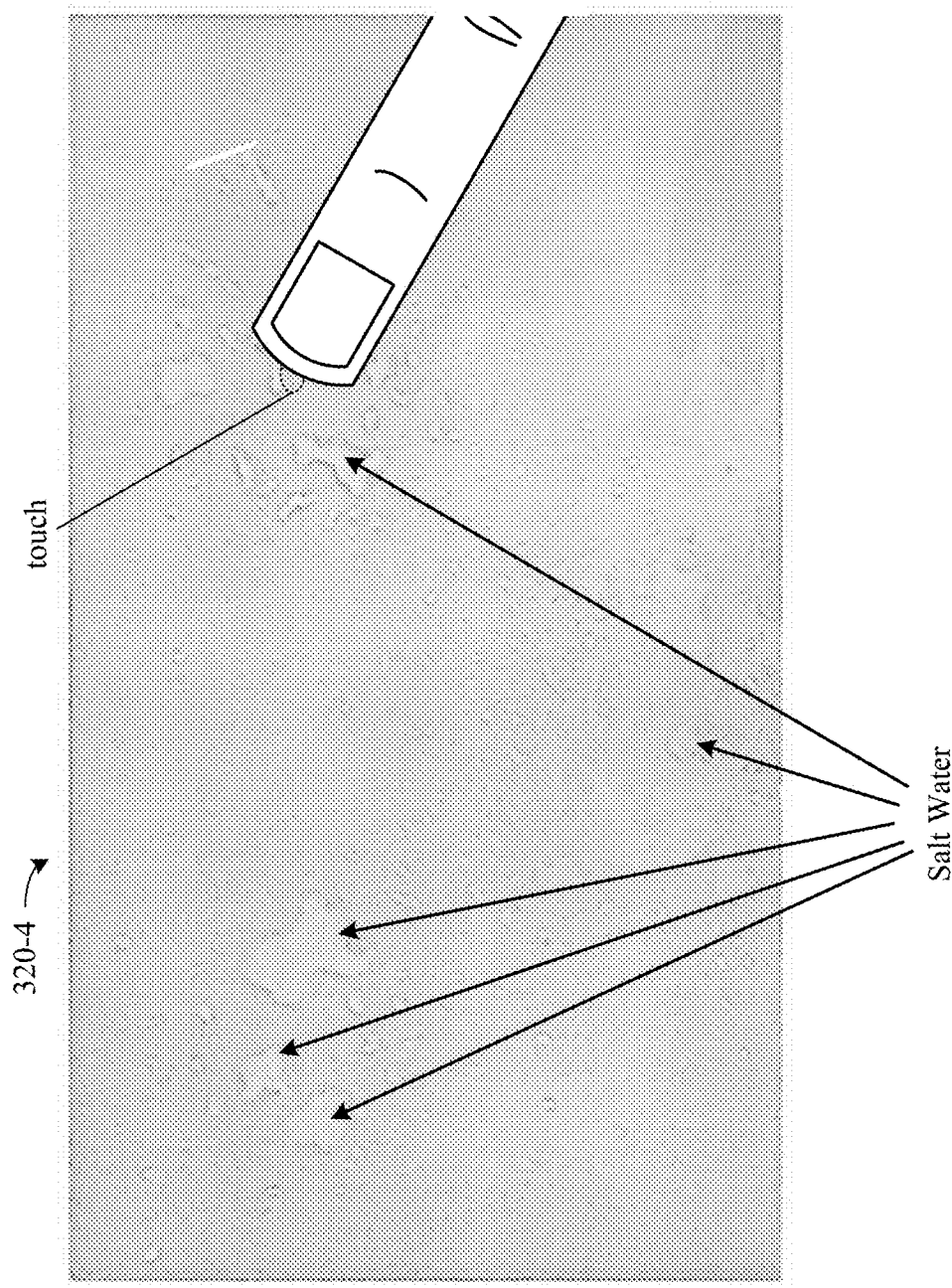
FIG. 60 is a pictorial diagram of an embodiment of a surface of a touch screen display in accordance with the present disclosure.

FIG. 60 is a pictorial diagram 320-4 of an embodiment of a surface of a touch screen display in accordance with the present disclosure. A further example of salt water on the display surface is presented that includes a touch by a finger.

Figure 61A:
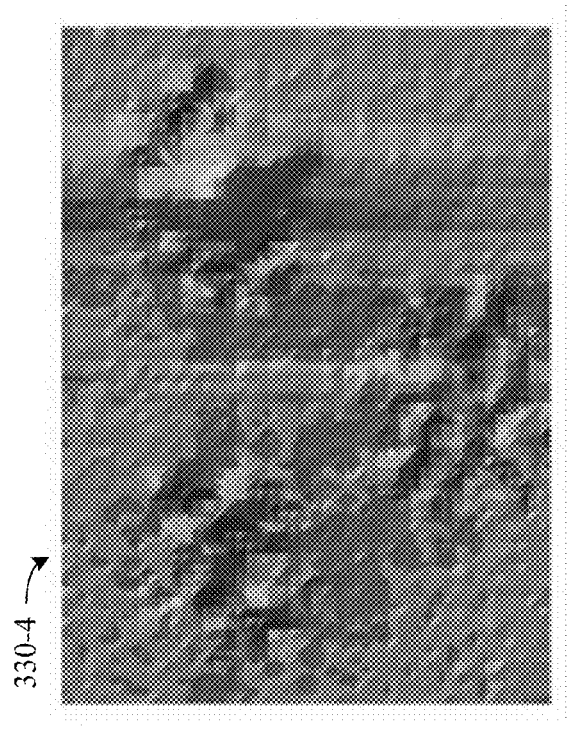
FIGS. 61A and 61B are graphical diagrams of an embodiment of capacitance image data in accordance with the present disclosure.
Figure 61B:
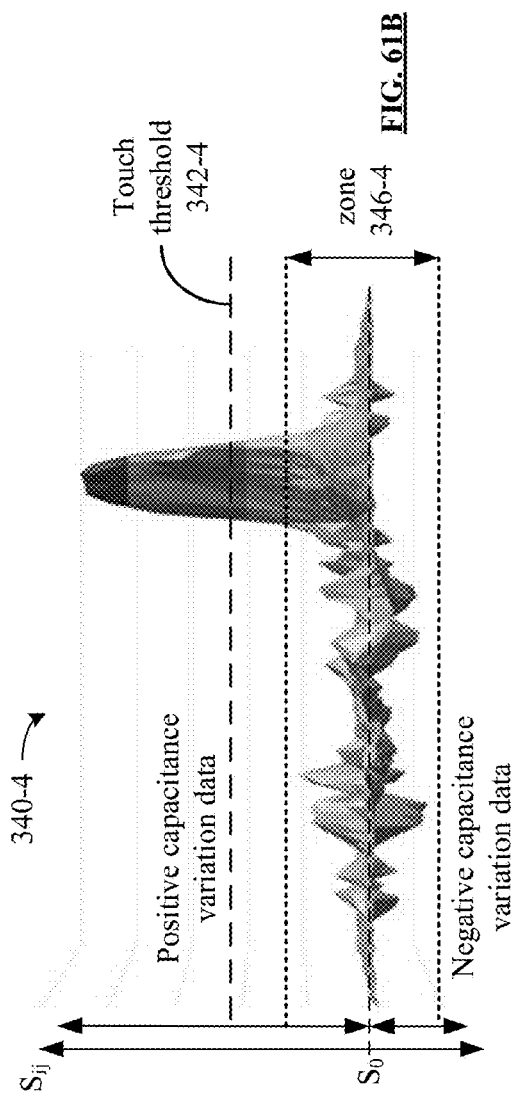

FIGS. 61A and 61B are graphical diagrams 330-4 and 340-4 of an embodiment of capacitance image data in accordance with the present disclosure. In particular, capacitance image data is presented in response to the surface water and finger touch presented in conjunction with FIG. 60. FIG. 61A presents a 2-D heat map representation where differing colors represent the magnitude of the positive capacitance variation data and the negative capacitance variation data. FIG. 61B presents a 3-D heat map representation where, again, differing colors represent the magnitude of the positive capacitance variation data and the negative capacitance variation data.

In the example shown, the presence of the finger touch is clearly indicated by the large peak in positive capacitance touch data. Compensated capacitance image data can subtract, remove or ignore portions of the positive capacitance variation data and the negative capacitance variation data within the zone 346-4 and/or by increasing the touch threshold 342-4 to fall above this zone 346-4. A condition detection function 2266-1 corresponding to a finger touch can detect and identify the finger touch based on the location of the positive peak in the positive capacitance variation data that exceeds the touch threshold 342-4. In the example shown, the touch threshold 342-4 is placed above, such as a predetermined value above, the upper threshold of the zone 346-4. In other examples, the touch threshold 342-4 can be set at the upper threshold of the zone 346-4. While zones 346-2 and 346-4 have been described in term of compensation for water and salt water artifacts, similar zones can be generated to compensate for other artifacts such as noise, interference, other foreign objects, etc. Furthermore, such zones can be used to set or adjust thresholds corresponding to both positive capacitance variation data and negative capacitance variation data for other conditions such as pressure, shape detection, etc.

FIG. 62A is a flow diagram of an embodiment of a method in accordance with the present disclosure. In particular a method is presented for use in conjunction with the processing module 42, display 250' and/or other processing modules and touch screen displays disclosed herein. Common elements of FIG. 52B are referred to by common reference numerals. Step 316-1 includes processing the capacitance image data (compensated or not) to identify and/or classify the pressure of an object. For example, the presence of a spike in the negative capacitance variation data below a pressure threshold can be used to identify a pressure point caused, for example, by weight or pressure applied by an object to the surface.

FIG. 62B is a schematic block diagram of an embodiment of a condition detection function in accordance with the present disclosure. In particular a pressure detection function 2266-2 is presented corresponding to a pressure condition by a passive stylus or another object, including a dielectric or non-conductive object. The condition detection function 2266-2 operates based on capacitance image data 1300-1 or compensated capacitance image data 1325-1, in the event that one or more artifacts where detected and compensated.

In various embodiments, the presence of a spike in the negative capacitance variation data below a pressure threshold can be used to identify a pressure point. The pressure threshold can be a predetermined threshold or a dynamic threshold that is adjusted based on the presence of one or more artifacts, such as noise, water, the presence of foreign objects, etc.

If a pressure condition is detected, condition data 1350-2 can be generated that indicates the pressure, and/or parameters of the pressure. Examples of condition data 1350-2 include the identification and location of the pressure, an amount or level of pressure determined based on the magnitude of the negative spike, etc. Such condition data 1350-2 can be sent via the host interface 2256 for use by a host device, running app, the core computer 14 etc.

Figure 63A:
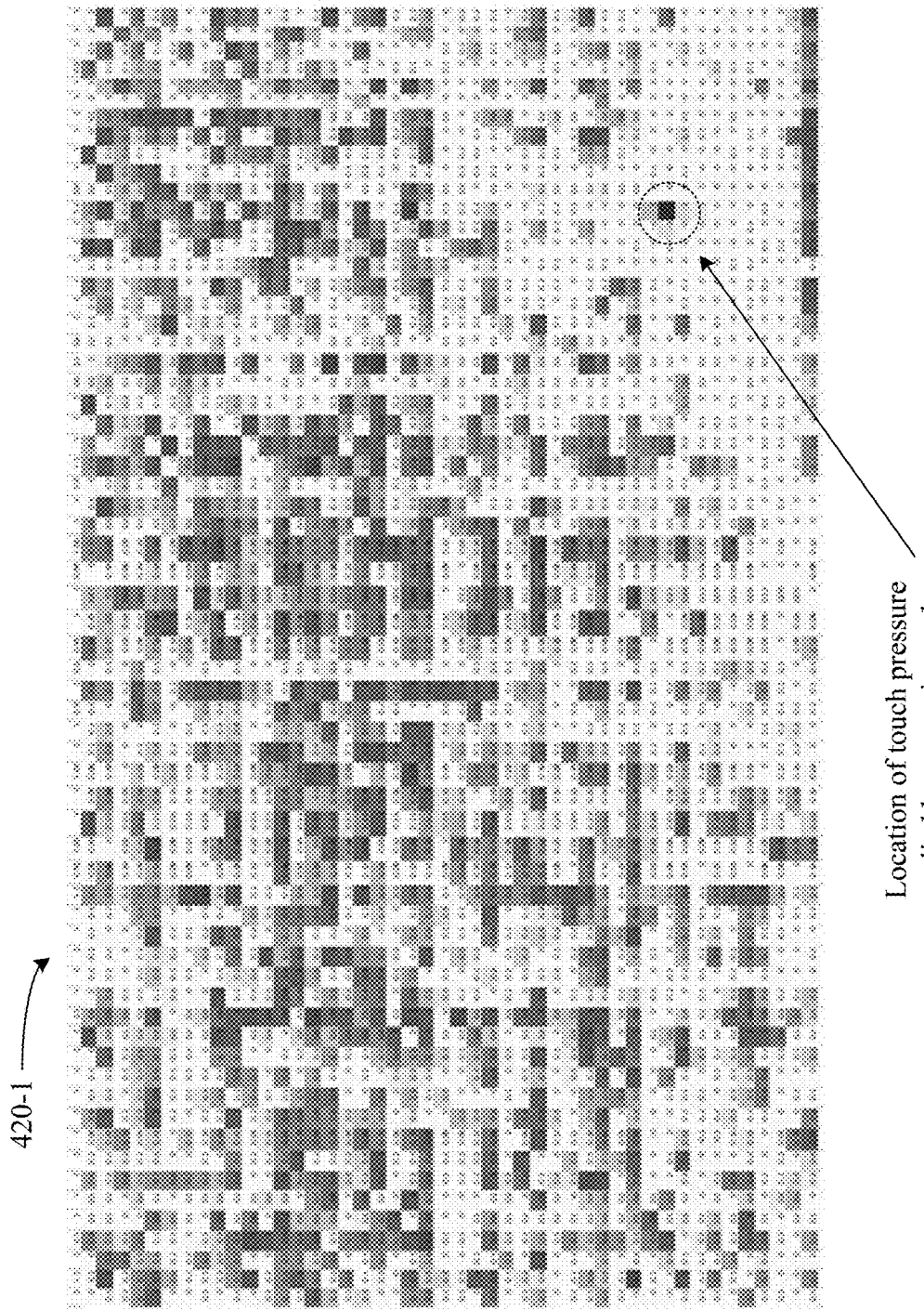
FIGS. 63A, 63B and 63C are graphical diagrams of an embodiment of capacitance image data in accordance with the present disclosure.
Figure 63B:
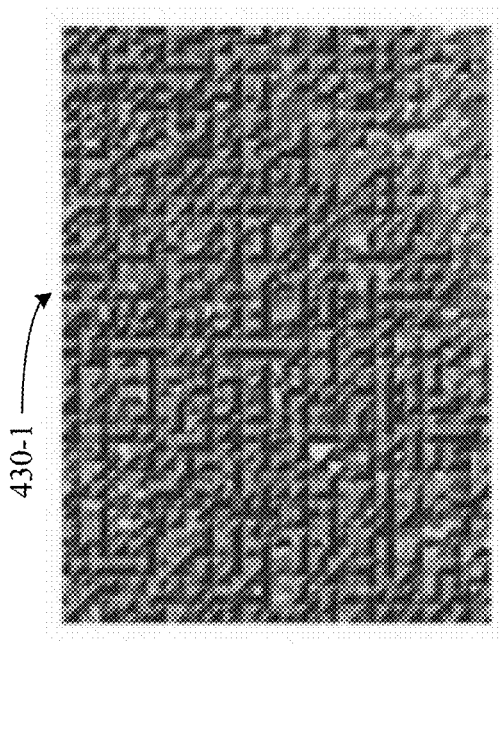
Figure 63C:
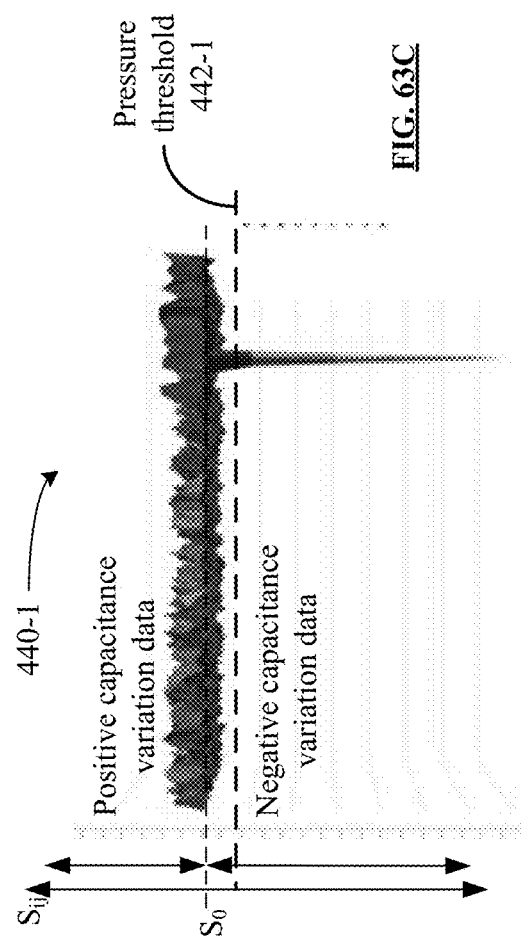

FIGS. 63A, 63B and 63C are graphical diagrams 420-1, 430-1 and 440-1 of an embodiment of capacitance image data in accordance with the present disclosure. In particular, capacitance image data is presented in response to the touch pressure applied to the location identified in FIG. 63A. FIGS. 63A and 63B present 2-D heat map representations where differing colors represent the magnitude of the positive capacitance variation data and the negative capacitance variation data. FIG. 63C presents a 3-D heat map representation where, again, differing colors represent the magnitude of the positive capacitance variation data and the negative capacitance variation data.

In particular, the presence of the finger touch is clearly indicated by the large peak in negative capacitance touch data. The condition detection function 2266-1 corresponding to a pressure can detect and identify the pressure touch based on the location of the negative peak in the positive capacitance variation data that exceeds the pressure threshold 442-1. In the presence of noise water or other artifacts characterized by a zone, the pressure threshold 442-1 can be placed slightly below, such as a predetermined value below, the lower threshold of such a zone. In other examples, the touch threshold 442-1 can be set at the lower threshold of the zone.

Figure 64A:
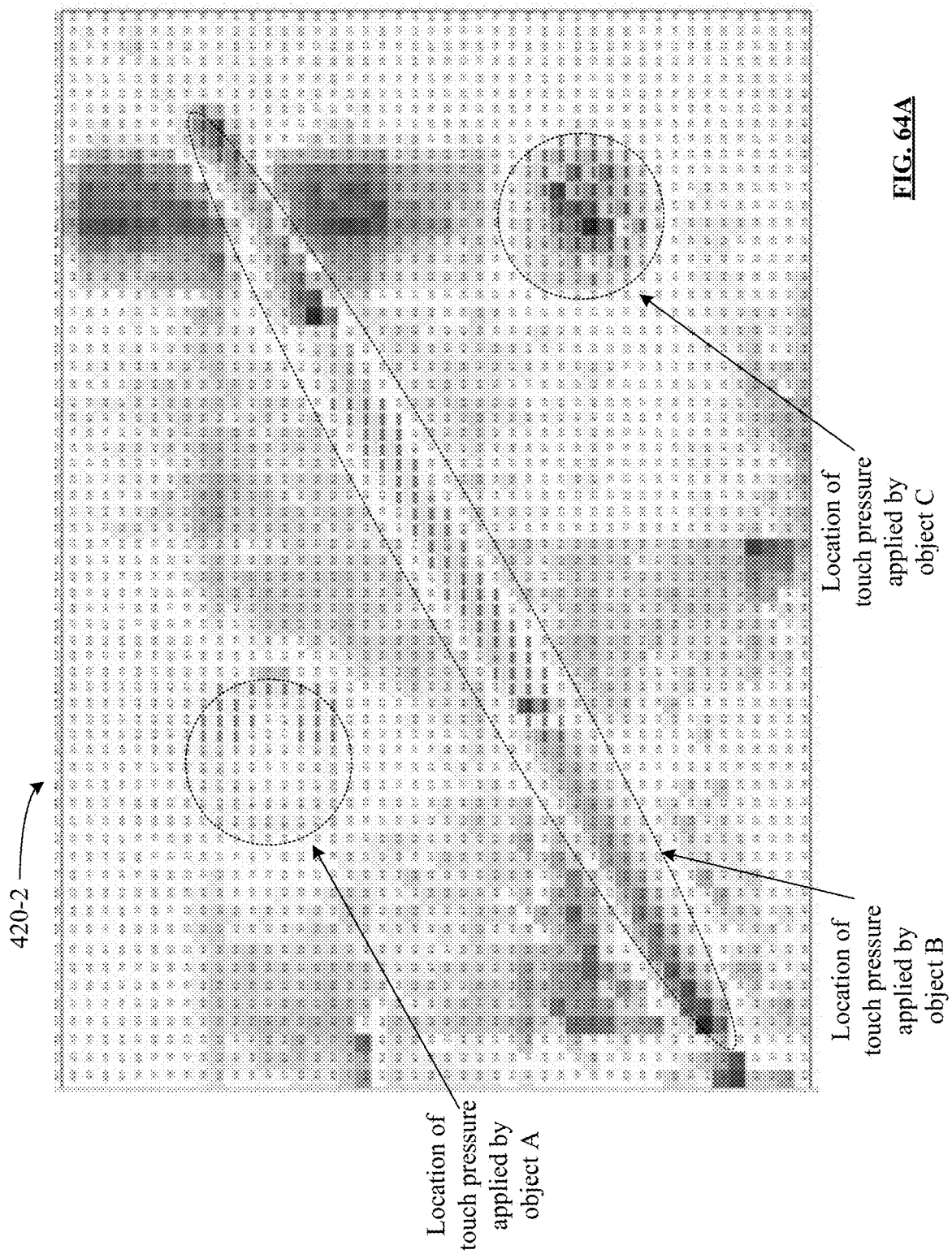
FIGS. 64A, 64B and 64C are graphical diagrams of an embodiment of capacitance image data in accordance with the present disclosure.
Figure 64B:
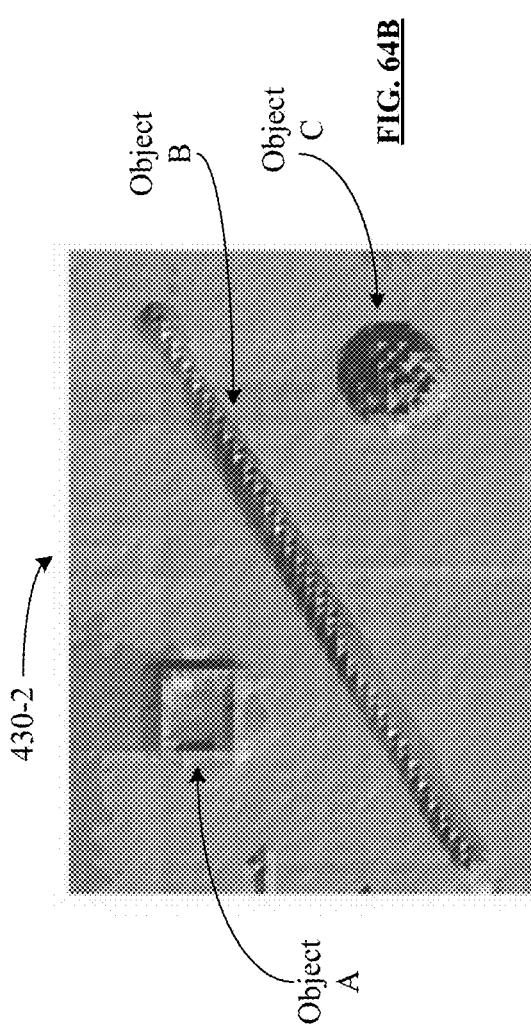
Figure 64C:
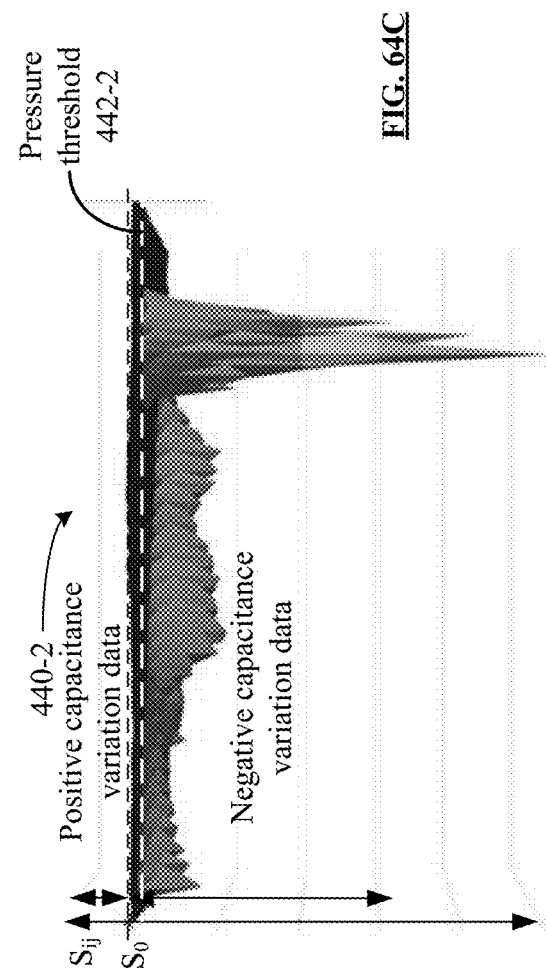

FIGS. 64A, 64B and 64C are graphical diagrams 420-2, 430-2 and 440-2 of an embodiment of capacitance image data in accordance with the present disclosure. In particular, capacitance image data is presented in response to the touch pressure applied to the location identified in FIG. 64A corresponding to objects A (a jar of nail polish), B (a pen) and C (a spool of thread). FIGS. 64A and 64B present 2-D heat map representations where differing colors represent the magnitude of the positive capacitance variation data and the negative capacitance variation data. FIG. 64C presents a 3-D heat map representation where, again, differing colors represent the magnitude of the positive capacitance variation data and the negative capacitance variation data.

In particular, the presence of the objects is clearly indicated by the large peaks in negative capacitance touch data. The condition detection function 2266-2 corresponding to a pressure can detect and identify the pressure touches based on the spot, spots and/or areas of the negative peaks in the positive capacitance variation data that exceeds the pressure threshold 442-1. Capacitive image data of this kind can also be used by condition detection function 2266-2 to not only locate the spot, spots and/or areas of pressure, but also to identify the objects via pattern recognition, clustering algorithms, AI models trained to recognize differing objects and/or other inference functions. The condition detection function 2266-2 can further used to determine the position and/or orientation of the objects that were detected.

Figure 65A:
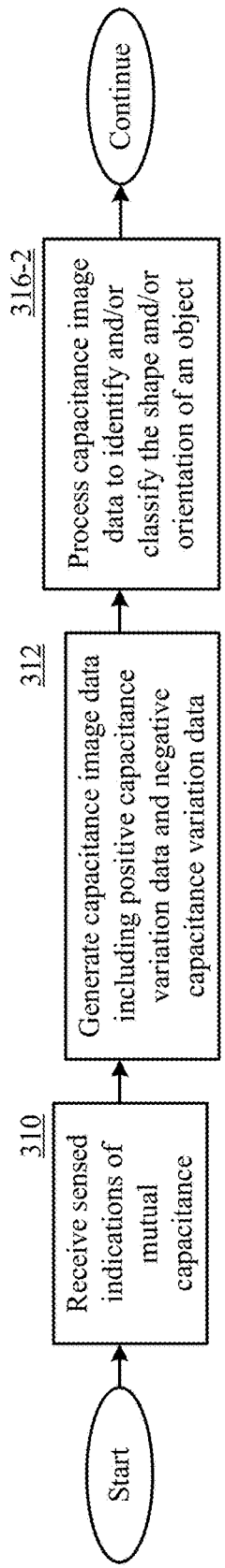
FIG. 65A is a flow diagram of an embodiment of a method in accordance with the present disclosure.

FIG. 65A is a flow diagram of an embodiment of a method in accordance with the present disclosure. In particular a method is presented for use in conjunction with the processing module 42, display 250, 250' and/or other processing modules and touch screen displays disclosed herein. Common elements of FIG. 52B are referred to by common reference numerals. Step 316-2 includes processing the capacitance image data (compensated or not) to identify and/or classify the shape of the object, the location of the object and/or orientation of the object.

Traditional PCAP touch controllers rely on Positive Capacitance values to detect objects with a traditional PCAP touch sensor (typically a matrix of rows and columns of conductors). Detection of uniquely identifiable shapes of conductor patterns or objects (grounded or un-grounded) with a traditional PCAP touch controller can be challenging. These touch controllers are further hindered by the fact that the orientation of object(s) relative to the touch sensor elements can render these object(s) indistinguishable or almost invisible when only looking at positive capacitance. In addition, detection of non-conductive objects is near impossible with traditional PCAP touch controllers.

Unique shapes can be viewed in any orientation by taking advantage of the ability to measure both the positive and negative capacitive data that these shapes produce when placed on the surface of a touch screen display, such as display 250, 250' and/or other touch screen displays disclosed herein. This information can be analyzed using many different techniques, including image processing algorithms and AI neural networks which may be especially adept at detecting shapes in any orientation.

Non-conductive objects on the screen (or compressed layers directly adjacent, above, below, or between the sensor layers) actually increase the dielectric strength of the capacitor or simply increase the capacitance by changing the geometry of the capacitor—moving the conductors closer together and compressing the dielectric material to change its relative permittivity. This results in an increase the capacitance at those cross-points and more of the transmitted mutual signal being coupled into a column—in examples where rows are driven and columns are sensed. This also results in negative capacitance variation data being generated at that cross-point compared to the baseline value.

Furthermore, shapes, such as those with curves or shapes with an odd number of spokes in a wheel and with a spoke removed, can generate negative capacitance variation data around the curves and in the area around the missing spoke. This negative capacitance variation data is highly distinguishable in the image in the raw data. The data can then be used to identify objects on the surface of the touch sensor.

Figure 65B:
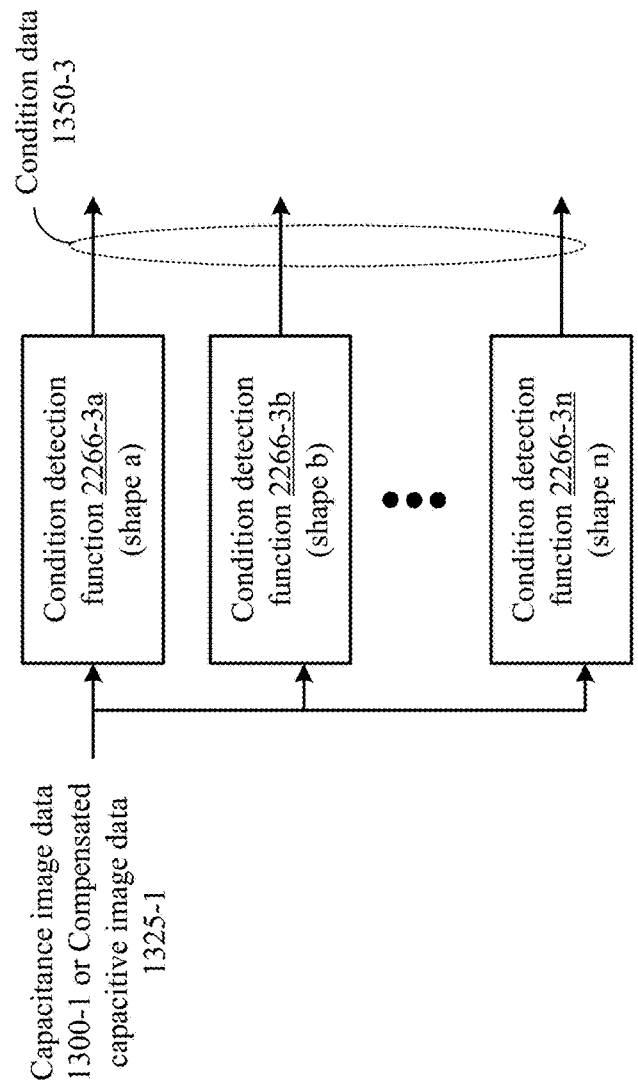
FIG. 65B is a schematic block diagram of an embodiment of condition detection functions in accordance with the present disclosure.

FIG. 65B is a schematic block diagram of an embodiment of a condition detection function in accordance with the present disclosure. In particular, n detection functions 2266-3a, 2266-3b . . . 2266-3n are presented that are tuned, trained or otherwise designed to detect corresponding shapes a, b, n. The condition detection function 2266-2 operates based on capacitance image data 1300-1 or compensated capacitance image data 1325-1, in the event that one or more artifacts were detected and compensated.

In various embodiments, each of the n detection functions 2266-3a, 2266-3b . . . 2266-3n are each implemented via a corresponding inference function. Examples of such inference functions can include statistical pattern recognition functions, other pattern recognition functions, texture recognition functions, artificial intelligence (AI) models such as convolutional neural networks, deep-learning functions, clustering algorithms, machine learning functions trained on sets of training data with capacitance image data corresponding to known shapes and/or orientations, and/or other image processing techniques.

If a particular condition is detected, condition data 1350-3 can be generated that indicates the condition and/or parameters of the condition. Such condition data can be sent via the host interface 2256 for use by a host device, running app, the core computer 14 etc. Examples of such condition data include the identification and location one or more particular shapes a, b n and/or parameters of their orientation.

FIG. 66A is a pictorial diagram 500-1 of an embodiment of an object in accordance with the present disclosure. In particular, an object in the shape of a seven-spoked wheel with one missing spoke is presented—i.e. a six-spoked wheel with spokes that are not evenly spaced. The shape was laser cut out of ITO on PET and has 300-500 ohms/square-inch of resistance. The area of the missing spoke is identified.

FIG. 66B is a graphical diagram 520-1 of an embodiment of capacitance image data in accordance with the present disclosure. In particular, capacitance image data is presented in response to the presence of five of the objects of FIG. 66A applied to the surface of a touch screen display at different locations and differing orientations. The capacitance image 2-D heat map representations where differing colors represent the magnitude of the positive capacitance variation data and the negative capacitance variation data. The locations and orientations of each of the objects on the surface can be determined based on the corresponding locations and orientations of the resulting patterns in the capacitance image data. The areas of the rim and spokes result in positive capacitance variation data while the areas between spokes result in negative capacitance variation data. As indicated, the location of the missing spoke in each pattern results in a larger area of negative capacitance variation data.

Figure 67A:
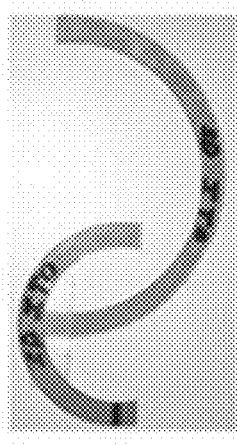
FIG. 67A is a pictorial diagram of an embodiment of an object in accordance with the present disclosure.

FIG. 67A is a pictorial diagram 500-2 of an embodiment of an object in accordance with the present disclosure. In particular, an object in the shape of two interconnected semicircles of differing radii is presented. The shape was laser cut out of ITO on PET and has 300-500 ohms/square-inch of resistance.

Figure 67B:
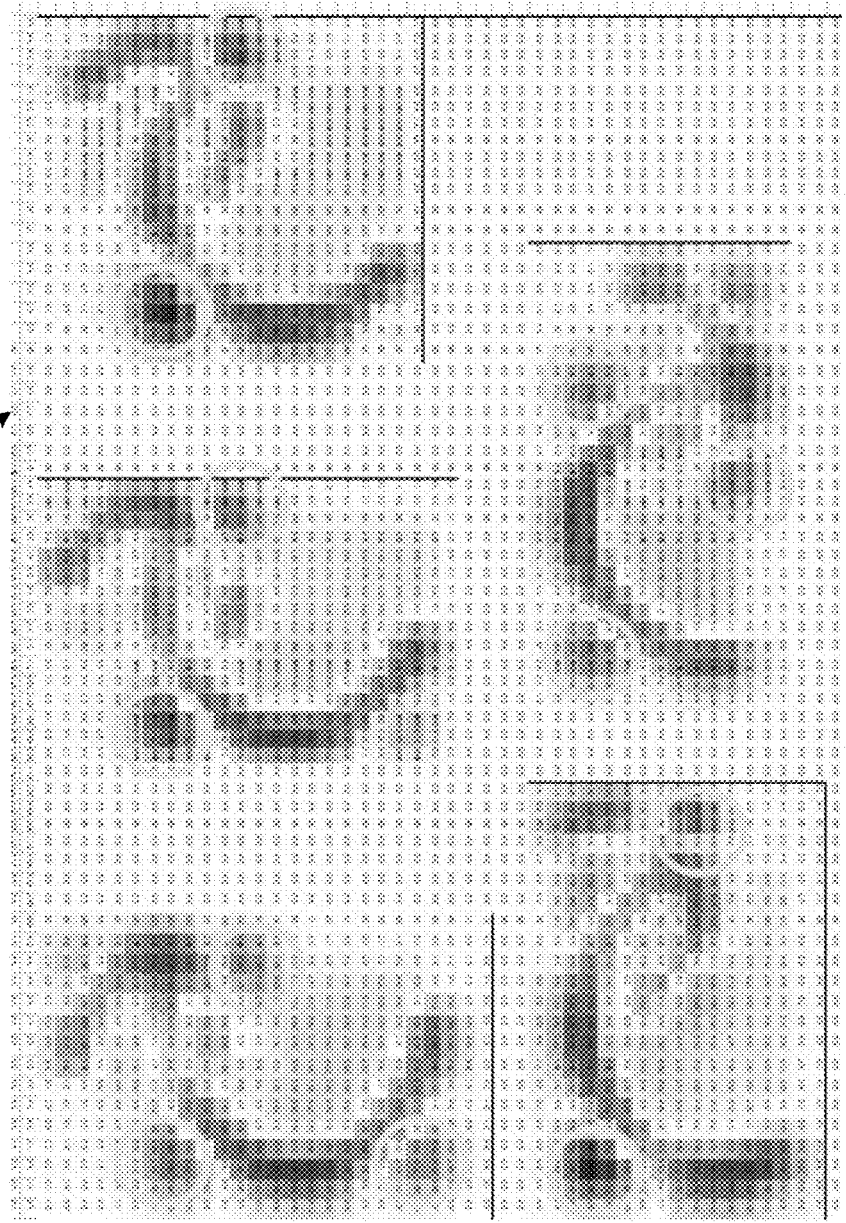
FIG. 67B is a graphical diagram of an embodiment of capacitance image data in accordance with the present disclosure.

FIG. 67B is a graphical diagram 520-2 of an embodiment of capacitance image data in accordance with the present disclosure. In particular, capacitance image data is presented in response to the presence of five of the objects of FIG. 67A applied to the surface of a touch screen display at different locations and differing orientations. The capacitance image 2-D heat map representations where differing colors represent the magnitude of the positive capacitance variation data and the negative capacitance variation data. The locations and orientations of each of the objects on the surface can be determined based on the corresponding locations and orientations of the resulting patterns in the capacitance image data. The areas of the semicircles result in positive capacitance variation data while particular areas adjacent to the semicircles result in negative capacitance variation data.

FIG. 68A is a flow diagram of an embodiment of a method in accordance with the present disclosure. In particular a method is presented for use in conjunction with the processing module 42, display 250, 250' and/or other processing modules and touch screen displays disclosed herein. Common elements of FIG. 52B are referred to by common reference numerals. Step 314-1' includes identifying noise in the capacitance image data. This step can be performed, for example, via a corresponding artifact detection function 2262 designed for this purpose. Step 314-2' includes compensating for the noise in the capacitance image data. This step can be performed, for example, via an artifact compensation function 2264. While shown as separate steps 314-1' and 314-2', these functions can be performed together to, for example, determine the amount of noise present in the capacitance image data and to compensate for that noise.

FIG. 68B is a schematic block diagram of an embodiment of an artifact detection function and artifact compensation function in accordance with the present disclosure. The presence of noise in the capacitance image data can result in variations in both the positive capacitance variation data and the negative capacitance variation data about $S_0$. This signal variation caused by the noise in the positive capacitance variation data and the negative capacitance variation data can be identified. As previously discussed, the artifact detection function(s) 2262 can operate to detect the presence of noise in the capacitance image data and identify the noise, for example by a noise level, noise energy, signal to noise ratio, etc.

In various embodiments, an artifact detection function 2262-2 can be implemented via signal analysis, statistical noise analysis or other noise detection technique. Once the noise has been identified by the artifact detection function 2262-2, an indication of the noise can be sent to the artifact compensation function 2264-2 for compensation of the noise. In response to this indication, the artifact compensation function 2264-2 can be enabled to generate compensated capacitance image data 1325-1 from the capacitance image data 1300-1. In the alternative, the artifact compensation function 2264-2 can be in continuous/periodic operation to compensate for the current noise conditions.

Once the noise level is identified, compensated capacitance image data 1325-1 can be generated by:
- determining a noise zone in the positive capacitance variation data and the negative capacitance variation data corresponding to variations caused by this artifact. For example, the noise zone can be defined by the region between an upper threshold (e.g. an upper baseline) corresponding to the highest positive peak in the positive capacitance variation data or highest average positive noise deviation and a lower threshold (e.g. a lower baseline) corresponding to the lowest negative peak or lowest average negative noise deviation in the negative capacitance variation data and/or based on other indications of noise energy, levels or noise statistics.
- generating the capacitance image data 1325-1 by subtracting or removing from the capacitance image data 1300-1, the portions of the positive capacitance variation data and the negative capacitance variation data within this zone or otherwise ignoring the portions of the positive capacitance variation data and the negative capacitance variation data within this zone.

By generating a noise zone, with a upper baseline value to represent a traditional PCAP touch controller baseline floor and an additional lower baseline value, which is used for the negative capacitance variation data, allows for the measurement of the negative capacitance variation data with the noise above to be subtracted, removed or ignored.

When the display is remotely located from the processing module 42 or other controller, there could be increased baseline noise, which will be addressed by the implementation of a noise zone. Also, when connecting two or more sensors with common parallel same/shared mutual signals, which is when the TX (transmitted) and/or RX (received) channels have cabling between the sensors, there is an increase of noise generated from the cabling, that increases the noise floor, with the artifact compensation function 2264-2 can increase the range between the upper baseline and the lower baseline, which will increase the range of the values to subtract, remove, or ignore from the measure values. Furthermore, when connecting two or more sensors that have cabling between the sensors with common parallel same/shared mutual signals, unique noise zones can be created by the artifact compensation function 2264-2 for each of sensor's measured signal content.

In addition, when connecting a multi-ended sensor with common parallel same/shared mutual signals, on a single large sensor or a high trace resistance sensor, there is an increase of noise generated on the cabling routed across/around the two or more ends of the sensors channels, that increases the noise floor. The artifact compensation function 2264-2 can compensate by increasing the range of the upper baseline and the lower baseline, which will increase the range of the values to subtract, remove, or ignore from the measure values.

Various embodiments of such same/shared mutual signaling and extended touch sensing are presented in conjunction with FIGS. 69A-69M that follow.

FIG. 69A is a schematic block diagram of an embodiment 2300 of an extended touch sensor device in accordance with the present invention. This diagram shows the same signaling that is provided via the row electrodes of two respective panels or touchscreen displays of a touch sensor device. In this diagram, the touch sensor device includes two respective panels or touchscreen displays. The signals are transmitted on the rows of the respective panels or touchscreen displays are shared, and there is separate receiving of those signals that may be detected via the column electrodes.

With respect to this diagram and others herein within which signals are provided to more than one panel or touchscreen display of a touch sensor device, this provides a distinct advantage over prior art systems when there is a limited number of different types of signals having different characteristics that may be used. For example, consider an implementation which has available only a limited number of transmit frequencies. By providing the same signals having similar transmit frequencies to different panels for touchscreen display that looked at sensor device, frequency reuse improves the overall operation of the system by making available additional signal frequencies for touchscreen device operations and/or other operations.

For example, a first signal is provided via a first electrode of the first panel of the touch sensor device and is also provided via a first electrode of the second panel or touchscreen display of the touch sensor device. In certain examples, this first electrode will be the top row electrode of both panels or touchscreen displays of the touch sensor device. Similarly, a second signal is provided via a second electrode of the first panel or touchscreen display of the touch sensor device and is also provided via a second electrode of the second panel or touchscreen display of the touch sensor device. In certain examples, this second electrode will be the second from top row electrode of both panels or touchscreen displays of the touch sensor device.

While transmission of the signals is made via the row electrodes of the different panels or touchscreen displays of the touch sensor device are shared, reception of those signals, via capacitive coupling and into the column electrodes, is performed separately so as to facilitate disambiguation of the location of such capacitive coupling between the row electrodes and the column electrodes.

As can be seen on the right-hand side of the diagram, considering two respective interactions with the panel or touchscreen display as shown by the hashed circles, then a corresponding heat map representation showing the electrode crosspoint intersection may be generated by the one or more processing modules 42 interpreting the signals provided to it via the DSCs 28 that couple to the row and column electrodes. As can be seen, the respective locations of the interactions with the panel or touchscreen display are shown as corresponding with respect to the two respective panels or touchscreen displays of the touch sensor device.

FIG. 69B is a schematic block diagram of an embodiment 2401 of an extended touch sensor device including signaling via respective sets of rows and columns in accordance with the present invention. This diagram has some similarities with the previous diagram with at least one difference being that the row electrodes and column electrodes are partitioned into respective sets of row electrodes and column electrodes that are respectively serviced by inspected sets of DSCs 28 that are in communication with one or more processing modules 42.

In this diagram, first one or more signaling is provided via a first set of row electrodes of the first panel or touchscreen display of the touch sensor device and also to a first set of row electrodes of the second panel or touchscreen display of the touch sensor device. Similarly, second one or more signaling is provided via a second set of row electrodes of the first panel or touchscreen display of the touch sensor device and also to a second set of row electrodes of the second panel or touchscreen display of the touch sensor device.

While transmission of the signals is made via the respective sets of row electrodes of the different panels or touchscreen displays of the touch sensor device are shared, reception of those signals, via capacitive coupling and into respective sets of column electrodes, is performed separately so as to facilitate disambiguation of the location of such capacitive coupling between the row electrodes and the column electrodes of the different respective sets of row electrodes and column electrodes.

FIG. 69C is a schematic block diagram of another embodiment 2402 of an extended touch sensor device including signaling via respective sets of rows and columns in accordance with the present invention. This diagram has some similarities to the previous diagram with at least one but difference being that the signals that are driven via the respective row electrodes of the two panels or touchscreen displays of the touch sensor device are driven from both sides of the respective panels. For example, there may be implementations in which the panel is of a particular size, impedance, and/or of the other characteristic such that it is desirable to drive the different respective panels or touchscreen displays of the touch sensor device from both ends (e.g., consider a high impedance panel that, when implemented in accordance with the prior art, necessarily requires driving from both sides of the panel). In a prior implementation in which such operation is desirable, driving the panel or touchscreen display from both sides, the board count and real estate consumption of such a device can be problematic.

The functionality and capability of the DSCs as described herein has capability to facilitate such operation with a significant reduction in board count and real estate consumption within the device.

FIG. 69D is a schematic block diagram of another embodiment 2500 of an extended touch sensor device in accordance with the present invention. Many diagrams herein show transmission of the same signaling via one or more of row electrodes of two or more panels or touchscreen displays of a touch sensor device and detection of those signals via capacitive coupling into one or more column electrodes of those two or more panels or touchscreen displays of the touch sensor device. Note that the converse operation may be performed such that there is transmission of the same signaling via one or more column electrodes of the two or more panels or touchscreen displays of the touch sensor device and detection of those signals via capacitive coupling into the one or more row electrodes of those two or more panels or touchscreen displays of the touch sensor device.

This diagram shows the same signaling that is provided via the column electrodes of two respective panels or touchscreen displays of a touch sensor device. In this diagram, the touch sensor device includes two respective panels or touchscreen displays. The signals are transmitted on the column of the respective panels or touchscreen displays are shared, and there is separate receiving of those signals that may be detected via the row electrodes.

For example, a first signal is provided via a first electrode of the first panel of the touch sensor device and is also provided via a first electrode of the second panel or touchscreen display of the touch sensor device. In certain examples, this first electrode will be the left most column electrode of both panels or touchscreen displays of the touch sensor device. Similarly, a second signal is provided via a second electrode of the first panel or touchscreen display of the touch sensor device and is also provided via a second electrode of the second panel or touchscreen display of the touch sensor device. In certain examples, this second electrode will be the second from top row electrode of both panels or touchscreen displays of the touch sensor device.

While transmission of the signals is made via the row electrodes of the different panels or touchscreen displays of the touch sensor device are shared, reception of those signals, via capacitive coupling and into the column electrodes, is performed separately so as to facilitate disambiguation of the location of such capacitive coupling between the row electrodes and the column electrodes.

As can be seen on the right-hand side of the diagram, considering two respective interactions with the panel or touchscreen display as shown by the hashed circles, then a corresponding heat map representation showing the electrode crosspoint intersection may be generated by the one or more processing modules 42 interpreting the signals provided to it via the DSCs 28 that couple to the row and column electrodes. As can be seen, the respective locations of the interactions with the panel or touchscreen display are shown as corresponding with respect to the two respective panels or touchscreen displays of the touch sensor device.

For example, as shown with respect to FIG. 51D, note that mutual signaling may be performed within different ways including transmission of one or more mutual signals via row electrodes and detection of capacitive coupling of those signals into column electrodes via the column electrodes, or vice versa. For example, mutual signaling may alternatively be performed based on transmission of one or more mutual signals via column electrodes and detection of capacitive coupling of those signals into row electrodes via the row electrodes.

FIG. 69E is a schematic block diagram of an embodiment 2600 of an extended touch sensor device including variable resolution and interoperable sensor panels in accordance with the present invention. This diagram shows two respective panels or touchscreen displays that have a same number of row electrodes and column electrodes but are of different size. For example, the second panel or touchscreen display may include a same number of row electrodes and column electrodes as the first panel or touchscreen display, but the row electrodes and/or column electrodes of the second panel or touchscreen display may be of a different pitch or separation than the row electrodes and/or the column electrodes is different between the first and second panels or touchscreen displays. The resolution of the two respective panels or touchscreen displays of the touch sensor device may be variable, yet the two respective panels or touchscreen displays are interoperable with one another.

This diagram has certain similarities with respect to FIG. 69A with at least one difference being that the second panel or touchscreen display is of a different size than the first panel or touchscreen display. Note that the second panel or touchscreen display may be larger or smaller than the first panel or touchscreen display and various examples. For example, the second panel or touchscreen display may include a same number of row electrodes and column electrodes but be of a different pitch or separation between the row electrodes and the column electrodes is different between the first and second panels or touchscreen displays.

This diagram shows the same signaling that is provided via the row electrodes of two respective panels or touchscreen displays of a touch sensor device that are of different size, resolution, etc. In this diagram, the touch sensor device includes two respective panels or touchscreen displays. The signals are transmitted on the rows of the respective panels or touchscreen displays are shared, and there is separate receiving of those signals that may be detected via the column electrodes.

For example, a first signal is provided via a first electrode of the first panel of the touch sensor device and is also provided via a first electrode of the second panel or touchscreen display of the touch sensor device. In certain examples, this first electrode will be the top row electrode of both panels or touchscreen displays of the touch sensor device. Similarly, a second signal is provided via a second electrode of the first panel or touchscreen display of the touch sensor device and is also provided via a second electrode of the second panel or touchscreen display of the touch sensor device. In certain examples, this second electrode will be the second from top row electrode of both panels or touchscreen displays of the touch sensor device.

While transmission of the signals is made via the row electrodes of the different panels or touchscreen displays of the touch sensor device are shared, reception of those signals, via capacitive coupling and into the column electrodes, is performed separately so as to facilitate disambiguation of the location of such capacitive coupling between the row electrodes and the column electrodes.

As can be seen on the right-hand side of the diagram, considering two respective interactions with the panel or touchscreen display as shown by the hashed circles, then a corresponding heat map representation showing the electrode crosspoint intersection may be generated by the one or more processing modules 42 interpreting the signals provided to it via the DSCs 28 that couple to the row and column electrodes. As can be seen, the respective locations of the interactions with the panel or touchscreen display are shown as corresponding with respect to the two respective panels or touchscreen displays of the touch sensor device.

FIG. 69F is a schematic block diagram of another embodiment 2700 of an extended touch sensor device in accordance with the present invention. This diagram shows for panels or touchscreen displays of a touch sensor device. Signaling is shared between certain of the panels or touchscreen displays of the touch sensor device. For example, the same first signaling that is provided via the row electrodes of the top two respective panels or touchscreen displays of the touch sensor device, and the same second signaling that is provided via the row electrodes of the bottom two respective panels or touchscreen displays of the touch sensor device.

Similarly, detection of any capacitive coupling of the signals associated with the first signaling or the second signaling is made via the column electrodes of the left two respective panels or touchscreen displays of the touch sensor device and also via the column electrodes of the right to respective panels or touchscreen displays of the touch sensor device.

As can be seen, a first set of DSCs 28 provides the same first signaling to the row electrodes of the top two respective panels or touchscreen displays of the touch sensor device. A second set of DSCs 28 provide the same second signaling to the row electrodes of the bottom two respective panels or touchscreen displays of the touch sensor device.

A third set of DSCs 28 is coupled to the column electrodes of the left two respective panels or touchscreen displays of the touch sensor device, and a fourth set of DSCs 28 is coupled to the column electrodes of the right two respective panels or touchscreen displays of the touch sensor device.

Based on different respective signaling being provided to the different respective row electrodes in this configuration, disambiguation of interaction with the respective panels or touchscreen displays of the touch sensor device may be made.

Consider four respective interactions with the panel touchscreen display as shown by the hashed circles, then a corresponding heat map representation showing the electrode crosspoint intersection may be generated by the one or more processing modules 42 interpreting the signals provided to it via the DSCs 28 that couple to the row and column electrodes of the four respective panels or touchscreen displays.

In an example of operation and implementation, consider the floor respective panels or touchscreen displays being numbered 1 2 3 4, such that 1 is the upper left-hand panel or touchscreen display, 2 is the upper right-hand panel or touchscreen display, 3 is the lower left-hand panel or touchscreen display, and 4 is the lower right-hand panel or touchscreen display. The panels or touchscreen displays 1 and 2 share the same transmission signals (TX1) that are provided to the respective rows of the panels or touchscreen displays 1 and 2, and the panels or touchscreen displays 3 and 4 share the same transmission signals (TX2) that are provided to the respective rows of the panels or touchscreen displays 1 and 2.

The panels or touchscreen displays 1 and 3 share the same receiving signals (RX1) for listening to the TX1 and/or TX2 signals that may be capacitively coupled into the column electrodes of the panels or touchscreen displays 1 and 3. Similarly, the panels or touchscreen displays 2 and 4 share the same receiving signals (RX2) for listening to the TX1 and/or TX2 signals that may be capacitively coupled into the column electrodes of the panels or touchscreen displays 2 and 4.

FIG. 69G is a schematic block diagram of another embodiment 2800 of an extended touch sensor device based on a distributed architecture for remotely located sensor panels in accordance with the present invention. This diagram has some similarity to certain of the previous diagrams including FIG. 69A with at least one difference being that the panels or touchscreen displays of the touch sensor device are remotely located with respect to the circuitry that is implemented to effectuate transmission, reception, sensing, etc. of signals via the electrodes of the panels or touchscreen displays of the touch sensor device (e.g., such as that shown by the DSCs 28, the one or more processing modules 42, etc.). Note that the distance between the panels or touchscreen displays of the touch sensor device is a relatively long distance in certain examples. For example, the distance between the circuitry and the panels or touchscreen displays of the touch sensor device may be greater than 1 meter (m), 2 m, 10 m, 50 m, 100 m, 1 km, 2 km, or of an even greater distance in various implementations.

The functionality and capability of the DSCs as described herein has capability to drive and sense signals via extremely long lines. In comparison to prior art that require the circuitry that services the respective electrodes of a panel or touchscreen display to be implemented extremely close to the edge of the panel or touchscreen display (e.g., the measurement control electronics, circuitry, chips, etc. of prior art systems need to be placed as close to the display or touchscreen display as possible), the use of DSCs as described herein facilitates locating the circuitry that services the electrodes of the panel or touchscreen display to be located remotely with respect to the pallet touchscreen display. In certain implementations, this has a variety of advantages and benefits over the prior art. For example, the panel or touchscreen display of the touch sensor lights may be located in an environment that is not particularly friendly to the circuitry that services the electrodes of the panel or touchscreen display. For example, the control electronics, circuitry, chips, etc. is exposed to the environment of the panel or touchscreen display (e.g. sunlight, rain, heat).

Such an environment may be of a particular level of humidity, temperature, pressure, vibration, etc. that may adversely affect the operation of the circuitry that services the electrodes of the panel or touchscreen display. In addition, such an environment may unfortunately provide exposure of the elements (e.g., extreme temperature, rain, snow, etc.) That also adversely affects the operation of the circuitry that services the electrodes of the panel or touchscreen display.

By using such circuitry as described herein, including the functionality and capability of the DSCs as described herein, the circuitry may be located remotely with respect to the panel or touchscreen display that is servicing.

Also, note that while many examples described herein show different respective panels or touchscreen displays as having similar construction at least with respect to the number of row electrodes and column electrodes included therein, even when they may be of different size, pitch, etc., note that similar functionality and operation may be performed with respect to panels or touchscreen displays having different construction at least with respect to different numbers of row electrodes and column electrodes included respectively therein. For example, a first panel or touchscreen display may include a first number of row electrodes and a second number of column electrodes while a second panel or touchscreen display may include a third number of row electrodes in a fourth number of column electrodes. Appropriate mapping between the first number of row electrodes and the third number of row electrodes, such as via one or more switching circuits, may be implemented to facilitate interoperability between the first panel or touchscreen display and a second panel or touchscreen display. Similarly, appropriate mapping between the second number of column electrodes in the fourth number of column electrodes, such as via one or more switching circuits, may be implemented to facilitate interoperability between the first panel or touchscreen display and a second panel or touchscreen display.

For example, consider a mapping between a first panel or touchscreen display that includes N row electrodes and a second panel or touchscreen display that includes 2N electrodes, such that N is a positive integer greater than or equal to 1. A mapping between the N and 2N row electrodes of the first and second panels or touchscreen displays may include mapping every row electrode of the first panel or touchscreen display to every other row electrode of the second panel or touchscreen display.

For example, consider a mapping between a first panel or touchscreen display that includes N row electrodes and a second panel or touchscreen display that includes 3N electrodes, such that N is a positive integer greater than or equal to 1. A mapping between the N and 3N row electrodes of the first and second panels or touchscreen displays may include mapping every row electrode of the first panel or touchscreen display to every third row electrode of the second panel or touchscreen display.

Based on the number of respective row electrodes between the first and second panels or touchscreen displays, any appropriate and/or desired mapping between the electrodes of the first panel or touchscreen display and the second panel or touchscreen display may be made.

In addition, with respect to this diagram of others herein that are implemented such that the circuitry that services the electrodes of one or more panels or touch screen displays is remotely located with respect to the one or more panels or touchscreen displays themselves, this provides an improvement by reducing the amount of space by which the respective panels or touchscreen displays need to be space. For example, with respect to prior art systems in which the measurement control electronics, circuitry, chips, etc. of prior art systems need to be placed as close to the display or touchscreen display as possible, various aspects, embodiments, and/or examples of the invention (and/or their equivalents) did not have such a requirement, and the circuitry that services the electrodes of the one or more panels or touch screen displays may be remotely located with respect to the one or more panels or touchscreen displays themselves.

FIG. 69H is a schematic block diagram of another embodiment 2900 of a touch sensor device based on a distributed architecture for remotely located and independently operable sensor panels in accordance with the present invention. This diagram shows multiple respective panels or touchscreen displays that are independently operable such that a corresponding set of DSCs 28 and another corresponding set of DSCs 28 service the row electrodes and column electrodes of each respective panel or touchscreen display independently. In addition, the circuitry that services these respective panels or touchscreen displays is remotely located with respect to each of these respective panels or touchscreen displays, and the respective panels or touchscreen displays are also remotely located with respect to one another.

With respect to the distance of separation between these various remotely located components, note that the distance or distances may be greater than 1 m, 2 m, 10 m, 50 m, 100 m, 1 km, 2 km, or of an even greater distance in various implementations. Again, the functionality and capability of the DSCs as described herein has capability to drive and sense signals via extremely long lines thereby facilitating and enabling the remote location of the circuitry that services the respective electrodes of the panels or touchscreen displays from the panels or touchscreen displays themselves. The prior art does not support such functionality and requires circuitry that services the respective electrodes of the panels or touchscreen displays to be co-located, and adjacently located, etc. with respect to the panels are touchscreen displays themselves.

Certain of the prior diagrams operate based on extension of the touch sensor device using different respective panels or touchscreen displays that operate cooperatively one another to provide an extended panels or touchscreen displays. Certain of the following diagrams depict duplicated/ mirrored panels or touchscreen displays of a touch sensor device. For example, by providing similar signaling to more than one panel or touchscreen display at a time, any interaction with any one of the panels are touchscreen displays may be detected based on one or more processing modules 42 interpreting the signals provided from the DSCs 20 a that service the respective electrodes of the panels are touchscreen displays. Such capability and functionality facilitates a number of advantages and new and novel modes of operation in comparison to the prior art. For example, consider a touchscreen display implementation in which two respective touchscreen displays show the same image or video, yet two different users interact respectively with the two respective touchscreen displays and their respective interaction is shown on a heat map representation showing the electrode crosspoint intersection of their interaction as well as showing any interaction by one or both of the users on the heat map representation.

FIG. 69I is a schematic block diagram of an embodiment 3000 of a duplicated/mirrored touch sensor device in accordance with the present invention. This diagram shows a first set of DSCs 28 in communication with the one or more processing modules 42 that is configured to service the row electrodes of the two respective panels or touchscreen displays of the touch sensor device and a second set of DSCs in communication with the one or more processing modules 42 that is configured to service the column electrodes of the two respective panels or touchscreen displays of the touch sensor device.

As can be seen, the very same signaling is provided respectively to the row electrodes and column electrodes of the two panels or touchscreen displays of the touch sensor device. Any interaction with either one of the two panels or touchscreen displays of the touch sensor device is shown within the heat map representation shown on the lower right-hand portion of the diagram. In this diagram, there is a shared transmission on the rows of the two panels or touchscreen displays of the touch sensor device, and there is also shared receiving on the columns of the two panels or touchscreen displays of the touch sensor device.

In addition, with respect to this diagram and others herein, note that such an implementation is operative to support touchscreen device such that information corresponding to two or more panels or touchscreen displays of the touch sensor device are operable all to be running simultaneously based on the same channels thereby sending one packet of interaction data.

In an example of operation and implementation, a particular application may include a student and teacher working on the same screen interacting without crossing each other's space. This can facilitate both the student and teacher to be touching the exact same spot on the screen of their respective panels or touchscreen displays.

In addition, with respect to this diagram and others herein, note that one or more objects (e.g., not specifically associated with the user) could be place on one panel or touchscreen display, and user interaction with respect to another panel or touchscreen display may be operative to interact with the signaling data associated with the one or more objects placed on the mean one panel or touchscreen display.

Furthermore, consider an application in which one or more items are placed on a gaming table, and a panel are touchscreen display is available for user interaction such that the user interaction would facilitate interaction with the data associated with the one or more at the chip level. For example, such interaction with respect to a human interface descriptor (HID), would be provided at the physical/sensor/controller level and not at the operating system (OS) level of a touch sensor device.

FIG. 69J is a schematic block diagram of another embodiment 3100 of a duplicated/mirrored touch sensor device based on a distributed architecture for remotely located sensor panels in accordance with the present invention. This diagram has similarity to the previous diagram, FIG. 69I, with at least one difference being that the two panels or touchscreen displays of the touch sensor device are remotely located with respect to the circuitry that services the respective row electrodes and column electrodes of the two panels or touchscreen displays of the touch sensor device. In this diagram, the two panels or touchscreen displays of the touch sensor device are co-located, adjacently located, etc. with respect to one another and remotely located with respect to the circuitry that services them.

For example, the two panels or touchscreen displays of the touch sensor device may be implemented such that they are co-located, adjacently located, etc. with respect to one another, such as with respect to an array (e.g., such as a video wall array that includes touchscreen displays), With respect to the distance of separation between these various remotely located components, note that the distance or distances may be greater than 1 m, 2 m, 10 m, 50 m, 100 m, 1 km, 2 km, or of an even greater distance in various implementations. Again, the functionality and capability of the DSCs as described herein has capability to drive and sense signals via extremely long lines thereby facilitating and enabling the remote location of the circuitry that services the respective electrodes of the panels or touchscreen displays from the panels or touchscreen displays themselves. The prior art does not support such functionality and requires circuitry that services the respective electrodes of the panels or touchscreen displays to be co-located, and adjacently located, etc. with respect to the panels are touchscreen displays themselves.

FIG. 69K is a schematic block diagram of another embodiment 3200 of a duplicated/mirrored touch sensor device based on a distributed architecture for remotely located sensor panels in accordance with the present invention. This diagram has similarity to the previous diagrams, FIG. 69I and FIG. 69J, with at least one difference being that the two panels or touchscreen displays of the touch sensor device are remotely located with respect to the circuitry that services the respective row electrodes and column electrodes of the two panels or touchscreen displays of the touch sensor device and also that the two panels or touchscreen displays of the touch sensor device are remotely located with respect to one another.

Such an implementation may be suitable for a variety of applications. Consider a touch sensor device to include sensor capability included within different respective locations of a home, office, building, etc. Interaction with any one of the respective panels or touchscreen displays of the touch sensor device may be detected by the touch sensor device. For example, consider different respective panels or touchscreen displays implemented to facilitate user interaction to perform any one or more of various operations corresponding to the operation of the home, office, building, etc. Examples of such operations may correspond to unlocking of the front door, opening or closing of a garage door, setting the temperature of a thermostat, turning lighting on or off for controlling the intensity thereof, opening or closing of a window, and/or any other operation corresponding to the operation of the home, office, building, etc.

In certain examples, different respective users interacting with different respective panels or touchscreen displays of the touch sensor device that are implemented within different respective locations of the home, office, building, etc. is performed to facilitate the execution of such operations. In other examples, one or more users interacting with different respective panels or touchscreen displays of the touch sensor device that are implemented within different respective locations of the home, office, building, etc. is performed to facilitate the execution of such operations at different respective times.

FIG. 69L is a schematic block diagram of another embodiment 3300 of a duplicated/mirrored touch sensor device based on a distributed architecture for remotely located sensor panels in accordance with the present invention. This diagram has similarity to the previous diagram, FIG. 69K, showing that the multiple panels or touchscreen displays of the touch sensor device are remotely located with respect to the circuitry that services the respective row electrodes and column electrodes of the respective panels or touchscreen displays of the touch sensor device and also that the respective panels or touchscreen displays of the touch sensor device are remotely located with respect to one another. As shown by the ellipses between the second and third panels or touchscreen displays, any desired number of panels or touchscreen displays may be implemented with in such an embodiment 3300 (e.g., 3, 4, 5, or more).

FIG. 69M is a schematic block diagram of an embodiment 3400 of a duplicated/mirrored touch sensor device including variable resolution and interoperable sensor panels in accordance with the present invention. This diagram has similarity to one of the previous diagrams, FIG. 69I, with at least one difference being that the second panel or touchscreen display is of a different size than the first panel or touchscreen display. Note that the second panel or touchscreen display may be larger or smaller than the first panel or touchscreen display and various examples. For example, the second panel or touchscreen display may include a same number of row electrodes and column electrodes as the first panel or touchscreen display, but the row electrodes and/or column electrodes of the second panel or touchscreen display may be of a different pitch or separation than the row electrodes and/or the column electrodes is different between the first and second panels or touchscreen displays. For example, when comparing the panels or touchscreen displays, one of the panels or touchscreen displays may have a course sensitivity, while the other may have a fine sensitivity. The resolution of the two respective panels or touchscreen displays of the touch sensor device may be variable, yet the two respective panels or touchscreen displays are interoperable with one another.

FIGS. 70A, 70B and 70C are graphical diagrams 620-1, 640-1 and 640-1' of an embodiment of capacitance image data in accordance with the present disclosure. In particular, compensated capacitance image data is presented in response to the presence on the surface of a display to objects 621 (a cookie), 622 (a rubber band), 623 (a smaller 7-spoked wheel with one spoke missing) and 624 (a larger 7-spoked wheel with one spoke missing). FIG. 70A presents a 2-D heat map representation where differing colors represent the magnitude of the positive capacitance variation data and the negative capacitance variation data. FIGS. 70B and 70C present 3-D heat map representation where, again, differing colors represent the magnitude of the positive capacitance variation data and the negative capacitance variation data.

The presence of the objects is indicated by the patterns in the positive and negative capacitance variation data. Noise is present that can be compensated by artifact compensation module 2266-2 by establishing a noise zone, such as the noise zone in FIG. 70C with a corresponding upper and lower baseline.

Figure 70D:
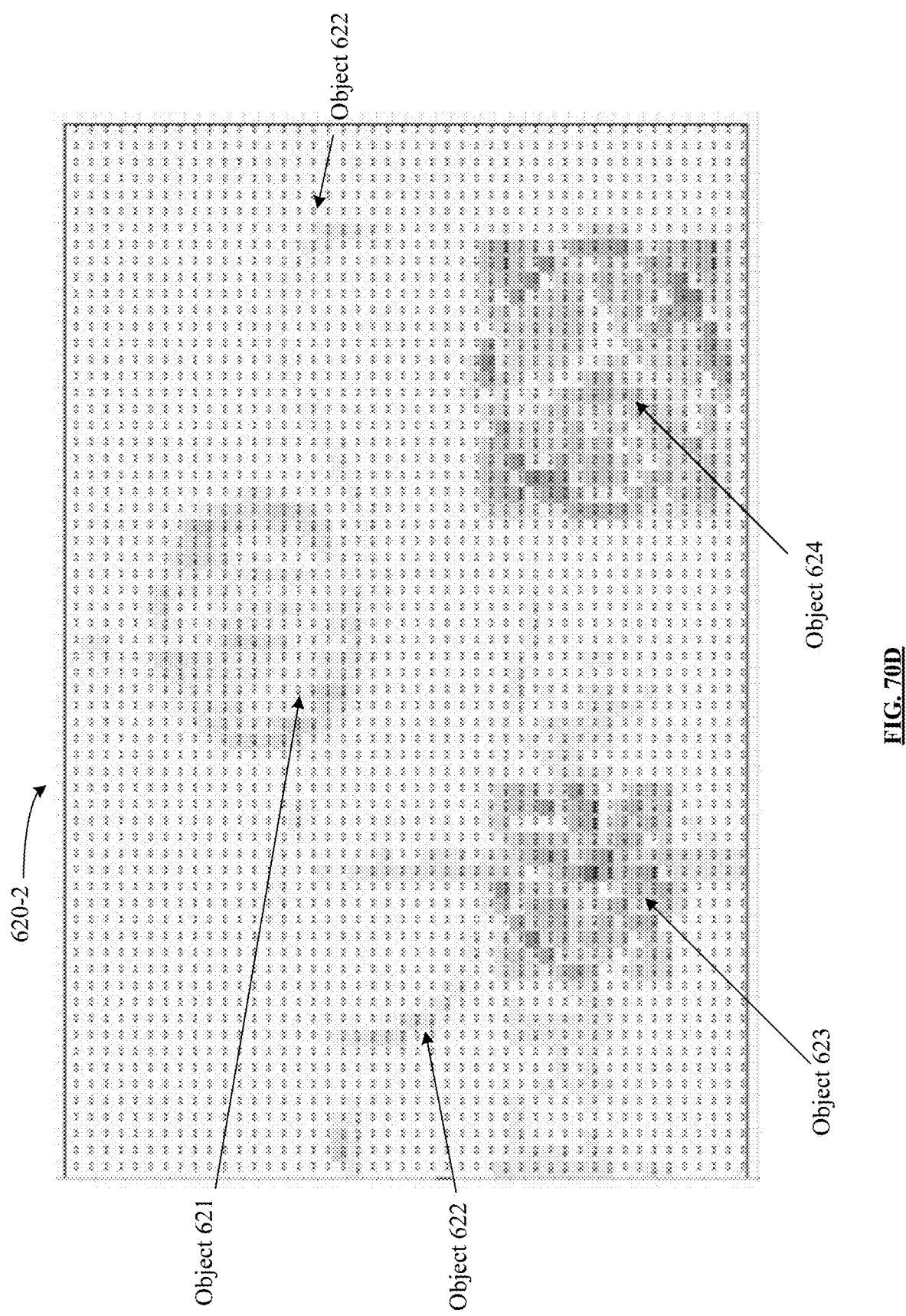
Figure 70E:
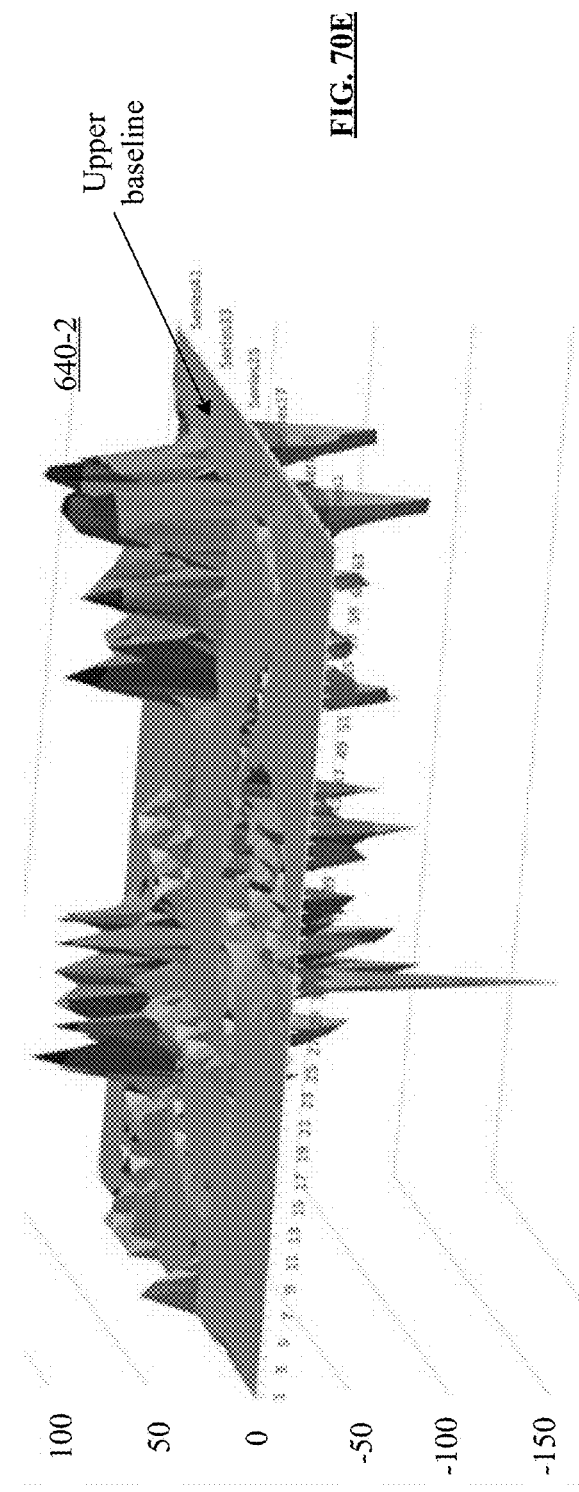
Figure 70F:
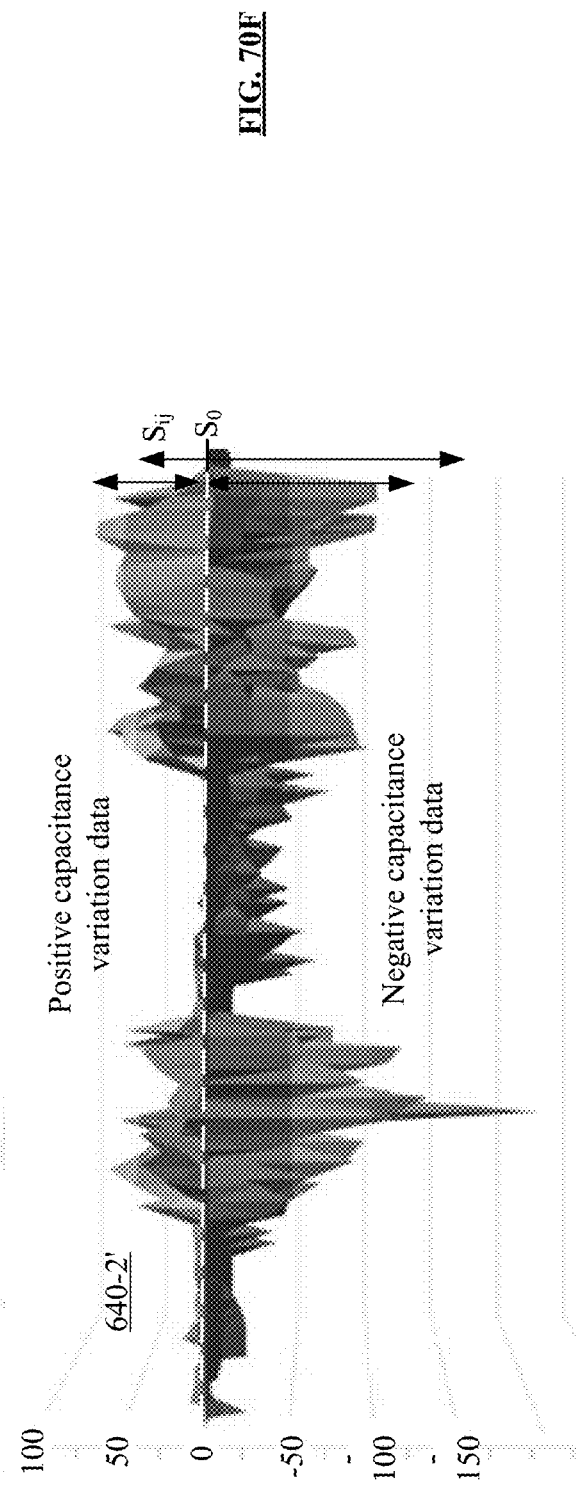
Figure 70G:
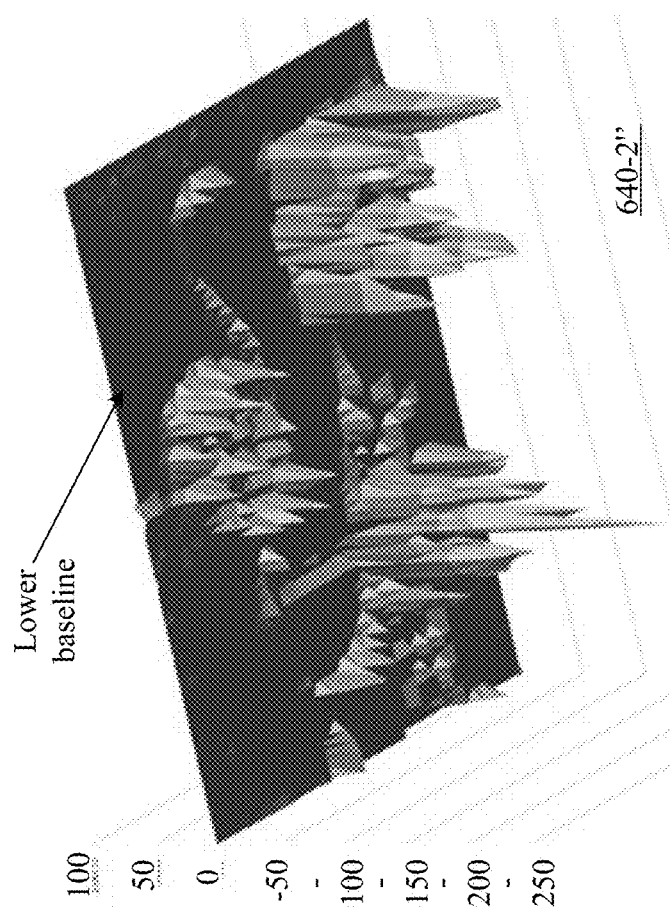

FIGS. 70D, 70F and 70G are graphical diagrams 620-2, 640-2, 640-2' and 640-2" of an embodiment of compensated capacitance image data in accordance with the present disclosure. In particular, compensated capacitance image data is presented in response to the presence on the surface of a display of objects 621 (a cookie), 622 (a rubber band), 623 (a smaller 7-spoked wheel with one spoke missing) and 624 (a larger 7-spoked wheel with one spoke missing). FIG. 70D presents a 2-D heat map representation corresponding to the capacitance image data of FIG. 70A, but where noise in the noise zone has been subtracted, removed or ignored. Similarly FIGS. 70E, 70F and 70E present 3-D heat map representations corresponding to differing views the capacitance image data of FIGS. 70B and 70C where, again, noise in the noise zone has been subtracted, removed or ignored.

As can be seen in FIGS. 70D and 70E, some of the positive capacitance variation data not associated with any of the objects on the surface has been removed—with only the positive capacitance variation data above the upper baseline being present. Furthermore, as can be seen most clearly in FIG. 70G, only the negative capacitance variation data below the lower baseline is present, providing a cleaner set of negative capacitance variation data for analysis.

FIG. 71 is a flow diagram of an embodiment of a method in accordance with the present disclosure. In particular, a method is presented for use in conjunction with any of the functions and features previously described. Step 700 includes providing a display configured to render frames of data into visible images. Step 702 includes providing a plurality of electrodes integrated into the display to facilitate touch sense functionality based on electrode signals having a drive signal component and a receive signal component, wherein the plurality of electrodes includes a plurality of row electrodes and a plurality of column electrodes, wherein the plurality of row electrodes is separated from the plurality of column electrodes by a dielectric material and wherein the plurality of row electrodes and the plurality of row electrodes form a plurality of cross points. Step 704 includes generating, via a plurality of drive-sense circuits coupled to at least some of the plurality of electrodes, a plurality of sensed signals, wherein each the plurality of drive-sense circuits includes a first conversion circuit and a second conversion circuit, and wherein, when a drive-sense circuit of the plurality of drive-sense circuits is enabled to monitor a corresponding electrode of the plurality of electrodes, the first conversion circuit is configured to convert the receive signal component into a sensed signal of the plurality of sensed signals and the second conversion circuit is configured to generate the drive signal component from the sensed signal of the plurality of sensed signals.

Step 706 includes receiving, at a processing module that includes at least one memory and at least one processing circuit, the plurality of sensed signals, wherein the sensed signals indicate variations in mutual capacitance associated with the plurality of cross points. Step 708 includes generating, via the processing module and based on the plurality of sensed signals, capacitance image data associated with the plurality of cross points that includes positive capacitance variation data corresponding to positive variations of the capacitance image data from a nominal value and negative capacitance variation data corresponding to negative variations of the capacitance image data from the nominal value. Step 710 includes identifying, via the processing module, noise in the capacitance image data based on the positive capacitance variation data, and the negative capacitance variation data. Step 712 includes determining, via the processing module and based on the noise in the capacitance image data, an upper threshold and a lower threshold. Step 714 includes generating, via the processing module, compensated capacitance image data, based on the upper threshold and the lower threshold, to compensate for the noise in the capacitance image data. Step 716 includes processing, via the processing module, the compensated capacitance image data to determine a proximal condition of the touch screen display.

In various embodiments, a region between the upper threshold and the lower threshold corresponds to a noise zone, and wherein generating the compensated capacitance image data includes ignoring portions of the capacitance image data within the noise zone, removing portions of the capacitance image data within the noise zone and/or subtracting portions of the capacitance image data within the noise zone.

In various embodiments, the compensated capacitance image includes compensated positive capacitance variation data and wherein processing the compensated capacitance image data to identify the condition of the touch screen display includes analyzing the compensated positive capacitance variation data. The proximal condition can include a proximal touch of the touch screen display by a finger.

In various embodiments the compensated capacitance image includes compensated negative capacitance variation data and wherein processing the compensated capacitance image data to identify the condition of the touch screen display includes analyzing the compensated negative capacitance variation data. The compensated capacitance image can include compensated positive capacitance variation data and compensated negative capacitance variation data and wherein processing the compensated capacitance image data to identify the condition of the touch screen display includes analyzing the compensated positive capacitance variation data and the compensated negative capacitance variation data. The proximal condition can include the presence of water on the surface of the touch screen display and/or an object on a surface of the touch screen display.

In various embodiments, variations in mutual capacitance associated the plurality of cross points vary positively and negatively from a nominal mutual capacitance. The nominal mutual capacitance can correspond to an average mutual capacitance of the plurality of cross points in a non-touch condition of the touch screen display.

In various embodiments, the sensed signals indicate an impedance of the plurality of cross points. The nominal value can be proportional to a nominal impedance corresponding to each of the cross-points of the plurality of cross points in a non-touch condition of the touch screen display.

In various embodiments, the first conversion circuit includes: a comparator to compare the electrode signal to an analog reference signal to produce an analog comparison signal; and an analog to digital converter operable to convert the analog comparison signal into the sensed signal; and the second conversion circuit includes: a digital to analog converter operable to convert the sensed signal into an analog feedback signal; a signal source circuit operable to generate a regulated source signal based on the analog feedback signal; and a driver operable to increase power of the regulated source signal to produce the drive signal component.

In various embodiments, each electrode comprises: a transparent conductive trace placed in a layer of the touch screen display, wherein the transparent conduction trace is constructed of one or more of: Indium Tin Oxide (ITO), Graphene, Carbon Nanotubes, Thin Metal Films, Silver Nanowires Hybrid Materials, Aluminum-doped Zinc Oxide (AZO), Amorphous Indium-Zinc Oxide, Gallium-doped Zinc Oxide (GZO), or poly(3,4-ethylenedioxythiophene) (PEDOT).

FIG. 72 is a flow diagram of an embodiment of a method in accordance with the present disclosure. In particular, a method is presented for use in conjunction with any of the functions and features previously described. Step 720 includes providing a display configured to render frames of data into visible images. Step 722 includes providing a plurality of electrodes integrated into the display to facilitate touch sense functionality based on electrode signals having a drive signal component and a receive signal component, wherein the plurality of electrodes includes a plurality of row electrodes and a plurality of column electrodes, wherein the plurality of row electrodes is separated from the plurality of column electrodes by a dielectric material and wherein the plurality of row electrodes and the plurality of row electrodes form a plurality of cross points. Step 724 includes generating, via a plurality of drive-sense circuits coupled to at least some of the plurality of electrodes, a plurality of sensed signals, wherein each the plurality of drive-sense circuits includes a first conversion circuit and a second conversion circuit, and wherein, when a drive-sense circuit of the plurality of drive-sense circuits is enabled to monitor a corresponding electrode of the plurality of electrodes, the first conversion circuit is configured to convert the receive signal component into a sensed signal of the plurality of sensed signals and the second conversion circuit is configured to generate the drive signal component from the sensed signal of the plurality of sensed signals.

Step 726 includes receiving, at a processing module that includes at least one memory and at least one processing circuit, the plurality of sensed signals, wherein the sensed signals indicate variations in mutual capacitance associated with the plurality of cross points. Step 728 includes generating, via the processing module and based on the plurality of sensed signals, capacitance image data associated with the plurality of cross points that includes positive capacitance variation data corresponding to positive variations of the capacitance image data from a nominal value and negative capacitance variation data corresponding to negative variations of the capacitance image data from the nominal value. Step 730 includes identifying, via the processing module, a presence of water on the touch screen display based on the positive capacitance variation data, and the negative capacitance variation data. Step 732 includes generating, via the processing module, compensated capacitance image data, to compensate for the water on the touch screen display. Step 734 includes processing, via the processing module, the compensated capacitance image data to determine a proximal condition of the touch screen display.

FIG. 73 is a flow diagram of an embodiment of a method in accordance with the present disclosure. In particular, a method is presented for use in conjunction with any of the functions and features previously described. Step 740 includes providing a display configured to render frames of data into visible images. Step 742 includes providing a sensor layer having a plurality of electrodes and a compressible dielectric layer adjacent to the sensor layer, the sensor layer and the compressible dielectric layer integrated into the display to facilitate touch sense functionality based on electrode signals having a drive signal component and a receive signal component, wherein a wherein the plurality of electrodes includes a plurality of row electrodes and a plurality of column electrodes, wherein the plurality of row electrodes is separated from the plurality of column electrodes by a dielectric material and wherein the plurality of row electrodes and the plurality of row electrodes form a plurality of cross points. Step 744 includes generating, via a plurality of drive-sense circuits coupled to at least some of the plurality of electrodes, a plurality of sensed signals, wherein each the plurality of drive-sense circuits includes a first conversion circuit and a second conversion circuit, and wherein, when a drive-sense circuit of the plurality of drive-sense circuits is enabled to monitor a corresponding electrode of the plurality of electrodes, the first conversion circuit is configured to convert the receive signal component into a sensed signal of the plurality of sensed signals and the second conversion circuit is configured to generate the drive signal component from the sensed signal of the plurality of sensed signals;

Step 746 includes receiving, at a processing module that includes at least one memory and at least one processing circuit, the plurality of sensed signals, wherein the sensed signals indicate variations in mutual capacitance associated with the plurality of cross points. Step 748 includes generating, via the processing module and based on the plurality of sensed signals, capacitance image data associated with the plurality of cross points that includes positive capacitance variation data corresponding to positive variations of the capacitance image data from a nominal value and negative capacitance variation data corresponding to negative variations of the capacitance image data from the nominal value. Step 748 includes processing, via the processing module, the negative capacitance variation data to determine a compressive touch condition of the touch screen display by a non-conductive object.

FIG. 74 is a flow diagram of an embodiment of a method in accordance with the present disclosure. In particular, a method is presented for use in conjunction with any of the functions and features previously described. Step 760 includes providing a display configured to render frames of data into visible images. Step 762 includes providing a sensor layer having a plurality of electrodes, the sensor layer integrated into the display to facilitate touch sense functionality based on electrode signals having a drive signal component and a receive signal component, wherein a wherein the plurality of electrodes includes a plurality of row electrodes and a plurality of column electrodes, wherein the plurality of row electrodes is separated from the plurality of column electrodes by a dielectric material and wherein the plurality of row electrodes and the plurality of row electrodes form a plurality of cross points. Step 764 includes generating, via a plurality of drive-sense circuits coupled to at least some of the plurality of electrodes, a plurality of sensed signals, wherein each the plurality of drive-sense circuits includes a first conversion circuit and a second conversion circuit, and wherein, when a drive-sense circuit of the plurality of drive-sense circuits is enabled to monitor a corresponding electrode of the plurality of electrodes, the first conversion circuit is configured to convert the receive signal component into a sensed signal of the plurality of sensed signals and the second conversion circuit is configured to generate the drive signal component from the sensed signal of the plurality of sensed signals.

Step 766 includes receiving, at a processing module that includes at least one memory and at least one processing circuit, the plurality of sensed signals, wherein the sensed signals indicate variations in mutual capacitance associated with the plurality of cross points. Step 768 includes generating, via the processing module and based on the plurality of sensed signals, capacitance image data associated with the plurality of cross points that includes positive capacitance variation data corresponding to positive variations of the capacitance image data from a nominal value and negative capacitance variation data corresponding to negative variations of the capacitance image data from the nominal value. Step 770 includes processing, via the processing module, the positive capacitive data and the negative capacitance variation data to determine a shape of an object on the touch screen display.

Also, note that any of the various aspects, embodiments, and/or examples of the invention (and/or their equivalents) may be implemented using panels or touchscreen devices of the same or different size, same or different resolution, same or different numbers of row electrodes and/or column electrodes, same or different patterns of electrodes, etc.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, a quantum register or other quantum memory and/or any other device that stores data in a non-transitory manner. Furthermore, the memory device may be in a form of a solid-state memory, a hard drive memory or other disk storage, cloud memory, thumb drive, server memory, computing device memory, and/or other non-transitory medium for storing data. The storage of data includes temporary storage (i.e., data is lost when power is removed from the memory element) and/or persistent storage (i.e., data is retained when power is removed from the memory element). As used herein, a transitory medium shall mean one or more of: (a) a wired or wireless medium for the transportation of data as a signal from one computing device to another computing device for temporary storage or persistent storage; (b) a wired or wireless medium for the transportation of data as a signal within a computing device from one element of the computing device to another element of the computing device for temporary storage or persistent storage; (c) a wired or wireless medium for the transportation of data as a signal from one computing device to another computing device for processing the data by the other computing device; and (d) a wired or wireless medium for the transportation of data as a signal within a computing device from one element of the computing device to another element of the computing device for processing the data by the other element of the computing device. As may be used herein, a non-transitory computer readable memory is substantially equivalent to a computer readable memory. A non-transitory computer readable memory can also be referred to as a non-transitory computer readable storage medium.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A touch screen display comprises:
    a display configured to render frames of data into visible images;
    a plurality of electrodes integrated into the display to facilitate touch sense functionality based on electrode signals having a drive signal component and a receive signal component, wherein the plurality of electrodes includes a plurality of row electrodes and a plurality of column electrodes, wherein the plurality of row electrodes is separated from the plurality of column electrodes by a dielectric material and wherein the plurality of row electrodes and the plurality of row electrodes form a plurality of cross points;

a plurality of drive-sense circuits coupled to at least some of the plurality of electrodes to generate a plurality of sensed signals, wherein each the plurality of drive-sense circuits includes a first conversion circuit and a second conversion circuit, and wherein, when a drive-sense circuit of the plurality of drive-sense circuits is enabled to monitor a corresponding electrode of the plurality of electrodes, the first conversion circuit is configured to convert the receive signal component into a sensed signal of the plurality of sensed signals and the second conversion circuit is configured to generate the drive signal component from the sensed signal of the plurality of sensed signals;

a processing module that includes at least one memory that stores operational instructions and at least one processing circuit that executes the instructions to perform operations that include:

receiving the plurality of sensed signals, wherein the sensed signals indicate variations in mutual capacitance associated with the plurality of cross points;

generating based on the plurality of sensed signals, capacitance image data associated with the plurality of cross points that includes positive capacitance variation data corresponding to positive variations of the capacitance image data from a nominal value and negative capacitance variation data corresponding to negative variations of the capacitance image data from the nominal value;

identifying a presence of water on the touch screen display based on the positive capacitance variation data, and the negative capacitance variation data;

generating compensated capacitance image data to compensate for effects of the water on the touch screen display in the capacitance image data; and processing the compensated capacitance image data to determine a proximal condition of the touch screen display.

2. The touch screen display of claim 1, wherein the operations further include:

determining, based on the capacitance image data, an upper threshold and a lower threshold corresponding to a zone.

3. The touch screen display of claim 2, wherein generating the compensated capacitance image data includes ignoring portions of the capacitance image data within the zone.

4. The touch screen display of claim 2, wherein generating the compensated capacitance image data includes removing portions of the capacitance image data within the zone.

5. The touch screen display of claim 2, wherein generating the compensated capacitance image data includes subtracting portions of the capacitance image data within the zone.

6. The touch screen display of claim 1, wherein the compensated capacitance image includes compensated positive capacitance variation data and wherein processing the compensated capacitance image data to identify the proximal condition of the touch screen display includes analyzing the compensated positive capacitance variation data.

7. The touch screen display of claim 6, wherein the proximal condition includes a proximal touch of the touch screen display by a finger.

8. The touch screen display of claim 1, wherein the compensated capacitance image includes compensated negative capacitance variation data and wherein processing the compensated capacitance image data to identify the condition of the touch screen display includes analyzing the compensated negative capacitance variation data.

9. The touch screen display of claim 1, wherein the compensated capacitance image includes compensated positive capacitance variation data and compensated negative capacitance variation data and wherein processing the compensated capacitance image data to identify the proximal condition of the touch screen display includes analyzing the compensated positive capacitance variation data and the compensated negative capacitance variation data.

10. The touch screen display of claim 9, wherein the proximal condition is an object on a surface of the touch screen display with a corresponding pressure or shape.

11. The touch screen display of claim 1, wherein the variations in mutual capacitance associated the plurality of cross points vary positively and negatively from a nominal mutual capacitance.

12. The touch screen display of claim 11, wherein the nominal mutual capacitance corresponds to an average mutual capacitance of the plurality of cross points in a non-touch condition of the touch screen display.

13. The touch screen display of claim 1, wherein the sensed signals indicate an impedance of the plurality of cross points.

14. The touch screen display of claim 13, wherein the nominal value is proportional to a nominal impedance corresponding to each cross-point of the plurality of cross points in a non-touch condition of the touch screen display.

15. The touch screen display of claim 1, wherein the first conversion circuit includes:

a comparator to compare the electrode signal to an analog reference signal to produce an analog comparison signal; and an analog to digital converter operable to convert the analog comparison signal into the sensed signal; and wherein the second conversion circuit includes:

a digital to analog converter operable to convert the sensed signal into an analog feedback signal;

a signal source circuit operable to generate a regulated source signal based on the analog feedback signal; and a driver operable to increase power of the regulated source signal to produce the drive signal component.

16. The touch screen display of claim 1, wherein each of the electrodes comprise:

a transparent conductive trace placed in a layer of the touch screen display, wherein the transparent conduction trace is constructed of one or more of: Indium Tin Oxide (ITO), Graphene, Carbon Nanotubes, Thin Metal Films, Silver Nanowires Hybrid Materials, Aluminum-doped Zinc Oxide (AZO), Amorphous Indium-Zinc Oxide, Gallium-doped Zinc Oxide (GZO), or poly(3,4-ethylenedioxythiophene) (PEDOT).

17. A method for use in a touch screen display comprises:

providing a display configured to render frames of data into visible images;

providing a plurality of electrodes integrated into the display to facilitate touch sense functionality based on electrode signals having a drive signal component and a receive signal component, wherein the plurality of electrodes includes a plurality of row electrodes and a plurality of column electrodes, wherein the plurality of row electrodes is separated from the plurality of column electrodes by a dielectric material and wherein the plurality of row electrodes and the plurality of row electrodes form a plurality of cross points;

generating, via a plurality of drive-sense circuits coupled to at least some of the plurality of electrodes, a plurality of sensed signals, wherein each the plurality of drive-sense circuits includes a first conversion circuit and a second conversion circuit, and wherein, when a drive-sense circuit of the plurality of drive-sense circuits is enabled to monitor a corresponding electrode of the plurality of electrodes, the first conversion circuit is configured to convert the receive signal component into a sensed signal of the plurality of sensed signals and the second conversion circuit is configured to generate the drive signal component from the sensed signal of the plurality of sensed signals;

receiving, at a processing module that includes at least one memory and at least one processing circuit, the plurality of sensed signals, wherein the sensed signals indicate variations in mutual capacitance associated with the plurality of cross points;

generating, via the processing module and based on the plurality of sensed signals, capacitance image data associated with the plurality of cross points that includes positive capacitance variation data corresponding to positive variations of the capacitance image data from a nominal value and negative capacitance variation data corresponding to negative variations of the capacitance image data from the nominal value;

identifying, via the processing module, a presence of water on the touch screen display based on the positive capacitance variation data, and the negative capacitance variation data;

generating, via the processing module, compensated capacitance image data to compensate for effects of the water on the touch screen display in the capacitance image data; and processing, via the processing module, the compensated capacitance image data to determine a proximal condition of the touch screen display.

18. The method of claim 17, further comprising:
determining, based on the capacitance image data, an upper threshold and a lower threshold corresponding to a zone;
wherein generating the compensated capacitance image data includes ignoring portions of the capacitance image data within the zone.

19. The method of claim 17, further comprising:
determining, based on the capacitance image data, an upper threshold and a lower threshold corresponding to a zone;
wherein generating the compensated capacitance image data includes removing portions of the capacitance image data within the zone.

20. The method of claim 17, further comprising:
determining, based on the capacitance image data, an upper threshold and a lower threshold corresponding to a zone;
wherein generating the compensated capacitance image data includes subtracting portions of the capacitance image data within the zone.

* * * * *